United States Patent
Filiz et al.

(10) Patent No.: US 10,120,478 B2
(45) Date of Patent: Nov. 6, 2018

(54) PIEZO BASED FORCE SENSING

(71) Applicant: Apple Inc., Cupertino, CA (US)

(72) Inventors: Sinan Filiz, Cupertino, CA (US); Brian Q. Huppi, San Francisco, CA (US); Christopher J. Butler, Cupertino, CA (US); Martin P. Grunthaner, Cupertino, CA (US); Shahrooz Shahparnia, Cupertino, CA (US); Sunggu Kang, Cupertino, CA (US); Kai Wang, Waterloo (CA)

(73) Assignee: Apple Inc., Cupertino, CA (US)

( * ) Notice: Subject to any disclaimer, the term of this patent is extended or adjusted under 35 U.S.C. 154(b) by 88 days.

(21) Appl. No.: 15/032,038

(22) PCT Filed: Oct. 28, 2014

(86) PCT No.: PCT/US2014/062739
§ 371 (c)(1),
(2) Date: Apr. 25, 2016

(87) PCT Pub. No.: WO2015/066086
PCT Pub. Date: May 7, 2015

(65) Prior Publication Data
US 2016/0306481 A1 Oct. 20, 2016

Related U.S. Application Data

(60) Provisional application No. 61/896,647, filed on Oct. 28, 2013, provisional application No. 61/917,282, filed on Dec. 17, 2013.

(51) Int. Cl.
*G06F 3/041* (2006.01)
*G06F 3/044* (2006.01)
(Continued)

(52) U.S. Cl.
CPC ............ *G06F 3/0414* (2013.01); *G01L 1/144* (2013.01); *G01L 1/146* (2013.01); *G01L 1/16* (2013.01);
(Continued)

(58) Field of Classification Search
CPC ...... G06F 3/0414; G06F 3/0416; G06F 3/044; G06F 2203/04106; G01L 1/144;
(Continued)

(56) References Cited

U.S. PATENT DOCUMENTS 3,745,502 A 7/1973 Watanabe
3,876,912 A 4/1975 Sanders
(Continued)

FOREIGN PATENT DOCUMENTS

CN 1527933 A 9/2004
CN 1796955 7/2006
(Continued)

OTHER PUBLICATIONS

International Search Report and Written Opinion dated Jan. 26, 2015, PCT/US2014/062739, 10 pages.
(Continued)

*Primary Examiner* — Nelson Rosario
*Assistant Examiner* — Eboni Hughes
(74) *Attorney, Agent, or Firm* — Brownstein Hyatt Farber Schreck, LLP

(57) ABSTRACT

Systems for detecting an amount and/or location of a force applied to a device using a piezoelectric film are provided. One example system can include a transparent piezoelectric film for generating an electric charge in response to a deformation of the film. Electrodes positioned on opposite surfaces of the piezoelectric film can be used to detect the generated electric charge and determine an amount and/or location of force applied to the film based on the generated
(Continued)

electric charge. In another embodiment, the system can include a capacitive touch sensor for determining a location of a touch event on the device.

19 Claims, 62 Drawing Sheets

(51) Int. Cl.
| | | |
|---|---|---|
| H01L 41/113 | (2006.01) | |
| H03K 17/96 | (2006.01) | |
| G01L 1/14 | (2006.01) | |
| G01L 1/16 | (2006.01) | |

(52) U.S. Cl.
CPC ............ *G06F 3/044* (2013.01); *G06F 3/0416* (2013.01); *H01L 41/1132* (2013.01); *H03K 17/962* (2013.01); *H03K 17/964* (2013.01); *H03K 17/9643* (2013.01); *G06F 2203/04106* (2013.01); *H03K 2017/9602* (2013.01); *H03K 2217/96031* (2013.01); *H03K 2217/960735* (2013.01); *H03K 2217/960755* (2013.01)

(58) Field of Classification Search
CPC ....... G01L 1/146; G01L 1/16; H01L 41/1132; H03K 17/962; H03K 17/964; H03K 17/9643; H03K 2017/9602; H03K 2217/96031; H03K 2217/960735; H03K 2217/960755

See application file for complete search history.

(56) References Cited

U.S. PATENT DOCUMENTS

| | | | |
|---|---|---|---|
| 4,345,477 A | 8/1982 | Johnson | |
| 4,423,640 A | 1/1984 | Jetter | |
| 4,516,112 A | 5/1985 | Chen | |
| 4,634,917 A | 1/1987 | Dvorsky et al. | |
| 4,695,963 A | 9/1987 | Sagisawa | |
| 4,951,510 A | 8/1990 | Holm-Kennedy et al. | |
| 5,481,905 A | 1/1996 | Pratt | |
| 5,673,041 A * | 9/1997 | Chatigny ............... H03K 17/94 | |
| | | | 178/18.04 |
| 5,673,042 A | 9/1997 | Chatigny et al. | |
| 5,708,460 A | 1/1998 | Young | |
| 5,915,285 A | 6/1999 | Sommer | |
| 6,288,829 B1 | 9/2001 | Kimura | |
| 6,369,865 B2 | 4/2002 | Hinata | |
| 6,386,023 B1 | 4/2002 | Sajna et al. | |
| 6,812,161 B2 | 11/2004 | Heremans | |
| 6,973,837 B2 | 12/2005 | Barnett | |
| 7,154,481 B2 | 12/2006 | Cross et al. | |
| 7,176,897 B2 | 2/2007 | Roberts | |
| 7,190,350 B2 | 3/2007 | Roberts | |
| 7,196,694 B2 | 3/2007 | Roberts | |
| 7,211,885 B2 | 5/2007 | Nordal et al. | |
| 7,392,716 B2 | 7/2008 | Wilner | |
| 7,441,467 B2 | 10/2008 | Bloom | |
| 7,456,823 B2 | 11/2008 | Poupyrev et al. | |
| 7,511,702 B2 | 3/2009 | Hotelling | |
| 7,707,894 B2 | 5/2010 | Sumigawa | |
| 7,724,248 B2 | 5/2010 | Saito | |
| 7,726,199 B2 | 6/2010 | Shkel et al. | |
| 7,755,616 B2 | 7/2010 | Jung et al. | |
| 7,903,091 B2 * | 3/2011 | Lee ........................ G06F 3/045 | |
| | | | 178/18.01 |
| 7,992,448 B2 | 8/2011 | Shimazu | |
| 8,020,456 B2 | 9/2011 | Liu et al. | |
| 8,050,876 B2 | 11/2011 | Feen et al. | |
| 8,056,421 B2 | 11/2011 | Sumigawa | |
| 8,077,154 B2 | 12/2011 | Emig et al. | |
| 8,132,468 B2 | 3/2012 | Radivojevic | |
| 8,243,225 B2 | 8/2012 | Kai et al. | |
| 8,266,971 B1 * | 9/2012 | Jones ...................... G01L 1/146 | |
| | | | 73/862.046 |
| 8,305,358 B2 | 11/2012 | Klighhult et al. | |
| 8,421,483 B2 | 4/2013 | Klinghult et al. | |
| 8,434,369 B2 | 5/2013 | Hou et al. | |
| 8,456,430 B2 | 6/2013 | Oliver et al. | |
| 8,519,974 B2 | 8/2013 | Berggren | |
| 8,531,429 B2 * | 9/2013 | Chang .................... G06F 3/044 | |
| | | | 178/18.06 |
| 8,605,053 B2 | 12/2013 | Murphy et al. | |
| 8,640,549 B2 | 2/2014 | Inamori | |
| 8,648,816 B2 | 2/2014 | Homma et al. | |
| 8,669,952 B2 | 3/2014 | Hashimura et al. | |
| 8,669,962 B2 | 3/2014 | Kuan | |
| 8,692,646 B2 | 4/2014 | Lee et al. | |
| 8,695,433 B2 | 4/2014 | Shimazu | |
| 8,780,060 B2 | 7/2014 | Maschmeyer et al. | |
| 8,780,074 B2 | 7/2014 | Castillo et al. | |
| 8,780,543 B2 | 7/2014 | Molne et al. | |
| 8,870,087 B2 | 10/2014 | Coogan et al. | |
| 8,878,803 B2 | 11/2014 | Kimura et al. | |
| 8,982,088 B2 * | 3/2015 | Kung ...................... G06F 3/044 | |
| | | | 178/18.06 |
| 9,007,333 B1 * | 4/2015 | Wilson .................... G06F 3/044 | |
| | | | 178/18.06 |
| 9,024,910 B2 | 5/2015 | Stephanou et al. | |
| 9,030,427 B2 | 5/2015 | Yasumatsu | |
| 9,057,653 B2 * | 6/2015 | Schediwy ............... G01L 1/146 | |
| 9,063,599 B2 | 6/2015 | Yanagi et al. | |
| 9,081,460 B2 | 7/2015 | Jeong et al. | |
| 9,099,971 B2 | 8/2015 | Lynn et al. | |
| 9,110,532 B2 | 8/2015 | Ando et al. | |
| 9,116,569 B2 | 8/2015 | Stacy et al. | |
| 9,116,570 B2 | 8/2015 | Lee et al. | |
| 9,182,849 B2 | 11/2015 | Huang et al. | |
| 9,223,162 B2 | 12/2015 | DeForest et al. | |
| 9,246,486 B2 | 1/2016 | Yang et al. | |
| 9,262,002 B2 | 2/2016 | Momeyer et al. | |
| 9,304,348 B2 | 4/2016 | Jang | |
| 9,329,719 B2 | 5/2016 | Molne et al. | |
| 9,383,848 B2 | 7/2016 | Daghigh | |
| 9,417,696 B2 | 8/2016 | DeLuca | |
| 9,466,783 B2 | 10/2016 | Olien et al. | |
| 9,542,028 B2 | 1/2017 | Filiz et al. | |
| 9,557,857 B2 * | 1/2017 | Schediwy ............... G06F 3/016 | |
| 9,612,170 B2 | 4/2017 | Vosgueritchian et al. | |
| 9,639,224 B2 * | 5/2017 | Lee ........................ G06K 9/0002 | |
| 9,665,200 B2 * | 5/2017 | Filiz ........................ G01L 1/18 | |
| 9,690,408 B1 * | 6/2017 | Krah ...................... G06F 3/0412 | |
| 9,729,730 B2 | 8/2017 | Levesque et al. | |
| 9,791,968 B2 | 10/2017 | Yang | |
| 9,916,942 B2 | 3/2018 | Shedletsky | |
| 10,032,592 B2 | 7/2018 | Brooks et al. | |
| 2002/0149571 A1 | 10/2002 | Roberts | |
| 2006/0043508 A1 | 3/2006 | Ohta et al. | |
| 2006/0197750 A1 | 9/2006 | Kerr et al. | |
| 2007/0046642 A1 * | 3/2007 | Lee ........................ G06F 3/045 | |
| | | | 345/173 |
| 2007/0113681 A1 * | 5/2007 | Nishimura ............ G06F 3/0414 | |
| | | | 73/862.046 |
| 2007/0159561 A1 | 7/2007 | Chien | |
| 2007/0229464 A1 * | 10/2007 | Hotelling .............. G06F 3/0414 | |
| | | | 345/173 |
| 2007/0236466 A1 * | 10/2007 | Hotelling .............. G06F 3/0414 | |
| | | | 345/173 |
| 2008/0165159 A1 | 7/2008 | Soss et al. | |
| 2008/0218488 A1 | 9/2008 | Yang et al. | |
| 2009/0002199 A1 * | 1/2009 | Lainonen ............. G06F 3/0414 | |
| | | | 341/20 |
| 2009/0189866 A1 | 7/2009 | Haffenden et al. | |
| 2009/0316380 A1 | 12/2009 | Armstrong | |
| 2010/0053116 A1 | 3/2010 | Daverman et al. | |
| 2010/0085325 A1 * | 4/2010 | King-Smith ........ G06F 3/03545 | |
| | | | 345/174 |
| 2010/0103115 A1 | 4/2010 | Hainzl | |
| 2010/0117809 A1 | 5/2010 | Dai et al. | |
| 2010/0123686 A1 | 5/2010 | Klinghult et al. | |

(56) References Cited

U.S. PATENT DOCUMENTS

| | | | |
|---|---|---|---|
| 2010/0253651 A1* | 10/2010 | Day | G06F 3/044 345/175 |
| 2011/0045285 A1 | 2/2011 | Saiki et al. | |
| 2011/0248839 A1 | 10/2011 | Kwok et al. | |
| 2011/0261021 A1 | 10/2011 | Modarres et al. | |
| 2011/0285660 A1* | 11/2011 | Prabhu | G06F 1/1643 345/174 |
| 2012/0019448 A1* | 1/2012 | Pitkanen | G06F 1/1662 345/173 |
| 2012/0038577 A1 | 2/2012 | Brown et al. | |
| 2012/0075226 A1* | 3/2012 | Andoh | G06F 3/046 345/173 |
| 2012/0086666 A1* | 4/2012 | Badaye | G06F 3/044 345/174 |
| 2012/0105367 A1 | 5/2012 | Son et al. | |
| 2012/0111119 A1* | 5/2012 | Small | G06F 3/0436 73/633 |
| 2012/0127136 A1 | 5/2012 | Schneider et al. | |
| 2012/0139864 A1* | 6/2012 | Sleeman | G06F 3/044 345/174 |
| 2012/0154299 A1* | 6/2012 | Hsu | G06F 3/016 345/173 |
| 2012/0188198 A1 | 7/2012 | Jeong et al. | |
| 2012/0293491 A1 | 11/2012 | Wang et al. | |
| 2013/0027339 A1* | 1/2013 | Kodani | G01L 1/16 345/173 |
| 2013/0027340 A1* | 1/2013 | Kodani | G06F 3/041 345/173 |
| 2013/0074988 A1 | 3/2013 | Chou | |
| 2013/0076646 A1* | 3/2013 | Krah | G06F 3/0414 345/173 |
| 2013/0082970 A1 | 4/2013 | Frey et al. | |
| 2013/0141365 A1 | 6/2013 | Lynn et al. | |
| 2013/0147739 A1 | 6/2013 | Aberg et al. | |
| 2013/0154933 A1 | 6/2013 | Sheik-Nainar | |
| 2013/0181949 A1* | 7/2013 | Setlak | G06F 3/042 345/175 |
| 2013/0215056 A1 | 8/2013 | Johansson et al. | |
| 2013/0222306 A1 | 8/2013 | Aberg et al. | |
| 2013/0328803 A1 | 12/2013 | Fukushima et al. | |
| 2013/0333922 A1 | 12/2013 | Kai et al. | |
| 2014/0062933 A1* | 3/2014 | Coulson | G06F 3/044 345/174 |
| 2014/0062934 A1* | 3/2014 | Coulson | G06F 3/044 345/174 |
| 2014/0085216 A1* | 3/2014 | Cok | G06F 3/0416 345/173 |
| 2014/0085253 A1* | 3/2014 | Leung | G06F 3/0414 345/174 |
| 2014/0118635 A1 | 5/2014 | Yang | |
| 2014/0139444 A1* | 5/2014 | Kauhanen | G06F 3/041 345/173 |
| 2014/0174190 A1 | 6/2014 | Kulkarni et al. | |
| 2014/0191973 A1 | 7/2014 | Zellers et al. | |
| 2014/0327847 A1* | 11/2014 | Park | G06F 3/041 349/12 |
| 2014/0333579 A1* | 11/2014 | Sleeman | G01L 1/146 345/174 |
| 2014/0362045 A1* | 12/2014 | berg | G06F 3/0488 345/174 |
| 2015/0002452 A1 | 1/2015 | Klinghult | |
| 2015/0084876 A1* | 3/2015 | Schwartz | G06F 3/0418 345/173 |
| 2015/0101849 A1 | 4/2015 | Bockmeyer et al. | |
| 2015/0116260 A1 | 4/2015 | Hoen et al. | |
| 2015/0242037 A1* | 8/2015 | Pedder | G01L 1/18 345/173 |
| 2015/0268725 A1 | 9/2015 | Levesque et al. | |
| 2015/0301684 A1 | 10/2015 | Shimamura | |
| 2015/0331517 A1 | 11/2015 | Filiz et al. | |
| 2015/0355771 A1* | 12/2015 | Watazu | G06F 3/0414 345/174 |
| 2015/0363019 A1* | 12/2015 | Schediwy | G06F 3/044 345/174 |
| 2015/0378493 A1* | 12/2015 | Kano | G06F 3/044 345/173 |
| 2016/0003697 A1 | 1/2016 | Okamoto et al. | |
| 2016/0033389 A1 | 2/2016 | Serpe | |
| 2016/0034073 A1* | 2/2016 | Andoh | G06F 3/046 345/174 |
| 2016/0035290 A1 | 2/2016 | Kim et al. | |
| 2016/0041672 A1 | 2/2016 | Hoen et al. | |
| 2016/0048266 A1 | 2/2016 | Smith et al. | |
| 2016/0062517 A1 | 3/2016 | Meyer et al. | |
| 2016/0077649 A1* | 3/2016 | Ando | G06F 3/0414 345/174 |
| 2016/0103545 A1* | 4/2016 | Filiz | G01L 1/18 345/174 |
| 2016/0117034 A1* | 4/2016 | Day | G06F 3/0414 345/174 |
| 2016/0117035 A1* | 4/2016 | Watazu | G06F 3/0414 345/173 |
| 2016/0124560 A1* | 5/2016 | Watazu | H01L 41/0478 345/173 |
| 2016/0132151 A1* | 5/2016 | Watazu | G06F 3/0414 345/174 |
| 2016/0139717 A1* | 5/2016 | Filiz | G01L 1/18 345/173 |
| 2016/0147353 A1 | 5/2016 | Filiz et al. | |
| 2016/0195994 A1* | 7/2016 | Kitada | G06F 3/044 345/174 |
| 2016/0231849 A1* | 8/2016 | Watazu | G06F 3/044 |
| 2016/0306481 A1* | 10/2016 | Filiz | G06F 3/0414 |
| 2016/0320899 A1* | 11/2016 | Watazu | G06F 3/047 |
| 2016/0357297 A1 | 12/2016 | Picciotto et al. | |
| 2017/0031495 A1 | 2/2017 | Smith | |
| 2017/0060329 A1* | 3/2017 | Yoon | G06F 3/0416 |
| 2017/0075465 A1 | 3/2017 | Pedder et al. | |
| 2017/0083142 A1* | 3/2017 | Wang | G06F 3/044 |
| 2017/0090638 A1 | 3/2017 | Vosgueritchian et al. | |
| 2017/0090655 A1 | 3/2017 | Zhang et al. | |
| 2017/0191884 A1 | 7/2017 | Vosgueritchian et al. | |
| 2017/0261387 A1 | 9/2017 | Vosgueritchian et al. | |
| 2017/0269757 A1 | 9/2017 | Filiz et al. | |
| 2017/0285864 A1 | 10/2017 | Pedder et al. | |
| 2018/0059839 A1 | 3/2018 | Kim et al. | |
| 2018/0074638 A1 | 3/2018 | Chiang et al. | |

FOREIGN PATENT DOCUMENTS

| | | |
|---|---|---|
| CN | 1860432 | 11/2006 |
| CN | 101017419 | 8/2007 |
| CN | 101071354 | 11/2007 |
| CN | 101201277 A | 6/2008 |
| CN | 101243383 | 8/2008 |
| CN | 101950224 | 1/2011 |
| CN | 102012772 | 4/2011 |
| CN | 102047088 | 5/2011 |
| CN | 102165400 | 8/2011 |
| CN | 102175362 A | 9/2011 |
| CN | 102368191 | 3/2012 |
| CN | 102460351 | 5/2012 |
| CN | 102591519 | 7/2012 |
| CN | 102822779 | 12/2012 |
| CN | 103026327 | 4/2013 |
| CN | 103069365 | 4/2013 |
| CN | 103197821 | 7/2013 |
| CN | 103336562 | 10/2013 |
| CN | 103582807 | 2/2014 |
| CN | 204461655 U | 7/2015 |
| CN | 204576454 U | 8/2015 |
| CN | 105444662 | 3/2016 |
| EP | 0332365 | 9/1989 |
| EP | 0467562 | 1/1992 |
| EP | 1840714 | 10/2007 |
| EP | 2120136 | 11/2009 |
| EP | 2381340 | 10/2011 |
| EP | 2629075 | 8/2013 |
| FR | 2907563 | 4/2008 |
| JP | 201039458 A | 2/2010 |

(56) References Cited

FOREIGN PATENT DOCUMENTS

| JP | 2010197066 | 9/2010 |
|---|---|---|
| WO | WO 96/038833 | 12/1996 |
| WO | WO 02/035461 | 5/2002 |
| WO | WO 07/074800 | 7/2007 |
| WO | WO 08/076393 | 6/2008 |
| WO | WO 11/156447 | 12/2011 |
| WO | WO 12/168892 | 12/2012 |
| WO | WO 13/177322 | 11/2013 |
| WO | WO 15/106183 | 7/2015 |
| WO | WO 15/158952 | 10/2015 |
| WO | WO 16/029354 | 3/2016 |

OTHER PUBLICATIONS

Bau, et al., "TeslaTouch: Electrovibration for Touch Surfaces," UIST'10, Oct. 3-6, 2010, New York, New York USA, 10 pages.

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

Rausch, "Printed piezoresistive strain sensors for monitoring of light-weight structures," SENSOR+TEST Conferences 2011—SENSOR Proceedings, pp. 216-220.

Schweizer, "Electrical characterization and investigation of the piezoresistive effect of PEDOT:PSS thin films," A Thesis Presented to the Academic Faculty in Partial Fulfillment of the Requirements for the Degree Master of Science of Electrical and Computer Engineering, Georgia Institute of Technology, Apr. 2005, 89 pages.

Takamatsu, et al., "Transparent conductive-polymer strain sensors for touch input sheets of flexible displays," *Journal of Micromechanics and Microengineering*, vol. 20, 2010, 6 pages.

Tsai, et al., "Fabrication of Graphene-based Micro Strain Gauge," NPL Management Ltd.—Internal, Oct. 15-16, 2012, 1 page.

\* cited by examiner

Personal Device 6100

Personal Device 6200

Personal Device 6400

Personal Device 6300

PIEZO BASED FORCE SENSING

CROSS-REFERENCE TO RELATED APPLICATIONS

This application is a 35 U.S.C. § 371 application of PCT/US2014/062739, filed on Oct. 28, 2014, and titled "Piezo Based Force Sensing," which claims priority to U.S. provisional application No. 61/896,647, filed Oct. 28, 2013, and titled "Piezo Based Force Sensing," and U.S. provisional application No. 62/917,282, filed Dec. 17, 2013, and titled "Piezo Based Force Sensing," the contents of each of which are incorporated herein by reference in their entirety.

FIELD

This relates generally to sensing force, and more particularly to sensing force using piezoelectric films.

BACKGROUND

Various input devices, such as track pads, mice, touch sensitive displays, and the like, are available for use with computing systems. While these devices can be used to receive a physical input from a user, their ability to determine an amount of force exerted by user can be limited.

SUMMARY

Systems for detecting an amount and/or location of a force applied to a device using a piezoelectric film are provided. One example system can include a transparent piezoelectric film for generating an electric charge in response to a deformation of the film. Electrodes positioned on opposite surfaces of the piezoelectric film can be used to detect the generated electric charge and determine an amount and/or location of force applied to the film based on the generated electric charge. In another embodiment, the system can further include a capacitive touch sensor for determining a location of a touch event on the device.

One embodiment may take the form of a system comprising: a cover material; a piezoelectric film operably coupled to the cover material; a first set of coplanar electrodes coupled to a first surface of the piezoelectric film; a second set of coplanar electrodes coupled to a second surface of the piezoelectric film; and a sense circuitry operable to detect an electric charge generated by the piezoelectric film in response to a deformation of the piezoelectric film; wherein at least one of the first and second sets of coplanar electrodes is patterned; and the sense circuitry is further operative to estimate a force exerted on the cover material from the electric charge.

Another embodiment may take the form of a system comprising: a first piezoelectric film; a second piezoelectric film coupled to the first piezoelectric film; a cover material coupled to the second piezoelectric film by a first layer of adhesive; a first set of electrodes coupled to the first piezoelectric film; a second set of electrodes coupled between the first and second piezoelectric films; a third set of electrodes coupled between the second piezoelectric film and the cover material; and sense circuitry operable to detect an electric charge generated by the first and second piezoelectric films in response to a deformation of the piezoelectric films and output an estimated force based on the electric charge.

Still another embodiment may take the form of a system comprising: a piezoelectric film; a touch sensor coupled to the piezoelectric film by a first layer of adhesive; a cover material coupled to the second piezoelectric film by a second layer of adhesive; a first set of electrodes coupled to the piezoelectric film; a second set of electrodes coupled between the piezoelectric film and the touch sensor; and sense circuitry operable to detect an electric charge generated by the piezoelectric film in response to a deformation of the piezoelectric films.

DETAILED DESCRIPTION

In the following description of examples, reference is made to the accompanying drawings in which it is shown by way of illustration specific examples that can be practiced. It is to be understood that other examples can be used and structural changes can be made without departing from the scope of the various examples.

This relates to systems for detecting an amount and/or location of a force applied to a device using a piezoelectric film. One example system can include a transparent piezoelectric film for generating an electric charge in response to a deformation of the film. Electrodes positioned on opposite surfaces of the piezoelectric film can be used to detect the generated electric charge and determine an amount and/or location of force applied to the film based on the generated electric charge. In another embodiment, the system can include a capacitive touch sensor for determining a location of a touch event on the device.

Figure 1:
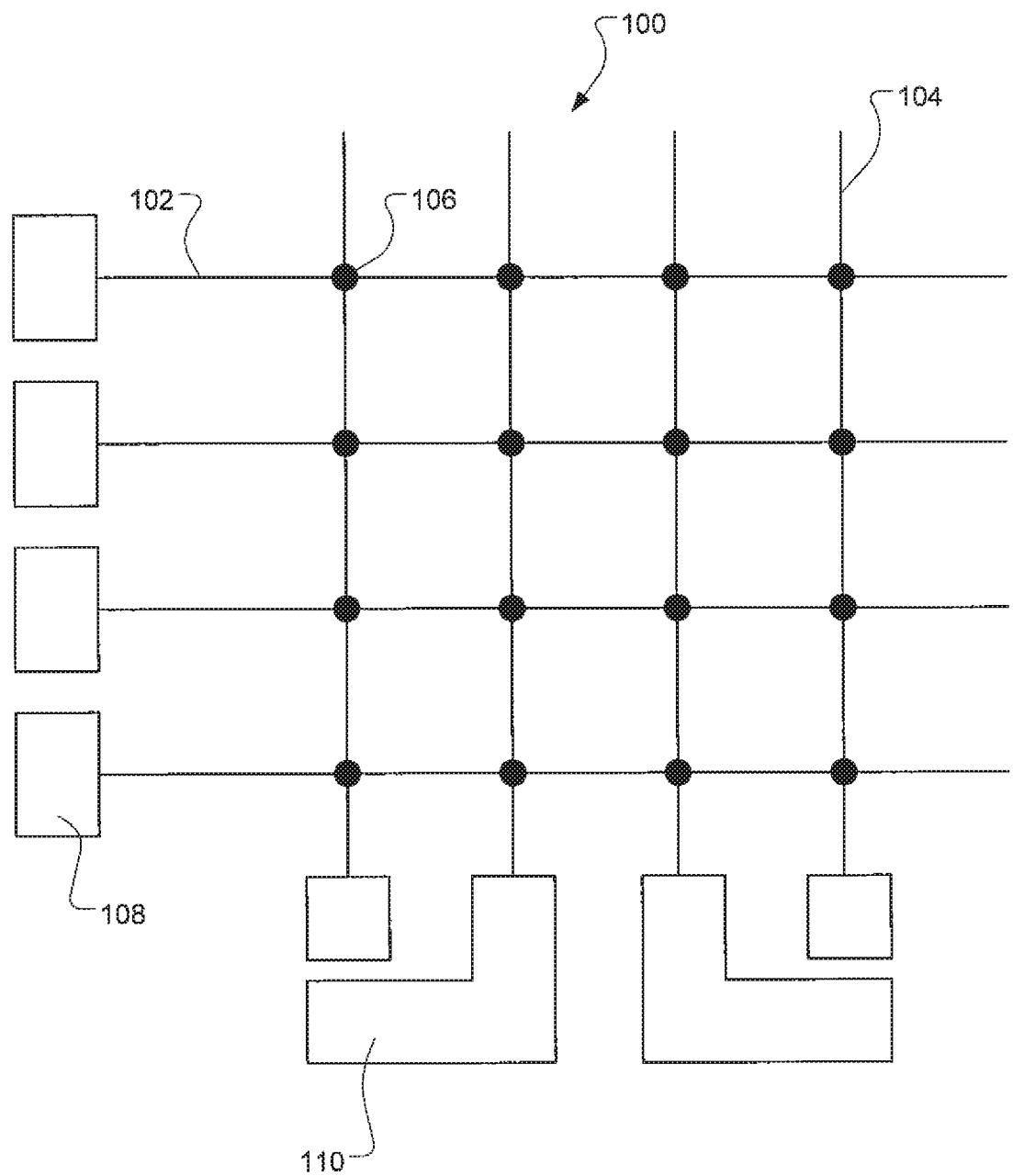
FIG. 1 illustrates an exemplary touch sensor panel according to various examples.

FIG. 1 illustrates an exemplary touch sensor panel 100 according to some embodiments of the disclosure. Touch sensor panel 100 can include an array of touch nodes 106 that can be formed by a two-layer electrode structure separated by a dielectric material. One layer of electrodes can comprise a plurality of drive lines 102 positioned substantially perpendicular to another layer of electrodes which can comprise a plurality of sense lines 104, with each of the nodes 106 having an associated mutual capacitance 114 (also referred to as coupling capacitance). The drive lines 102 and sense lines 104 cross over each other in different planes separated from one another by a dielectric. Alternatively, in other embodiments the drive lines 102 and sense lines 104 can be formed by a one-layer electrode structure.

Drive lines 102 (also referred to as rows, row traces, or row electrodes) can be activated by a stimulation signal provided by respective drive circuits 108. Each of the drive circuits 108 can include an alternating current (AC) voltage source referred to as a stimulation signal source. To sense touch event(s) on the touch sensor panel 100, one or more of the drive lines 102 can be stimulated by the drive circuits 108, and the sense circuitry 110 can detect the resulting voltage values from the sense lines 104. The voltage values can be indicative of a finger or object altering charge from the mutual capacitance signal. The detected voltage values can be representative of node touch output values, with changes to those output values indicating the node locations 106 where the touch events occurred and the amount of touch that occurred at those location(s).

Figure 2:
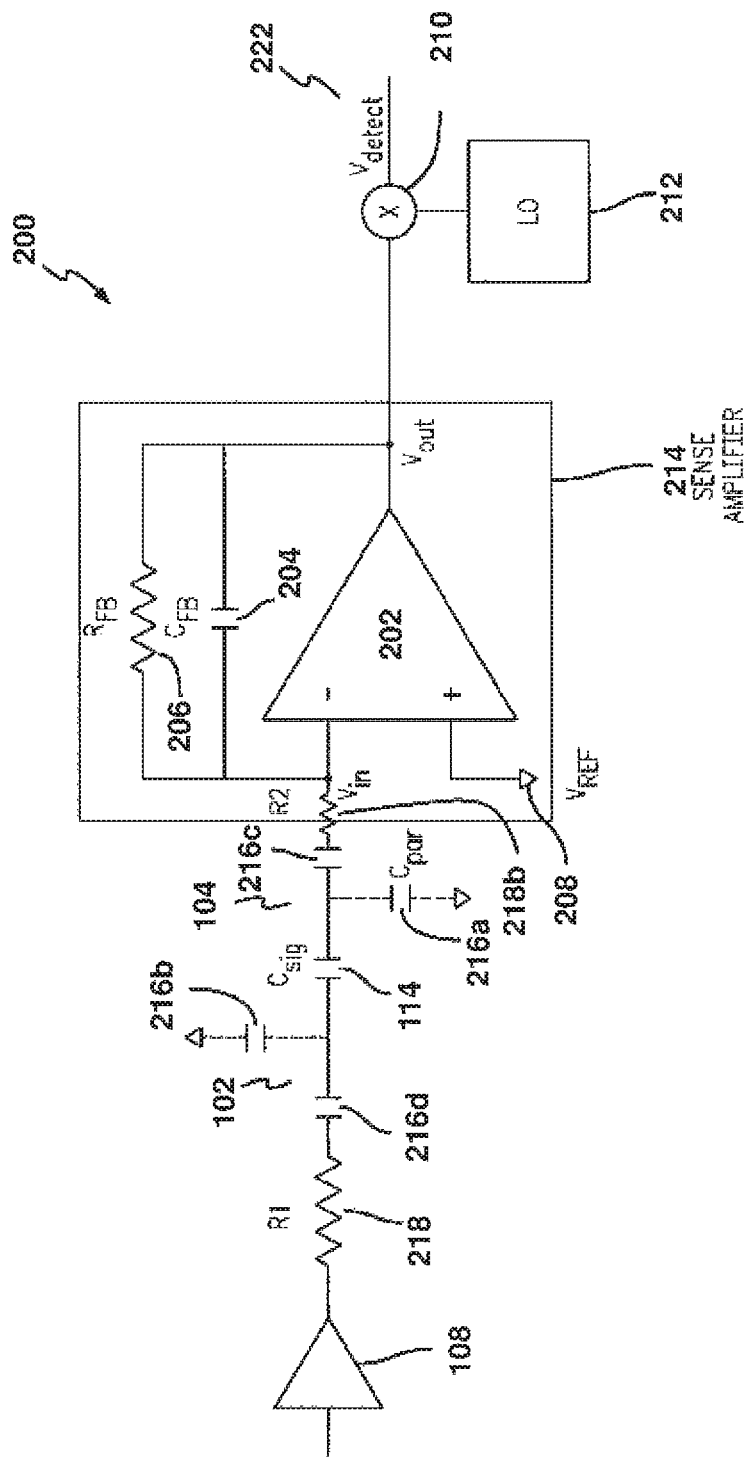
FIG. 2 illustrates an exemplary touch signal sensing circuit according to various examples.

FIG. 2 illustrates an exemplary sense circuit 200, which is an example of the sense circuit 110 of FIG. 1. Drive circuit 108 can produce drive signals (also referred to as stimulation signals Vstim), which can be transmitted on drive lines 102 that contain a line resistance 218 and coupled onto sense lines 104 due to mutual capacitance 114 (referred to as Csig) between the drive and sense lines. The coupled signal can then be received by sense amplifier 214. Sense amplifier 214 can include operational amplifier 202, and at least one of a feedback resistor 206 and a feedback capacitor 204. FIG. 2 is shown for the general case in which both resistive and capacitive feedback elements are utilized. The signal can be inputted into the inverting input (referred to as Vin) of the operational amplifier 202, and the non-inverting input can, in some embodiments, be tied to a reference voltage Vref at 208. If Vstim is a sinusoidal signal (such as an AC signal), the output of the amplifier, Vout, should also be a sinusoid. Moreover, Vout should be a sinusoid that possesses the same frequency as Vstim with a phase shift. For example:

if $V\text{stim}=A\ \sin(\omega t) \rightarrow V\text{out}=B\ \sin(\omega t+\Phi)$ where $\Phi$=phase shift The value of $\Phi$ can be influenced by many factors, including any parasitic capacitance 216 (Cpar) encountered by the sense circuit 200. Parasitic capacitance 216 can be characterized as any capacitance other than the mutual capacitance 114 between the drive lines 102 and sense lines 104 which is the capacitance of interest. The parasitic capacitance may be connected in series with Csig as shown at 216$c$ and 216$d$ or may alternatively be connected in parallel as shown at 216$a$ or 216$b$. The number 216 is used to represent any one or more of the parasitic capacitances 216$a$-216$d$. There can be multiple factors that contribute to the value of parasitic capacitance 216 including coupling with metallic elements within the display and variations in the air gap or other resilient members of the stack up. As shown in FIG. 2, Vout can then be heterodyned by being fed into a multiplier 210, and multiplied with a local oscillator 212 to produce Vdetect 222. The direct current (DC) portion of Vdetect 222 can be used to detect if a touch or proximity event has occurred.

Figure 3:
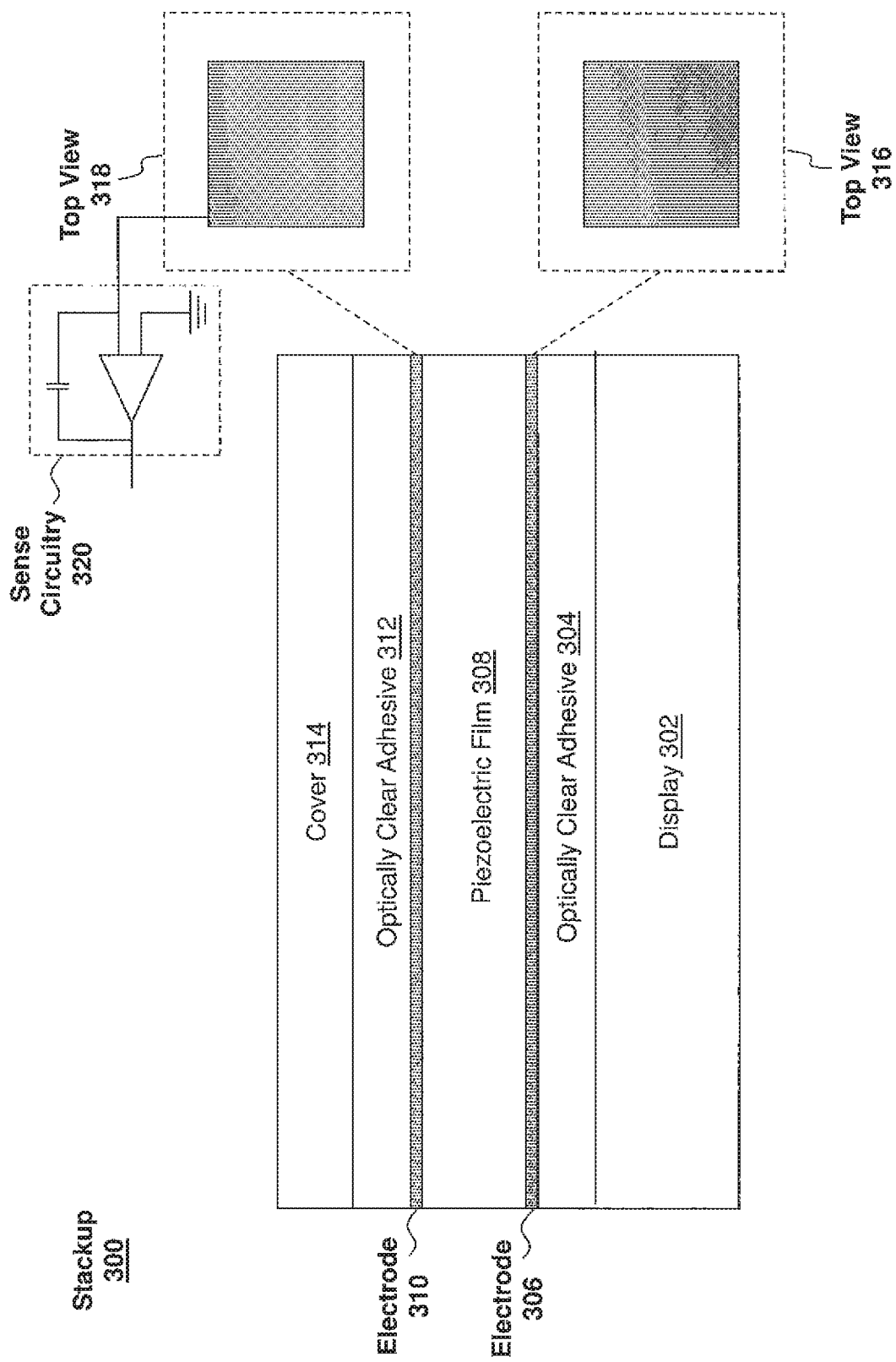
FIGS. 3-26 illustrate exemplary stackups for a device having a piezoelectric film for detecting force according to various examples.

FIG. 3 illustrates a cross-sectional view of an exemplary stackup 300 for a device. Stackup 300 can include a display 302, such as a liquid crystal display (LCD), light-emitting diode (LED) display, organic light-emitting diode (OLED) display, or the like, for generating images to be displayed by the device. Stackup 300 can further include a piezoelectric film 308 coupled to display 302 by optically clear adhesive 304. Piezoelectric film 308 can include a transparent film capable of generating a localized electric charge in response to a deformation of the film. Piezoelectric film 308 can further include a first set of electrodes 306 and a second set of electrodes 310 formed on opposite surfaces of the film. A set of electrodes can include a single electrode or multiple electrodes. The electrodes can be formed from a transparent conductive material, such as indium tin oxide (ITO), PEDOT, or silver nanowire. Top views 316 and 318 show the shapes of electrodes 306 and 310, respectively, as viewed from above stackup 300. In the illustrated example, electrodes 306 and 310 can both have a shape that substantially matches that of piezoelectric film 308 and display 302 and can extend along the surfaces of piezoelectric film 308. Stackup 300 can further include cover material 314 (e.g., glass, plastic, or other rigid and transparent material) coupled to piezoelectric film 308 by optically clear adhesive 312. Since the materials above display 302 can be formed from transparent materials, images generated by display 302 can be viewed through the various layers of stackup 300.

In some examples, electrode 306 can be coupled to ground and electrode 310 can be coupled to sense circuitry 320 capable of detecting an amount of electric charge generated by piezoelectric film 308. Sense circuitry 320 can include an amplifier and capacitor, as shown in FIG. 3, or it can include sense circuitry similar or identical to that shown in FIG. 2. During operation, as a user applies a downward force on cover material 314, cover material 314 can deform by an amount corresponding to an amount of the applied force. The deformation of cover material 314 can cause a corresponding deformation in optically clear adhesive 312 and piezoelectric film 308. Piezoelectric film 308 can then generate an amount of electric charge based on the amount of deformation of the film. The generated electric charge can be received by sense circuitry 320 via electrode 310. Since the amount of electric charge generated by piezoelectric film 308 can be representative of the amount of deformation of the film and because the amount of deformation of the film can be representative of the force applied to cover material 314, the amount of electric charge detected by sense circuitry 320 can be representative of the force applied to cover material 314. In this way, sense circuitry 320 can be used to detect an amount of force applied to cover material 314. In other examples, electrode 310 can be coupled to ground and electrode 306 can be coupled to sense circuitry 320. In these examples, sense circuitry 320 can be used to determine the amount of force applied to cover material 314 based on electric charge received from electrode 306.

Figure 4:
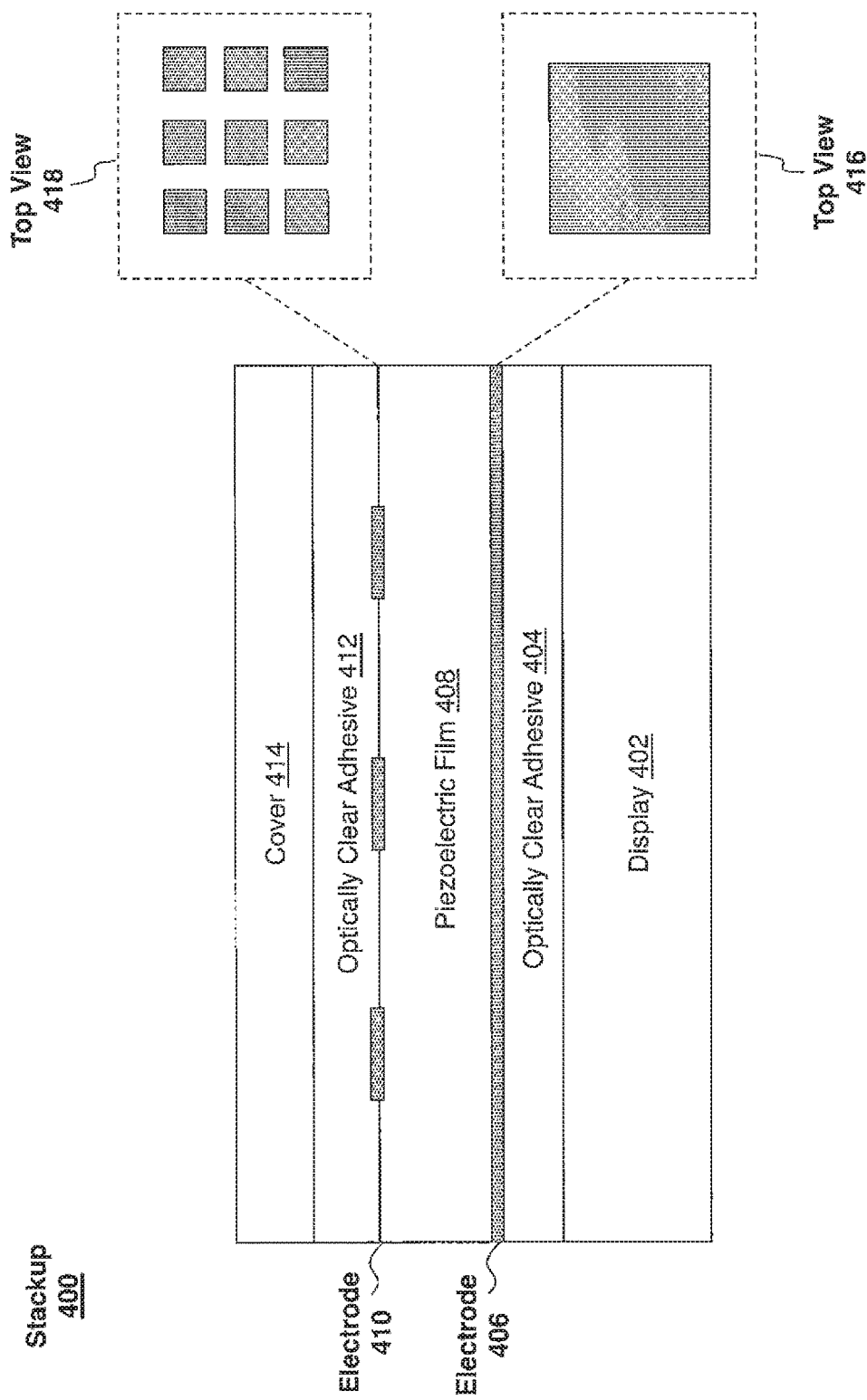

FIG. 4 illustrates a cross-sectional view of another exemplary stackup 400 for a device. Stackup 400 can include a display 402, such as an LCD, LED display, OLED display, or the like, for generating images to be displayed by the device. Stackup 400 can further include a piezoelectric film 408 coupled to display 402 by optically clear adhesive 404. Piezoelectric film 408 can include a transparent film capable of generating a localized electric charge in response to a deformation of the film. Piezoelectric film 408 can include a first electrode 406 and a second electrode 410 formed on opposite surfaces of the film. The electrodes can be formed from a transparent conductive material, such as ITO, PEDOT, or silver nanowire. Top views 416 and 418 show the shapes of electrodes 406 and 410, respectively, as viewed from above stackup 400. In the illustrated example, electrode 406 can extend along the bottom surface of piezoelectric film 408 and electrode 410 can include multiple discrete electrodes extending along the top surface of piezoelectric film 408. Stackup 400 can further include cover material 414 (e.g., glass, plastic, or other rigid and transparent material) coupled to piezoelectric film 408 by optically clear adhesive 412. While FIG. 4 shows electrode 410 having nine square electrodes arranged in rows and columns, it should be appreciated that electrode 410 can include any number of electrodes having any desired shaped and arranged in any desired pattern.

Electrode 410 can be separated into discrete electrodes to allow sense circuitry coupled to the electrodes of electrode 410 to determine both the amount and location of force applied to cover material 414. Additionally, separating electrode 410 into discrete electrodes allows for detection of multiple forces applied to different portions of cover material 414 at the same time. For example, electrode 406 can be coupled to ground and each electrode of electrode 410 can be coupled to separate sense circuitry (not shown) similar or identical to sense circuitry 320 that is capable of detecting an amount of electric charge generated by the portion of piezoelectric film 408 coupled to the electrode. During operation, as a user applies a downward force on cover material 414, cover material 414 can deform by an amount corresponding to an amount of the applied force. The deformation of cover material 414 can cause a corresponding deformation in optically clear adhesive 412 and piezoelectric film 408. Piezoelectric film 408 can then generate an amount of electric charge based on an amount of deformation of the film and at a location corresponding to the location of the deformation of the film. The electrode of electrode 410 positioned at or near the location of the deformation and that is electrically coupled to receive the generated charge can transmit the generated charge to its associated sense circuitry. Since the amount of electric charge generated by piezoelectric film 408 can be representative of the amount of deformation of the film and because the amount of deformation of the film can be representative of the force applied to cover material 414, the amount of electric charge detected by the sense circuitry can be representative of the force applied to cover material 414. Additionally, since the location of the electrode of electrode 410 receiving the generated charge is known, the location of the applied force can also be determined. In this way, the sense circuitry can be used to detect an amount and location of a force applied to cover material 414. Moreover, the multiple electrodes of electrode 410 and the separate sense circuitry coupled to each electrode allows for detection of multiple forces applied to different portions of cover material 414 at the same time. In other examples, electrode 410 can be coupled to the bottom of piezoelectric film 408 and electrode 406 can be coupled to the top of piezoelectric film 408. In these examples, the electrodes of electrode 410 can each be coupled to separate sense circuitry and electrode 406 can be coupled to ground. The sense circuitry can be used to detect an amount and location of force applied to cover material 414 in a manner similar to that described above for the configuration shown in FIG. 4.

Figure 5:
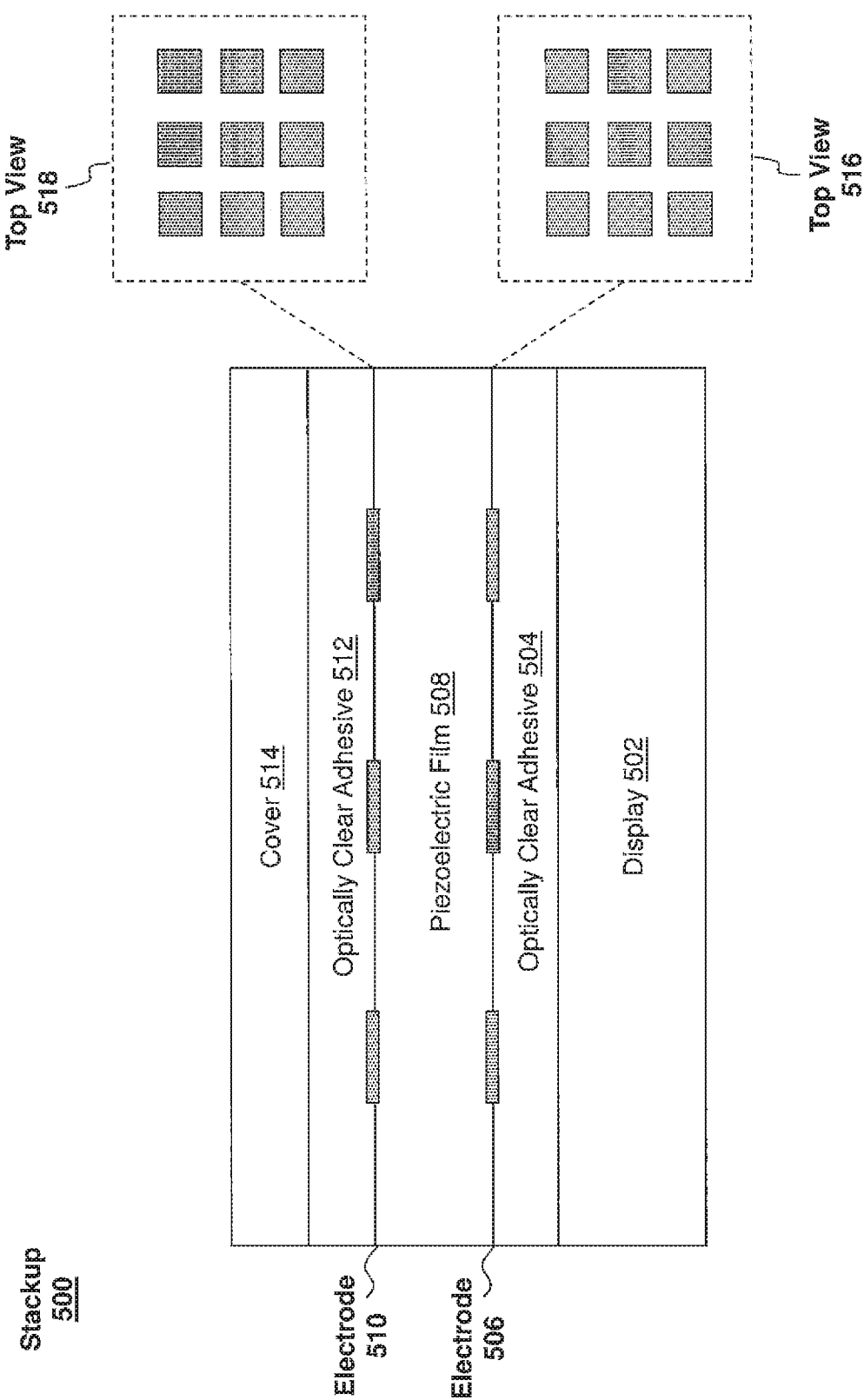

FIG. 5 illustrates a cross-sectional view of another exemplary stackup 500 for a device. Stackup 500 can include a display 502, such as an LCD, LED display, OLED display, or the like, for generating images to be displayed by the device. Stackup 500 can further include a piezoelectric film 508 coupled to display 502 by optically clear adhesive 504. Piezoelectric film 508 can include a transparent film capable of generating a localized electric charge in response to a deformation of the film. Piezoelectric film 508 can include a first electrode 506 and a second electrode 510 formed on opposite surfaces of the film. The electrodes can be formed from a transparent conductive material, such as ITO, PEDOT, or silver nanowire. Top views 516 and 518 show the shapes of electrodes 506 and 510, respectively, as viewed from above stackup 500. In the illustrated example, electrodes 506 and 510 can both include multiple discrete electrodes extending along the top surface of piezoelectric film 508. Stackup 500 can further include cover material 514 (e.g., glass, plastic, or other rigid and transparent material) coupled to piezoelectric film 508 by optically clear adhesive 512. While FIG. 5 shows electrodes 506 and 510 each having nine square electrodes arranged in rows and columns, it should be appreciated that electrodes 506 and 510 can each include any number of electrodes having any desired shaped and arranged in any desired pattern such that the electrodes of electrode 506 are positioned opposite the electrodes of electrode 510 on piezoelectric film 508.

Electrodes 506 and 510 can be separated into discrete electrodes positioned opposite each other on piezoelectric film 508 to allow the sense circuitry coupled to the electrodes of electrode 510 to determine both the amount and location of force applied to cover material 514. Additionally, separating electrodes 506 and 510 allows for detection of multiple forces applied to different portions of cover material 514 at the same time. For example, the electrodes of electrode 506 can be coupled to ground and each electrode of electrode 510 can be coupled to separate sense circuitry (not shown) similar or identical to sense circuitry 320 that is capable of detecting an amount of electric charge generated by the portion of piezoelectric film 508 coupled to the electrode. During operation, as a user applies a downward force on cover material 514, cover material 514 can deform by an amount corresponding to an amount of the applied force. The deformation of cover material 514 can cause a corresponding deformation in optically clear adhesive 512 and piezoelectric film 508. Piezoelectric film 508 can then generate an amount of electric charge based on an amount of deformation of the film. The location of the generated electric charge can correspond to the location of the deformation of the film. The electrode of electrode 510 positioned at or near the location of the deformation and that is electrically coupled to receive the generated charge can transmit the generated charge to its associated sense circuitry. Since the amount of electric charge generated by piezoelectric film 508 can be representative of the amount of deformation of the film and because the amount of deformation of the film can be representative of the force applied to cover material 514, the amount of electric charge detected by the sense circuitry can be representative of the force applied to cover material 514. Additionally, since the location of the electrode of electrode 510 receiving the generated charge is known, the location of the applied force can also be determined. In this way, the sense circuitry can be used to detect an amount and location of a force applied to cover material 514. Moreover, the multiple electrodes of electrode 510 and the separate sense circuitry coupled to each electrode allows for detection of multiple forces applied to different portions of cover material 514. In other examples, the electrodes of electrode 510 can be coupled to ground and the electrodes of electrode 506 can each be coupled to separate sense circuitry. In these examples, the sense circuitry can be used to determine the amount and location of forces applied to cover material 514 based on electric charges received from the electrodes of electrode 506.

Figure 6:
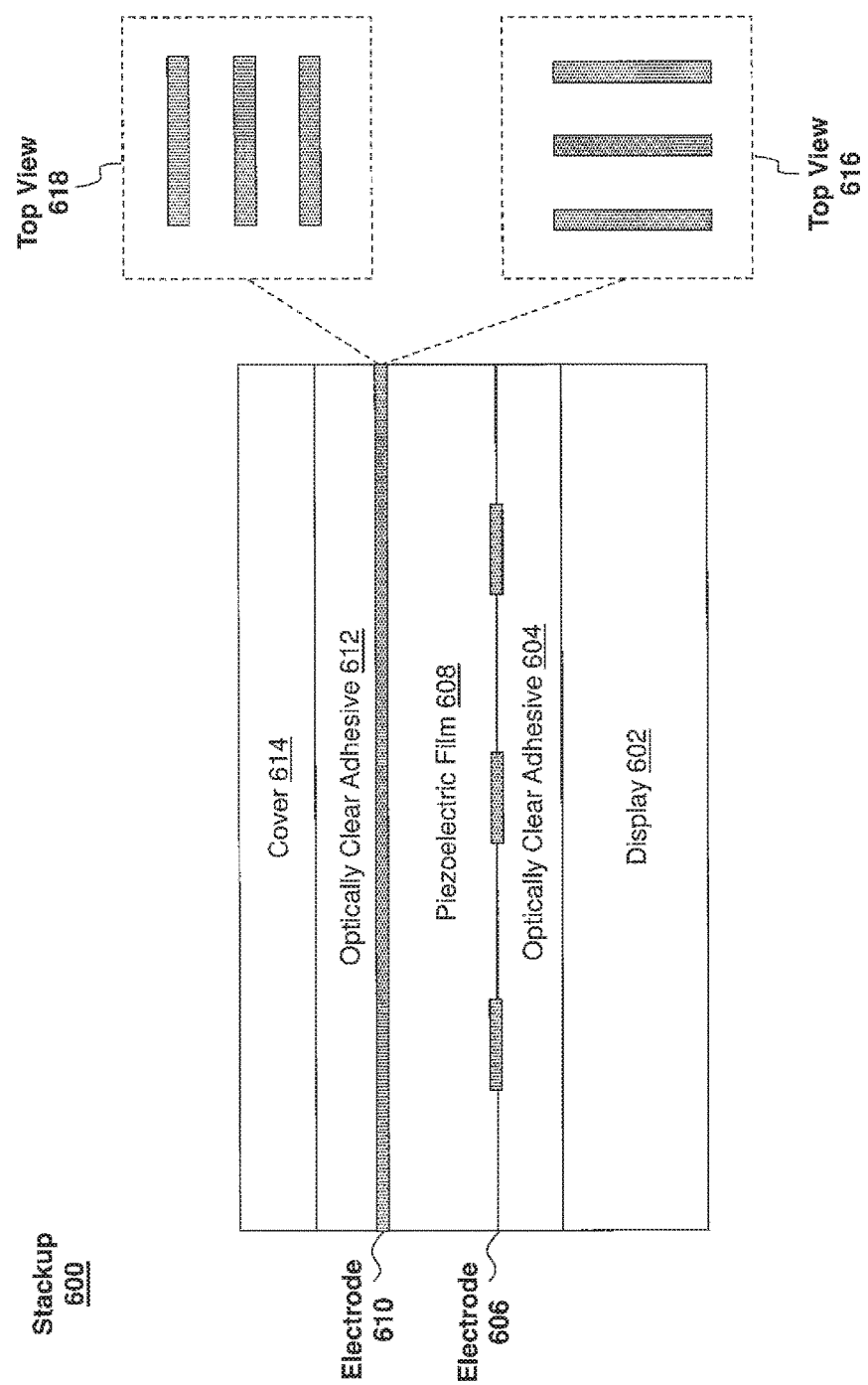

FIG. 6 illustrates a cross-sectional view of another exemplary stackup 600 for a device. Stackup 600 can include a display 602, such as an LCD, LED display, OLED display, or the like, for generating images to be displayed by the device. Stackup 600 can further include a piezoelectric film 608 coupled to display 602 by optically clear adhesive 604. Piezoelectric film 608 can include a transparent film capable of generating a localized electric charge in response to a deformation of the film. Piezoelectric film 608 can include a first electrode 606 and a second electrode 610 formed on opposite surfaces of the film. The electrodes can be formed from a transparent conductive material, such as ITO, PEDOT, or silver nanowire. Top views 616 and 618 show the shapes of electrodes 606 and 610, respectively, as viewed from above stackup 600. In the illustrated example, electrode 606 can include multiple discrete columns of electrodes and electrode 610 can include multiple discrete rows of electrodes. Stackup 600 can further include cover material 614 (e.g., glass, plastic, or other rigid and transparent material) coupled to piezoelectric film 608 by optically clear adhesive 612. While FIG. 6 shows electrodes 606 and 610 each having three rectangular electrodes arranged in columns and rows, respectively, it should be appreciated that electrodes 606 and 610 can each include any number of rectangular electrodes and can instead be arranged in rows and columns, respectively.

In some examples, the electrodes of electrode 606 can be coupled to ground and each electrode of electrode 610 can be coupled to separate sense circuitry (not shown) similar or identical to sense circuitry 320 that is capable of detecting an amount of electric charge generated by the portion of piezoelectric film 608 coupled to the electrode. During operation, as a user applies a downward force on cover material 614, cover material 614 can deform by an amount corresponding to an amount of the applied force. The deformation of cover material 614 can cause a corresponding deformation in optically clear adhesive 612 and piezoelectric film 608. Piezoelectric film 608 can then generate an amount of electric charge based on an amount of deformation of the film. The location of the generated electric charge can correspond to the location of the deformation of the film. The electrode of electrode 610 positioned at or near the location of the deformation and that is electrically coupled to receive the generated charge can transmit the generated charge to its associated sense circuitry. Since the amount of electric charge generated by piezoelectric film 608 can be representative of the amount of deformation of the film and because the amount of deformation of the film can be representative of the force applied to cover material 614, the amount of electric charge detected by the sense circuitry can be representative of the force applied to cover material 614. Additionally, since the location of the electrode of electrode 610 receiving the generated charge is known, the location of the applied force can also be determined. In this way, the sense circuitry can be used to detect an amount and location of a force applied to cover material 614. Moreover, the multiple electrodes of electrode 610 and the separate sense circuitry coupled to each electrode allows for detection of multiple forces applied to different portions of cover material 614 at the same time. In other examples, the electrodes of electrode 610 can be coupled to ground and the electrodes of electrode 606 can each be coupled to separate sense circuitry. In these examples, the sense circuitry can be used to determine the amount and location of forces applied to cover material 614 based on electric charges received from the electrodes of electrode 606.

In yet other examples, electrode 606 can be coupled to ground and electrode 610 can be coupled to separate sense circuitry. The sense circuitry can be used to determine both an amount and location along one of the electrodes of electrode 610 of an applied force. Using, for example, switching circuitry coupled to electrodes 606 and 610, electrode 606 can then be coupled to separate sense circuitry and electrode 610 can then be coupled to ground. The sense circuitry can be used to determine both an amount and location along one of the electrodes of electrode 606 of an applied force. The intersection of the determined row and column can be interpreted as a location of the force on cover material 614.

Figure 7:
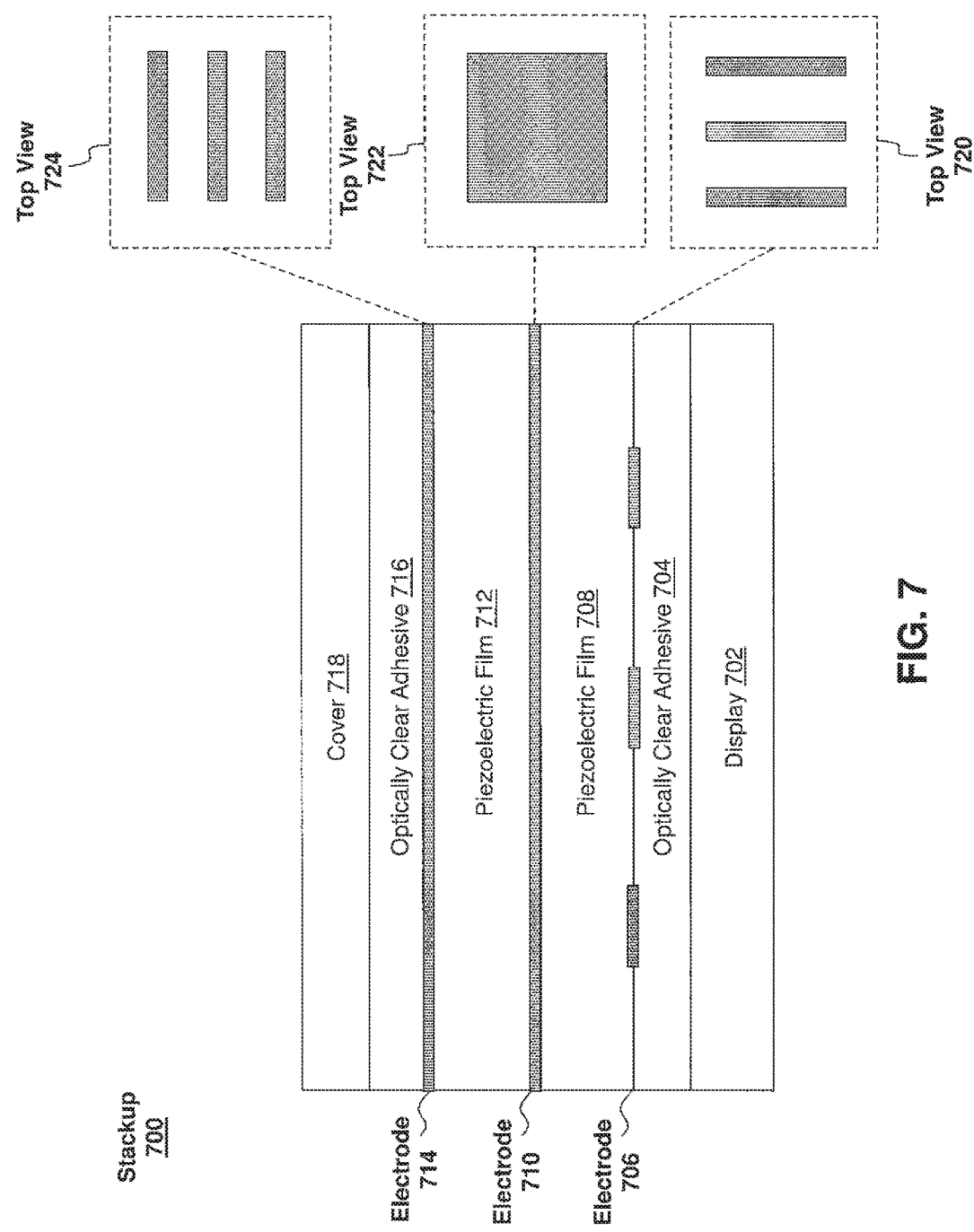

FIG. 7 illustrates a cross-sectional view of another exemplary stackup 700 for a device. Stackup 700 can include a display 702, such as an LCD, LED display, OLED display, or the like, for generating images to be displayed by the device. Stackup 700 can further include a first piezoelectric film 708 coupled to display 702 by optically clear adhesive 704. Stackup 700 can further include a second piezoelectric film 712 coupled to first piezoelectric film 708. The first and second piezoelectric films 708 and 712 can both include a transparent film capable of generating a localized electric charge in response to a deformation of the film. A first electrode 706 can be formed on the bottom of the first piezoelectric film 708, a second electrode 710 can be formed between the first and second piezoelectric films 708 and 712, and a third electrode 714 can be formed on the top of the second piezoelectric film 712. The electrodes can be formed from a transparent conductive material, such as ITO, PEDOT, or silver nanowire. Top views 720, 722, and 724 show the shapes of electrodes 706, 710, and 714, respectively, as viewed from above stackup 700. In the illustrated example, electrode 706 can include multiple columns of discrete electrodes, electrode 710 can include an electrode extending along the surfaces of piezoelectric films 712 and 708, and electrode 714 can include rows of multiple discrete electrodes. Stackup 700 can further include cover material 718 (e.g., glass, plastic, or other rigid and transparent material) coupled to piezoelectric film 712 by optically clear adhesive 716. While FIG. 7 shows electrodes 706 and 714 each having three rectangular electrodes arranged in columns and rows, respectively, it should be appreciated that electrodes 706 and 714 can each include any number of rectangular electrodes and can instead be arranged in rows and columns, respectively.

Electrodes 706 and 714 can be separated into discrete columns and rows of electrodes to allow the sense circuitry coupled to the electrodes of electrodes 706 and 714 to determine both the amount and location of force applied to cover material 718. Additionally, multiple forces applied to different portions of cover material 718 can be detected at the same time using the electrodes of electrodes 706 and 714. For example, electrode 710 can be coupled to ground while the electrodes of electrode 706 can each be coupled to separate sense circuitry (not shown) similar or identical to sense circuitry 320 that is capable of detecting an amount of electric charge generated by the portion of piezoelectric film 708 coupled to the electrode. The electrodes of electrode 714 can also be coupled to separate sense circuitry (not shown) similar or identical to sense circuitry 320 that is capable of detecting an amount of electric charge generated by the portion of piezoelectric film 712 coupled to the electrode. During operation, as a user applies a downward force on cover material 718, cover material 718 can deform by an amount corresponding to an amount of the applied force. The deformation of cover material 718 can cause a corresponding deformation in optically clear adhesive 716, piezoelectric film 712, and piezoelectric film 708. Piezoelectric films 712 and 708 can then generate an amount of electric charge based on an amount of deformation of the film and at a location of the deformation of the film. The electrode of electrode 714 positioned at or near the location of the deformation of piezoelectric film 712 and that is electrically coupled to receive the generated charge can transmit the generated charge to its associated sense circuitry. Similarly the electrode of electrode 706 positioned at or near the location of the deformation of piezoelectric film 708 and that is electrically coupled to receive the generated charge can transmit the generated charge to its associated sense circuitry. Since the amount of electric charge generated by piezoelectric films 708 and 712 can be representative of the amount of deformation of the films and because the amount of deformation of the films can be representative of the force applied to cover material 718, the amount of electric charge detected by the sense circuitry can be representative of the force applied to cover material 718. Additionally, since the location of the electrodes of electrodes 706 and 714 receiving the generated charge is known, the location of the applied force can also be determined. For example, electrode 714 can be used to determine the row at which the force was applied, while electrode 706 can be used to determine the column at which the force was applied. The intersection of the determined row and column can be the location of the applied force. In this way, the sense circuitry can be used to detect an amount and location of a force applied to cover material 718. Moreover, the multiple electrodes of electrodes 706 and 714 and the separate sense circuitry coupled to each electrode allows for detection of multiple forces applied to different portions of cover material 718 at the same time. In other examples, electrode 714 can be coupled to the bottom of piezoelectric film 708 and electrode 706 can be coupled to the top of piezoelectric film 712. In these examples, the electrodes of electrodes 706 and 714 can each be coupled to separate sense circuitry. The sense circuitry can be used to detect an amount and location of force applied to cover material 718 in a manner similar to that described above for the configuration shown in FIG. 7.

Figure 8:
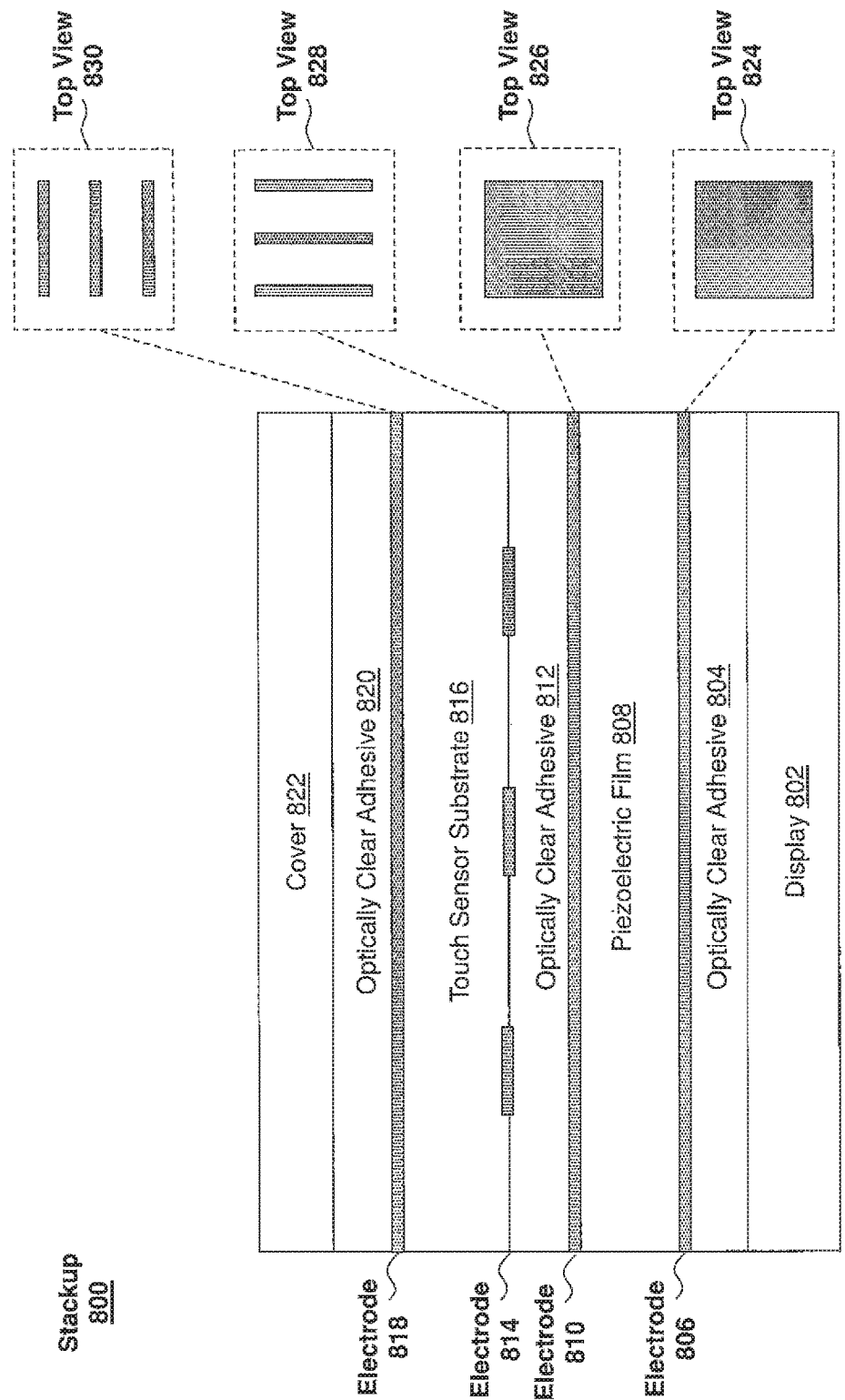

FIG. 8 illustrates a cross-sectional view of an exemplary stackup 800 for a device. Stackup 800 can include a display 802, such as an LCD, LED display, OLED display, or the like, for generating images to be displayed by the device. Stackup 800 can further include a piezoelectric film 808 coupled to display 802 by optically clear adhesive 804. Piezoelectric film 808 can include a transparent film capable of generating a localized electric charge in response to a deformation of the film. Piezoelectric film 808 can further include a first electrode 806 and a second electrode 810 formed on opposite surfaces of the film. The electrodes can be formed from a transparent conductive material, such as ITO, PEDOT, or silver nanowire. Top views 824 and 826 show the shapes of electrodes 806 and 810, respectively, as viewed from above stackup 800. In the illustrated example, electrodes 806 and 810 can both extend along the surfaces of piezoelectric film 808.

Stackup 800 can further include touch sensor substrate 816 coupled to piezoelectric film 808 by optically clear adhesive 812. Touch sensor substrate 816 can include electrodes 814 and 818 formed on opposite surfaces of the sensor. The electrodes can be formed from a transparent conductive material, such as ITO, PEDOT, or silver nanowire. Top views 828 and 830 show the shapes of electrodes 814 and 818, respectively, as viewed from above stackup 800. In the illustrated example, electrodes 814 can include columns of multiple discrete electrodes and electrode 818 can include multiple rows of discrete electrodes. Stackup 800 can further include cover material 822 (e.g., glass, plastic, or other rigid and transparent material) coupled to touch sensor substrate 816 by optically clear adhesive 820. While FIG. 8 shows three columns of electrodes 814 and three rows of electrodes 818, it should be appreciated that any number of rows and columns of electrodes can be used. Moreover, in other examples, electrode 814 can be formed on the top of touch sensor substrate 816 and electrode 818 can be formed on the bottom of touch sensor substrate 816.

In some examples, electrode 806 can be coupled to ground and electrode 810 can be coupled to sense circuitry (not shown) similar or identical to sense circuitry 320 that is capable of detecting an amount of electric charge generated by piezoelectric film 808. During operation, as a user applies a downward force on cover material 822, cover material 822 can deform by an amount corresponding to an amount of the applied force. The deformation of cover material 822 can cause a corresponding deformation in optically clear adhesive 820, touch sensor substrate 816, optically clear adhesive 812, and piezoelectric film 808. Piezoelectric film 808 can then generate an amount of electric charge based on an amount of deformation of the film. The generated electric charge can be received by the sense circuitry via electrode 810. Since the amount of electric charge generated by piezoelectric film 808 can be representative of the amount of deformation of the film and because the amount of deformation of the film can be representative of the force applied to cover material 822, the amount of electric charge detected by the sense circuitry can be representative of the force applied to cover material 822. In this way, the sense circuitry can be used to detect an amount of force applied to cover material 822. In other examples, the electrode 810 can be coupled to ground and electrode 806 can be coupled to the sense circuitry. In these examples, the sense circuitry can be used to determine the amount of force applied to cover material 822 based on electric charge received from electrode 806.

Additionally, during operation, touch sensor substrate 816 and electrodes 814 and 818 can be used to determine a position of a touch event (e.g., a finger, stylus, or other object touching cover material 822) on cover material 822 using a mutual capacitance sensing technique. For example, electrodes 818 can be driven with sinusoidal stimulation signals to capacitively couple with crossing columns of electrodes 814, thereby forming a capacitive path for coupling charge from electrodes 818 to the electrodes 814. The crossing electrodes 814 can output touch signals representing the coupled charge or current. When an object, such as a passive stylus, finger, etc., touches cover material 822, the object can cause a capacitance between electrodes 818 and 814 at the touch location to decrease. This capacitance change can be caused by charge or current from the stimulated electrode 818 being shunted through the touching object to ground rather than being coupled to the crossing electrode 814 at the touch location. The touch signals representative of the capacitance change can be received by electrodes 814 and transmitted to sense circuitry (e.g., similar or identical to sense circuitry 320) for processing. The touch signals can indicate the touch region where the touch occurred. When combined with the amount of force determined using piezoelectric film 808 and electrodes 806 and 810, both the location of a touch event and amount of force applied to cover material 822 can be determined. In other examples, electrode 814 can be driven with stimulation signals while electrode 818 can be coupled to sense circuitry for detecting a location of a touch event on cover material 822.

Figure 9:
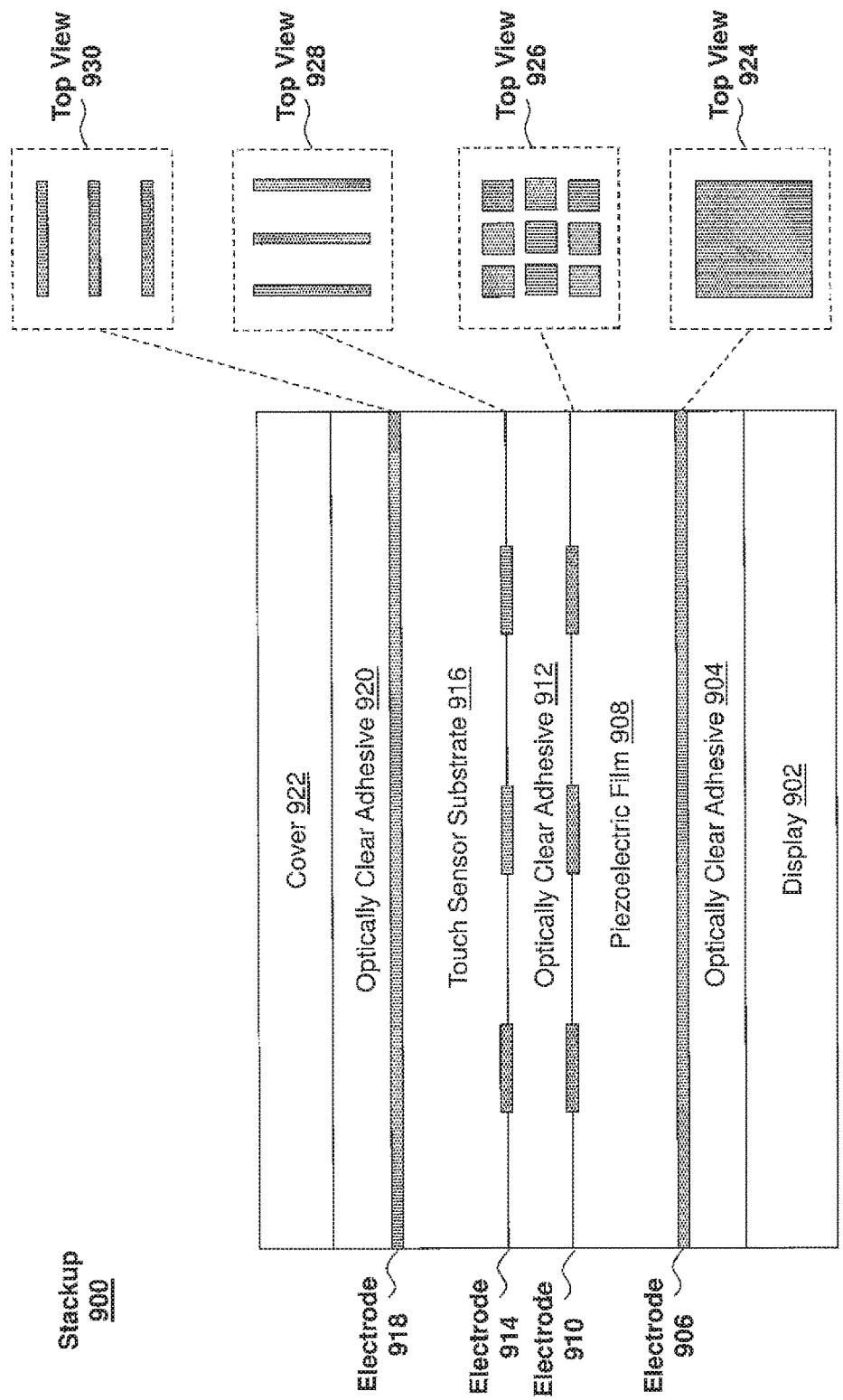

FIG. 9 illustrates a cross-sectional view of an exemplary stackup 900 for a device. Stackup 900 can include a display 902, such as an LCD, LED display, OLED display, or the like, for generating images to be displayed by the device. Stackup 900 can further include a piezoelectric film 908 coupled to display 902 by optically clear adhesive 904. Piezoelectric film 908 can include a transparent film capable of generating a localized electric charge in response to a deformation of the film. Piezoelectric film 908 can further include a first electrode 906 and a second electrode 910 formed on opposite surfaces of the film. The electrodes can be formed from a transparent conductive material, such as ITO, PEDOT, or silver nanowire. Top views 924 and 926 show the shapes of electrodes 906 and 910, respectively, as viewed from above stackup 900. In the illustrated example, electrode 906 can extend along the bottom surface of piezoelectric film 908 and electrode 910 can include multiple discrete electrodes extending along the top surface of piezoelectric film 908. While electrode 910 is shown as having nine square electrodes arranged in rows and columns, it should be appreciated that electrode 910 can each include any number of electrodes having any desired shaped and arranged in any desired pattern.

Stackup 900 can further include touch sensor substrate 916 coupled to piezoelectric film 908 by optically clear adhesive 912. Touch sensor substrate 916 can include electrodes 914 and 918 formed on opposite surfaces of the sensor. The electrodes can be formed from a transparent conductive material, such as ITO, PEDOT, or silver nanowire. Top views 928 and 930 show the shapes of electrodes 914 and 918, respectively, as viewed from above stackup 900. In the illustrated example, electrodes 914 can include columns of multiple discrete electrodes and electrode 918 can include multiple rows of discrete electrodes. Stackup 900 can further include cover material 922 (e.g., glass, plastic, or other rigid and transparent material) coupled to touch sensor substrate 916 by optically clear adhesive 920. While FIG. 9 shows three columns of electrodes 914 and three rows of electrodes 918, it should be appreciated that any number of rows and columns of electrodes can be used. Moreover, in other examples, electrode 914 can be formed on the top of touch sensor substrate 916 and electrode 918 can be formed on the bottom of touch sensor substrate 916.

Electrode 910 can be separated into discrete electrodes to allow the sense circuitry coupled to the electrodes of electrode 910 to determine both the amount and location of force applied to cover material 922. Additionally, multiple forces applied to different portions of cover material 922 can be detected using the electrodes of electrode 910. For example, electrode 906 can be coupled to ground and each electrode of electrode 910 can be coupled to separate sense circuitry (not shown) similar or identical to sense circuitry 320 that is capable of detecting an amount of electric charge generated by the portion of piezoelectric film 908 coupled to the electrode. During operation, as a user applies a downward force on cover material 922, cover material 922 can deform by an amount corresponding to an amount of the applied force. The deformation of cover material 922 can cause a corresponding deformation in optically clear adhesive 920, touch sensor substrate 916, optically clear adhesive 912, and piezoelectric film 908. Piezoelectric film 908 can then generate an amount of electric charge based on an amount of deformation of the film at a location of the deformation of the film. The electrode of electrode 910 positioned at or near the location of the deformation and that is electrically coupled to receive the generated charge can transmit the generated charge to its associated sense circuitry. Since the amount of electric charge generated by piezoelectric film 908 can be representative of the amount of deformation of the film and because the amount of deformation of the film can be representative of the force applied to cover material 922, the amount of electric charge detected by the sense circuitry can be representative of the force applied to cover material 922. Additionally, since the location of the electrode of electrode 910 receiving the generated charge is known, the location of the applied force can also be determined. In this way, the sense circuitry can be used to detect an amount and location of a force applied to cover material 922. Moreover, the multiple electrodes of electrode 910 and the separate sense circuitry coupled to each electrode allows for detection of multiple forces applied to different portions of cover material 922 at the same time. In other examples, electrode 910 can be coupled to the bottom of piezoelectric film 908 and electrode 906 can be coupled to the top of piezoelectric film 908. In these examples, the electrodes of electrode 910 can each be coupled to separate sense circuitry and electrode 906 can be coupled to ground. The sense circuitry can be used to detect an amount and location of force applied to cover material 922 in a manner similar to that described above for the configuration shown in FIG. 9.

Additionally, during operation, touch sensor substrate 916 and electrodes 914 and 918 can be used to determine a position of a touch event (e.g., a finger, stylus, or other object touching cover material 922) on cover material 922 using a mutual capacitance sensing technique. For example, electrodes 918 can be driven with sinusoidal stimulation signals to capacitively couple with crossing columns of electrodes 914, thereby forming a capacitive path for coupling charge from electrodes 918 to the electrodes 914. The crossing electrodes 914 can output touch signals representing the coupled charge or current. When an object, such as a passive stylus, finger, etc., touches cover material 922, the object can cause a capacitance between electrodes 918 and 914 at the touch location to decrease. This capacitance change can be caused by charge or current from the stimulated electrode 918 being shunted through the touching object to ground rather than being coupled to the crossing electrode 914 at the touch location. The touch signals representative of the capacitance change can be received by electrodes 914 and transmitted to the sense circuitry (e.g., similar or identical to sense circuitry 320) for processing. The touch signals can indicate the touch region where the touch occurred. When combined with the amount of force determined using piezoelectric film 908 and electrodes 906 and 910, both the location of the touch event and amount of force applied to cover material 922 can be determined. In other examples, electrode 914 can be driven with stimulation signals while electrode 918 can be coupled to sense circuitry for detecting a location of a touch event on cover material 922.

Figure 10:
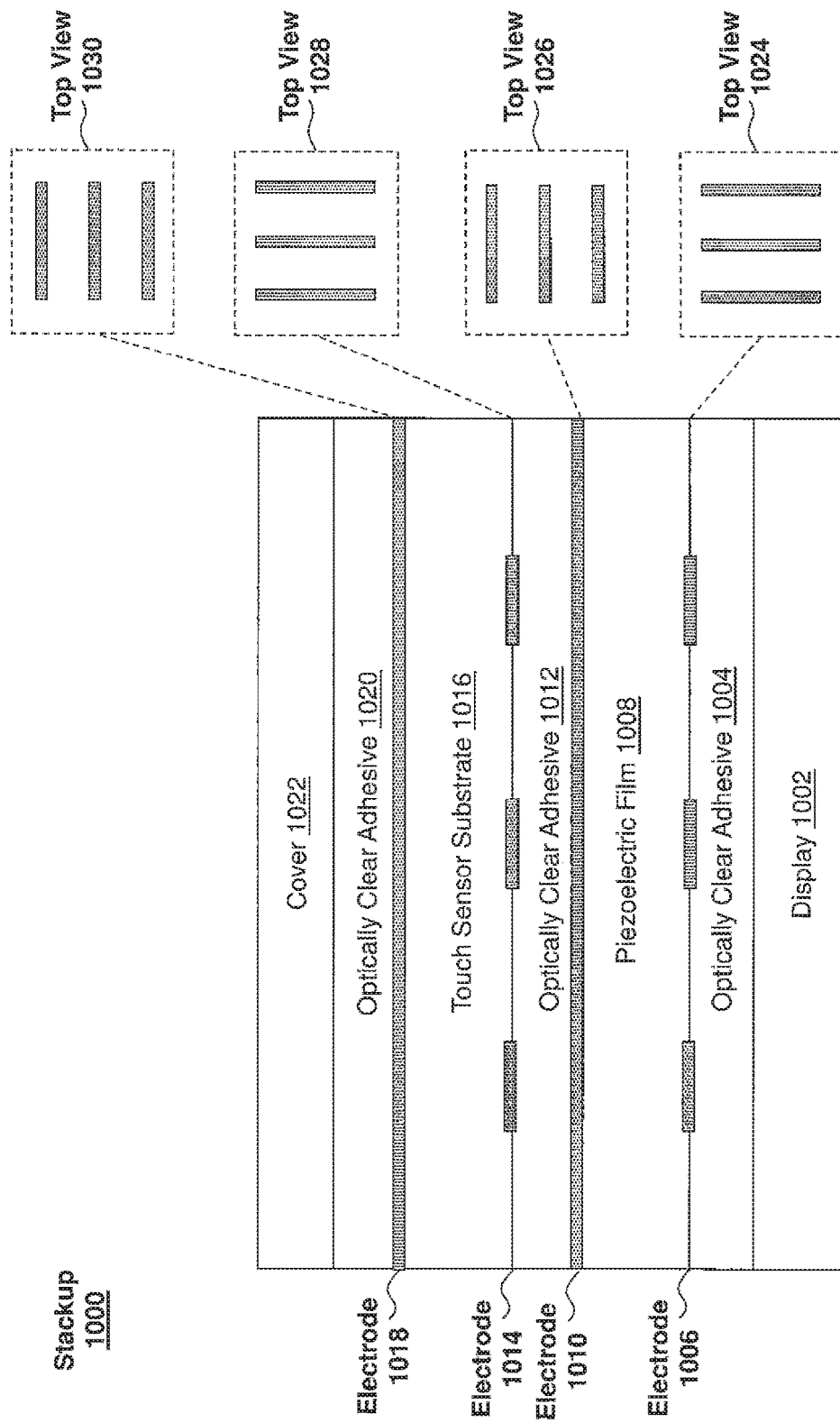

FIG. 10 illustrates a cross-sectional view of an exemplary stackup 1000 for a device. Stackup 1000 can include a display 1002, such as an LCD, LED display, OLED display, or the like, for generating images to be displayed by the device. Stackup 1000 can further include a piezoelectric film 1008 coupled to display 1002 by optically clear adhesive 1004. Piezoelectric film 1008 can include a transparent film capable of generating a localized electric charge in response to a deformation of the film. Piezoelectric film 1008 can further include a first electrode 1006 and a second electrode 1010 formed on opposite surfaces of the film. The electrodes can be formed from a transparent conductive material, such as ITO, PEDOT, or silver nanowire. Top views 1024 and 1026 show the shapes of electrodes 1006 and 1010, respectively, as viewed from above stackup 1000. In the illustrated example, electrode 1006 can include multiple columns of discrete electrodes and electrode 1010 can include multiple rows of discrete electrodes. While FIG. 10 shows three columns of electrodes 1006 and three rows of electrodes 1010, it should be appreciated that any number of rows and columns of electrodes can be used. Moreover, in other examples, electrode 1006 can be formed on the top of piezoelectric film 1008 and electrode 1010 can be formed on the bottom of piezoelectric film 1008.

Stackup 1000 can further include touch sensor substrate 1016 coupled to piezoelectric film 1008 by optically clear adhesive 1012. Touch sensor substrate 1016 can include electrodes 1014 and 1018 formed on opposite surfaces of the sensor. The electrodes can be formed from a transparent conductive material, such as ITO, PEDOT, or silver nanowire. Top views 1028 and 1030 show the shapes of electrodes 1014 and 1018, respectively, as viewed from above stackup 1000. In the illustrated example, electrodes 1014 can include multiple columns of discrete electrodes and electrode 1018 can include multiple rows of discrete electrodes. Stackup 1000 can further include cover material 1022 (e.g., glass, plastic, or other rigid and transparent material) coupled to touch sensor substrate 1016 by optically clear adhesive 1020. While FIG. 10 shows three columns of electrodes 1014 and three rows of electrodes 1018, it should be appreciated that any number of rows and columns of electrodes can be used. Moreover, in other examples, electrode 1014 can be formed on the top of touch sensor substrate 1016 and electrode 1018 can be formed on the bottom of touch sensor substrate 1016.

In some examples, the electrodes of electrode 1006 can be coupled to ground and each electrode of electrode 1010 can be coupled to separate sense circuitry (not shown) similar or identical to sense circuitry 320 that is capable of detecting an amount of electric charge generated by the portion of piezoelectric film 1008 coupled to the electrode. During operation, as a user applies a downward force on cover material 1022, cover material 1022 can deform by an amount corresponding to an amount of the applied force. The deformation of cover material 1022 can cause a corresponding deformation in optically clear adhesive 1020, touch sensor substrate 1016, optically clear adhesive 1012, and piezoelectric film 1008. Piezoelectric film 1008 can then generate an amount of electric charge based on an amount of deformation of the film. The location of the generated electric charge can correspond to the location of the deformation of the film. The electrode of electrode 1010 positioned at or near the location of the deformation and that is electrically coupled to receive the generated charge can transmit the generated charge to its associated sense circuitry. Since the amount of electric charge generated by piezoelectric film 1008 can be representative of the amount of deformation of the film and because the amount of deformation of the film can be representative of the force applied to cover material 1022, the amount of electric charge detected by the sense circuitry can be representative of the force applied to cover material 1022. Additionally, since the location of the electrode of electrode 1010 receiving the generated charge is known, the location of the applied force can also be determined. In this way, the sense circuitry can be used to detect an amount and location of a force applied to cover material 1022. Moreover, the multiple electrodes of electrode 1010 and the separate sense circuitry coupled to each electrode allows for detection of multiple forces applied to different portions of cover material 1022 at the same time. In other examples, the electrodes of electrode 1010 can be coupled to ground and the electrodes of electrode 1006 can each be coupled to separate sense circuitry. In these examples, the sense circuitry can be used to determine the amount and location of forces applied to cover material 1022 based on electric charges received from the electrodes of electrode 1006.

In yet other examples, electrode 1006 can be coupled to ground and electrode 1010 can be coupled to separate sense circuitry. The sense circuitry can be used to determine both an amount and location along one of the electrodes of electrode 1010 of an applied force. Using, for example, switching circuitry coupled to electrodes 1006 and 1010, electrode 1006 can then be coupled to separate sense circuitry and electrode 1010 can then be coupled to ground. The sense circuitry can be used to determine both an amount and location along one of the electrodes of electrode 1006 of an applied force. The intersection of the determined row and column can be interpreted as a location of the force on cover material 1014.

Additionally, during operation, touch sensor substrate 1016 and electrodes 1014 and 1018 can be used to determine a position of a touch event (e.g., a finger, stylus, or other object touching cover material 1022) on cover material 1022 using a mutual capacitance sensing technique. For example, electrodes 1018 can be driven with sinusoidal stimulation signals to capacitively couple with crossing columns of electrodes 1014, thereby forming a capacitive path for coupling charge from electrodes 1018 to the electrodes 1014. The crossing electrodes 1014 can output touch signals representing the coupled charge or current. When an object, such as a passive stylus, finger, etc., touches cover material 1022, the object can cause a capacitance between electrodes 1018 and 1014 at the touch location to decrease. This capacitance change can be caused by charge or current from the stimulated electrode 1018 being shunted through the touching object to ground rather than being coupled to the crossing electrode 1014 at the touch location. The touch signals representative of the capacitance change can be received by electrodes 1014 and transmitted to the sense circuitry (e.g., similar or identical to sense circuitry 320) for processing. The touch signals can indicate the touch region where the touch occurred. When combined with the amount of force determined using piezoelectric film 1008 and electrodes 1006 and 1010, both the location of the touch event and amount of force applied to cover material 1022 can be determined. In other examples, electrode 1014 can be driven with stimulation signals while electrode 1018 can be coupled to sense circuitry for detecting a location of a touch event on cover material 1022.

Figure 11:
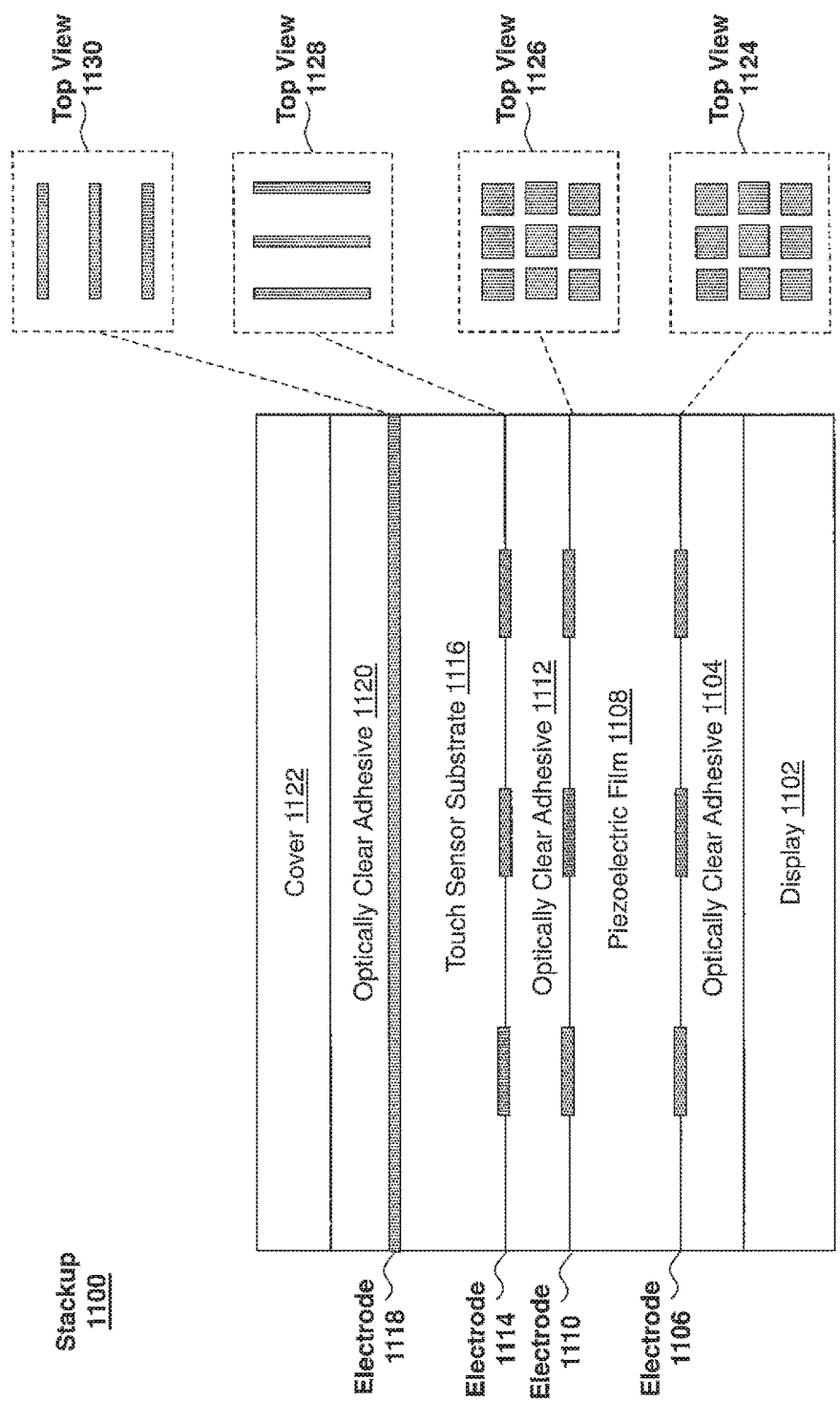

FIG. 11 illustrates a cross-sectional view of an exemplary stackup 1100 for a device. Stackup 1100 can include a display 1102, such as an LCD, LED display, OLED display, or the like, for generating images to be displayed by the device. Stackup 1100 can further include a piezoelectric film 1108 coupled to display 1102 by optically clear adhesive 1104. Piezoelectric film 1108 can include a transparent film capable of generating a localized electric charge in response to a deformation of the film. Piezoelectric film 1108 can further include a first electrode 1106 and a second electrode 1110 formed on opposite surfaces of the film. The electrodes can be formed from a transparent conductive material, such as ITO, PEDOT, or silver nanowire. Top views 1124 and 1126 show the shapes of electrodes 1106 and 1110, respectively, as viewed from above stackup 1100. In the illustrated example, electrodes 1106 and 1110 can both include multiple discrete electrodes extending along the top surface of piezoelectric film 1108. While FIG. 11 shows electrodes 1106 and 1110 each having nine square electrodes arranged in rows and columns, it should be appreciated that electrodes 1106 and 1110 can each include any number of electrodes having any desired shaped and arranged in any desired pattern such that the electrodes of electrode 1106 are positioned opposite the electrodes of electrode 1110 on piezoelectric film 1108.

Stackup 1100 can further include touch sensor substrate 1116 coupled to piezoelectric film 1108 by optically clear adhesive 1112. Touch sensor substrate 1116 can include electrodes 1114 and 1118 formed on opposite surfaces of the sensor. The electrodes can be formed from a transparent conductive material, such as ITO, PEDOT, or silver nanowire. Top views 1128 and 1130 show the shapes of electrodes 1114 and 1118, respectively, as viewed from above stackup 1100. In the illustrated example, electrodes 1114 can include multiple columns of discrete electrodes and electrode 1118 can include multiple rows of discrete electrodes. Stackup 1100 can further include cover material 1122 (e.g., glass, plastic, or other rigid and transparent material) coupled to touch sensor substrate 1116 by optically clear adhesive 1120. While FIG. 11 shows three columns of electrodes 1114 and three rows of electrodes 1118, it should be appreciated that any number of rows and columns of electrodes can be used. Moreover, in other examples, electrode 1114 can be formed on the top of touch sensor substrate 1116 and electrode 1118 can be formed on the bottom of touch sensor substrate 1116.

Electrodes 1106 and 1110 can be separated into discrete electrodes positioned opposite each other on piezoelectric film 1108 to allow the sense circuitry coupled to the electrodes of electrode 1110 to determine both the amount and location of force applied to cover material 1122. Additionally, multiple forces applied to different portions of cover material 1122 can be detected using the electrodes of electrode 1110. For example, the electrodes of electrode 1106 can be coupled to ground and each electrode of electrode 1110 can be coupled to separate sense circuitry (not shown) similar or identical to sense circuitry 320 that is capable of detecting an amount of electric charge generated by the portion of piezoelectric film 1108 coupled to the electrode. During operation, as a user applies a downward force on cover material 1122, cover material 1122 can deform by an amount corresponding to an amount of the applied force. The deformation of cover material 1122 can cause a corresponding deformation in optically clear adhesive 1120, touch sensor substrate 1116, optically clear adhesive 1112, and piezoelectric film 1108. Piezoelectric film 1108 can then generate an amount of electric charge based on an amount of deformation of the film and at a location of the deformation of the film. The electrode of electrode 1110 positioned at or near the location of the deformation and that is electrically coupled to receive the generated charge can transmit the generated charge to its associated sense circuitry. Since the amount of electric charge generated by piezoelectric film 1108 can be representative of the amount of deformation of the film and because the amount of deformation of the film can be representative of the force applied to cover material 1122, the amount of electric charge detected by the sense circuitry can be representative of the force applied to cover material 1122. Additionally, since the location of the electrode of electrode 1110 receiving the generated charge is known, the location of the applied force can also be determined. In this way, the sense circuitry can be used to detect an amount and location of a force applied to cover material 1122. Moreover, the multiple electrodes of electrode 1110 and the separate sense circuitry coupled to each electrode allows for detection of multiple forces applied to different portions of cover material 1122 at the same time. In other examples, the electrodes of electrode 1110 can be coupled to ground and the electrodes of electrode 1106 can each be coupled to separate sense circuitry. In these examples, the sense circuitry can be used to determine the amount and location of forces applied to cover material 1122 based on electric charges received from the electrodes of electrode 1106.

Additionally, during operation, touch sensor substrate 1116 and electrodes 1114 and 1118 can be used to determine a position of a touch event (e.g., a finger, stylus, or other object touching cover material 1122) on cover material 1122 using a mutual capacitance sensing technique. For example, electrodes 1118 can be driven with sinusoidal stimulation signals to capacitively couple with crossing columns of electrodes 1114, thereby forming a capacitive path for coupling charge from electrodes 1118 to the electrodes 1114. The crossing electrodes 1114 can output touch signals representing the coupled charge or current. When an object, such as a passive stylus, finger, etc., touches cover material 1122, the object can cause a capacitance between electrodes 1118 and 1114 at the touch location to decrease. This capacitance change can be caused by charge or current from the stimulated electrode 1118 being shunted through the touching object to ground rather than being coupled to the crossing electrode 1114 at the touch location. The touch signals representative of the capacitance change can be received by electrodes 1114 and transmitted to the sense circuitry (e.g., similar or identical to sense circuitry 320) for processing. The touch signals can indicate the touch region where the touch occurred. When combined with the amount of force determined using piezoelectric film 1108 and electrodes 1106 and 1110, both the location of the touch event and amount of force applied to cover material 1122 can be determined. In other examples, electrode 1114 can be driven with stimulation signals while electrode 1118 can be coupled to sense circuitry for detecting a location of a touch event on cover material 1122.

Figure 12:
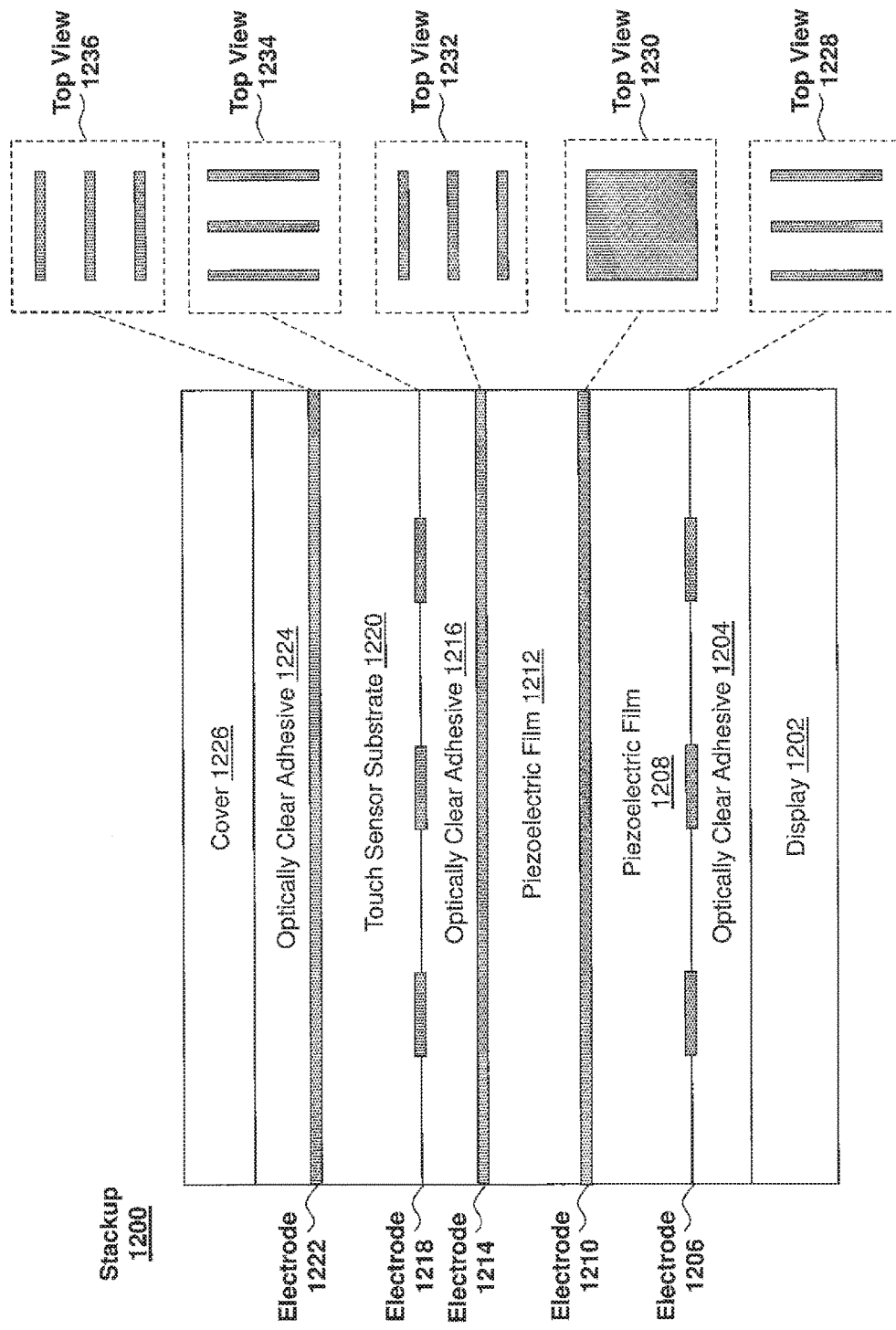

FIG. 12 illustrates a cross-sectional view of an exemplary stackup 1200 for a device. Stackup 1200 can include a display 1202, such as an LCD, LED display, OLED display, or the like, for generating images to be displayed by the device. Stackup 1200 can further include a first piezoelectric film 1208 coupled to display 1202 by optically clear adhesive 1204. Stackup 1200 can further include a second piezoelectric film 1212 coupled to first piezoelectric film 1208. The first and second piezoelectric films 1208 and 1212 can both include a transparent film capable of generating a localized electric charge in response to a deformation of the film. A first electrode 1206 can be formed on the bottom of the first piezoelectric film 1208, a second electrode 1210 can be formed between the first and second piezoelectric films 1208 and 1212, and a third electrode 1214 can be formed on the top of the second piezoelectric film 1212. The electrodes can be formed from a transparent conductive material, such as ITO, PEDOT, or silver nanowire. Top views 1228, 1230, and 1232 show the shapes of electrodes 1206, 1210, and 1214, respectively, as viewed from above stackup 1200. In the illustrated example, electrode 1206 can include multiple columns of discrete electrodes, electrode 1210 can include an electrode extending along the surfaces of piezoelectric films 1208 and 1212, and electrode 1214 can include rows of multiple discrete electrodes. While FIG. 12 shows electrodes 1206 and 1214 each having three rectangular electrodes arranged in columns and rows, respectively, it should be appreciated that electrodes 1206 and 1214 can each include any number of rectangular electrodes and can instead be arranged in rows and columns, respectively.

Stackup 1200 can further include touch sensor substrate 1220 coupled to piezoelectric film 1212 by optically clear adhesive 1216. Touch sensor substrate 1220 can include electrodes 1218 and 1222 formed on opposite surfaces of the sensor. The electrodes can be formed from a transparent conductive material, such as ITO, PEDOT, or silver nanowire. Top views 1234 and 1236 show the shapes of electrodes 1218 and 1222, respectively, as viewed from above stackup 1200. In the illustrated example, electrodes 1218 can include multiple columns of discrete electrodes and electrode 1222 can include multiple rows of discrete electrodes. Stackup 1200 can further include cover material 1226 (e.g., glass, plastic, or other rigid and transparent material) coupled to touch sensor substrate 1220 by optically clear adhesive 1224. While FIG. 12 shows three columns of electrodes 1218 and three rows of electrodes 1222, it should be appreciated that any number of rows and columns of electrodes can be used. Moreover, in other examples, electrode 1218 can be formed on the top of touch sensor substrate 1220 and electrode 1222 can be formed on the bottom of touch sensor substrate 1220.

Electrodes 1206 and 1214 can be separated into discrete columns and rows of electrodes to allow the sense circuitry coupled to the electrodes of electrodes 1206 and 1214 to determine both the amount and location of force applied to cover material 1226. Additionally, multiple forces applied to different portions of cover material 1226 can be detected using the electrodes of electrodes 1206 and 1214. For example, electrode 1210 can be coupled to ground while the electrodes of electrode 1206 can each be coupled to separate sense circuitry (not shown) similar or identical to sense circuitry 320 that is capable of detecting an amount of electric charge generated by the portion of piezoelectric film 1208 coupled to the electrode. The electrodes of electrode 1214 can also be coupled to separate sense circuitry similar or identical to sense circuitry 320 capable of detecting an amount of electric (not shown) charge generated by the portion of piezoelectric film 1212 coupled to the electrode. During operation, as a user applies a downward force on cover material 1226, cover material 1226 can deform by an amount corresponding to an amount of the applied force. The deformation of cover material 1226 can cause a corresponding deformation in optically clear adhesive 1224, touch sensor substrate 1220, optically clear adhesive 1216, piezoelectric film 1212, and piezoelectric film 1208. Piezoelectric films 1212 and 1208 can then generate an amount of electric charge based on an amount of deformation of the film and at a location of the deformation of the film. The electrode of electrode 1214 positioned at or near the location of the deformation of piezoelectric film 1212 and that is electrically coupled to receive the generated charge can transmit the generated charge to its associated sense circuitry. Similarly the electrode of electrode 1206 positioned at or near the location of the deformation of piezoelectric film 1208 and that is electrically coupled to receive the generated charge can transmit the generated charge to its associated sense circuitry. Since the amount of electric charge generated by piezoelectric films 1208 and 1212 can be representative of the amount of deformation of the films and because the amount of deformation of the films can be representative of the force applied to cover material 1226, the amount of electric charge detected by the sense circuitry can be representative of the force applied to cover material 1226. Additionally, since the location of the electrodes of electrodes 1206 and 1214 receiving the generated charge are known, the location of the applied force can also be determined. For example, electrode 1214 can be used to determine the row at which the force was applied, while electrode 1206 can be used to determine the column at which the force was applied. The intersection of the determined row and column can be the location of the applied force. In this way, the sense circuitry can be used to detect an amount and location of a force applied to cover material 1226. Moreover, the multiple electrodes of electrodes 1206 and 1214 and the separate sense circuitry coupled to each electrode allows for detection of multiple forces applied to different portions of cover material 1226. In other examples, electrode 1214 can be coupled to the bottom of piezoelectric film 1208 and electrode 1206 can be coupled to the top of piezoelectric film 1212. In these examples, the electrodes of electrodes 1206 and 1214 can each be coupled to separate sense circuitry. The sense circuitry can be used to detect an amount and location of force applied to cover material 1226 in a manner similar to that described above for the configuration shown in FIG. 12.

Additionally, during operation, touch sensor substrate 1220 and electrodes 1218 and 1222 can be used to determine a position of a touch event (e.g., a finger, stylus, or other object touching cover material 1226) on cover material 1226 using a mutual capacitance sensing technique. For example, electrodes 1222 can be driven with sinusoidal stimulation signals to capacitively couple with crossing columns of electrodes 1218, thereby forming a capacitive path for coupling charge from electrodes 1222 to the electrodes 1218. The crossing electrodes 1218 can output touch signals representing the coupled charge or current. When an object, such as a passive stylus, finger, etc., touches cover material 1226, the object can cause a capacitance between electrodes 1222 and 1218 at the touch location to decrease. This capacitance change can be caused by charge or current from the stimulated electrode 1222 being shunted through the touching object to ground rather than being coupled to the crossing electrode 1218 at the touch location. The touch signals representative of the capacitance change can be received by electrodes 1218 and transmitted to the sense circuitry (e.g., similar or identical to sense circuitry 320) for processing. The touch signals can indicate the touch region where the touch occurred. When combined with the amount of force determined using piezoelectric films 1208 and 1212 and electrodes 1206, 1210, and 1214, both the location of the touch event and amount of force applied to cover material 1226 can be determined. In other examples, electrode 1218 can be driven with stimulation signals while electrode 1222 can be coupled to sense circuitry for detecting a location of a touch event on cover material 1226.

Figure 13:
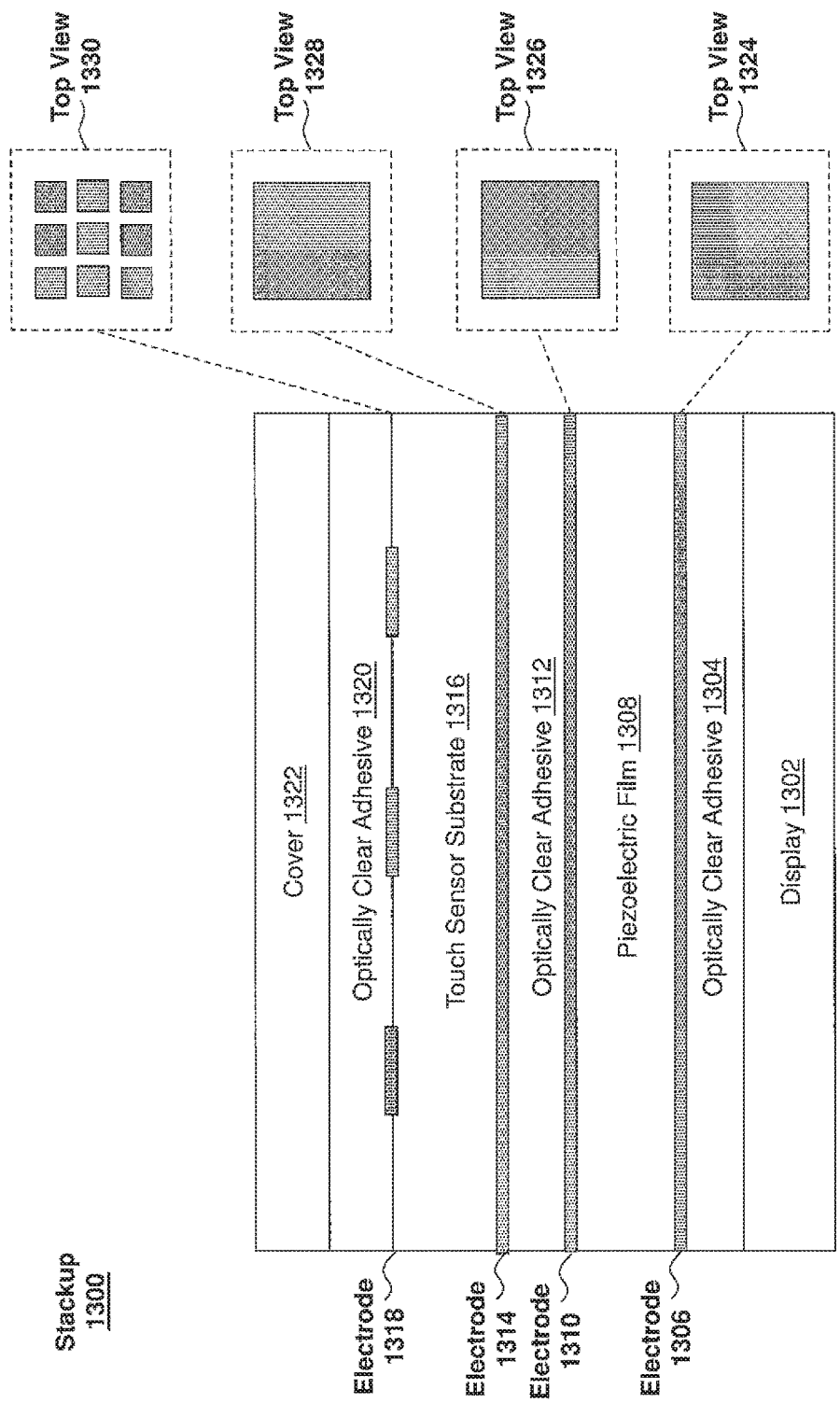

FIG. 13 illustrates a cross-sectional view of an exemplary stackup 1300 for a device. Stackup 1300 can include a display 1302, such as an LCD, LED display, OLED display, or the like, for generating images to be displayed by the device. Stackup 1300 can further include a piezoelectric film 1308 coupled to display 1302 by optically clear adhesive 1304. Piezoelectric film 1308 can include a transparent film capable of generating a localized electric charge in response to a deformation of the film. Piezoelectric film 1308 can further include a first electrode 1306 and a second electrode 1310 formed on opposite surfaces of the film. The electrodes can be formed from a transparent conductive material, such as ITO, PEDOT, or silver nanowire. Top views 1324 and 1326 show the shapes of electrodes 1306 and 1310, respectively, as viewed from above stackup 1300. In the illustrated example, electrodes 1306 and 1310 can both extend along the surfaces of piezoelectric film 1308.

Stackup 1300 can further include touch sensor substrate 1316 coupled to piezoelectric film 1308 by optically clear adhesive 1312. Touch sensor substrate 1316 can include electrodes 1314 and 1318 formed on opposite surfaces of the sensor. The electrodes can be formed from a transparent conductive material, such as ITO, PEDOT, or silver nanowire. Top views 1328 and 1330 show the shapes of electrodes 1314 and 1318, respectively, as viewed from above stackup 1300. In the illustrated example, electrode 1318 can include multiple discrete electrodes extending along the top surface of touch sensor substrate 1316 and electrode 1314 can extend along the bottom surface of touch sensor substrate 1316. Stackup 1300 can further include cover material 1322 (e.g., glass, plastic, or other rigid and transparent material) coupled to touch sensor substrate 1316 by optically clear adhesive 1320. While FIG. 13 shows electrode 1318 having nine square electrodes arranged in rows and columns, it should be appreciated that electrode 1318 can include any number of electrodes having any desired shaped and arranged in any desired pattern. Moreover, in other examples, electrode 1314 can be formed on the top of touch sensor substrate 1316 and electrode 1318 can be formed on the bottom of touch sensor substrate 1316.

In some examples, electrode 1306 can be coupled to ground and electrode 1310 can be coupled to sense circuitry (not shown) similar or identical to sense circuitry 320 that is capable of detecting an amount of electric charge generated by piezoelectric film 1308. During operation, as a user applies a downward force on cover material 1322, cover material 1322 can deform by an amount corresponding to an amount of the applied force. The deformation of cover material 1322 can cause a corresponding deformation in optically clear adhesive 1320, touch sensor substrate 1316, optically clear adhesive 1312, and piezoelectric film 1308. Piezoelectric film 1308 can then generate an amount of electric charge based on an amount of deformation of the film. The generated electric charge can be received by the sense circuitry via electrode 1310. Since the amount of electric charge generated by piezoelectric film 1308 can be representative of the amount of deformation of the film and because the amount of deformation of the film can be representative of the force applied to cover material 1322, the amount of electric charge detected by the sense circuitry can be representative of the force applied to cover material 1322. In this way, the sense circuitry can be used to detect an amount of force applied to cover material 1322. In other examples, the electrode 1310 can be coupled to ground and electrode 1306 can be coupled to the sense circuitry. In these examples, the sense circuitry can be used to determine the amount of force applied to cover material 1322 based on electric charge received from electrode 1306.

Additionally, during operation, electrodes 1314 and 1318 can be used to determine a position of a touch event (e.g., a finger, stylus, or other object touching cover material 1322) on cover material 1322 using a self capacitance sensing technique. For example, each electrode of electrode 1318 can be coupled to a voltage source and sense circuitry. The sense circuitry can measure a change in capacitance at each electrode caused by an object, such as a passive stylus, finger, etc., touching cover material 1322. The capacitance change can be caused by charge or current from the electrode of electrode 1318 being shunted through the touching object to ground. The detected change in capacitance measured by the sense circuitry can be representative of a touch event occurring at a location corresponding to the associated electrode of electrode 1318. When combined with the amount of force determined using piezoelectric film 1308 and electrodes 1306 and 1310, both the location of the touch event and amount of force applied to cover material 1322 can be determined.

Figure 14:
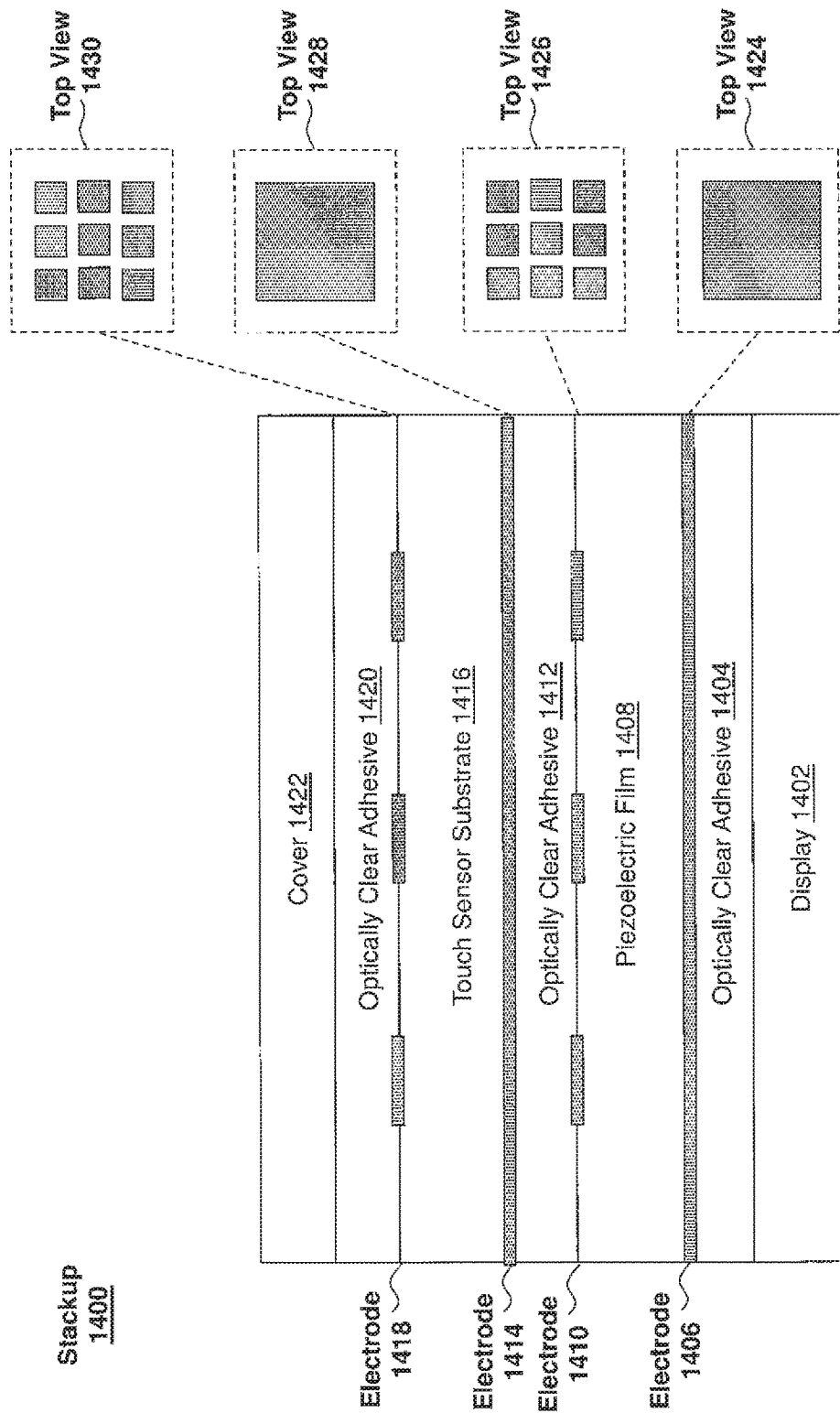

FIG. 14 illustrates a cross-sectional view of an exemplary stackup 1400 for a device. Stackup 1400 can include a display 1402, such as an LCD, LED display, OLED display, or the like, for generating images to be displayed by the device. Stackup 1400 can further include a piezoelectric film 1408 coupled to display 1402 by optically clear adhesive 1404. Piezoelectric film 1408 can include a transparent film capable of generating a localized electric charge in response to a deformation of the film. Piezoelectric film 1408 can further include a first electrode 1406 and a second electrode 1410 formed on opposite surfaces of the film. The electrodes can be formed from a transparent conductive material, such as ITO, PEDOT, or silver nanowire. Top views 1424 and 1426 show the shapes of electrodes 1406 and 1410, respectively, as viewed from above stackup 1400. In the illustrated example, electrode 1406 can extend along the bottom surface of piezoelectric film 1408 and electrode 1410 can include multiple discrete electrodes extending along the top surface of piezoelectric film 1408. While electrode 1410 is shown as having nine square electrodes arranged in rows and columns, it should be appreciated that electrode 1410 can each include any number of electrodes having any desired shaped and arranged in any desired pattern.

Stackup 1400 can further include touch sensor substrate 1416 coupled to piezoelectric film 1408 by optically clear adhesive 1412. Touch sensor substrate 1416 can include electrodes 1414 and 1418 formed on opposite surfaces of the sensor. The electrodes can be formed from a transparent conductive material, such as ITO, PEDOT, or silver nanowire. Top views 1428 and 1430 show the shapes of electrodes 1414 and 1418, respectively, as viewed from above stackup 1400. In the illustrated example, electrode 1418 can include multiple discrete electrodes extending along the top surface of touch sensor substrate 1416 and electrode 1414 can extend along the bottom surface of touch sensor substrate 1416. Stackup 1400 can further include cover material 1422 (e.g., glass, plastic, or other rigid and transparent material) coupled to touch sensor substrate 1416 by optically clear adhesive 1420. While FIG. 14 shows electrode 1418 having nine square electrodes arranged in rows and columns, it should be appreciated that electrode 1418 can include any number of electrodes having any desired shaped and arranged in any desired pattern. Moreover, in other examples, electrode 1414 can be formed on the top of touch sensor substrate 1416 and electrode 1418 can be formed on the bottom of touch sensor substrate 1416.

Electrode 1410 can be separated into discrete electrodes to allow the sense circuitry coupled to the electrodes of electrode 1410 to determine both the amount and location of force applied to cover material 1422. Additionally, multiple forces applied to different portions of cover material 1422 can be detected using the electrodes of electrode 1410. For example, electrode 1406 can be coupled to ground and each electrode of electrode 1410 can be coupled to separate sense circuitry (not shown) similar or identical to sense circuitry 320 that is capable of detecting an amount of electric charge generated by the portion of piezoelectric film 1408 coupled to the electrode. During operation, as a user applies a downward force on cover material 1422, cover material 1422 can deform by an amount corresponding to an amount of the applied force. The deformation of cover material 1422 can cause a corresponding deformation in optically clear adhesive 1420, touch sensor substrate 1416, optically clear adhesive 1412, and piezoelectric film 1408. Piezoelectric film 1408 can then generate an amount of electric charge based on an amount of deformation of the film at a location of the deformation of the film. The electrode of electrode 1410 positioned at or near the location of the deformation and that is electrically coupled to receive the generated charge can transmit the generated charge to its associated sense circuitry. Since the amount of electric charge generated by piezoelectric film 1408 can be representative of the amount of deformation of the film and because the amount of deformation of the film can be representative of the force applied to cover material 1422, the amount of electric charge detected by the sense circuitry can be representative of the force applied to cover material 1422. Additionally, since the location of the electrode of electrode 1410 receiving the generated charge is known, the location of the applied force can also be determined. In this way, the sense circuitry can be used to detect an amount and location of a force applied to cover material 1422. Moreover, the multiple electrodes of electrode 1410 and the separate sense circuitry coupled to each electrode allows for detection of multiple forces applied to different portions of cover material 1422 at the same time. In other examples, electrode 1410 can be coupled to the bottom of piezoelectric film 1408 and electrode 1406 can be coupled to the top of piezoelectric film 1408. In these examples, the electrodes of electrode 1410 can each be coupled to separate sense circuitry and electrode 1406 can be coupled to ground. The sense circuitry can be used to detect an amount and location of force applied to cover material 1422 in a manner similar to that described above for the configuration shown in FIG. 14.

Additionally, during operation, electrodes 1414 and 1418 can be used to determine a position of a touch event (e.g., a finger, stylus, or other object touching cover material 1422) on cover material 1422 using a self capacitance sensing technique. For example, each electrode of electrode 1418 can be coupled to a voltage source and sense circuitry. The sense circuitry can measure a change in capacitance at each electrode caused by an object, such as a passive stylus, finger, etc., touching cover material 1422. The capacitance change can be caused by charge or current from the electrode of electrode 1418 being shunted through the touching object to ground. The detected change in capacitance measured by the sense circuitry can be representative of a touch event occurring at a location corresponding to the associated electrode of electrode 1418. When combined with the amount of force determined using piezoelectric film 1408 and electrodes 1406 and 1410, both the location of the touch event and amount of force applied to cover material 1422 can be determined.

Figure 15:
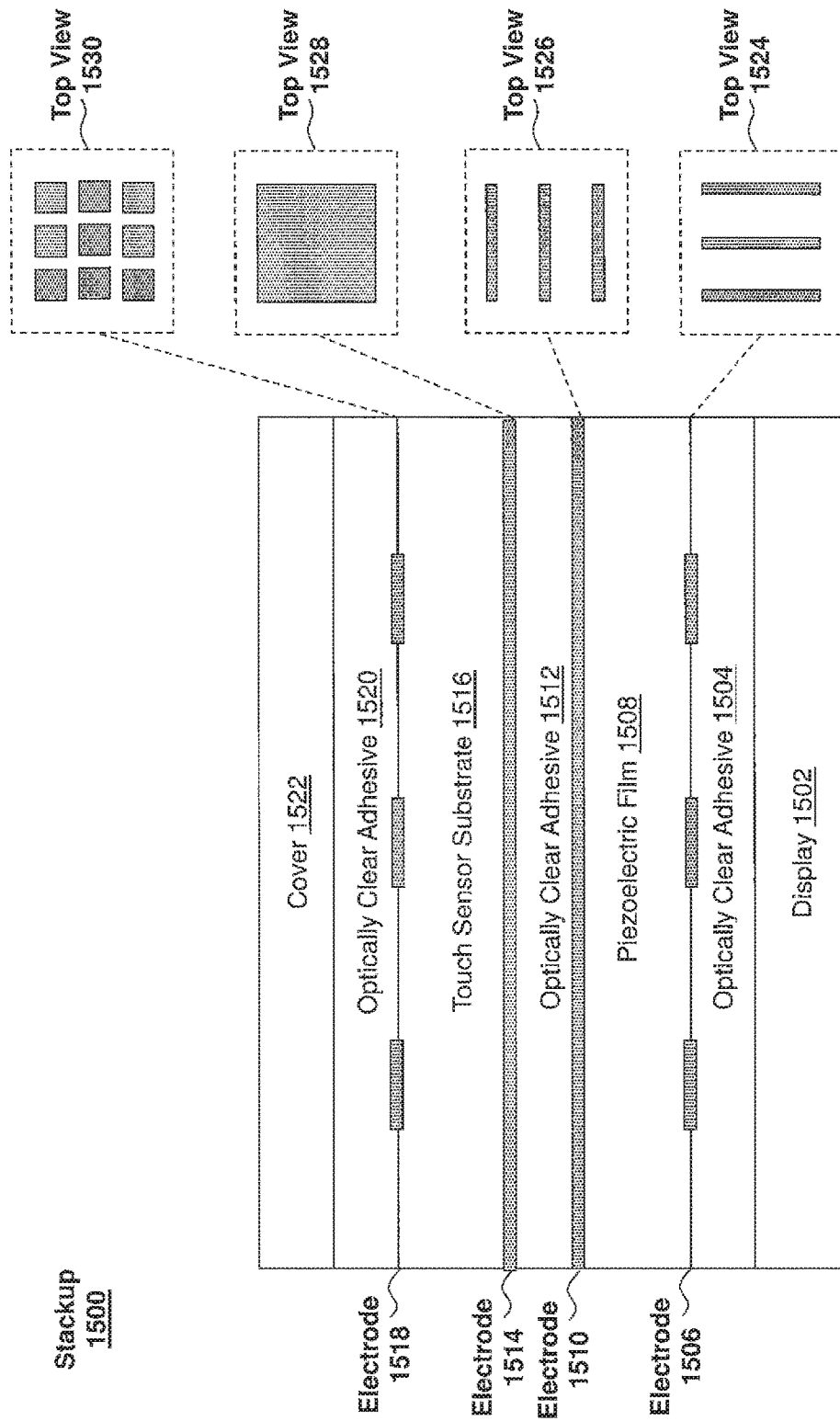

FIG. 15 illustrates a cross-sectional view of an exemplary stackup 1500 for a device. Stackup 1500 can include a display 1502, such as an LCD, LED display, OLED display, or the like, for generating images to be displayed by the device. Stackup 1500 can further include a piezoelectric film 1508 coupled to display 1502 by optically clear adhesive 1504. Piezoelectric film 1508 can include a transparent film capable of generating a localized electric charge in response to a deformation of the film. Piezoelectric film 1508 can further include a first electrode 1506 and a second electrode 1510 formed on opposite surfaces of the film. The electrodes can be formed from a transparent conductive material, such as ITO, PEDOT, or silver nanowire. Top views 1524 and 1526 show the shapes of electrodes 1506 and 1510, respectively, as viewed from above stackup 1500. In the illustrated example, electrode 1506 can include multiple columns of discrete electrodes and electrode 1510 can include multiple rows of discrete electrodes. While FIG. 15 shows three columns of electrodes 1506 and three rows of electrodes 1510, it should be appreciated that any number of rows and columns of electrodes can be used. Moreover, in other examples, electrode 1506 can be formed on the top of piezoelectric film 1508 and electrode 1510 can be formed on the bottom of piezoelectric film 1508.

Stackup 1500 can further include touch sensor substrate 1516 coupled to piezoelectric film 1508 by optically clear adhesive 1512. Touch sensor substrate 1516 can include electrodes 1514 and 1518 formed on opposite surfaces of the sensor. The electrodes can be formed from a transparent conductive material, such as ITO, PEDOT, or silver nanowire. Top views 1528 and 1530 show the shapes of electrodes 1514 and 1518, respectively, as viewed from above stackup 1500. In the illustrated example, electrode 1518 can include multiple discrete electrodes extending along the top surface of touch sensor substrate 1516 and electrode 1514 can extend along the bottom surface of touch sensor substrate 1516. Stackup 1500 can further include cover material 1522 (e.g., glass, plastic, or other rigid and transparent material) coupled to touch sensor substrate 1516 by optically clear adhesive 1520. While FIG. 15 shows electrode 1518 having nine square electrodes arranged in rows and columns, it should be appreciated that electrode 1518 can include any number of electrodes having any desired shaped and arranged in any desired pattern. Moreover, in other examples, electrode 1514 can be formed on the top of touch sensor substrate 1516 and electrode 1518 can be formed on the bottom of touch sensor substrate 1516.

In some examples, the electrodes of electrode 1506 can be coupled to ground and each electrode of electrode 1510 can be coupled to separate sense circuitry (not shown) similar or identical to sense circuitry 320 that is capable of detecting an amount of electric charge generated by the portion of piezoelectric film 1508 coupled to the electrode. During operation, as a user applies a downward force on cover material 1522, cover material 1522 can deform by an amount corresponding to an amount of the applied force. The deformation of cover material 1522 can cause a corresponding deformation in optically clear adhesive 1520, touch sensor substrate 1516, optically clear adhesive 1512, and piezoelectric film 1508. Piezoelectric film 1508 can then generate an amount of electric charge based on an amount of deformation of the film. The location of the generated electric charge can correspond to the location of the deformation of the film. The electrode of electrode 1510 positioned at or near the location of the deformation and that is electrically coupled to receive the generated charge can transmit the generated charge to its associated sense circuitry. Since the amount of electric charge generated by piezoelectric film 1508 can be representative of the amount of deformation of the film and because the amount of deformation of the film can be representative of the force applied to cover material 1522, the amount of electric charge detected by the sense circuitry can be representative of the force applied to cover material 1522. Additionally, since the location of the electrode of electrode 1510 receiving the generated charge is known, the location of the applied force can also be determined. In this way, the sense circuitry can be used to detect an amount and location of a force applied to cover material 1522. Moreover, the multiple electrodes of electrode 1510 and the separate sense circuitry coupled to each electrode allows for detection of multiple forces applied to different portions of cover material 1522 at the same time. In other examples, the electrodes of electrode 1510 can be coupled to ground and the electrodes of electrode 1506 can each be coupled to separate sense circuitry. In these examples, the sense circuitry can be used to determine the amount and location of forces applied to cover material 1522 based on electric charges received from the electrodes of electrode 1506.

In yet other examples, electrode 1506 can be coupled to ground and electrode 1510 can be coupled to separate sense circuitry. The sense circuitry can be used to determine both an amount and location along one of the electrodes of electrode 1510 of an applied force. Using, for example, switching circuitry coupled to electrodes 1506 and 1510, electrode 1506 can then be coupled to separate sense circuitry and electrode 1510 can then be coupled to ground. The sense circuitry can be used to determine both an amount and location along one of the electrodes of electrode 1506 of an applied force. The intersection of the determined row and column can be interpreted as a location of the force on cover material 1514.

Additionally, during operation, electrodes 1514 and 1518 can be used to determine a position of a touch event (e.g., a finger, stylus, or other object touching cover material 1522) on cover material 1522 using a self capacitance sensing technique. For example, each electrode of electrode 1518 can be coupled to a voltage source and sense circuitry. The sense circuitry can measure a change in capacitance at each electrode caused by an object, such as a passive stylus, finger, etc., touching cover material 1522. The capacitance change can be caused by charge or current from the electrode of electrode 1518 being shunted through the touching object to ground. The detected change in capacitance measured by the sense circuitry can be representative of a touch event occurring at a location corresponding to the associated electrode of electrode 1518. When combined with the amount of force determined using piezoelectric film 1508 and electrodes 1506 and 1510, both the location of the touch event and amount of force applied to cover material 1522 can be determined.

Figure 16:
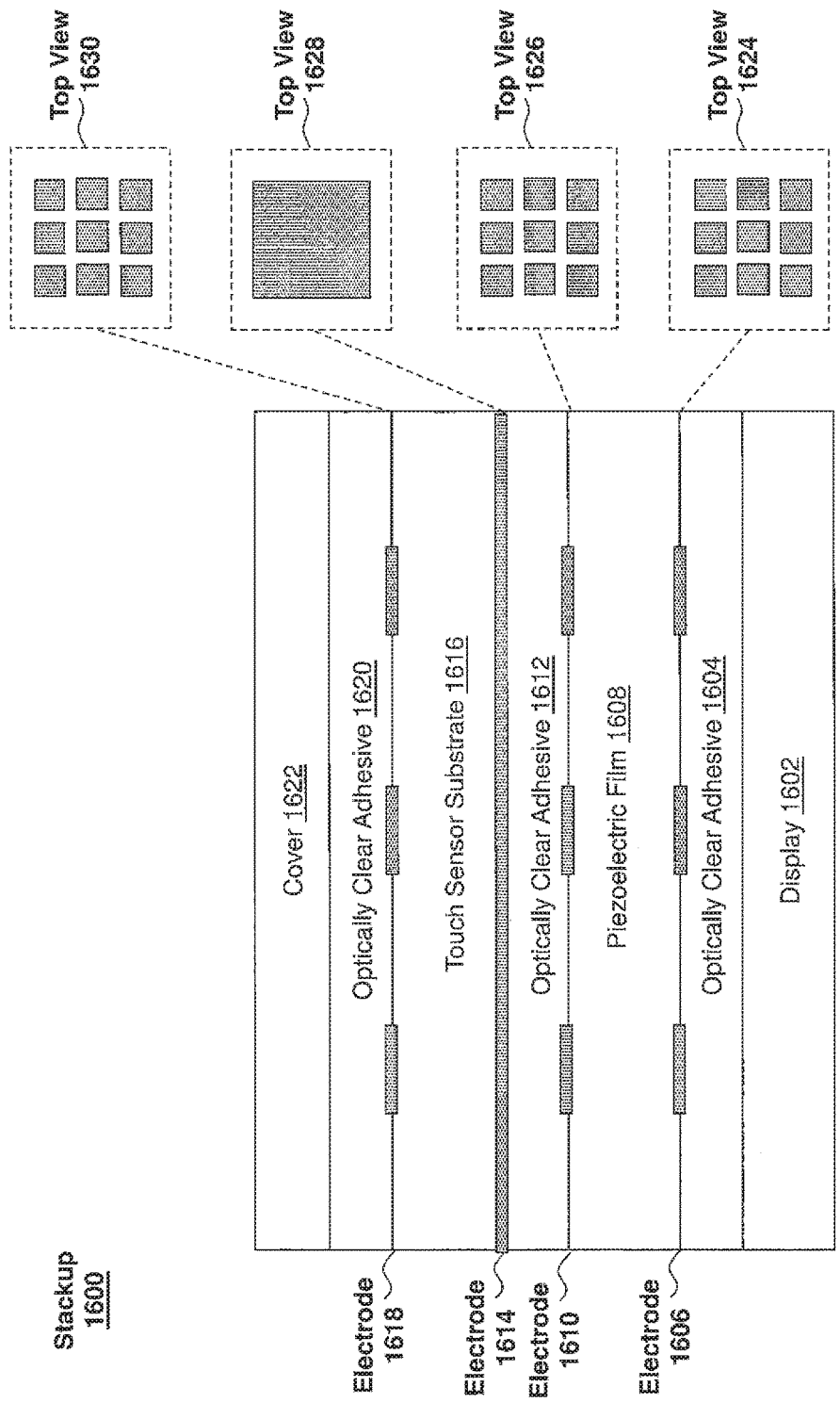

FIG. 16 illustrates a cross-sectional view of an exemplary stackup 1600 for a device. Stackup 1600 can include a display 1602, such as an LCD, LED display, OLED display, or the like, for generating images to be displayed by the device. Stackup 1600 can further include a piezoelectric film 1608 coupled to display 1602 by optically clear adhesive 1604. Piezoelectric film 1608 can include a transparent film capable of generating a localized electric charge in response to a deformation of the film. Piezoelectric film 1608 can further include a first electrode 1606 and a second electrode 1610 formed on opposite surfaces of the film. The electrodes can be formed from a transparent conductive material, such as ITO, PEDOT, or silver nanowire. Top views 1624 and 1626 show the shapes of electrodes 1606 and 1610, respectively, as viewed from above stackup 1600. In the illustrated example, electrodes 1606 and 1610 can both include multiple discrete electrodes extending along the top surface of piezoelectric film 1608. While FIG. 16 shows electrodes 1606 and 1610 each having nine square electrodes arranged in rows and columns, it should be appreciated that electrodes 1606 and 1610 can each include any number of electrodes having any desired shaped and arranged in any desired pattern such that the electrodes of electrode 1606 are positioned opposite the electrodes of electrode 1610 on piezoelectric film 1608.

Stackup 1600 can further include touch sensor substrate 1616 coupled to piezoelectric film 1608 by optically clear adhesive 1612. Touch sensor substrate 1616 can include electrodes 1614 and 1618 formed on opposite surfaces of the sensor. The electrodes can be formed from a transparent conductive material, such as ITO, PEDOT, or silver nanowire. Top views 1628 and 1630 show the shapes of electrodes 1614 and 1618, respectively, as viewed from above stackup 1600. In the illustrated example, electrode 1618 can include multiple discrete electrodes extending along the top surface of touch sensor substrate 1616 and electrode 1614 can extend along the bottom surface of touch sensor substrate 1616. Stackup 1600 can further include cover material 1622 (e.g., glass, plastic, or other rigid and transparent material) coupled to touch sensor substrate 1616 by optically clear adhesive 1620. While FIG. 16 shows electrode 1618 having nine square electrodes arranged in rows and columns, it should be appreciated that electrode 1618 can include any number of electrodes having any desired shaped and arranged in any desired pattern. Moreover, in other examples, electrode 1614 can be formed on the top of touch sensor substrate 1616 and electrode 1618 can be formed on the bottom of touch sensor substrate 1616.

Electrodes 1606 and 1610 can be separated into discrete electrodes positioned opposite each other on piezoelectric film 1608 to allow the sense circuitry coupled to the electrodes of electrode 1610 to determine both the amount and location of force applied to cover material 1622. Additionally, multiple forces applied to different portions of cover material 1622 can be detected using the electrodes of electrode 1610. For example, the electrodes of electrode 1606 can be coupled to ground and each electrode of electrode 1610 can be coupled to separate sense circuitry (not shown) similar or identical to sense circuitry 320 that is capable of detecting an amount of electric charge generated by the portion of piezoelectric film 1608 coupled to the electrode. During operation, as a user applies a downward force on cover material 1622, cover material 1622 can deform by an amount corresponding to an amount of the applied force. The deformation of cover material 1622 can cause a corresponding deformation in optically clear adhesive 1620, touch sensor substrate 1616, optically clear adhesive 1612, and piezoelectric film 1608. Piezoelectric film 1608 can then generate an amount of electric charge based on an amount of deformation of the film and at a location of the deformation of the film. The electrode of electrode 1610 positioned at or near the location of the deformation and that is electrically coupled to receive the generated charge can transmit the generated charge to its associated sense circuitry. Since the amount of electric charge generated by piezoelectric film 1608 can be representative of the amount of deformation of the film and because the amount of deformation of the film can be representative of the force applied to cover material 1622, the amount of electric charge detected by the sense circuitry can be representative of the force applied to cover material 1622. Additionally, since the location of the electrode of electrode 1610 receiving the generated charge is known, the location of the applied force can also be determined. In this way, the sense circuitry can be used to detect an amount and location of a force applied to cover material 1622. Moreover, the multiple electrodes of electrode 1610 and the separate sense circuitry coupled to each electrode allows for detection of multiple forces applied to different portions of cover material 1622 at the same time. In other examples, the electrodes of electrode 1610 can be coupled to ground and the electrodes of electrode 1606 can each be coupled to separate sense circuitry. In these examples, the sense circuitry can be used to determine the amount and location of forces applied to cover material 1622 based on electric charges received from the electrodes of electrode 1606.

Additionally, during operation, electrodes 1614 and 1618 can be used to determine a position of a touch event (e.g., a finger, stylus, or other object touching cover material 1622) on cover material 1622 using a self capacitance sensing technique. For example, each electrode of electrode 1618 can be coupled to a voltage source and sense circuitry. The sense circuitry can measure a change in capacitance at each electrode caused by an object, such as a passive stylus, finger, etc., touching cover material 1622. The capacitance change can be caused by charge or current from the electrode of electrode 1618 being shunted through the touching object to ground. The detected change in capacitance measured by the sense circuitry can be representative of a touch event occurring at a location corresponding to the associated electrode of electrode 1618. When combined with the amount of force determined using piezoelectric film 1608 and electrodes 1606 and 1610, both the location of the touch event and amount of force applied to cover material 1622 can be determined.

Figure 17:
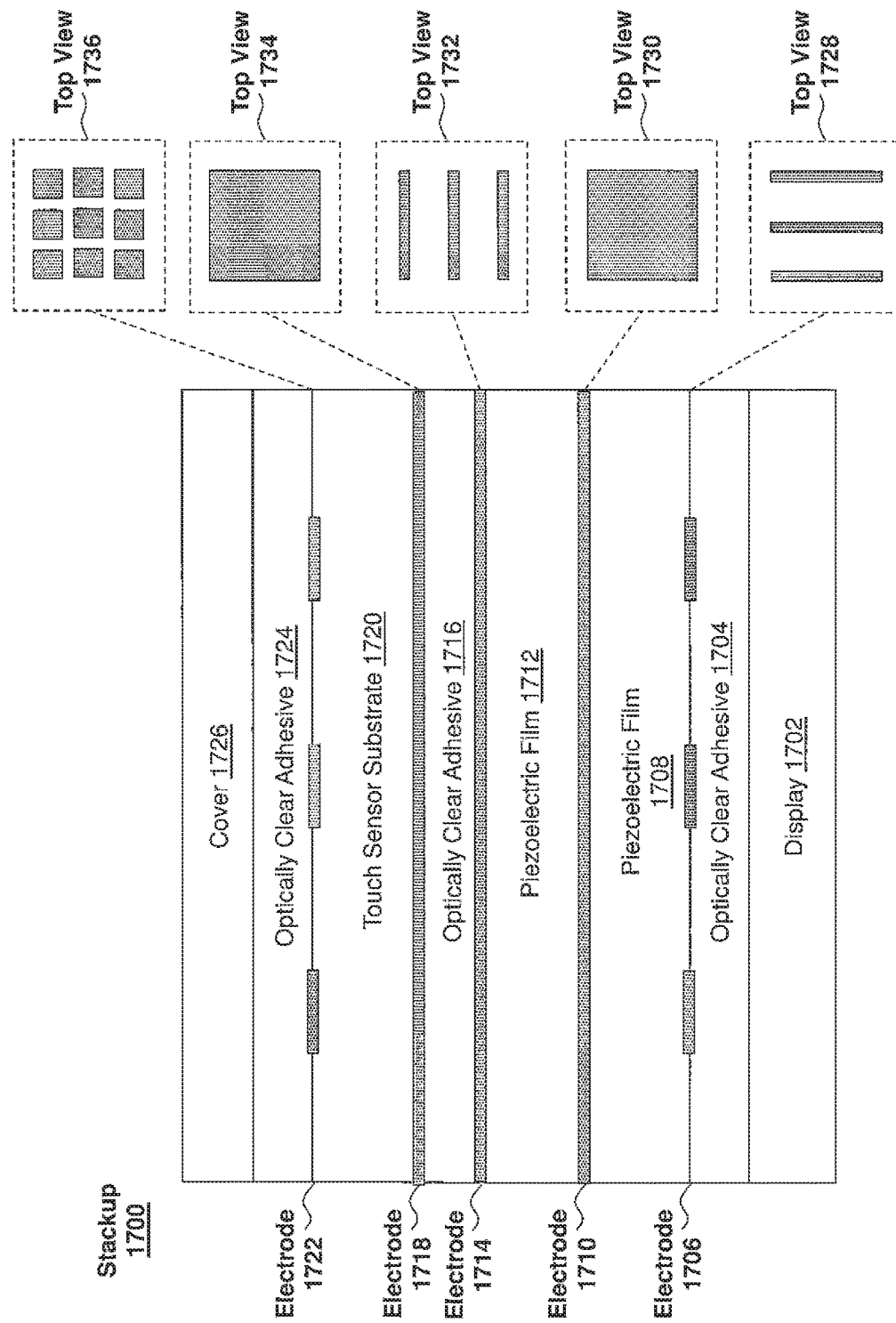

FIG. 17 illustrates a cross-sectional view of an exemplary stackup 1700 for a device. Stackup 1700 can include a display 1702, such as an LCD, LED display, OLED display, or the like, for generating images to be displayed by the device. Stackup 1700 can further include a first piezoelectric film 1708 coupled to display 1702 by optically clear adhesive 1704. Stackup 1700 can further include a second piezoelectric film 1712 coupled to first piezoelectric film 1708. The first and second piezoelectric films 1708 and 1712 can both include a transparent film capable of generating a localized electric charge in response to a deformation of the film. A first electrode 1706 can be formed on the bottom of the first piezoelectric film 1708, a second electrode 1710 can be formed between the first and second piezoelectric films 1708 and 1712, and a third electrode 1714 can be formed on the top of the second piezoelectric film 1712. The electrodes can be formed from a transparent conductive material, such as ITO, PEDOT, or silver nanowire. Top views 1728, 1730, and 1732 show the shapes of electrodes 1706, 1710, and 1714, respectively, as viewed from above stackup 1700. In the illustrated example, electrode 1706 can include multiple columns of discrete electrodes, electrode 1710 can include an electrode extending along the surfaces of piezoelectric films 1708 and 1712, and electrode 1714 can include rows of multiple discrete electrodes. While FIG. 17 shows electrodes 1706 and 1714 each having three rectangular electrodes arranged in columns and rows, respectively, it should be appreciated that electrodes 1706 and 1714 can each include any number of rectangular electrodes and can instead be arranged in rows and columns, respectively.

Stackup 1700 can further include touch sensor substrate 1720 coupled to piezoelectric film 1712 by optically clear adhesive 1716. Touch sensor substrate 1720 can include electrodes 1718 and 1722 formed on opposite surfaces of the sensor. The electrodes can be formed from a transparent conductive material, such as ITO, PEDOT, or silver nanowire. Top views 1734 and 1736 show the shapes of electrodes 1718 and 1722, respectively, as viewed from above stackup 1700. In the illustrated example, electrode 1722 can include multiple discrete electrodes extending along the top surface of touch sensor substrate 1720 and electrode 1718 can extend along the bottom surface of touch sensor substrate 1720. Stackup 1700 can further include cover material 1726 (e.g., glass, plastic, or other rigid and transparent material) coupled to touch sensor substrate 1720 by optically clear adhesive 1724. While FIG. 17 shows electrode 1722 having nine square electrodes arranged in rows and columns, it should be appreciated that electrode 1722 can include any number of electrodes having any desired shaped and arranged in any desired pattern. Moreover, in other examples, electrode 1718 can be formed on the top of touch sensor substrate 1720 and electrode 1722 can be formed on the bottom of touch sensor substrate 1720.

Electrodes 1706 and 1714 can be separated into discrete columns and rows of electrodes to allow the sense circuitry coupled to the electrodes of electrodes 1706 and 1714 to determine both the amount and location of force applied to cover material 1726. Additionally, multiple forces applied to different portions of cover material 1726 can be detected using the electrodes of electrodes 1706 and 1714. For example, electrode 1710 can be coupled to ground while the electrodes of electrode 1706 can each be coupled to separate sense circuitry (not shown) similar or identical to sense circuitry 320 that is capable of detecting an amount of electric charge generated by the portion of piezoelectric film 1708 coupled to the electrode. The electrodes of electrode 1714 can also be coupled to separate sense circuitry similar or identical to sense circuitry 320 capable of detecting an amount of electric (not shown) charge generated by the portion of piezoelectric film 1712 coupled to the electrode. During operation, as a user applies a downward force on cover material 1726, cover material 1726 can deform by an amount corresponding to an amount of the applied force. The deformation of cover material 1726 can cause a corresponding deformation in optically clear adhesive 1724, touch sensor substrate 1720, optically clear adhesive 1716, piezoelectric film 1712, and piezoelectric film 1708. Piezoelectric films 1712 and 1708 can then generate an amount of electric charge based on an amount of deformation of the film and at a location of the deformation of the film. The electrode of electrode 1714 positioned at or near the location of the deformation of piezoelectric film 1712 and that is electrically coupled to receive the generated charge can transmit the generated charge to its associated sense circuitry. Similarly the electrode of electrode 1706 positioned at or near the location of the deformation of piezoelectric film 1708 and that is electrically coupled to receive the generated charge can transmit the generated charge to its associated sense circuitry. Since the amount of electric charge generated by piezoelectric films 1708 and 1712 can be representative of the amount of deformation of the films and because the amount of deformation of the films can be representative of the force applied to cover material 1726, the amount of electric charge detected by the sense circuitry can be representative of the force applied to cover material 1726. Additionally, since the location of the electrodes of electrodes 1706 and 1714 receiving the generated charge are known, the location of the applied force can also be determined. For example, electrode 1714 can be used to determine the row at which the force was applied, while electrode 1706 can be used to determine the column at which the force was applied. The intersection of the determined row and column can be the location of the applied force. In this way, the sense circuitry can be used to detect an amount and location of a force applied to cover material 1726. Moreover, the multiple electrodes of electrodes 1706 and 1714 and the separate sense circuitry coupled to each electrode allows for detection of multiple forces applied to different portions of cover material 1726. In other examples, electrode 1714 can be coupled to the bottom of piezoelectric film 1708 and electrode 1706 can be coupled to the top of piezoelectric film 1712. In these examples, the electrodes of electrodes 1706 and 1714 can each be coupled to separate sense circuitry. The sense circuitry can be used to detect an amount and location of force applied to cover material 1726 in a manner similar to that described above for the configuration shown in FIG. 17.

Additionally, during operation, electrodes 1718 and 1722 can be used to determine a position of a touch event (e.g., a finger, stylus, or other object touching cover material 1726) on cover material 1726 using a self capacitance sensing technique. For example, each electrode of electrode 1722 can be coupled to a voltage source and sense circuitry. The sense circuitry can measure a change in capacitance at each electrode caused by an object, such as a passive stylus, finger, etc., touching cover material 1726. The capacitance change can be caused by charge or current from the electrode of electrode 1722 being shunted through the touching object to ground. The detected change in capacitance measured by the sense circuitry can be representative of a touch event occurring at a location corresponding to the associated electrode of electrode 1722. When combined with the amount of force determined using piezoelectric films 1708 and 1712 and electrodes 1706, 1710, and 1714, both the location of the touch event and amount of force applied to cover material 1726 can be determined.

Figure 18:
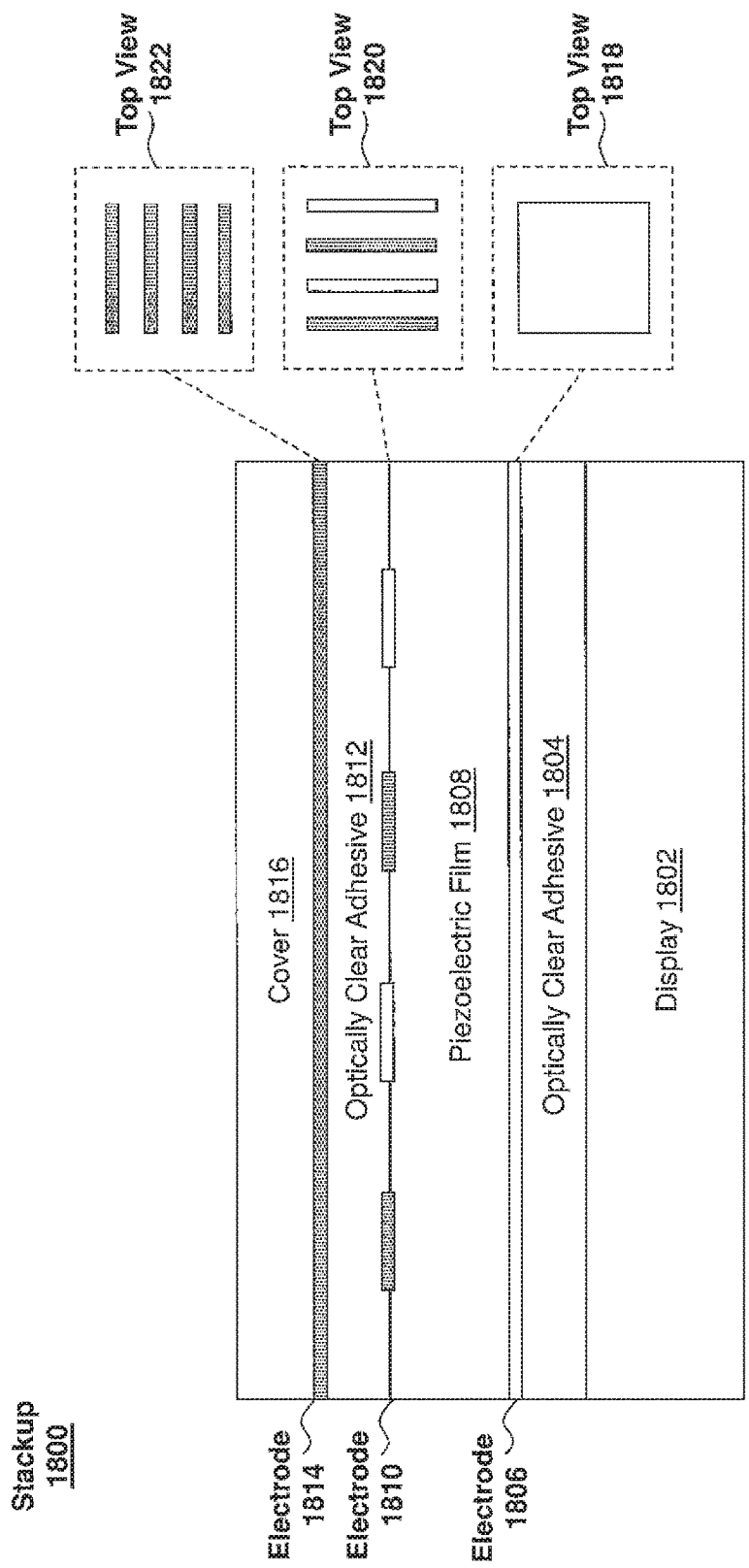

FIG. 18 illustrates a cross-sectional view of an exemplary stackup 1800 for a device. Stackup 1800 can include a display 1802, such as an LCD, LED display, OLED display, or the like, for generating images to be displayed by the device. Stackup 1800 can further include a piezoelectric film 1808 coupled to display 1802 by optically clear adhesive 1804. Piezoelectric film 1808 can include a transparent film capable of generating a localized electric charge in response to a deformation of the film. Piezoelectric film 1808 can further include a first electrode 1806 and a second electrode 1810 formed on opposite surfaces of the film. The electrodes can be formed from a transparent conductive material, such as ITO, PEDOT, or silver nanowire. Top views 1818 and 1820 show the shapes of electrodes 1806 and 1810, respectively, as viewed from above stackup 1800. In the illustrated example, electrode 1806 can extend along the bottom surface of piezoelectric film 1808 and electrode 1810 can include multiple columns of discrete electrodes. Stackup 1800 can further include cover material 1816 (e.g., glass, plastic, or other rigid and transparent material) coupled to piezoelectric film 1808 by optically clear adhesive 1812. Cover material 1816 can include a third electrode 1814 formed on the bottom surface of the material. Top view 1822 shows the shape of electrode 1814 as viewed from above stackup 1800. In the illustrated example, electrode 1814 can include multiple rows of discrete electrodes. While FIG. 18 shows electrodes 1810 and 1814 each having four rectangular electrodes arranged in columns and rows, respectively, it should be appreciated that electrodes 1810 and 1814 can each include any number of rectangular electrodes and can instead be arranged in rows and columns, respectively.

In some examples, a portion of the electrodes of electrode 1810 can be used for touch detection, while the remaining electrodes can be used to determine an amount of force applied to cover material 1816. To illustrate, the shaded electrodes of electrode 1810 shown in FIG. 18 can be used for touch detection, while the white electrodes can be used for force detection. Specifically, the white electrodes of electrode 1810 can be coupled to ground and electrode 1806 can be coupled to sense circuitry (not shown) similar or identical to sense circuitry 320 that is capable of detecting an amount of electric charge generated by piezoelectric film 1808. During operation, as a user applies a downward force on cover material 1816, cover material 1816 can deform by an amount corresponding to an amount of the applied force. The deformation of cover material 1816 can cause a corresponding deformation in optically clear adhesive 1812, and piezoelectric film 1808. Piezoelectric film 1808 can then generate an amount of electric charge based on an amount of deformation of the film. The generated electric charge can be received by the sense circuitry via electrode 1806. Since the amount of electric charge generated by piezoelectric film 1808 can be representative of the amount of deformation of the film and because the amount of deformation of the film can be representative of the force applied to cover material 1816, the amount of electric charge detected by the sense circuitry can be representative of the force applied to cover material 1816. In this way, the sense circuitry can be used to detect an amount of force applied to cover material 1816.

Additionally, during operation, electrodes 1810 and 1814 can be used to determine a position of the applied force on cover material 1816 using a mutual capacitance sensing technique. For example, electrodes 1814 can be driven with sinusoidal stimulation signals to capacitively couple with crossing columns of shaded electrodes of electrodes 1810, thereby forming a capacitive path for coupling charge from electrodes 1814 to the shaded electrodes of electrodes 1810. The crossing shaded electrodes of electrodes 1810 can output touch signals representing the coupled charge or current. When an object, such as a passive stylus, finger, etc., touches cover material 1816, the object can cause a capacitance between electrodes 1814 and the shaded electrodes of electrodes 1810 at the touch location to decrease. This capacitance change can be caused by charge or current from the stimulated electrode 1814 being shunted through the touching object to ground rather than being coupled to the crossing shaded electrode of electrode 1810 at the touch location. The touch signals representative of the capacitance change can be received by shaded electrodes of electrodes 1810 and transmitted to the sense circuitry (e.g., similar or identical to sense circuitry 320) for processing. The touch signals can indicate the touch region where the touch occurred. When combined with the amount of force determined using piezoelectric film 1808, electrode 1806, and the white electrodes of electrode 1810, both the location of the touch event and amount of force applied to cover material 1816 can be determined. In other examples, the shaded electrodes of electrode 1810 can be driven with stimulation signals while electrode 1814 can be coupled to sense circuitry for detecting a location of a touch event on cover material 1816. While electrode 1810 is shown with an alternating pattern of touch detection electrodes and force detection electrodes, it should be appreciated that any desired distribution of touch and force detection electrodes can be used.

Figure 19:
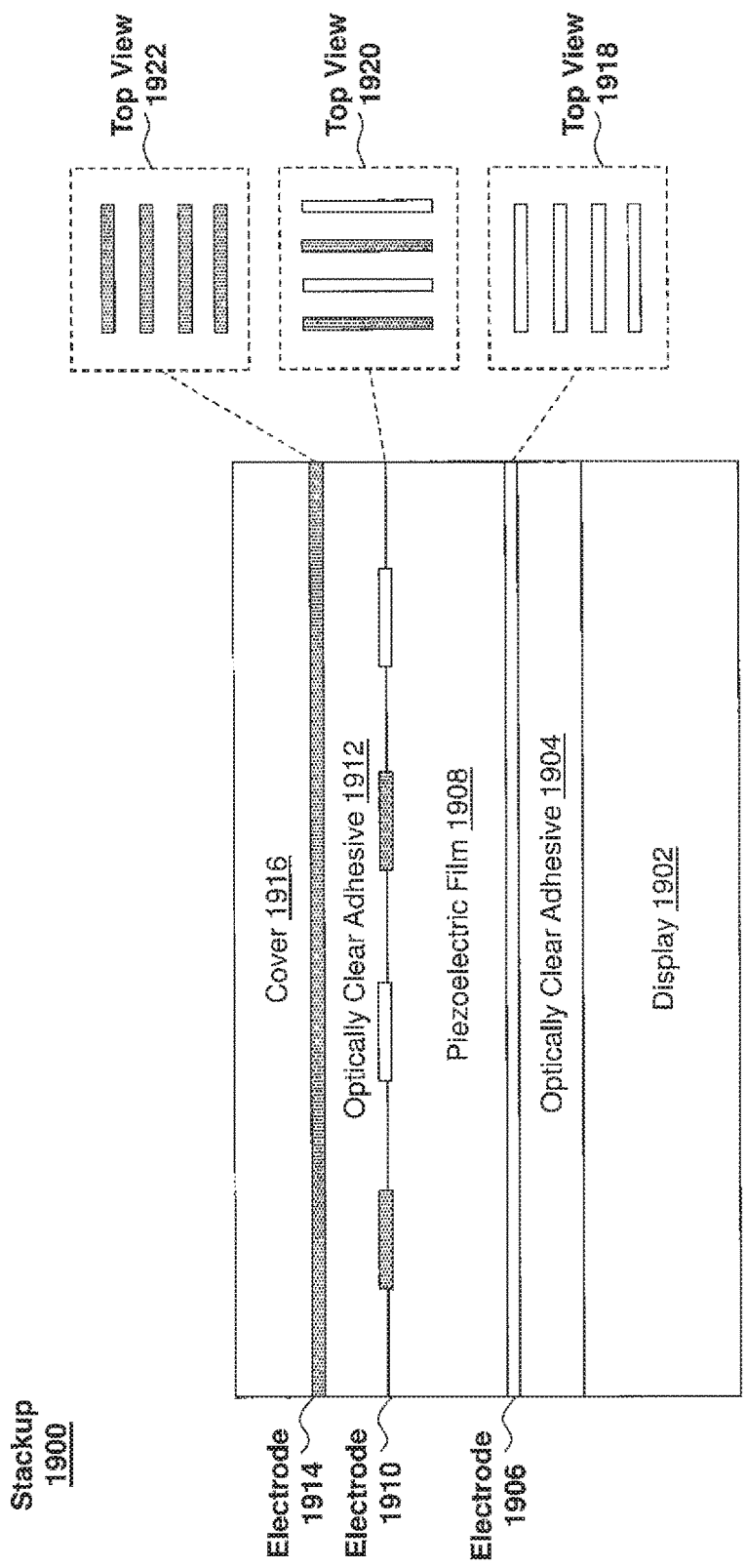

FIG. 19 illustrates a cross-sectional view of an exemplary stackup 1900 for a device. Stackup 1900 can include a display 1902, such as an LCD, LED display, OLED display, or the like, for generating images to be displayed by the device. Stackup 1900 can further include a piezoelectric film 1908 coupled to display 1902 by optically clear adhesive 1904. Piezoelectric film 1908 can include a transparent film capable of generating a localized electric charge in response to a deformation of the film. Piezoelectric film 1908 can further include a first electrode 1906 and a second electrode 1910 formed on opposite surfaces of the film. The electrodes can be formed from a transparent conductive material, such as ITO, PEDOT, or silver nanowire. Top views 1918 and 1920 show the shapes of electrodes 1906 and 1910, respectively, as viewed from above stackup 1900. In the illustrated example, electrode 1906 can include multiple rows of discrete electrodes and electrode 1910 can include multiple columns of discrete electrodes. Stackup 1900 can further include cover material 1916 (e.g., glass, plastic, or other rigid and transparent material) coupled to piezoelectric film 1908 by optically clear adhesive 1912. Cover material 1916 can include a third electrode 1914 formed on the bottom surface of the material. Top view 1922 shows the shape of electrode 1914 as viewed from above stackup 1900. In the illustrated example, electrode 1914 can include multiple rows of discrete electrodes. While FIG. 19 shows electrodes

1906, 1910, and 1914 each having four rectangular electrodes, it should be appreciated that electrodes 1906, 1910, and 1914 can each include any number of rectangular electrodes. Moreover, in other examples, the electrodes of electrodes 1906 and 1914 can be arranged in columns, while the electrodes of electrode 1910 can be arranged in rows.

In some examples, a portion of the electrodes of electrode 1910 can be used for touch detection, while the remaining electrodes can be used to determine an amount of force applied to cover material 1916. To illustrate, the shaded electrodes of electrode 1910 shown in FIG. 19 can be used for touch detection, while the white electrodes can be used for force detection. In some examples, the white electrodes of electrode 1910 can be coupled to ground and each electrode of electrode 1906 can be coupled to separate sense circuitry (not shown) similar or identical to sense circuitry 320 that is capable of detecting an amount of electric charge generated by the portion of piezoelectric film 1908 coupled to the electrode. During operation, as a user applies a downward force on cover material 1916, cover material 1916 can deform by an amount corresponding to an amount of the applied force. The deformation of cover material 1916 can cause a corresponding deformation in optically clear adhesive 1912 and piezoelectric film 1908. Piezoelectric film 1908 can then generate an amount of electric charge based on an amount of deformation of the film. The location of the generated electric charge can correspond to the location of the deformation of the film. The electrode of electrode 1906 positioned at or near the location of the deformation and that is electrically coupled to receive the generated charge can transmit the generated charge to its associated sense circuitry. Since the amount of electric charge generated by piezoelectric film 1908 can be representative of the amount of deformation of the film and because the amount of deformation of the film can be representative of the force applied to cover material 1916, the amount of electric charge detected by the sense circuitry can be representative of the force applied to cover material 1916. Additionally, since the location of the electrode of electrode 1906 receiving the generated charge is known, the location of the applied force can also be determined. In this way, the sense circuitry can be used to detect an amount and location of a force applied to cover material 1916. Moreover, the multiple electrodes of electrode 1906 and the separate sense circuitry coupled to each electrode allows for detection of multiple forces applied to different portions of cover material 1916 at the same time. In other examples, the electrodes of electrode 1906 can be coupled to ground and the electrodes of electrode 1910 can each be coupled to separate sense circuitry. In these examples, the sense circuitry can be used to determine the amount and location of forces applied to cover material 1916 based on electric charges received from the electrodes of electrode 1910.

Additionally, during operation, electrode 1914 and the shaded electrodes of electrode 1910 can be used to determine a position of a touch event (e.g., a finger, stylus, or other object touching cover material 1916) on cover material 1916 using a mutual capacitance sensing technique. For example, electrodes 1914 can be driven with sinusoidal stimulation signals to capacitively couple with crossing columns of shaded electrodes of electrodes 1910, thereby forming a capacitive path for coupling charge from electrodes 1914 to the shaded electrodes of electrodes 1910. The crossing shaded electrodes of electrodes 1910 can output touch signals representing the coupled charge or current. When an object, such as a passive stylus, finger, etc., touches cover material 1916, the object can cause a capacitance between electrodes 1914 and the shaded electrodes of electrodes 1910 at the touch location to decrease. This capacitance change can be caused by charge or current from the stimulated electrode 1914 being shunted through the touching object to ground rather than being coupled to the crossing shaded electrode of electrode 1910 at the touch location. The touch signals representative of the capacitance change can be received by shaded electrodes of electrodes 1910 and transmitted to the sense circuitry (e.g., similar or identical to sense circuitry 320) for processing. The touch signals can indicate the touch region where the touch occurred. When combined with the amount of force determined using piezoelectric film 1908, electrodes 1906, and the white electrodes of electrode 1910, both the location of the touch event and amount of force applied to cover material 1916 can be determined. In other examples, the shaded electrodes of electrode 1910 can be driven with stimulation signals while electrode 1914 can be coupled to sense circuitry for detecting a location of a touch event on cover material 1916.

Figure 20:
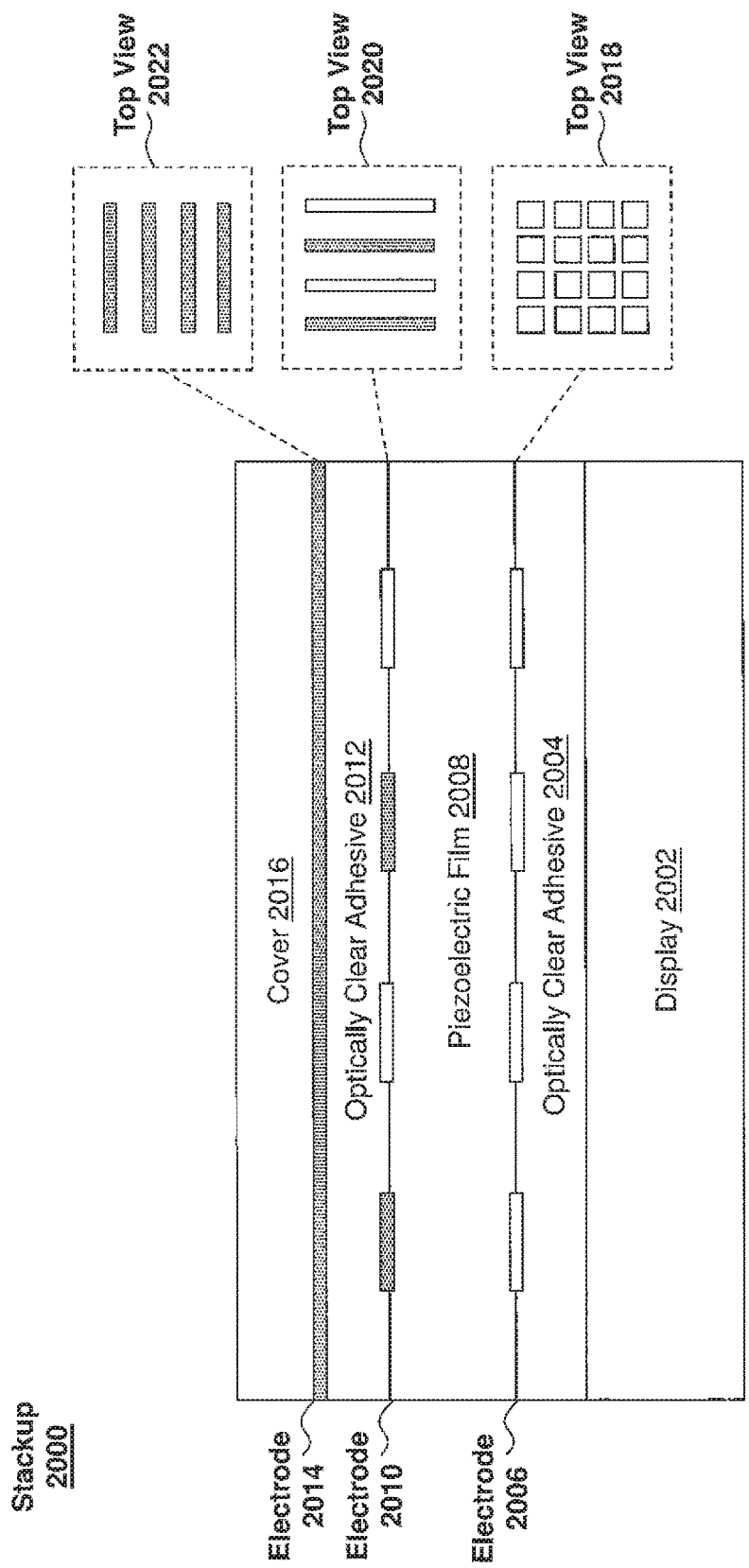

FIG. 20 illustrates a cross-sectional view of an exemplary stackup 2000 for a device. Stackup 2000 can include a display 2002, such as an LCD, LED display, OLED display, or the like, for generating images to be displayed by the device. Stackup 2000 can further include a piezoelectric film 2008 coupled to display 2002 by optically clear adhesive 2004. Piezoelectric film 2008 can include a transparent film capable of generating a localized electric charge in response to a deformation of the film. Piezoelectric film 2008 can further include a first electrode 2006 and a second electrode 2010 formed on opposite surfaces of the film. The electrodes can be formed from a transparent conductive material, such as ITO, PEDOT, or silver nanowire. Top views 2018 and 2020 show the shapes of electrodes 2006 and 2010, respectively, as viewed from above stackup 2000. In the illustrated example, electrode 2006 can include multiple discrete electrodes extending along the bottom surface of piezoelectric film 2008 and electrode 2010 can include multiple columns of discrete electrodes. Stackup 2000 can further include cover material 2016 (e.g., glass, plastic, or other rigid and transparent material) coupled to piezoelectric film 2008 by optically clear adhesive 2012. Cover material 2016 can include a third electrode 2014 formed on the bottom surface of the material. Top view 2022 shows the shape of electrode 2014 as viewed from above stackup 2000. In the illustrated example, electrode 2014 can include multiple rows of discrete electrodes. While FIG. 20 shows electrodes 2010 and 2014 each having four rectangular electrodes, it should be appreciated that electrodes 2010 and 2014 can each include any number of rectangular electrodes. Additionally, while FIG. 20 shows electrode 2006 having 16 square electrodes arranged in rows and columns, it should be appreciated that electrode 2006 can include any number of electrodes having any desired shaped and arranged in any desired pattern. Moreover, in other examples, the electrodes of electrodes 2010 can be arranged in rows, while the electrodes of electrode 2014 can be arranged in columns.

In some examples, a portion of the electrodes of electrode 2010 can be used for touch detection, while the remaining electrodes can be used to determine an amount of force applied to cover material 2016. To illustrate, the shaded electrodes of electrode 2010 shown in FIG. 20 can be used for touch detection, while the white electrodes can be used for force detection. Specifically the white electrodes of electrode 2010 can be coupled to ground and each electrode of electrode 2006 can be coupled to separate sense circuitry (not shown) similar or identical to sense circuitry 320 that is capable of detecting an amount of electric charge generated by the portion of piezoelectric film 2008 coupled to the electrode. During operation, as a user applies a downward force on cover material 2016, cover material 2016 can deform by an amount corresponding to an amount of the applied force. The deformation of cover material 2016 can cause a corresponding deformation in optically clear adhesive 2012 and piezoelectric film 2008. Piezoelectric film 2008 can then generate an amount of electric charge based on an amount of deformation of the film. The location of the generated electric charge can correspond to the location of the deformation of the film. The electrode of electrode 2006 positioned at or near the location of the deformation and that is electrically coupled to receive the generated charge can transmit the generated charge to its associated sense circuitry. Since the amount of electric charge generated by piezoelectric film 2008 can be representative of the amount of deformation of the film and because the amount of deformation of the film can be representative of the force applied to cover material 2016, the amount of electric charge detected by the sense circuitry can be representative of the force applied to cover material 2016. Additionally, since the location of the electrode of electrode 2006 receiving the generated charge is known, the location of the applied force can also be determined. In this way, the sense circuitry can be used to detect an amount and location of a force applied to cover material 2016. Moreover, the multiple electrodes of electrode 2006 and the separate sense circuitry coupled to each electrode allows for detection of multiple forces applied to different portions of cover material 2016.

Additionally, during operation, electrode 2014 and the shaded electrodes of electrode 2014 can be used to determine a position of a touch event (e.g., a finger, stylus, or other object touching cover material 2016) on cover material 2016 using a mutual capacitance sensing technique. For example, electrodes 2014 can be driven with sinusoidal stimulation signals to capacitively couple with crossing columns of shaded electrodes of electrodes 2010, thereby forming a capacitive path for coupling charge from electrodes 2014 to the shaded electrodes of electrodes 2010. The crossing shaded electrodes of electrodes 2010 can output touch signals representing the coupled charge or current. When an object, such as a passive stylus, finger, etc., touches cover material 2016, the object can cause a capacitance between electrodes 2014 and the shaded electrodes of electrodes 2010 at the touch location to decrease. This capacitance change can be caused by charge or current from the stimulated electrode 2014 being shunted through the touching object to ground rather than being coupled to the crossing shaded electrode of electrode 2010 at the touch location. The touch signals representative of the capacitance change can be received by shaded electrodes of electrodes 2010 and transmitted to the sense circuitry (e.g., similar or identical to sense circuitry 320) for processing. The touch signals can indicate the touch region where the touch occurred. When combined with the amount of force determined using piezoelectric film 2008, electrode 2006, and the white electrodes of electrode 2010, both the location of the touch event and amount of force applied to cover material 2016 can be determined. In other examples, the shaded electrodes of electrode 2010 can be driven with stimulation signals while electrode 2014 can be coupled to sense circuitry for detecting a location of a touch event on cover material 2016. Moreover, while electrode 2010 is shown with an alternating pattern of touch detection electrodes and force detection electrodes, it should be appreciated that any desired distribution of touch and force detection electrodes can be used.

Figure 21:
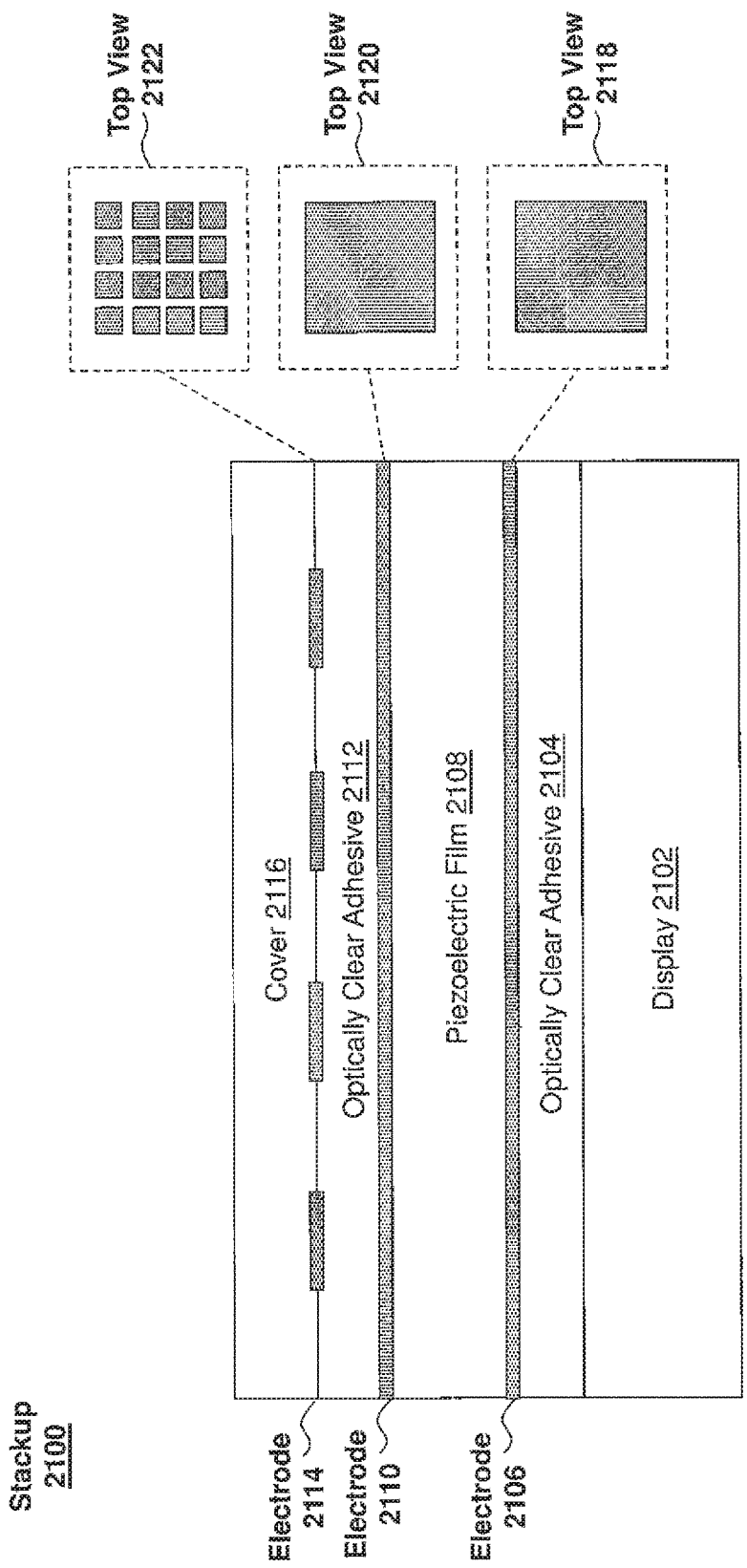

FIG. 21 illustrates a cross-sectional view of an exemplary stackup 2100 for a device. Stackup 2100 can include a display 2102, such as an LCD, LED display, OLED display, or the like, for generating images to be displayed by the device. Stackup 2100 can further include a piezoelectric film 2108 coupled to display 2102 by optically clear adhesive 2104. Piezoelectric film 2108 can include a transparent film capable of generating a localized electric charge in response to a deformation of the film. Piezoelectric film 2108 can further include a first electrode 2106 and a second electrode 2110 formed on opposite surfaces of the film. The electrodes can be formed from a transparent conductive material, such as ITO, PEDOT, or silver nanowire. Top views 2118 and 2120 show the shapes of electrodes 2106 and 2110, respectively, as viewed from above stackup 2100. In the illustrated example, electrodes 2106 and 2110 can extend along opposite surfaces of piezoelectric film 2108. Stackup 2100 can further include cover material 2116 (e.g., glass, plastic, or other rigid and transparent material) coupled to piezoelectric film 2108 by optically clear adhesive 2112. Cover material 2116 can include a third electrode 2114 formed on the bottom surface of the material. Top view 2122 shows the shape of electrode 2114 as viewed from above stackup 2100. In the illustrated example, electrode 2114 can include multiple discrete electrodes extending along the bottom surface of cover material 2116. While FIG. 21 shows electrode 2114 having 16 square electrodes arranged in rows and columns, it should be appreciated that electrode 2114 can include any number of electrodes having any desired shaped and arranged in any desired pattern. For example, a bridge-type arrangement can be used.

In some examples, electrode 2110 can be coupled to ground and electrode 2106 can be coupled to sense circuitry (not shown) similar or identical to sense circuitry 320 that is capable of detecting an amount of electric charge generated by piezoelectric film 2108. During operation, as a user applies a downward force on cover material 2116, cover material 2116 can deform by an amount corresponding to an amount of the applied force. The deformation of cover material 2116 can cause a corresponding deformation in optically clear adhesive 2112 and piezoelectric film 2108. Piezoelectric film 2108 can then generate an amount of electric charge based on an amount of deformation of the film. The generated electric charge can be received by the sense circuitry via electrode 2106. Since the amount of electric charge generated by piezoelectric film 2108 can be representative of the amount of deformation of the film and because the amount of deformation of the film can be representative of the force applied to cover material 2116, the amount of electric charge detected by the sense circuitry can be representative of the force applied to cover material 2116. In this way, the sense circuitry can be used to detect an amount of force applied to cover material 2116.

Additionally, during operation, electrodes 2110 and 2114 can be used to determine a position of a touch event (e.g., a finger, stylus, or other object touching cover material 2116) on cover material 2116 using a self capacitance sensing technique. For example, each electrode of electrode 2114 can be coupled to a voltage source and sense circuitry. The sense circuitry can measure a change in capacitance at each electrode caused by an object, such as a passive stylus, finger, etc., touching cover material 2116. The capacitance change can be caused by charge or current from the electrode of electrode 2114 being shunted through the touching object to ground. The detected change in capacitance measured by the sense circuitry can be representative of a touch event occurring at a location corresponding to the associated electrode of electrode 2114. When combined with the amount of force determined using piezoelectric film 2108 and electrodes 2106 and 2110, both the location of the touch event and amount of force applied to cover material 2116 can be determined.

Figure 22:
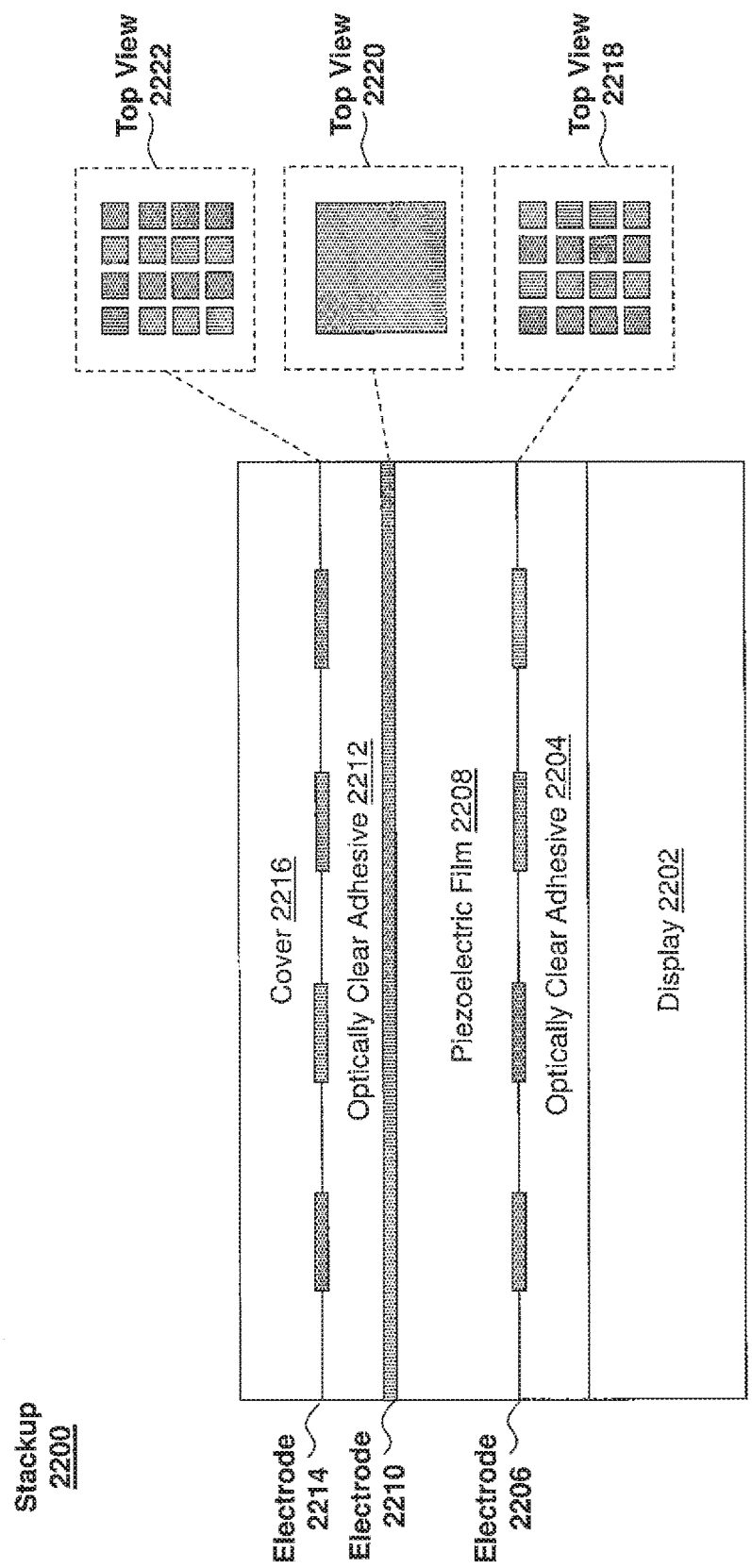

FIG. 22 illustrates a cross-sectional view of an exemplary stackup 2200 for a device. Stackup 2200 can include a display 2202, such as an LCD, LED display, OLED display, or the like, for generating images to be displayed by the device. Stackup 2200 can further include a piezoelectric film 2208 coupled to display 2202 by optically clear adhesive 2204. Piezoelectric film 2208 can include a transparent film capable of generating a localized electric charge in response to a deformation of the film. Piezoelectric film 2208 can further include a first electrode 2206 and a second electrode 2210 formed on opposite surfaces of the film. The electrodes can be formed from a transparent conductive material, such as ITO, PEDOT, or silver nanowire. Top views 2218 and 2220 show the shapes of electrodes 2206 and 2210, respectively, as viewed from above stackup 2200. In the illustrated example, electrode 2210 can extend along the top surface of piezoelectric film 2208 and electrode 2206 can include multiple discrete electrodes extending along the bottom surface of piezoelectric film 2208. Stackup 2200 can further include cover material 2216 (e.g., glass, plastic, or other rigid and transparent material) coupled to piezoelectric film 2208 by optically clear adhesive 2212. Cover material 2216 can include a third electrode 2214 formed on the bottom surface of the material. Top view 2222 shows the shape of electrode 2214 as viewed from above stackup 2200. In the illustrated example, electrode 2214 can include multiple discrete electrodes extending along the bottom surface of cover material 2216. While FIG. 22 shows electrodes 2206 and 2214 having 16 square electrodes arranged in rows and columns, it should be appreciated that electrodes 2206 and 2214 can include any number of electrodes having any desired shaped and arranged in any desired pattern.

Electrode 2210 can be coupled to ground and each electrode of electrode 2206 can be coupled to separate sense circuitry (not shown) similar or identical to sense circuitry 320 that is capable of detecting an amount of electric charge generated by the portion of piezoelectric film 2208 coupled to the electrode. During operation, as a user applies a downward force on cover material 2216, cover material 2216 can deform by an amount corresponding to an amount of the applied force. The deformation of cover material 2216 can cause a corresponding deformation in optically clear adhesive 2212 and piezoelectric film 2208. Piezoelectric film 2208 can then generate an amount of electric charge based on an amount of deformation of the film and at a location of the deformation of the film. The electrode of electrode 2206 positioned at or near the location of the deformation and that is electrically coupled to receive the generated charge can transmit the generated charge to its associated sense circuitry. Since the amount of electric charge generated by piezoelectric film 2208 can be representative of the amount of deformation of the film and because the amount of deformation of the film can be representative of the force applied to cover material 2216, the amount of electric charge detected by the sense circuitry can be representative of the force applied to cover material 2216. Additionally, since the location of the electrode of electrode 2206 receiving the generated charge is known, the location of the applied force can also be determined. In this way, the sense circuitry can be used to detect an amount and location of a force applied to cover material 2216. Moreover, the multiple electrodes of electrode 2206 and the separate sense circuitry coupled to each electrode allows for detection of multiple forces applied to different portions of cover material 2216.

Additionally, during operation, electrodes 2210 and 2214 can be used to determine a position of a touch event (e.g., a finger, stylus, or other object touching cover material 2216) on cover material 2216 using a self capacitance sensing technique. For example, each electrode of electrode 2214 can be coupled to a voltage source and sense circuitry. The sense circuitry can measure a change in capacitance at each electrode caused by an object, such as a passive stylus, finger, etc., touching cover material 2216. The capacitance change can be caused by charge or current from the electrode of electrode 2214 being shunted through the touching object to ground. The detected change in capacitance measured by the sense circuitry can be representative of a touch event occurring at a location corresponding to the associated electrode of electrode 2214. When combined with the amount of force determined using piezoelectric film 2208 and electrodes 2206 and 2210, both the location of the touch event and amount of force applied to cover material 2216 can be determined.

Figure 23:
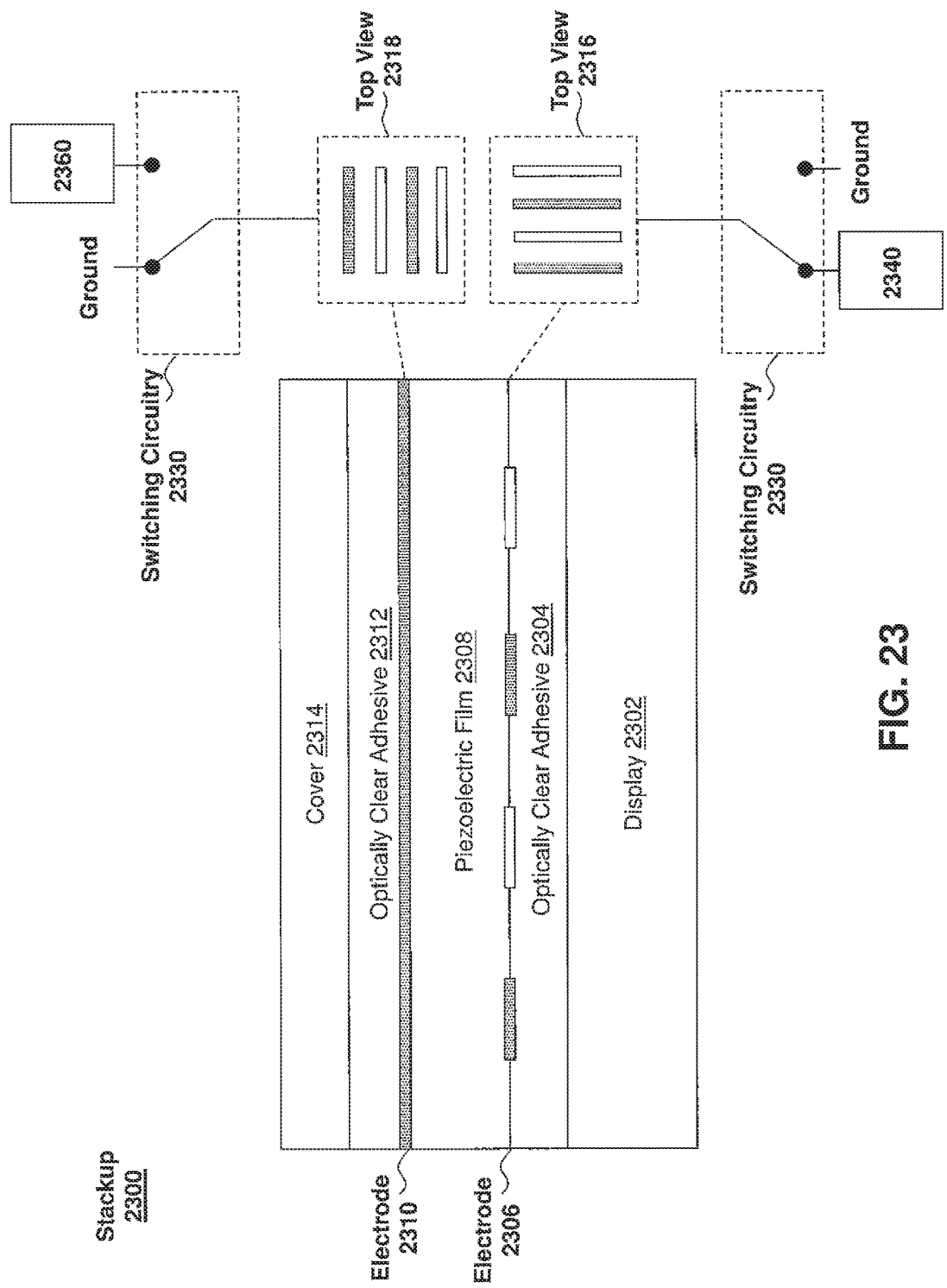

FIG. 23 illustrates a cross-sectional view of another exemplary stackup 2300 for a device. Stackup 2300 can include a display 2302, such as an LCD, LED display, OLED display, or the like, for generating images to be displayed by the device. Stackup 2300 can further include a piezoelectric film 2308 coupled to display 2302 by optically clear adhesive 2304. Piezoelectric film 2308 can include a transparent film capable of generating a localized electric charge in response to a deformation of the film. Piezoelectric film 2308 can include a first electrode 2306 and a second electrode 2310 formed on opposite surfaces of the film. The electrodes can be formed from a transparent conductive material, such as ITO, PEDOT, or silver nanowire. Top views 2316 and 2318 show the shapes of electrodes 2306 and 2310, respectively, as viewed from above stackup 2300. In the illustrated example, electrode 2306 can include multiple columns of discrete electrodes and electrode 2310 can include multiple rows of discrete electrodes. Stackup 2300 can further include cover material 2314 (e.g., glass, plastic, or other rigid and transparent material) coupled to piezoelectric film 2308 by optically clear adhesive 2312. While FIG. 23 shows electrodes 2306 and 2310 each having four rectangular electrodes arranged in columns and rows, respectively, it should be appreciated that electrodes 2306 and 2310 can each include any number of rectangular electrodes and can instead be arranged in rows and columns, respectively.

In some examples, a portion of the electrodes of electrode 2306 and a portion of the electrodes of electrode 2310 can be used for touch detection, while the remaining electrodes of electrode 2306 and 2310 can be used to determine an amount of force applied to cover material 2314. To illustrate, the shaded electrodes of electrode 2306 and 2310 shown in FIG. 23 can be used for touch detection, while the white electrodes can be used for force detection. Specifically, the white electrodes of electrode 2306 can be coupled to ground and the white electrodes of electrode 2310 can be coupled to sense circuitry (not shown) similar or identical to sense circuitry 320 that is capable of detecting an amount of electric charge generated by piezoelectric film 2308. During operation, as a user applies a downward force on cover material 2314, cover material 2314 can deform by an amount corresponding to an amount of the applied force. The deformation of cover material 2314 can cause a corresponding deformation in optically clear adhesive 2312, and piezoelectric film 2308. Piezoelectric film 2308 can then generate an amount of electric charge based on an amount of deformation of the film. The generated electric charge can be received by the sense circuitry via the white electrodes of electrode 2310. Since the amount of electric charge generated by piezoelectric film 2308 can be representative of the amount of deformation of the film and because the amount of deformation of the film can be representative of the force applied to cover material 2314, the amount of electric charge detected by the sense circuitry can be representative of the force applied to cover material 2314. In this way, the sense circuitry can be used to detect an amount of force applied to cover material 2314. In other examples, the white electrodes of electrode 2310 can be coupled to ground and the white electrodes of electrode 2306 can each be coupled to sense circuitry to detect a force applied to cover material 2314 in a manner similar to that described above with respect to FIG. 23. In yet other examples, using optional switching circuitry 2330, white electrodes of electrode 2306 can be coupled to ground and white electrodes of electrode 2310 can be coupled to separate sense circuitry 2360 (e.g., similar or identical to sense circuitry 320). The sense circuitry 2360 can be used to determine both an amount and location along one of the white electrodes of electrode 2310 of an applied force. Using switching circuitry 2330 coupled to white electrodes of electrodes 2306 and 2310, white electrodes of electrode 2306 can then be coupled to separate sense circuitry 2340 (e.g., similar or identical to sense circuitry 320) and white electrodes of electrode 2310 can then be coupled to ground. The sense circuitry 2340 can be used to determine both an amount and location along one of the white electrodes of electrode 2306 of an applied force. The intersection of the determined row and column can be interpreted as a location of the force on cover material 2314.

Additionally, during operation, the shaded electrodes of electrodes 2306 and 2310 can be used to determine a position of a touch event (e.g., a finger, stylus, or other object touching cover material 2316) on cover material 2314 using a mutual capacitance sensing technique. For example, the shaded electrodes of electrode 2310 can be driven with sinusoidal stimulation signals to capacitively couple with crossing columns of shaded electrodes of electrodes 2306, thereby forming a capacitive path for coupling charge from electrodes 2310 to the shaded electrodes of electrodes 2306. The crossing shaded electrodes of electrodes 2306 can output touch signals representing the coupled charge or current. When an object, such as a passive stylus, finger, etc., touches cover material 2314, the object can cause a capacitance between electrodes 2310 and the shaded electrodes of electrodes 2306 at the touch location to decrease. This capacitance change can be caused by charge or current from the stimulated electrode 2310 being shunted through the touching object to ground rather than being coupled to the crossing shaded electrode of electrode 2306 at the touch location. The touch signals representative of the capacitance change can be received by shaded electrodes of electrodes 2306 and transmitted to the sense circuitry (e.g., similar or identical to sense circuitry 320) for processing. The touch signals can indicate the touch region where the touch occurred. When combined with the amount of force determined using piezoelectric film 2308 and the white electrodes of electrodes 2306 and 2310, both the location of the touch event and amount of force applied to cover material 2314 can be determined. In other examples, the shaded electrodes of electrode 2306 can be driven with stimulation signals while electrode 2310 can be coupled to sense circuitry for detecting a location of a touch event on cover material 2314.

Figure 24:
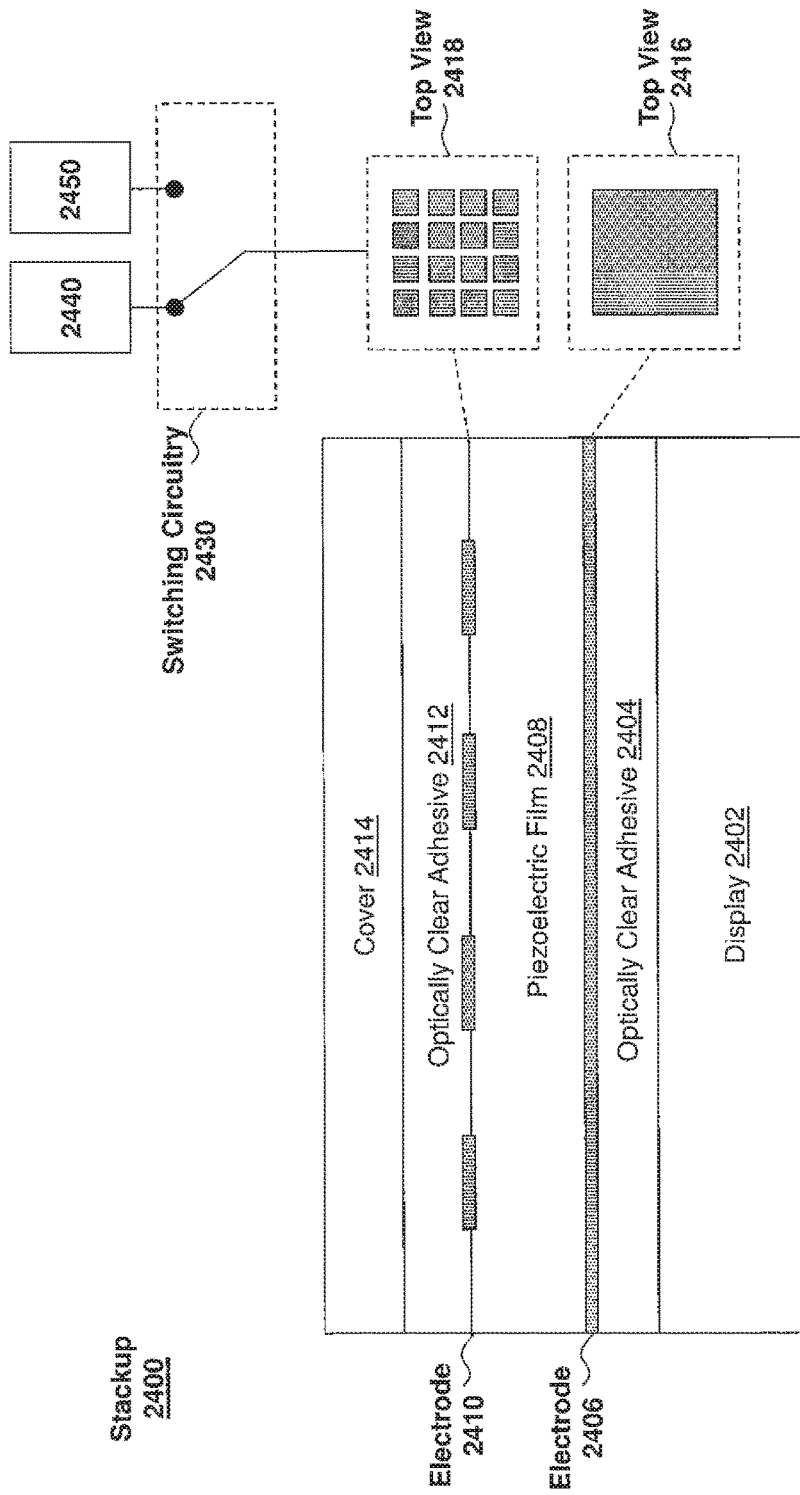

FIG. 24 illustrates a cross-sectional view of another exemplary stackup 2400 for a device. Stackup 2400 can include a display 2402, such as an LCD, LED display, OLED display, or the like, for generating images to be displayed by the device. Stackup 2400 can further include a piezoelectric film 2408 coupled to display 2402 by optically clear adhesive 2404. Piezoelectric film 2408 can include a transparent film capable of generating a localized electric charge in response to a deformation of the film. Piezoelectric film 2408 can include a first electrode 2406 and a second electrode 2410 formed on opposite surfaces of the film. The electrodes can be formed from a transparent conductive material, such as ITO, PEDOT, or silver nanowire. Top views 2416 and 2418 show the shapes of electrodes 2406 and 2410, respectively, as viewed from above stackup 2400. In the illustrated example, electrode 2406 can extend along the bottom surface of piezoelectric film 2408 and electrode 2410 can include multiple discrete electrodes extending along the top surface of piezoelectric film 2408. Stackup 2400 can further include cover material 2414 (e.g., glass, plastic, or other rigid and transparent material) coupled to piezoelectric film 2408 by optically clear adhesive 2412. While FIG. 24 shows electrode 2410 having 16 square electrodes arranged in columns and rows, it should be appreciated that electrode 2410 can include any number of electrodes having any desired shaped and arranged in any desired pattern. Moreover, in other examples, electrode 2406 can be formed on the top surface of piezoelectric film 2408 and electrode 2410 can be formed on the bottom surface of piezoelectric film 2406.

In some examples, electrodes 2410 and 2406 can be used for both touch detection and determining an amount of force applied to cover material 2414. In these examples, the use of electrodes 2410 and 2406 can be time multiplexed such that both electrodes 2406 and 2410 can alternatingly be used for touch and force detection. For example, during operation, electrode 2406 can be coupled to ground and each electrode of electrode 2410 can be coupled to switching circuitry 2430 operable to selectively couple the electrodes to either force sense circuitry 2440 (e.g., similar or identical to sense circuitry 320) or touch sense circuitry 2450 (e.g., similar or identical to sense circuitry 200). The switching circuitry 2430 can switch between the force sense circuitry 2440 and the touch sense circuitry 2450 periodically, intermittently, or at any desired intervals of time. In this way, the device can detect both touch events and determine an amount of force being applied to cover material 2414.

During operation, when the switching circuitry 2430 couples the electrodes of electrode 2410 to the force sense circuitry 2440, as a user applies a downward force on cover material 2414, cover material 2414 can deform by an amount corresponding to an amount of the applied force. The deformation of cover material 2414 can cause a corresponding deformation in optically clear adhesive 2412 and piezoelectric film 2408. Piezoelectric film 2408 can then generate an amount of electric charge based on an amount of deformation of the film. The generated electric charge can be received by the force sense circuitry 2440 via electrode 2410. Since the amount of electric charge generated by piezoelectric film 2408 can be representative of the amount of deformation of the film and because the amount of deformation of the film can be representative of the force applied to cover material 2414, the amount of electric charge detected by the force sense circuitry 2440 can be representative of the force applied to cover material 2414. In this way, the force sense circuitry 2440 can be used to detect an amount of force applied to cover material 2414.

Additionally, during operation, when the switching circuitry 2430 couples the electrodes of electrode 2410 to the touch sense circuitry 2450, each electrode of 2410 can be coupled to a voltage source and sense circuitry of the touch sense circuitry 2450 to perform a self capacitance sensing technique. The sense circuitry 2450 can measure a change in capacitance at each electrode caused by an object, such as a passive stylus, finger, etc., touching cover material 2414. The capacitance change can be caused by charge or current from the electrode of electrode 2410 being shunted through the touching object to ground. The detected change in capacitance measured by the sense circuitry 2450 can be representative of a touch event occurring at a location corresponding to the associated electrode of electrode 2410. Thus, electrodes 2406 and 2410 can be used to both determine a location of a touch event and an amount of force applied to cover material 2414.

Figure 25:
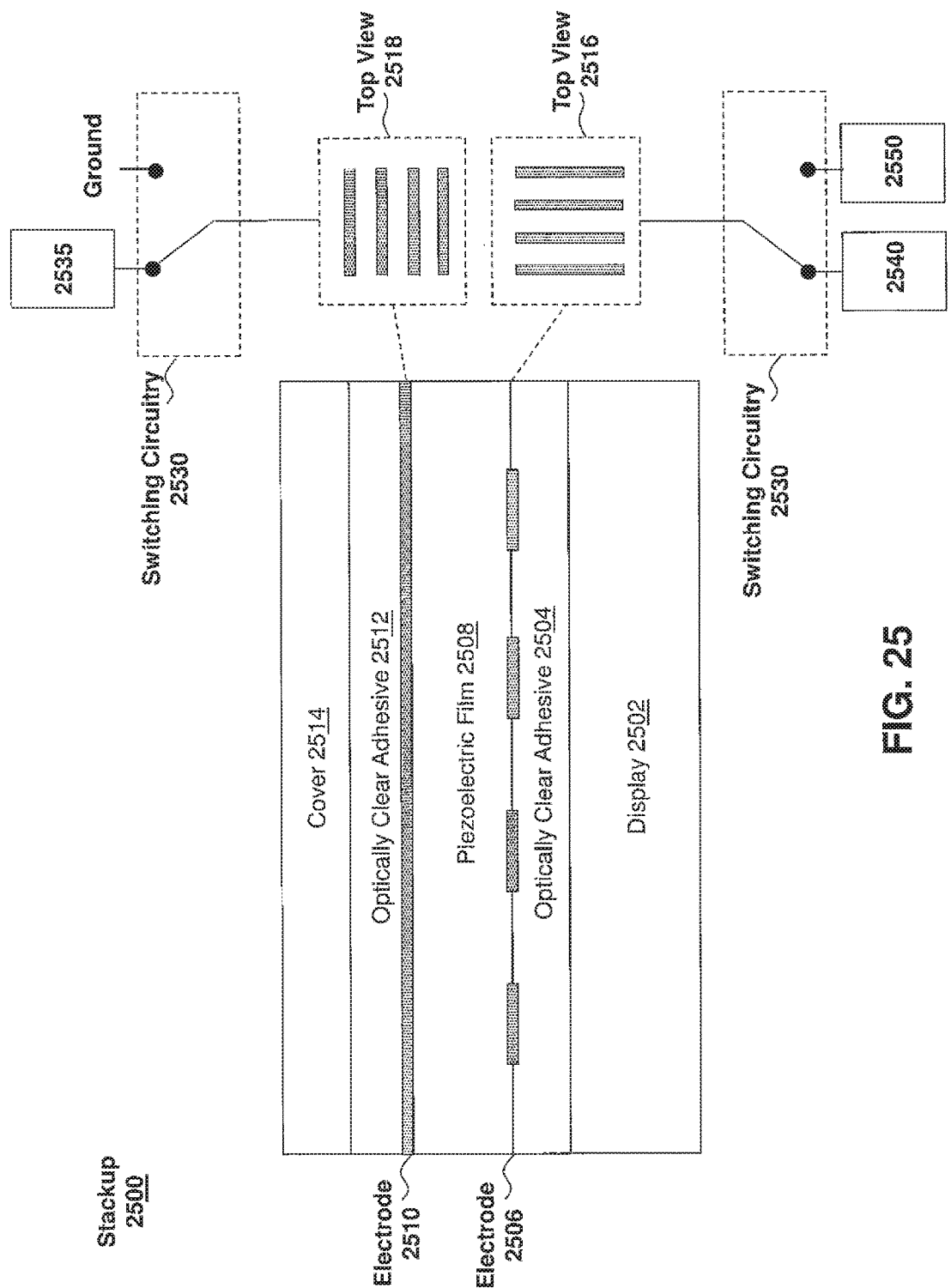

FIG. 25 illustrates a cross-sectional view of another exemplary stackup 2500 for a device. Stackup 2500 can include a display 2502, such as an LCD, LED display, OLED display, or the like, for generating images to be displayed by the device. Stackup 2500 can further include a piezoelectric film 2508 coupled to display 2502 by optically clear adhesive 2504. Piezoelectric film 2508 can include a transparent film capable of generating a localized electric charge in response to a deformation of the film. Piezoelectric film 2508 can include a first electrode 2506 and a second electrode 2510 formed on opposite surfaces of the film. The electrodes can be formed from a transparent conductive material, such as ITO, PEDOT, or silver nanowire. Top views 2516 and 2518 show the shapes of electrodes 2506 and 2510, respectively, as viewed from above stackup 2500. In the illustrated example, electrode 2506 can include multiple discrete columns of electrodes and electrode 2510 can include multiple discrete rows of electrodes. Stackup 2500 can further include cover material 2514 (e.g., glass, plastic, or other rigid and transparent material) coupled to piezoelectric film 2508 by optically clear adhesive 2512. While FIG. 25 shows electrodes 2506 and 2510 having four rectangular electrodes arranged in columns and rows, respectively, it should be appreciated that electrodes 2506 and 2510 can include any number of rectangular electrodes and can instead be arranged in rows and columns, respectively.

In some examples, electrodes 2510 and 2506 can be used for both touch detection and determining an amount of force applied to cover material 2514. In these examples, the use of electrodes 2510 and 2506 can be time multiplexed such that both electrodes 2506 and 2510 can alternatingly be used for touch and force detection. For example, during operation, the electrodes of electrode 2510 can be coupled switching circuitry 2530 operable to selectively couple each electrode of electrode 2510 to drive circuitry 2535 (e.g., similar or identical to drive circuits 108) or to ground. The electrodes of electrode 2506 can be coupled to switching circuitry 2530 operable to couple each electrode of electrode 2506 to either force sense circuitry 2550 (e.g., similar or identical to sense circuitry 320) or touch sense circuitry 2540 (e.g., similar or identical to sense circuitry 200). The switching circuitry 2530 coupled to electrodes 2506 and 2510 can selectively switch periodically, intermittently, or at any desired intervals of time. In this way, the device can detect both touch events and determine an amount of force being applied to cover material 2514.

During operation, when the switching circuitry 2530 coupled to electrode 2510 couples the electrodes to ground, the switching circuitry 2530 coupled to electrode 2506 can couple the electrodes of electrode 2506 to the force sense circuitry 2550. During this time, as a user applies a downward force on cover material 2514, cover material 2514 can deform by an amount corresponding to an amount of the applied force. The deformation of cover material 2514 can cause a corresponding deformation in optically clear adhesive 2512 and piezoelectric film 2508. Piezoelectric film 2508 can then generate an amount of electric charge based on an amount of deformation of the film. The generated electric charge can be received by the force sense circuitry 2550 via electrode 2506. Since the amount of electric charge generated by piezoelectric film 2508 can be representative of the amount of deformation of the film and because the amount of deformation of the film can be representative of the force applied to cover material 2514, the amount of electric charge detected by the force sense circuitry 2550 can be representative of the force applied to cover material 2514. In this way, the force sense circuitry 2550 can be used to detect an amount of force applied to cover material 2514.

Additionally, during operation, when the switching circuitry 2530 coupled to electrode 2510 couples the electrodes to drive circuitry 2535, the switching circuitry 2530 coupled to electrode 2506 can couple the electrodes of electrode 2506 to the touch sense circuitry 2540 (e.g., similar or identical to sense circuitry 200) to perform a mutual capacitance sensing technique. During this time, each electrode of 2510 can be driven with sinusoidal stimulation signals from the drive circuitry 2535 to capacitively couple with crossing columns of electrodes of electrodes 2506, thereby forming a capacitive path for coupling charge from electrodes 2510 to the electrodes of electrodes 2506. The crossing electrodes of electrodes 2506 can output touch signals representing the coupled charge or current. When an object, such as a passive stylus, finger, etc., touches cover material 2514, the object can cause a capacitance between electrodes 2510 and the shaded of electrodes 2506 at the touch location to decrease. This capacitance change can be caused by charge or current from the stimulated electrode 2510 being shunted through the touching object to ground rather than being coupled to the crossing electrode of electrode 2506 at the touch location. The touch signals representative of the capacitance change can be received by electrodes of electrodes 2506 and transmitted to the sense circuitry for processing. The touch signals can indicate the touch region where the touch occurred. Thus, electrodes 2506 and 2510 can be used to both determine a location of a touch event and an amount of force applied to cover material 2514.

In some examples, any of the stackups shown in FIGS. 13-25 can further include a polarizer between the display and piezoelectric film or between the cover material and piezoelectric film.

Figure 26:
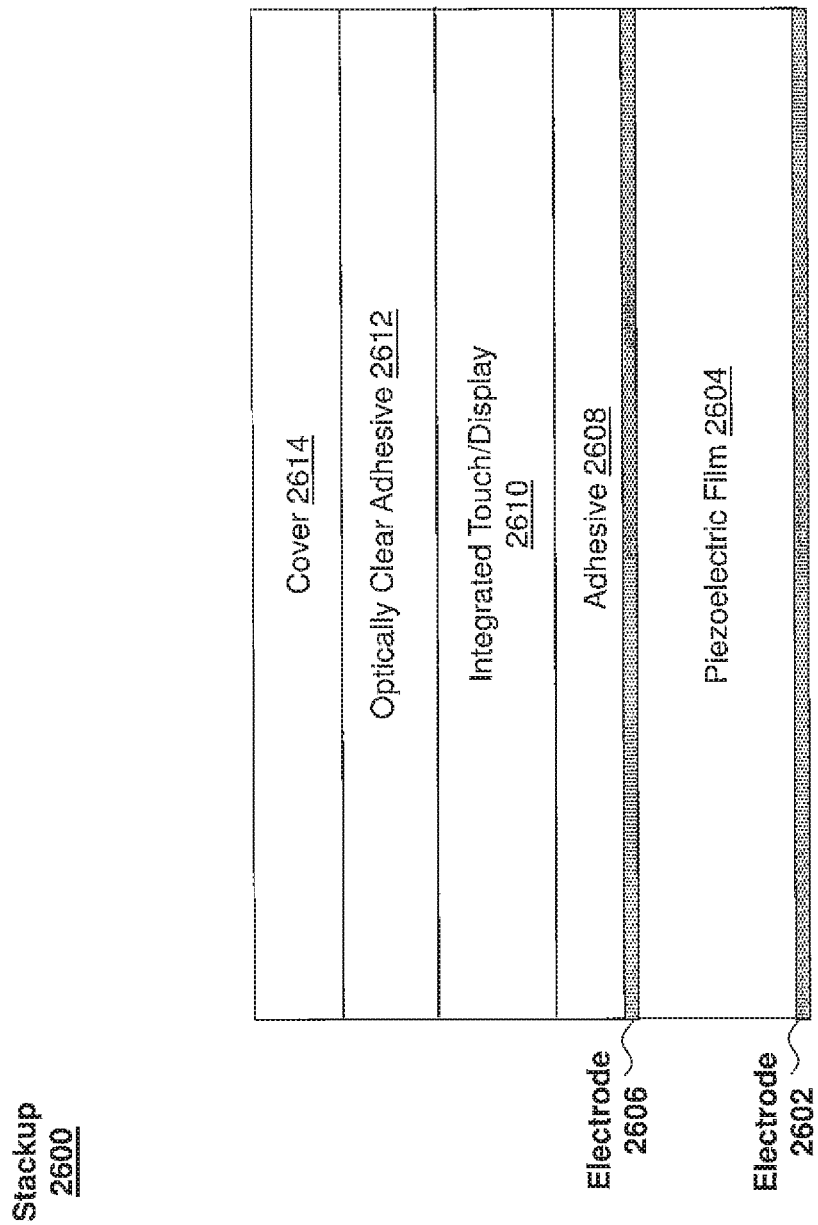

While the examples described above with respect to FIGS. 8-25 include displays that are separate from the touch sensor and/or electrodes used for touch detection, it should be appreciated that the piezoelectric film can similarly be used with integrated touch displays capable of both generating a display and performing touch detection. For example, FIG. 26 illustrates a cross-sectional view of another exemplary stackup 2600 for a device containing an integrated touch display. Stackup 2600 can include a piezoelectric film 2604 formed from a transparent film capable of generating a localized electric charge in response to a deformation of the film. Piezoelectric film 2604 can include a first electrode 2602 and a second electrode 2606 formed on opposite surfaces of the film. The electrodes can be formed from a transparent or non-transparent conductive material, such as ITO, PEDOT, silver ink, silver nanowire, or copper. Stackup 2600 can further include integrated touch/display 2610 coupled to piezoelectric film 2604 by adhesive 2608. It should be appreciated that unlike the examples described above, electrodes 2602 and 2606, piezoelectric film 2604, and adhesive 2608 need not be transparent or optically clear since they are located behind the integrated touch/display 2610. Integrated touch/display 2610 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry.

Figure 27:
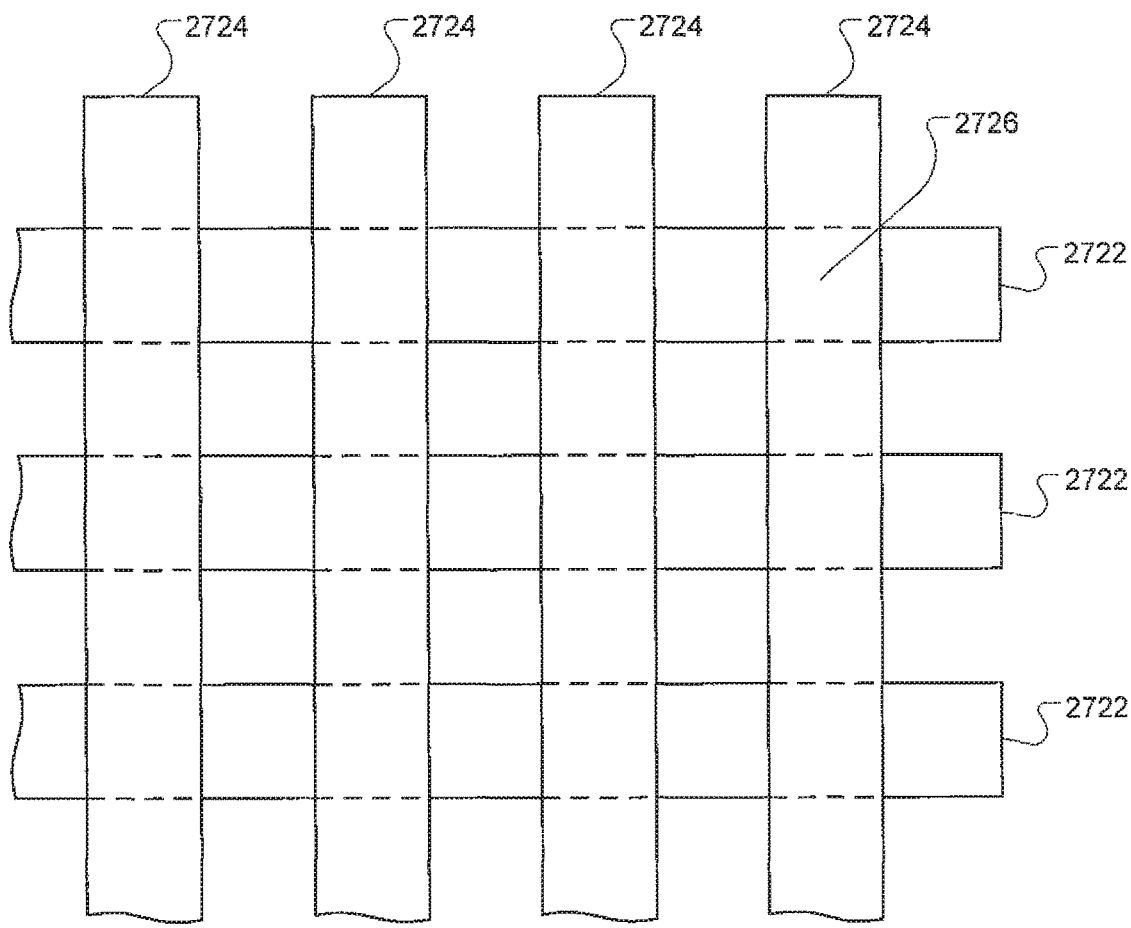
FIGS. 27 and 28 illustrate an exemplary integrated touch display according to various examples.

For example, FIG. 27 shows an example configuration of drive lines 2722 and sense lines 2724 of an integrated touch-and/or force-screen according to various examples. As shown in FIG. 27, each drive line 2722 may extend in a first common direction and each sense line 2724 in a second common direction. The presence of a finger or other capacitive object at or near a node 2726 (e.g., an overlap or intersection of a drive line and sense line) may change the capacitance between the drive line and sense line of that node. This change in capacitance may be used to detect a touch or near-touch event. Typically, such configurations as shown in FIG. 27 place the drive and sense lines on separate planes.

In another embodiment, the drive and sense lines may be coplanar. For example, each drive line can be formed of one or more drive line segments that can be electrically connected by drive line links. Drive line links are not electrically connected to sense lines; rather, the drive line links can bypass the sense lines through bypasses. Drive lines and sense lines can interact capacitively to form touch nodes. Drive lines (e.g., drive line segments and corresponding drive line links) and sense lines can be formed of electrical circuit elements in touch screen. Each of touch nodes and can include at least a portion of one drive line segment, a portion of a sense line, and a portion of another drive line segment. For example, one touch pixel can include a right-half portion of a drive line segment on one side of a sense line, and a left-half portion of a drive line segment on the opposite side of the sense line.

Figure 28:
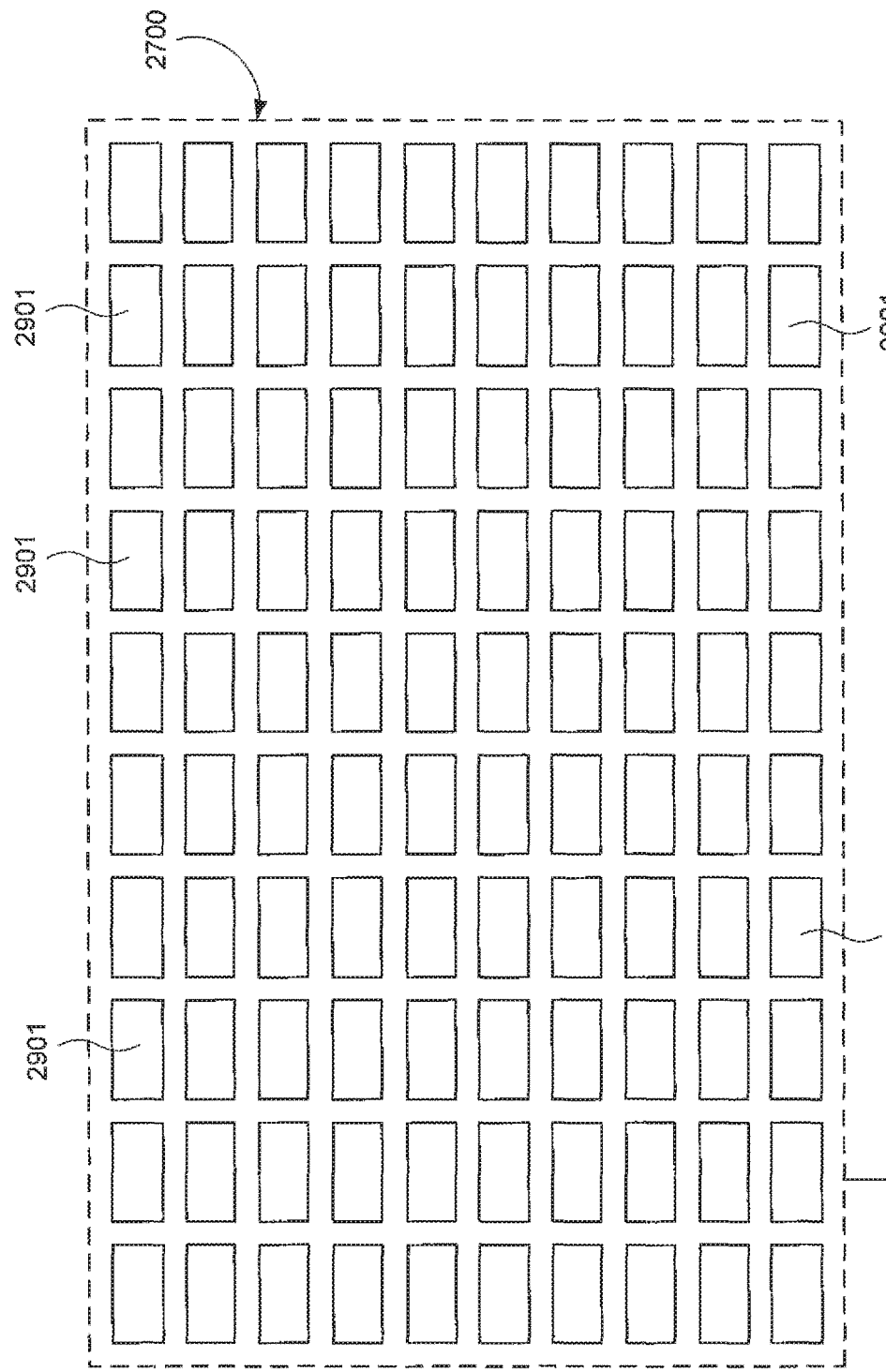

FIG. 28 generally shows another sample embodiment of a touch- and force-sensitive display or screen. Here, each node takes the form of a pixel that may capacitively sense a touch or near-touch event and/or, in some applications, an exertion of force. Each pixel is separately routed to circuitry 2903 to measure changes in capacitance. Thus, each pixel has its own routing and electrical connection to the circuitry 2903, rather than sharing a drive and/or sense line as adjacent nodes may in the embodiment of FIG. 27.

In some embodiments, common electrodes can form portions of the touch sensing circuitry of a touch sensing system. Common electrodes can be circuit elements of the display system circuitry in the stackup (e.g., the stacked material layers forming the display pixels) of the display pixels of some types of conventional LCD displays, e.g., fringe field switching (FFS) displays, that can operate as part of the display system to display an image. In one example, a common electrode can serve as a multi-function circuit element that can operate as display circuitry of the display system of touch screen and can also operate as touch sensing circuitry of the touch sensing system. In this example, common electrode can operate as a common electrode of the display circuitry of the touch screen, and can also operate together when grouped with other common electrodes as touch sensing circuitry of the touch screen. For example, a group of common electrodes can operate together as a capacitive part of a drive line or a sense line of the touch sensing circuitry during the touch sensing phase. Other circuit elements of touch screen can form part of the touch sensing circuitry by, for example, electrically connecting together common electrodes of a region, switching electrical connections, etc. In general, each of the touch sensing circuit elements may be either a multi-function circuit element that can form part of the touch sensing circuitry and can perform one or more other functions, such as forming part of the display circuitry, or may be a single-function circuit element that can operate as touch sensing circuitry only. Similarly, each of the display circuit elements may be either a multi-function circuit element that can operate as display circuitry and perform one or more other functions, such as operating as touch sensing circuitry, or may be a single-function circuit element that can operate as display circuitry only. Therefore, in some examples, some of the circuit elements in the display pixel stackups can be multi-function circuit elements and other circuit elements may be single-function circuit elements. In other embodiments, all of the circuit elements of the display pixel stackups may be single-function circuit elements.

As one further example, common electrodes may be grouped together to form drive region segments and sense regions that generally correspond to drive line segments and sense lines, respectively. Grouping multi-function circuit elements of display pixels into a region can mean operating the multi-function circuit elements of the display pixels together to perform a common function of the region. Grouping into functional regions may be accomplished through one or a combination of approaches, for example, the structural configuration of the system (e.g., physical breaks and bypasses, voltage line configurations), the operational configuration of the system (e.g., switching circuit elements on/off, changing voltage levels and/or signals on voltage lines), and so on.

Referring back to FIG. 26, stackup 2600 can further include cover material 2614 (e.g., glass, plastic, or other rigid and transparent material) coupled to integrated touch/display 2610 by optically clear adhesive 2612.

Electrodes 2602 and 2606 can be configured to determine an amount of force applied to cover material 2614 in various ways. In one example, electrodes 2602 and 2606 can be configured to be similar or identical to electrodes 306 and 310, respectively, and can be used to determine an amount of force applied to cover material 2614 in a manner similar to that described above. In another example, electrodes 2602 and 2606 can be configured to be similar or identical to electrodes 406 and 410, respectively, and can be used to determine an amount of force applied to cover material 2614 in a manner similar to that described above. In another example, electrodes 2602 and 2606 can be configured to be similar or identical to electrodes 506 and 510, respectively, and can be used to determine an amount of force applied to cover material 2614 in a manner similar to that described above. In another example, electrodes 2602 and 2606 can be configured to be similar or identical to electrodes 606 and 610, respectively, and can be used to determine an amount of force applied to cover material 2614 in a manner similar to that described above. In another example, piezoelectric film 2604 and electrodes 2602 and 2606 can be replaced with two piezoelectric films similar or identical to piezoelectric films 708 and 712 and electrodes similar or identical to electrodes 706, 710, and 714. These piezoelectric films and electrodes can be used to determine an amount of force applied to cover material 2614 in a manner similar to that described above.

In some examples, the above described piezoelectric film and electrode configurations can be positioned behind the display of a device. For example, in LCD displays, the piezoelectric film and electrodes can be laminated to the back of the polarizer while, in OLED displays, they can be laminated to the back of the OLED display. The following stackups illustrate various stackup configurations that can be used for LCD and OLED displays where the piezoelectric film and electrodes are positioned behind the display of the device.

Figure 29:
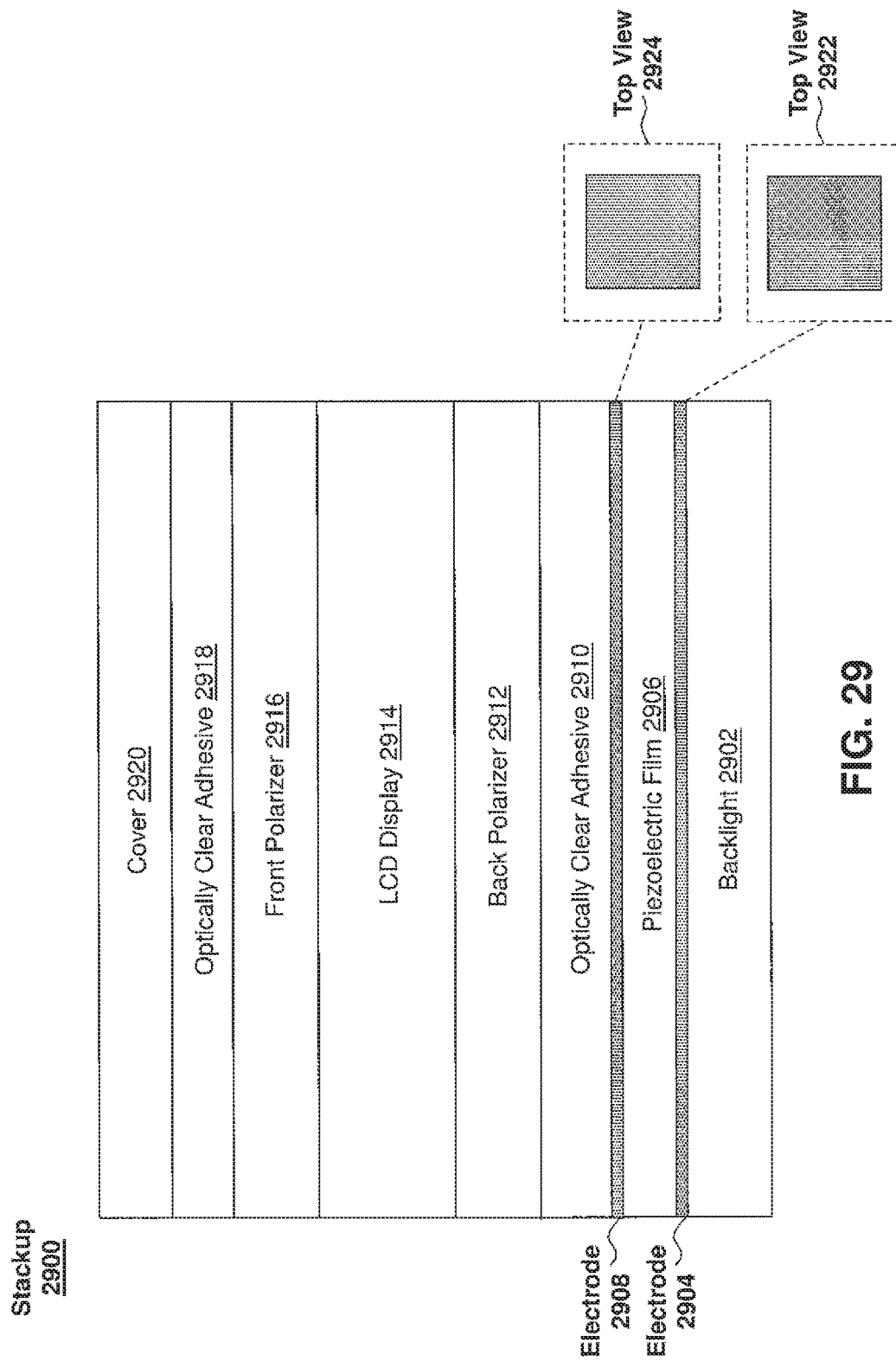
FIGS. 29-58 illustrate exemplary stackups for a device having a piezoelectric film for detecting force according to various examples.

FIG. 29 illustrates a cross-sectional view of another exemplary stackup 2900 for a device containing an integrated LCD touch/display 2914. Stackup 2900 can include a backlight unit 2902 coupled to a piezoelectric film 2906 formed from a transparent film capable of generating a localized electric charge in response to a deformation of the film. Piezoelectric film 2906 can include a first electrode 2904 and a second electrode 2908 formed on opposite surfaces of the film. The electrodes can be formed from a transparent conductive material, such as ITO, PEDOT, or silver nanowire. Top views 2922 and 2924 show the shapes of electrodes 2904 and 2908, respectively, as viewed from above stackup 2900. In the illustrated example, electrodes 2904 and 2908 can both have a shape that substantially matches that of piezoelectric film 2906 and can extend along the surfaces of piezoelectric film 2906.

Stackup 2900 can further include integrated LCD touch/display 2914 coupled between a back polarizer 2912 and front polarizer 2916. The back polarizer can be coupled to piezoelectric film 2906 by optically clear adhesive 2910. Integrated touch/display 2914 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 2900 can further include cover material 2920 (e.g., glass, plastic, or other rigid and transparent material) coupled to front polarizer 2916 by optically clear adhesive 2918.

In some examples, electrode 2904 can be coupled to ground and electrode 2908 can be coupled to sense circuitry (not shown) similar or identical to sense circuitry 320 that is capable of detecting an amount of electric charge generated by piezoelectric film 2906. During operation, as a user applies a downward force on cover material 2920, cover material 2920 can deform by an amount corresponding to an amount of the applied force. The deformation of cover material 2920 can cause a corresponding deformation in optically clear adhesive 2918, polarizers 2916 and 2912, LCD display 2914, optically clear adhesive 2910, and piezoelectric film 2906. Piezoelectric film 2906 can then generate an amount of electric charge based on the amount of deformation of the film. The generated electric charge can be received by the sense circuitry via electrode 2908. Since the amount of electric charge generated by piezoelectric film 2906 can be representative of the amount of deformation of the film and because the amount of deformation of the film can be representative of the force applied to cover material 2920, the amount of electric charge detected by the sense circuitry can be representative of the force applied to cover material 2920. In this way, the sense circuitry can be used to detect an amount of force applied to cover material 2920. In other examples, electrode 2908 can be coupled to ground and electrode 2904 can be coupled to the sense circuitry. In these examples, the sense circuitry can be used to determine the amount of force applied to cover material 2920 based on electric charge received from electrode 2904.

Figure 30:
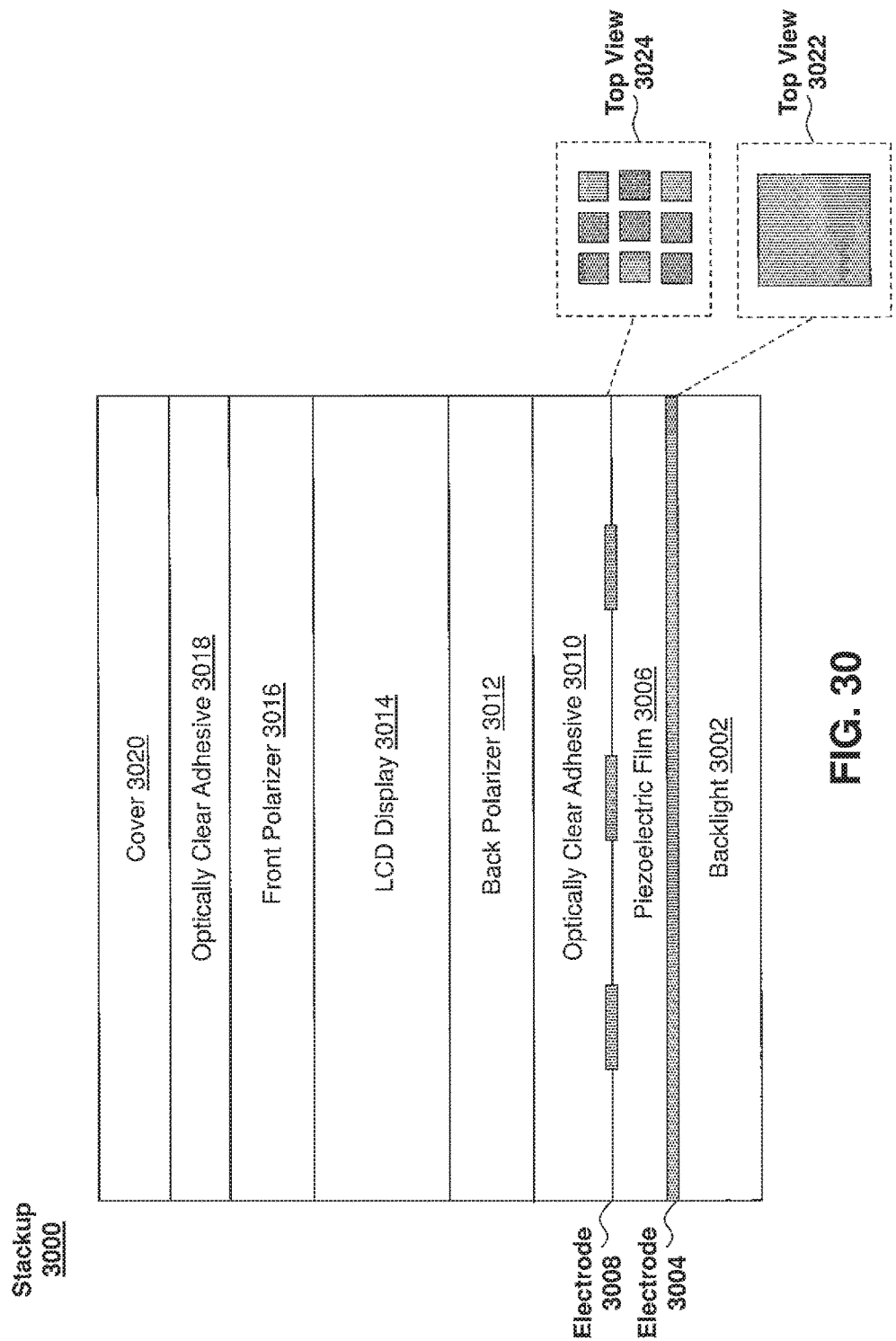

FIG. 30 illustrates a cross-sectional view of another exemplary stackup 3000 for a device containing an integrated LCD touch/display 3014. Stackup 3000 can include a backlight unit 3002 coupled to a piezoelectric film 3006 formed from a transparent film capable of generating a localized electric charge in response to a deformation of the film. Piezoelectric film 3006 can include a first electrode 3004 and a second electrode 3008 formed on opposite surfaces of the film. The electrodes can be formed from a transparent conductive material, such as ITO, PEDOT, or silver nanowire. Top views 3022 and 3024 show the shapes of electrodes 3004 and 3008, respectively, as viewed from above stackup 3000. In the illustrated example, electrode 3004 can extend along the bottom surface of piezoelectric film 3006 and electrode 3008 can include multiple discrete electrodes extending along the top surface of piezoelectric film 3006. While FIG. 30 shows electrode 3008 having nine square electrodes arranged in rows and columns, it should be appreciated that electrode 3008 can include any number of electrodes having any desired shaped and arranged in any desired pattern.

Stackup 3000 can further include integrated LCD touch/display 3014 coupled between a back polarizer 3012 and front polarizer 3016. The back polarizer can be coupled to piezoelectric film 3006 by optically clear adhesive 3010. Integrated touch/display 3014 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3000 can further include cover material 3020 (e.g., glass, plastic, or other rigid and transparent material) coupled to front polarizer 3016 by optically clear adhesive 3018.

Electrode 3008 can be separated into discrete electrodes to allow sense circuitry coupled to the electrodes of electrode 3008 to determine both the amount and location of force applied to cover material 3020. Additionally, separating electrode 3008 into discrete electrodes allows for detection of multiple forces applied to different portions of cover material 3020 at the same time. For example, electrode 3004 can be coupled to ground and each electrode of electrode 3008 can be coupled to separate sense circuitry (not shown) similar or identical to sense circuitry 320 that is capable of detecting an amount of electric charge generated by the portion of piezoelectric film 3006 coupled to the electrode. During operation, as a user applies a downward force on cover material 3020, cover material 3020 can deform by an amount corresponding to an amount of the applied force. The deformation of cover material 3020 can cause a corresponding deformation in optically clear adhesive 3018, polarizers 3016 and 3012, LCD display 3014, optically clear adhesive 3010, and piezoelectric film 3006. Piezoelectric film 3006 can then generate an amount of electric charge based on an amount of deformation of the film and at a location corresponding to the location of the deformation of the film. The electrode of electrode 3008 positioned at or near the location of the deformation and that is electrically coupled to receive the generated charge can transmit the generated charge to its associated sense circuitry. Since the amount of electric charge generated by piezoelectric film 3006 can be representative of the amount of deformation of the film and because the amount of deformation of the film can be representative of the force applied to cover material 3020, the amount of electric charge detected by the sense circuitry can be representative of the force applied to cover material 3020. Additionally, since the location of the electrode of electrode 3008 receiving the generated charge is known, the location of the applied force can also be determined. In this way, the sense circuitry can be used to detect an amount and location of a force applied to cover material 3020. Moreover, the multiple electrodes of electrode 3008 and the separate sense circuitry coupled to each electrode allows for detection of multiple forces applied to different portions of cover material 3020 at the same time. In other examples, electrode 3008 can be coupled to the bottom of piezoelectric film 3006 and electrode 3004 can be coupled to the top of piezoelectric film 3006. In these examples, the electrodes of electrode 3008 can each be coupled to separate sense circuitry and electrode 3004 can be coupled to ground. The sense circuitry can be used to detect an amount and location of force applied to cover material 3020 in a manner similar to that described above for the configuration shown in FIG. 30.

Figure 31:
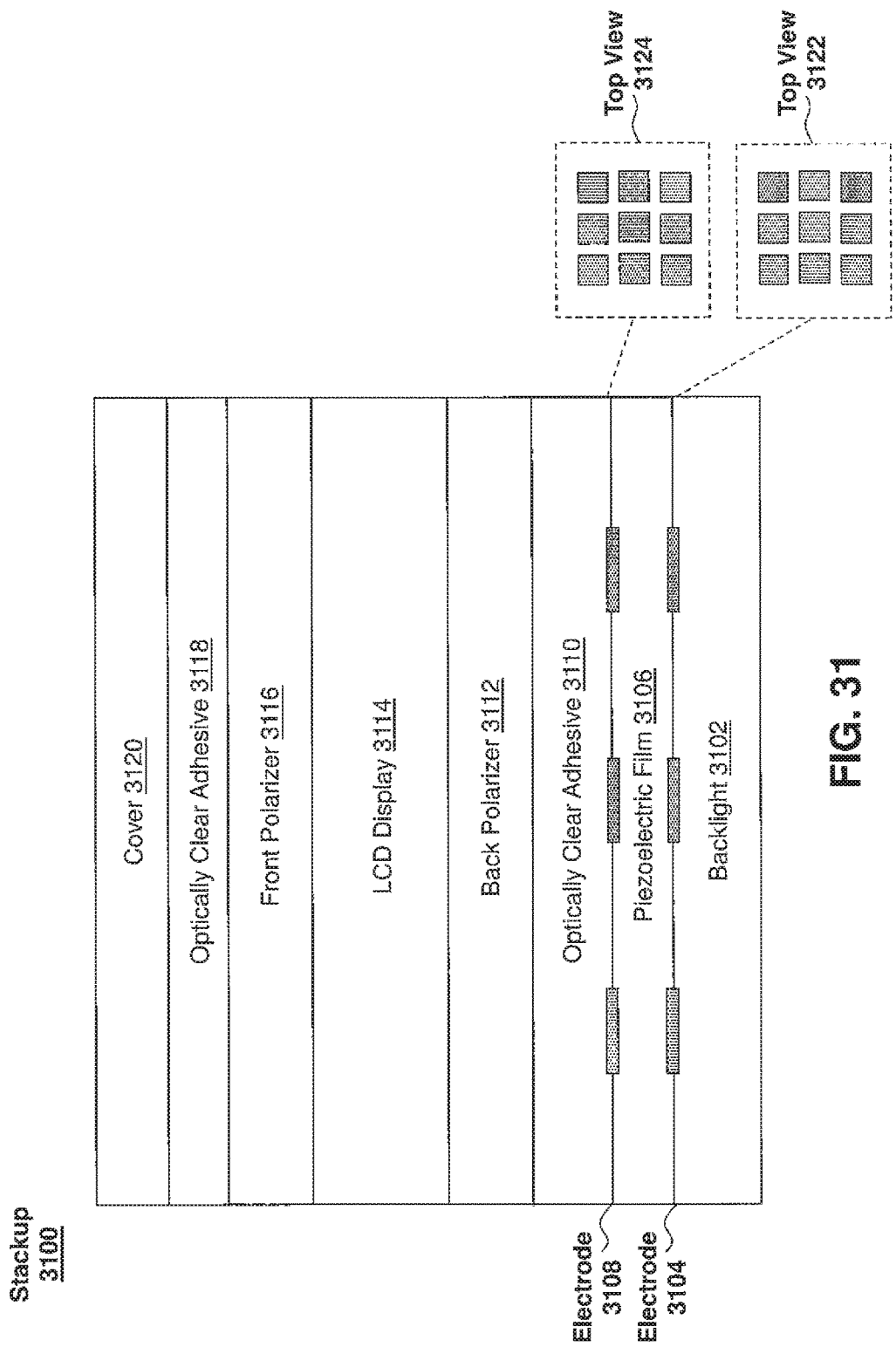

FIG. 31 illustrates a cross-sectional view of another exemplary stackup 3100 for a device containing an integrated LCD touch/display 3114. Stackup 3100 can include a backlight unit 3102 coupled to a piezoelectric film 3106 formed from a transparent film capable of generating a localized electric charge in response to a deformation of the film. Piezoelectric film 3106 can include a first electrode 3104 and a second electrode 3108 formed on opposite surfaces of the film. The electrodes can be formed from a transparent conductive material, such as ITO, PEDOT, or silver nanowire. Top views 3122 and 3124 show the shapes of electrodes 3104 and 3108, respectively, as viewed from above stackup 3100. In the illustrated example, electrodes 3104 and 3108 can both include multiple discrete electrodes extending along the top surface of piezoelectric film 3106. While FIG. 31 shows electrodes 3104 and 3108 each having nine square electrodes arranged in rows and columns, it should be appreciated that electrodes 3104 and 3108 can each include any number of electrodes having any desired shaped and arranged in any desired pattern such that the electrodes of electrode 3104 are positioned opposite the electrodes of electrode 3108 on piezoelectric film 3106.

Stackup 3100 can further include integrated LCD touch/display 3114 coupled between a back polarizer 3112 and front polarizer 3116. The back polarizer can be coupled to piezoelectric film 3106 by optically clear adhesive 3110. Integrated touch/display 3114 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3100 can further include cover material 3120 (e.g., glass, plastic, or other rigid and transparent material) coupled to front polarizer 3116 by optically clear adhesive 3118.

Electrodes 3104 and 3108 can be separated into discrete electrodes positioned opposite each other on piezoelectric film 3106 to allow the sense circuitry coupled to the electrodes of electrode 3108 to determine both the amount and location of force applied to cover material 3120. Additionally, multiple forces applied to different portions of cover material 3120 can be detected using the electrodes of electrode 3108. For example, the electrodes of electrode 3104 can be coupled to ground and each electrode of electrode 3108 can be coupled to separate sense circuitry (not shown) similar or identical to sense circuitry 320 that is capable of detecting an amount of electric charge generated by the portion of piezoelectric film 3106 coupled to the electrode. During operation, as a user applies a downward force on cover material 3120, cover material 3120 can deform by an amount corresponding to an amount of the applied force. The deformation of cover material 3120 can cause a corresponding deformation in optically clear adhesive 3118, polarizers 3116 and 3112, LCD display 3114, optically clear adhesive 3110, and piezoelectric film 3106. Piezoelectric film 3106 can then generate an amount of electric charge based on an amount of deformation of the film and at a location of the deformation of the film. The electrode of electrode 3108 positioned at or near the location of the deformation and that is electrically coupled to receive the generated charge can transmit the generated charge to its associated sense circuitry. Since the amount of electric charge generated by piezoelectric film 3106 can be representative of the amount of deformation of the film and because the amount of deformation of the film can be representative of the force applied to cover material 3120, the amount of electric charge detected by the sense circuitry can be representative of the force applied to cover material 3120. Additionally, since the location of the electrode of electrode 3108 receiving the generated charge is known, the location of the applied force can also be determined. In this way, the sense circuitry can be used to detect an amount and location of a force applied to cover material 3120. Moreover, the multiple electrodes of electrode 3108 and the separate sense circuitry coupled to each electrode allows for detection of multiple forces applied to different portions of cover material 3120 at the same time. In other examples, the electrodes of electrode 3108 can be coupled to ground and the electrodes of electrode 3104 can each be coupled to separate sense circuitry. In these examples, the sense circuitry can be used to determine the amount and location of forces applied to cover material 3120 based on electric charges received from the electrodes of electrode 3104.

Figure 32:
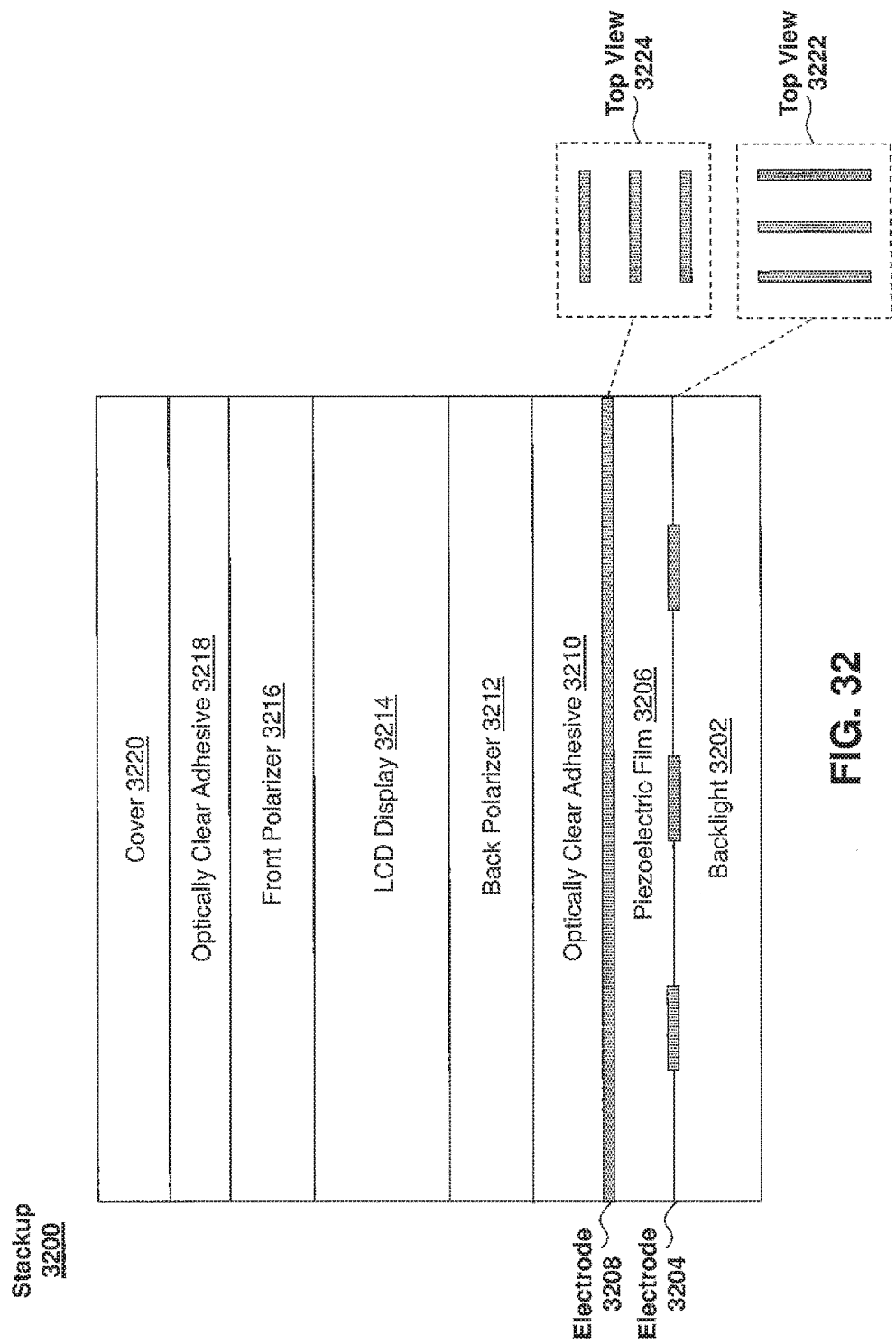

FIG. 32 illustrates a cross-sectional view of another exemplary stackup 3200 for a device containing an integrated LCD touch display 3214. Stackup 3200 can include a backlight unit 3202 coupled to a piezoelectric film 3206 formed from a transparent film capable of generating a localized electric charge in response to a deformation of the film. Piezoelectric film 3206 can include a first electrode 3204 and a second electrode 3208 formed on opposite surfaces of the film. The electrodes can be formed from a transparent conductive material, such as ITO, PEDOT, or silver nanowire. Top views 3222 and 3224 show the shapes of electrodes 3204 and 3208, respectively, as viewed from above stackup 3200. In the illustrated example, electrode 3204 can include multiple discrete columns of electrodes and electrode 3208 can include multiple discrete rows of electrodes. While FIG. 32 shows electrodes 3204 and 3208 each having three rectangular electrodes arranged in columns and rows, respectively, it should be appreciated that electrodes 3204 and 3208 can each include any number of rectangular electrodes and can instead be arranged in rows and columns, respectively.

Stackup 3200 can further include integrated LCD touch/display 3214 coupled between a back polarizer 3212 and front polarizer 3216. The back polarizer can be coupled to piezoelectric film 3206 by optically clear adhesive 3210. Integrated touch/display 3214 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3200 can further include cover material 3220 (e.g., glass, plastic, or other rigid and transparent material) coupled to front polarizer 3216 by optically clear adhesive 3218.

In some examples, the electrodes of electrode 3204 can be coupled to ground and each electrode of electrode 3208 can be coupled to separate sense circuitry (not shown) similar or identical to sense circuitry 320 that is capable of detecting an amount of electric charge generated by the portion of piezoelectric film 3206 coupled to the electrode. During operation, as a user applies a downward force on cover material 3220, cover material 3220 can deform by an amount corresponding to an amount of the applied force. The deformation of cover material 3220 can cause a corresponding deformation in optically clear adhesive 3218, polarizers 3216 and 3212, integrated LCD touch/display 3214, optically clear adhesive 3210, and piezoelectric film 3206. Piezoelectric film 3206 can then generate an amount of electric charge based on an amount of deformation of the film. The location of the generated electric charge can correspond to the location of the deformation of the film. The electrode of electrode 3208 positioned at or near the location of the deformation and that is electrically coupled to receive the generated charge can transmit the generated charge to its associated sense circuitry. Since the amount of electric charge generated by piezoelectric film 3206 can be representative of the amount of deformation of the film and because the amount of deformation of the film can be representative of the force applied to cover material 3220, the amount of electric charge detected by the sense circuitry can be representative of the force applied to cover material 3220. Additionally, since the location of the electrode of electrode 3208 receiving the generated charge is known, the location of the applied force can also be determined. In this way, the sense circuitry can be used to detect an amount and location of a force applied to cover material 3220. Moreover, the multiple electrodes of electrode 3208 and the separate sense circuitry coupled to each electrode allows for detection of multiple forces applied to different portions of cover material 3220 at the same time. In other examples, the electrodes of electrode 3208 can be coupled to ground and the electrodes of electrode 3204 can each be coupled to separate sense circuitry. In these examples, the sense circuitry can be used to determine the amount and location of forces applied to cover material 3220 based on electric charges received from the electrodes of electrode 3204.

In yet other examples, electrode 3204 can be coupled to ground and electrode 3208 can be coupled to separate sense circuitry. The sense circuitry can be used to determine both an amount and location along one of the electrodes of electrode 3208 of an applied force. Using, for example, switching circuitry coupled to electrodes 3204 and 3208, electrode 3204 can then be coupled to separate sense circuitry and electrode 3208 can then be coupled to ground. The sense circuitry can be used to determine both an amount and location along one of the electrodes of electrode 3204 of an applied force. The intersection of the determined row and column can be interpreted as a location of the force on cover material 3220.

Figure 33:
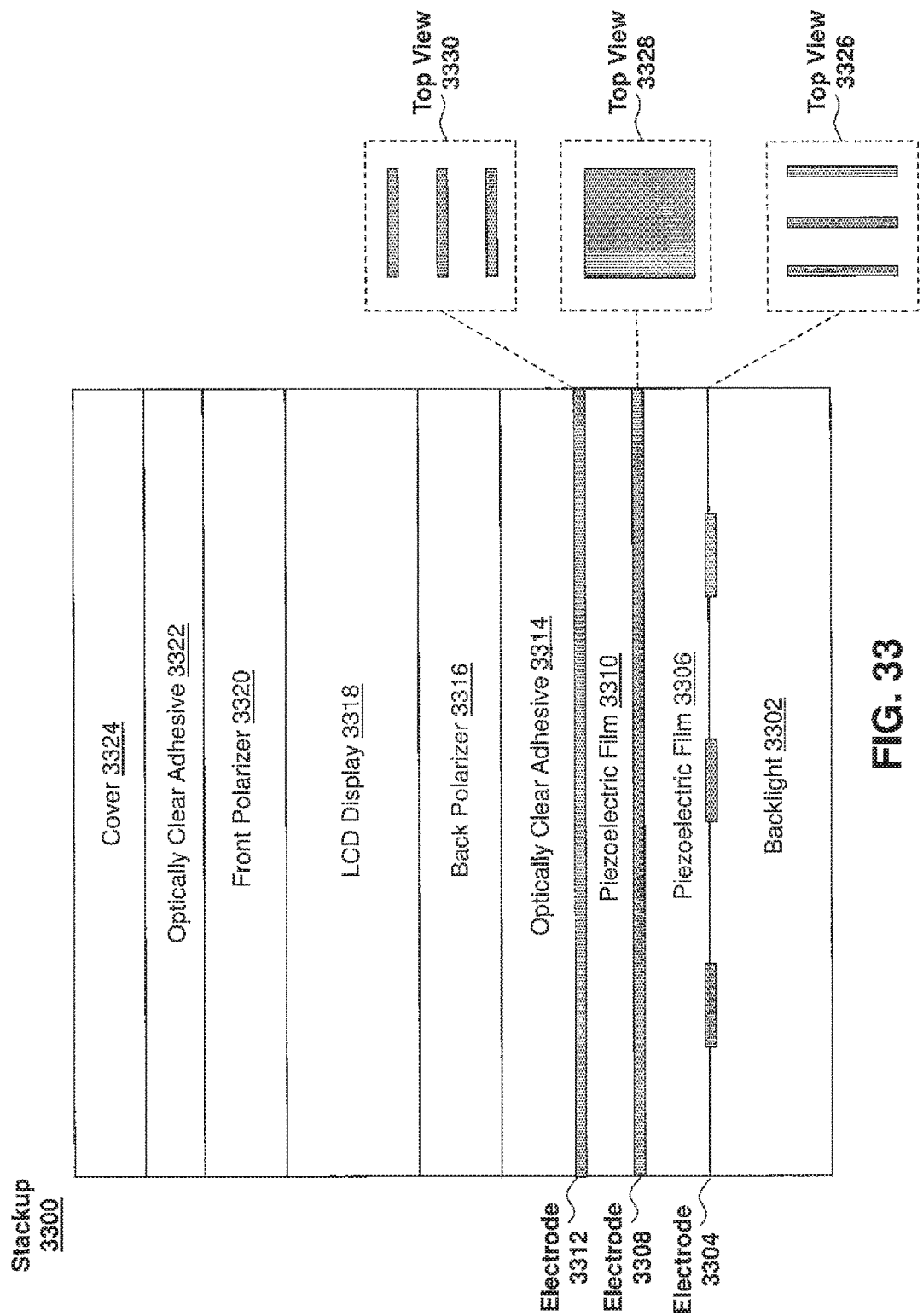

FIG. 33 illustrates a cross-sectional view of another exemplary stackup 3300 for a device containing an integrated LCD touch/display 3318. Stackup 3300 can include a backlight unit 3302 coupled to a first piezoelectric film 3306. Stackup 3300 can further include a second piezoelectric film 3310 coupled to first piezoelectric film 3306. The first and second piezoelectric films 3306 and 3310 can both include a transparent film capable of generating a localized electric charge in response to a deformation of the film. A first electrode 3304 can be formed on the bottom of the first piezoelectric film 3306, a second electrode 3308 can be formed between the first and second piezoelectric films 3306 and 3310, and a third electrode 3312 can be formed on the top of the second piezoelectric film 3310. The electrodes can be formed from a transparent conductive material, such as ITO. Top views 3326, 3328, and 3330 show the shapes of electrodes 3304, 3308, and 3312, respectively, as viewed from above stackup 3300. In the illustrated example, electrode 3304 can include multiple columns of discrete electrodes, electrode 3308 can include an electrode extending along the surfaces of piezoelectric films 3306 and 3310, and electrode 3312 can include rows of multiple discrete electrodes. While FIG. 33 shows electrodes 3304 and 3312 each having three rectangular electrodes arranged in columns and rows, respectively, it should be appreciated that electrodes 3304 and 3312 can each include any number of rectangular electrodes and can instead be arranged in rows and columns, respectively.

Stackup 3300 can further include integrated LCD touch/display 3318 coupled between a back polarizer 3316 and front polarizer 3320. The back polarizer can be coupled to second piezoelectric film 3310 by optically clear adhesive 3314. Integrated LCD touch/display 3318 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3300 can further include cover material 3324 (e.g., glass, plastic, or other rigid and transparent material) coupled to front polarizer 3320 by optically clear adhesive 3322.

Electrodes 3304 and 3312 can be separated into discrete columns and rows of electrodes to allow the sense circuitry coupled to the electrodes of electrodes 3304 and 3312 to determine both the amount and location of force applied to cover material 3224. Additionally, multiple forces applied to different portions of cover material 3324 can be detected at the same time using the electrodes of electrodes 3304 and 3312. For example, electrode 3308 can be coupled to ground while the electrodes of electrode 3304 can each be coupled to separate sense circuitry (not shown) similar or identical to sense circuitry 320 that is capable of detecting an amount of electric charge generated by the portion of piezoelectric film 3306 coupled to the electrode. The electrodes of electrode 3312 can also be coupled to separate sense circuitry (not shown) similar or identical to sense circuitry 320 that is capable of detecting an amount of electric charge generated by the portion of piezoelectric film 3310 coupled to the electrode. During operation, as a user applies a downward force on cover material 3324, cover material 3324 can deform by an amount corresponding to an amount of the applied force. The deformation of cover material 3324 can cause a corresponding deformation in optically clear adhesive 3322, polarizers 3320 and 3316, integrated LCD touch/display 3318, optically clear adhesive 3314, and piezoelectric films 3310 and 3306. Piezoelectric films 3310 and 3306 can then generate an amount of electric charge based on an amount of deformation of the film and at a location of the deformation of the film. The electrode of electrode 3312 positioned at or near the location of the deformation of piezoelectric film 3310 and that is electrically coupled to receive the generated charge can transmit the generated charge to its associated sense circuitry. Similarly the electrode of electrode 3304 positioned at or near the location of the deformation of piezoelectric film 3306 and that is electrically coupled to receive the generated charge can transmit the generated charge to its associated sense circuitry. Since the amount of electric charge generated by piezoelectric films 3306 and 3312 can be representative of the amount of deformation of the films and because the amount of deformation of the films can be representative of the force applied to cover material 3324, the amount of electric charge detected by the sense circuitry can be representative of the force applied to cover material 3324. Additionally, since the location of the electrodes of electrodes 3304 and 3312 receiving the generated charge is known, the location of the applied force can also be determined. For example, electrode 3312 can be used to determine the row at which the force was applied, while electrode 3304 can be used to determine the column at which the force was applied. The intersection of the determined row and column can be the location of the applied force. In this way, the sense circuitry can be used to detect an amount and location of a force applied to cover material 3324. Moreover, the multiple electrodes of electrodes 3304 and 3312 and the separate sense circuitry coupled to each electrode allows for detection of multiple forces applied to different portions of cover material 3324 at the same time. In other examples, electrode 3312 can be coupled to the bottom of piezoelectric film 3306 and electrode 3304 can be coupled to the top of piezoelectric film 3310. In these examples, the electrodes of electrodes 3304 and 3312 can each be coupled to separate sense circuitry. The sense circuitry can be used to detect an amount and location of force applied to cover material 3324 in a manner similar to that described above for the configuration shown in FIG. 33.

Figure 34:
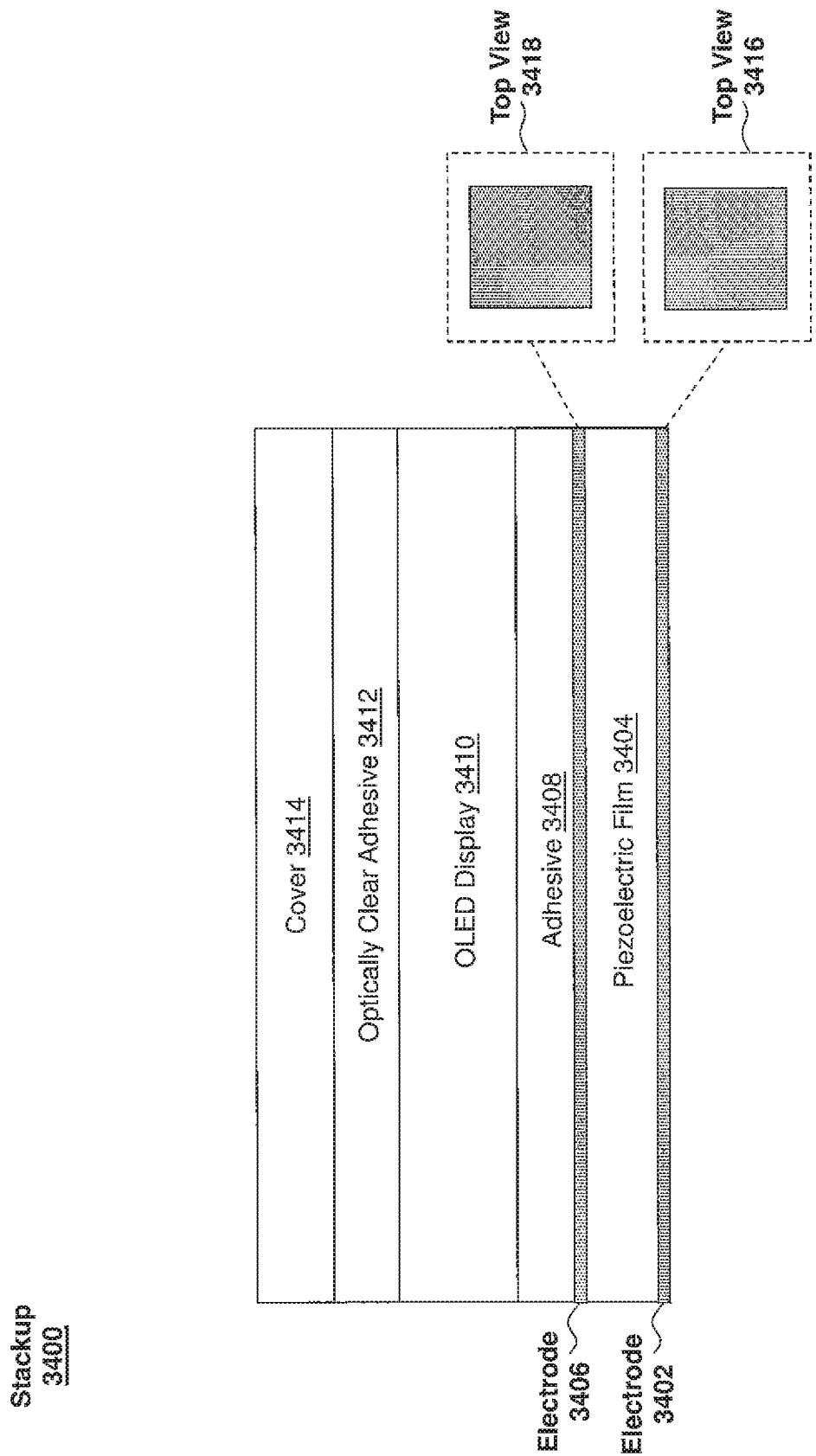

FIG. 34 illustrates a cross-sectional view of another exemplary stackup 3400 for a device containing an integrated OLED touch/display 3410. Stackup 3400 can include piezoelectric film 3404 formed from a transparent or non-transparent film capable of generating a localized electric charge in response to a deformation of the film. Piezoelectric film 3304 can include a first electrode 3402 and a second electrode 3406 formed on opposite surfaces of the film. The electrodes can be formed from a transparent or non-transparent conductive material, such as ITO, PEDOT, silver ink, silver nanowire, or copper. Top views 3416 and 3418 show the shapes of electrodes 3402 and 3406, respectively, as viewed from above stackup 3400. In the illustrated example, electrodes 3402 and 3406 can both have a shape that substantially matches that of piezoelectric film 3404 and can extend along the surfaces of piezoelectric film 3404.

Stackup 3400 can further include integrated OLED touch/display 3410 coupled to piezoelectric film 3404 by adhesive 3408. Unlike the LCD examples described herein, piezoelectric film 3404, adhesive 3408, and electrodes 3402 and 3406 need not be transparent or optically clear since they are located behind OLED display 3410 and thus, would not block a user's view of the display. Integrated OLED touch/display 3410 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3400 can further include cover material 3414 (e.g., glass, plastic, or other rigid and transparent material) coupled to integrated OLED touch/display 3410 by optically clear adhesive 3412.

In some examples, electrode 3402 can be coupled to ground and electrode 3406 can be coupled to sense circuitry (not shown) similar or identical to sense circuitry 320 that is capable of detecting an amount of electric charge generated by piezoelectric film 3404. During operation, as a user applies a downward force on cover material 3414, cover material 3414 can deform by an amount corresponding to an amount of the applied force. The deformation of cover material 3414 can cause a corresponding deformation in optically clear adhesive 3412, integrated OLED touch/display 3410, adhesive 3408, and piezoelectric film 3404. Piezoelectric film 3404 can then generate an amount of electric charge based on the amount of deformation of the film. The generated electric charge can be received by the sense circuitry via electrode 3406. Since the amount of electric charge generated by piezoelectric film 3404 can be representative of the amount of deformation of the film and because the amount of deformation of the film can be representative of the force applied to cover material 3414, the amount of electric charge detected by the sense circuitry can be representative of the force applied to cover material 3414. In this way, the sense circuitry can be used to detect an amount of force applied to cover material 3414. In other examples, electrode 3406 can be coupled to ground and electrode 3402 can be coupled to the sense circuitry. In these examples, the sense circuitry can be used to determine the amount of force applied to cover material 3414 based on electric charge received from electrode 3402.

Figure 35:
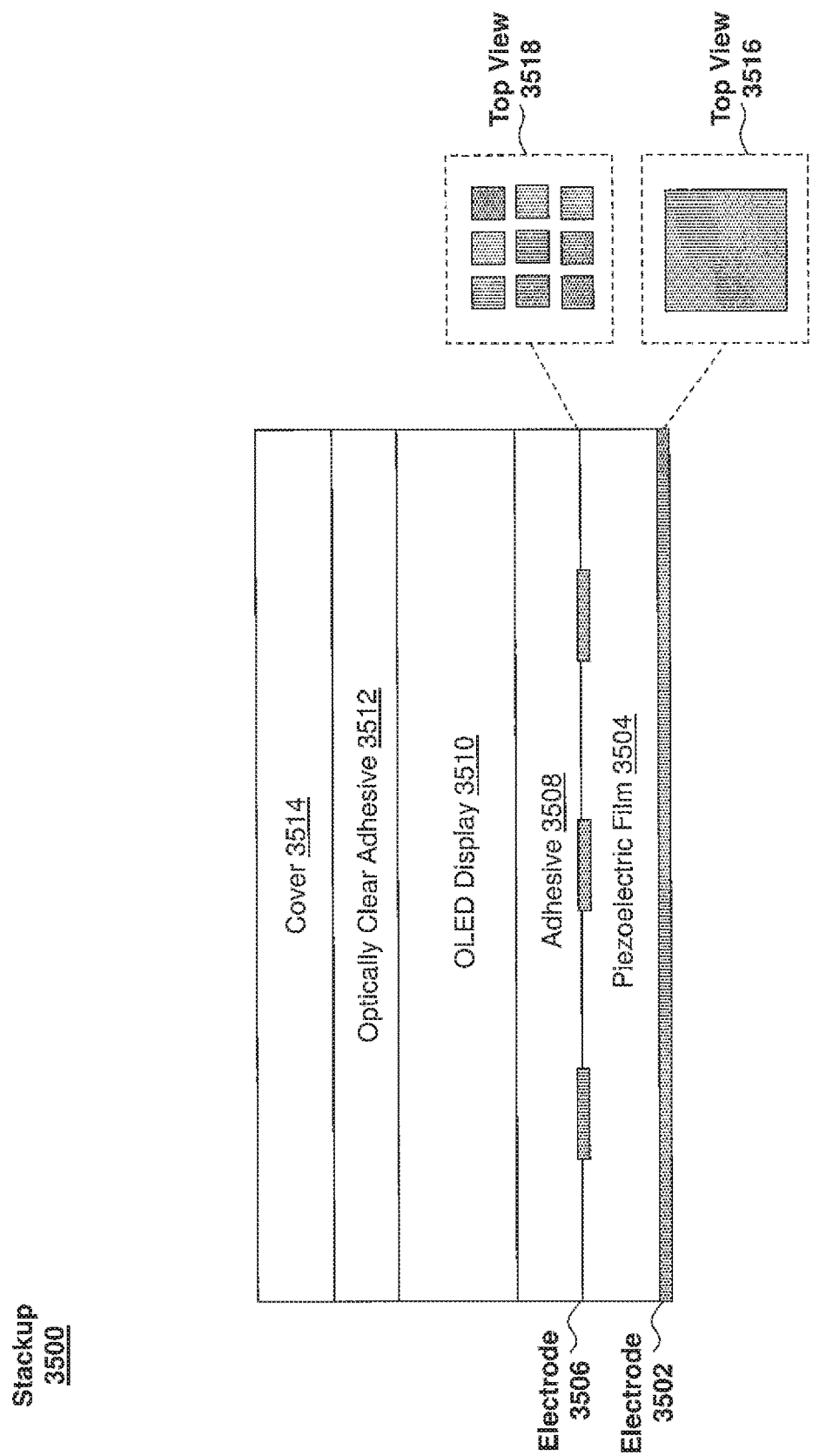

FIG. 35 illustrates a cross-sectional view of another exemplary stackup 3500 for a device containing an integrated OLED touch display 3510. Stackup 3500 can include piezoelectric film 3504 formed from a transparent or non-transparent film capable of generating a localized electric charge in response to a deformation of the film. Piezoelectric film 3504 can include a first electrode 3502 and a second electrode 3506 formed on opposite surfaces of the film. The electrodes can be formed from a transparent or non-transparent conductive material, such as ITO, PEDOT, silver ink, silver nanowire, or copper. Top views 3516 and 3518 show the shapes of electrodes 3502 and 3506, respectively, as viewed from above stackup 3500. In the illustrated example, electrode 3502 can extend along the bottom surface of piezoelectric film 3504 and electrode 3506 can include multiple discrete electrodes extending along the top surface of piezoelectric film 3504. While FIG. 35 shows electrode 3506 having nine square electrodes arranged in rows and columns, it should be appreciated that electrode 3506 can include any number of electrodes having any desired shaped and arranged in any desired pattern.

Stackup 3500 can further include integrated OLED touch/display 3510 coupled to piezoelectric film 3504 by adhesive 3508. Unlike the LCD examples described herein, piezoelectric film 3504, adhesive 3508, and electrodes 3502 and 3506 need not be transparent or optically clear since they are located behind OLED display 3510 and thus, would not block a user's view of the display. Integrated touch/display 3510 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3500 can further include cover material 3514 (e.g., glass, plastic, or other rigid and transparent material) coupled to integrated OLED touch/display 3510 by optically clear adhesive 3512.

Electrode 3506 can be separated into discrete electrodes to allow sense circuitry coupled to the electrodes of electrode 3506 to determine both the amount and location of force applied to cover material 3514. Additionally, separating electrode 3506 into discrete electrodes allows for detection of multiple forces applied to different portions of cover material 3514 at the same time. For example, electrode 3516 can be coupled to ground and each electrode of electrode 3506 can be coupled to separate sense circuitry (not shown) similar or identical to sense circuitry 320 that is capable of detecting an amount of electric charge generated by the portion of piezoelectric film 3504 coupled to the electrode. During operation, as a user applies a downward force on cover material 3514, cover material 3514 can deform by an amount corresponding to an amount of the applied force. The deformation of cover material 3514 can cause a corresponding deformation in optically clear adhesive 3512, integrated OLED touch/display 3510, adhesive 3508, and piezoelectric film 3504. Piezoelectric film 3504 can then generate an amount of electric charge based on an amount of deformation of the film and at a location corresponding to the location of the deformation of the film. The electrode of electrode 3506 positioned at or near the location of the deformation and that is electrically coupled to receive the generated charge can transmit the generated charge to its associated sense circuitry. Since the amount of electric charge generated by piezoelectric film 3504 can be representative of the amount of deformation of the film and because the amount of deformation of the film can be representative of the force applied to cover material 3514, the amount of electric charge detected by the sense circuitry can be representative of the force applied to cover material 3514. Additionally, since the location of the electrode of electrode 3506 receiving the generated charge is known, the location of the applied force can also be determined. In this way, the sense circuitry can be used to detect an amount and location of a force applied to cover material 3514. Moreover, the multiple electrodes of electrode 3506 and the separate sense circuitry coupled to each electrode allows for detection of multiple forces applied to different portions of cover material 3514 at the same time. In other examples, electrode 3506 can be coupled to the bottom of piezoelectric film 3504 and electrode 3502 can be coupled to the top of piezoelectric film 3504. In these examples, the electrodes of electrode 3506 can each be coupled to separate sense circuitry and electrode 3502 can be coupled to ground. The sense circuitry can be used to detect an amount and location of force applied to cover material 3514 in a manner similar to that described above for the configuration shown in FIG. 35.

Figure 36:
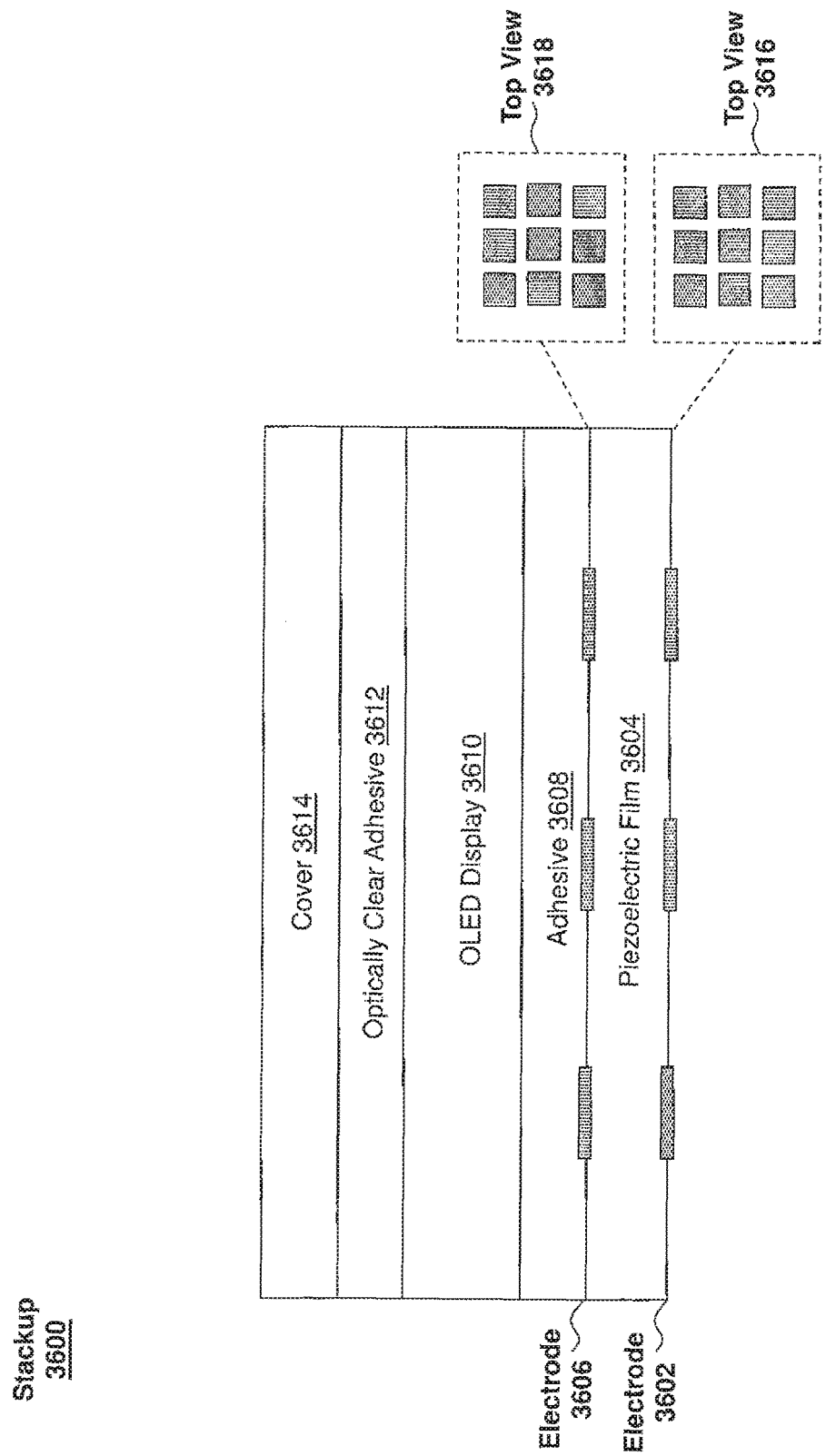

FIG. 36 illustrates a cross-sectional view of another exemplary stackup 3600 for a device containing an integrated OLED touch/display 3610. Stackup 3600 can include piezoelectric film 3604 formed from a transparent or non-transparent film capable of generating a localized electric charge in response to a deformation of the film. Piezoelectric film 3304 can include a first electrode 3602 and a second electrode 3606 formed on opposite surfaces of the film. The electrodes can be formed from a transparent or non-transparent conductive material, such as ITO, PEDOT, silver ink, silver nanowire, or copper. Top views 3616 and 3618 show the shapes of electrodes 3602 and 3606, respectively, as viewed from above stackup 3600. In the illustrated example, electrodes 3602 and 3606 can both include multiple discrete electrodes extending along the top surface of piezoelectric film 3604. While FIG. 36 shows electrodes 3602 and 3606 each having nine square electrodes arranged in rows and columns, it should be appreciated that electrodes 3602 and 3606 can each include any number of electrodes having any desired shaped and arranged in any desired pattern such that the electrodes of electrode 3602 are positioned opposite the electrodes of electrode 3606 on piezoelectric film 3604.

Stackup 3600 can further include integrated OLED touch/display 3610 coupled to piezoelectric film 3604 by adhesive 3608. Unlike the LCD examples described herein, piezoelectric film 3604, adhesive 3608, and electrodes 3602 and 3606 need not be transparent or optically clear since they are located behind OLED display 3610 and thus, would not block a user's view of the display. Integrated OLED touch/display 3610 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3600 can further include cover material 3614 (e.g., glass, plastic, or other rigid and transparent material) coupled to integrated OLED touch/display 3610 by optically clear adhesive 3612.

Electrodes 3602 and 3606 can be separated into discrete electrodes positioned opposite each other on piezoelectric film 3604 to allow the sense circuitry coupled to the electrodes of electrode 3606 to determine both the amount and location of force applied to cover material 3614. Additionally, multiple forces applied to different portions of cover material 3614 can be detected using the electrodes of electrode 3606. For example, the electrodes of electrode 3602 can be coupled to ground and each electrode of electrode 3606 can be coupled to separate sense circuitry (not shown) similar or identical to sense circuitry 320 that is capable of detecting an amount of electric charge generated by the portion of piezoelectric film 3604 coupled to the electrode. During operation, as a user applies a downward force on cover material 3614, cover material 3614 can deform by an amount corresponding to an amount of the applied force. The deformation of cover material 3614 can cause a corresponding deformation in optically clear adhesive 3612, integrated OLED touch/display 3610, adhesive 3608, and piezoelectric film 3604. Piezoelectric film 3604 can then generate an amount of electric charge based on an amount of deformation of the film and at a location of the deformation of the film. The electrode of electrode 3606 positioned at or near the location of the deformation and that is electrically coupled to receive the generated charge can transmit the generated charge to its associated sense circuitry. Since the amount of electric charge generated by piezoelectric film 3604 can be representative of the amount of deformation of the film and because the amount of deformation of the film can be representative of the force applied to cover material 3614, the amount of electric charge detected by the sense circuitry can be representative of the force applied to cover material 3614. Additionally, since the location of the electrode of electrode 3606 receiving the generated charge is known, the location of the applied force can also be determined. In this way, the sense circuitry can be used to detect an amount and location of a force applied to cover material 3614. Moreover, the multiple electrodes of electrode 3606 and the separate sense circuitry coupled to each electrode allows for detection of multiple forces applied to different portions of cover material 3614 at the same time. In other examples, the electrodes of electrode 3606 can be coupled to ground and the electrodes of electrode 3602 can each be coupled to separate sense circuitry. In these examples, the sense circuitry can be used to determine the amount and location of forces applied to cover material 3614 based on electric charges received from the electrodes of electrode 3602.

Figure 37:
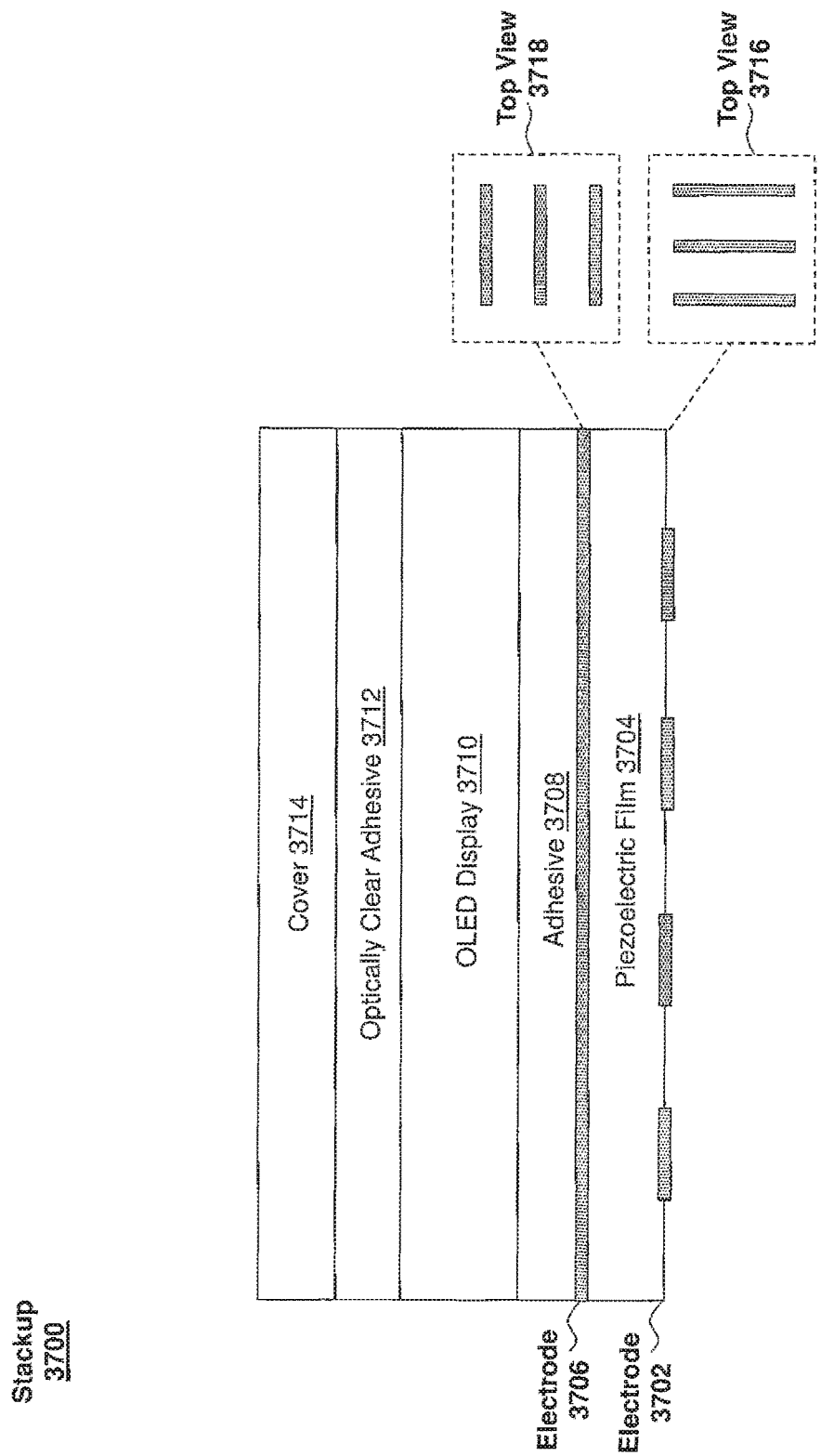

FIG. 37 illustrates a cross-sectional view of another exemplary stackup 3700 for a device containing an integrated OLED touch/display 3710. Stackup 3700 can include piezoelectric film 3704 formed from a transparent or non-transparent film capable of generating a localized electric charge in response to a deformation of the film. Piezoelectric film 3704 can include a first electrode 3702 and a second electrode 3706 formed on opposite surfaces of the film. The electrodes can be formed from a transparent or non-transparent conductive material, such as ITO, PEDOT, silver ink, silver nanowire, or copper. Top views 3716 and 3718 show the shapes of electrodes 3702 and 3706, respectively, as viewed from above stackup 3700. In the illustrated example, electrode 3702 can include multiple discrete columns of electrodes and electrode 3706 can include multiple discrete rows of electrodes. While FIG. 37 shows electrodes 3702 and 3706 each having three rectangular electrodes arranged in columns and rows, respectively, it should be appreciated that electrodes 3702 and 3706 can each include any number of rectangular electrodes and can instead be arranged in rows and columns, respectively.

Stackup 3700 can further include integrated OLED touch/display 3710 coupled to piezoelectric film 3704 by adhesive 3708. Unlike the LCD examples described herein, piezoelectric film 3704, adhesive 3708, and electrodes 3702 and 3706 need not be transparent or optically clear since they are located behind OLED display 3710 and thus, would not block a user's view of the display. Integrated touch/display 3710 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3700 can further include cover material 3714 (e.g., glass, plastic, or other rigid and transparent material) coupled to integrated OLED touch/display 3710 by optically clear adhesive 3712.

In some examples, the electrodes of electrode 3702 can be coupled to ground and each electrode of electrode 3706 can be coupled to separate sense circuitry (not shown) similar or identical to sense circuitry 320 that is capable of detecting an amount of electric charge generated by the portion of piezoelectric film 3704 coupled to the electrode. During operation, as a user applies a downward force on cover material 3714, cover material 3714 can deform by an amount corresponding to an amount of the applied force. The deformation of cover material 3714 can cause a corresponding deformation in optically clear adhesive 3712, integrated OLED touch/display 3710, adhesive 3708, and piezoelectric film 3704. Piezoelectric film 3704 can then generate an amount of electric charge based on an amount of deformation of the film. The location of the generated electric charge can correspond to the location of the deformation of the film. The electrode of electrode 3706 positioned at or near the location of the deformation and that is electrically coupled to receive the generated charge can transmit the generated charge to its associated sense circuitry. Since the amount of electric charge generated by piezoelectric film 3704 can be representative of the amount of deformation of the film and because the amount of deformation of the film can be representative of the force applied to cover material 3714, the amount of electric charge detected by the sense circuitry can be representative of the force applied to cover material 3714. Additionally, since the location of the electrode of electrode 3706 receiving the generated charge is known, the location of the applied force can also be determined. In this way, the sense circuitry can be used to detect an amount and location of a force applied to cover material 3714. Moreover, the multiple electrodes of electrode 3706 and the separate sense circuitry coupled to each electrode allows for detection of multiple forces applied to different portions of cover material 3714 at the same time. In other examples, the electrodes of electrode 3706 can be coupled to ground and the electrodes of electrode 3702 can each be coupled to separate sense circuitry. In these examples, the sense circuitry can be used to determine the amount and location of forces applied to cover material 3714 based on electric charges received from the electrodes of electrode 3702.

In yet other examples, electrode 3702 can be coupled to ground and electrode 3706 can be coupled to separate sense circuitry. The sense circuitry can be used to determine both an amount and location along one of the electrodes of electrode 3706 of an applied force. Using, for example, switching circuitry coupled to electrodes 3702 and 3706, electrode 3702 can then be coupled to separate sense circuitry and electrode 3706 can then be coupled to ground. The sense circuitry can be used to determine both an amount and location along one of the electrodes of electrode 3702 of an applied force. The intersection of the determined row and column can be interpreted as a location of the force on cover material 3714.

Figure 38:
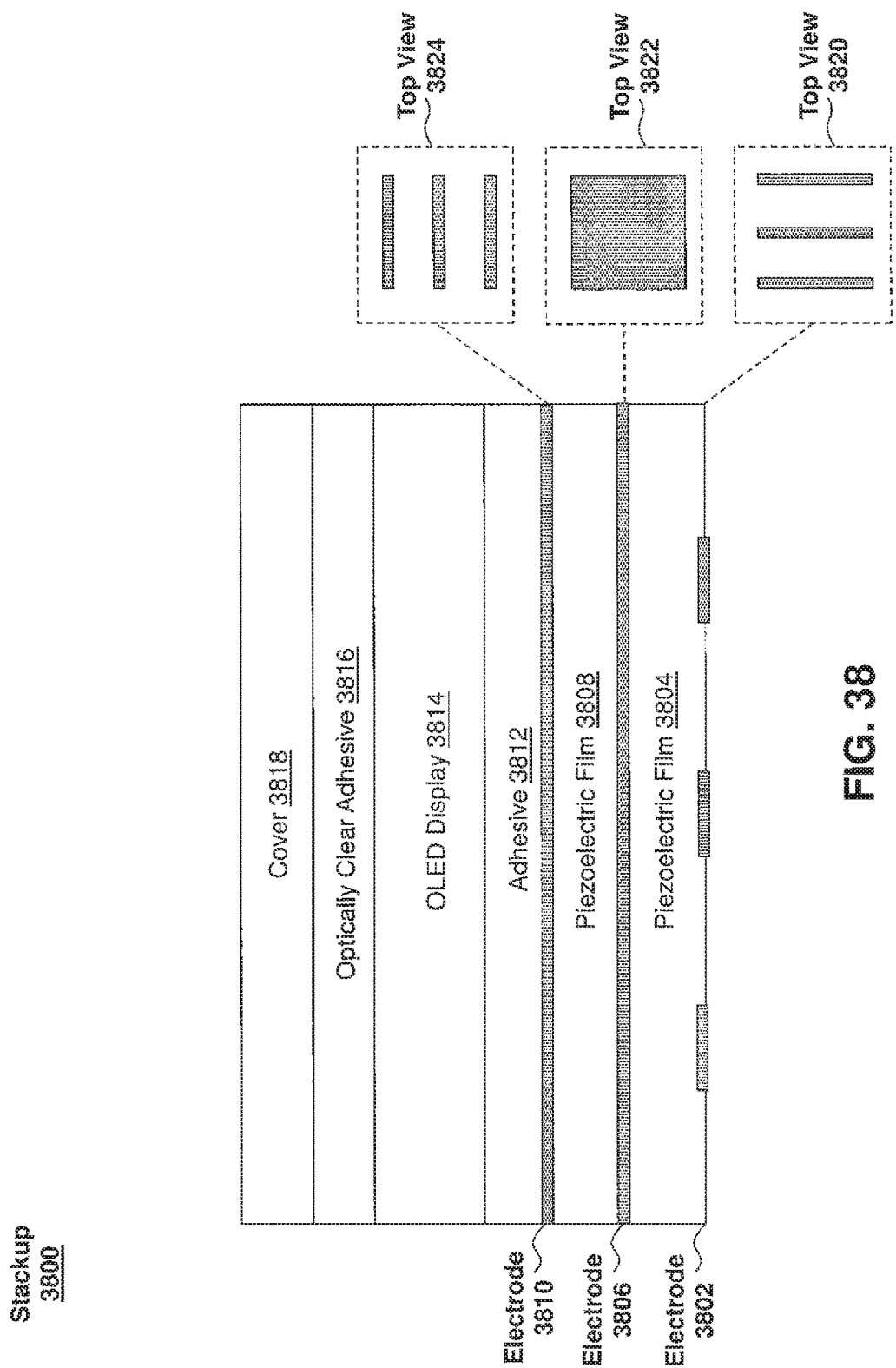

FIG. 38 illustrates a cross-sectional view of another exemplary stackup 3800 for a device containing an integrated OLED touch/display 3814. Stackup 3800 can further include a first piezoelectric film 3804 and a second piezoelectric film 3808 coupled to first piezoelectric film 3804. The first and second piezoelectric films 3804 and 3808 can both include a transparent or non-transparent film capable of generating a localized electric charge in response to a deformation of the film. A first electrode 3802 can be formed on the bottom of the first piezoelectric film 3804, a second electrode 3806 can be formed between the first and second piezoelectric films 3804 and 3808, and a third electrode 3810 can be formed on the top of the second piezoelectric film 3808. The electrodes can be formed from a transparent or non-transparent conductive material, such as ITO, PEDOT, silver ink, silver nanowire, or copper. Top views 3820, 3822, and 3824 show the shapes of electrodes 3802, 3806, and 3810, respectively, as viewed from above stackup 3800.

Stackup 3800 can further include integrated OLED touch/display 3814 coupled to second piezoelectric film 3808 by adhesive 3812. Unlike the LCD examples described herein, piezoelectric films 3804 and 3808, adhesive 3812, and electrodes 3802, 3806, and 3810 need not be transparent or optically clear since they are located behind OLED display 3814 and thus, would not block a user's view of the display. Integrated touch/display 3814 can include circuit elements, such as touch signal lines, such as drive lines and sense lines, grounding regions, in the display pixel stackups that can be grouped together to form touch sensing circuitry that senses a touch on or near the display. An integrated touch/display can include multi-function circuit elements that can operate as circuitry of the display system to generate an image on the display, and can also form part of a touch sensing system that senses one or more touches on or near the display. The multi-function circuit elements can be, for example, capacitors in display pixels that can be configured to operate as storage capacitors/electrodes, common electrodes, conductive wires/pathways, etc., of the display circuitry in the display system, and that may also be configured to operate as circuit elements of the touch sensing circuitry. FIG. 27, discussed above, shows an example configuration of drive lines 2722 and sense lines 2723 of an integrated touch screen according to various examples. Stackup 3800 can further include cover material 3818 (e.g., glass, plastic, or other rigid and transparent material) coupled to OLED display 3814 by optically clear adhesive 3816.

Electrodes 3802 and 3810 can be separated into discrete columns and rows of electrodes to allow the sense circuitry coupled to the electrodes of electrodes 3802 and 3810 to determine both the amount and location of force applied to cover material 3818. Additionally, multiple forces applied to different portions of cover material 3818 can be detected at the same time using the electrodes of electrodes 3802 and 3810. For example, electrode 3806 can be coupled to ground while the electrodes of electrode 3802 can each be coupled to separate sense circuitry (not shown) similar or identical to sense circuitry 320 that is capable of detecting an amount of electric charge generated by the portion of piezoelectric film 3804 coupled to the electrode. The electrodes of electrode 3810 can also be coupled to separate sense circuitry (not shown) similar or identical to sense circuitry 320 that is capable of detecting an amount of electric charge generated by the portion of piezoelectric film 3808 coupled to the electrode. During operation, as a user applies a downward force on cover material 3818, cover material 3818 can deform by an amount corresponding to an amount of the applied force. The deformation of cover material 3818 can cause a corresponding deformation in optically clear adhesive 3816, integrated OLED touch/display 3814, adhesive 3812, and piezoelectric films 3808 and 3804. Piezoelectric films 3808 and 3804 can then generate an amount of electric charge based on an amount of deformation of the film and at a location of the deformation of the film. The electrode of electrode 3810 positioned at or near the location of the deformation of piezoelectric film 3808 and that is electrically coupled to receive the generated charge can transmit the generated charge to its associated sense circuitry. Similarly the electrode of electrode 3802 positioned at or near the location of the deformation of piezoelectric film 3804 and that is electrically coupled to receive the generated charge can transmit the generated charge to its associated sense circuitry. Since the amount of electric charge generated by piezoelectric films 3804 and 3808 can be representative of the amount of deformation of the films and because the amount of deformation of the films can be representative of the force applied to cover material 3818, the amount of electric charge detected by the sense circuitry can be representative of the force applied to cover material 3818. Additionally, since the location of the electrodes of electrodes 3802 and 3810 receiving the generated charge is known, the location of the applied force can also be determined. For example, electrode 3810 can be used to determine the row at which the force was applied, while electrode 3802 can be used to determine the column at which the force was applied. The intersection of the determined row and column can be the location of the applied force. In this way, the sense circuitry can be used to detect an amount and location of a force applied to cover material 3818. Moreover, the multiple electrodes of electrodes 3802 and 3810 and the separate sense circuitry coupled to each electrode allows for detection of multiple forces applied to different portions of cover material 3818 at the same time. In other examples, electrode 3810 can be coupled to the bottom of piezoelectric film 3804 and electrode 3802 can be coupled to the top of piezoelectric film 3808. In these examples, the electrodes of electrodes 3802 and 3810 can each be coupled to separate sense circuitry. The sense circuitry can be used to detect an amount and location of force applied to cover material 3818 in a manner similar to that described above for the configuration shown in FIG. 38.

Figure 39:
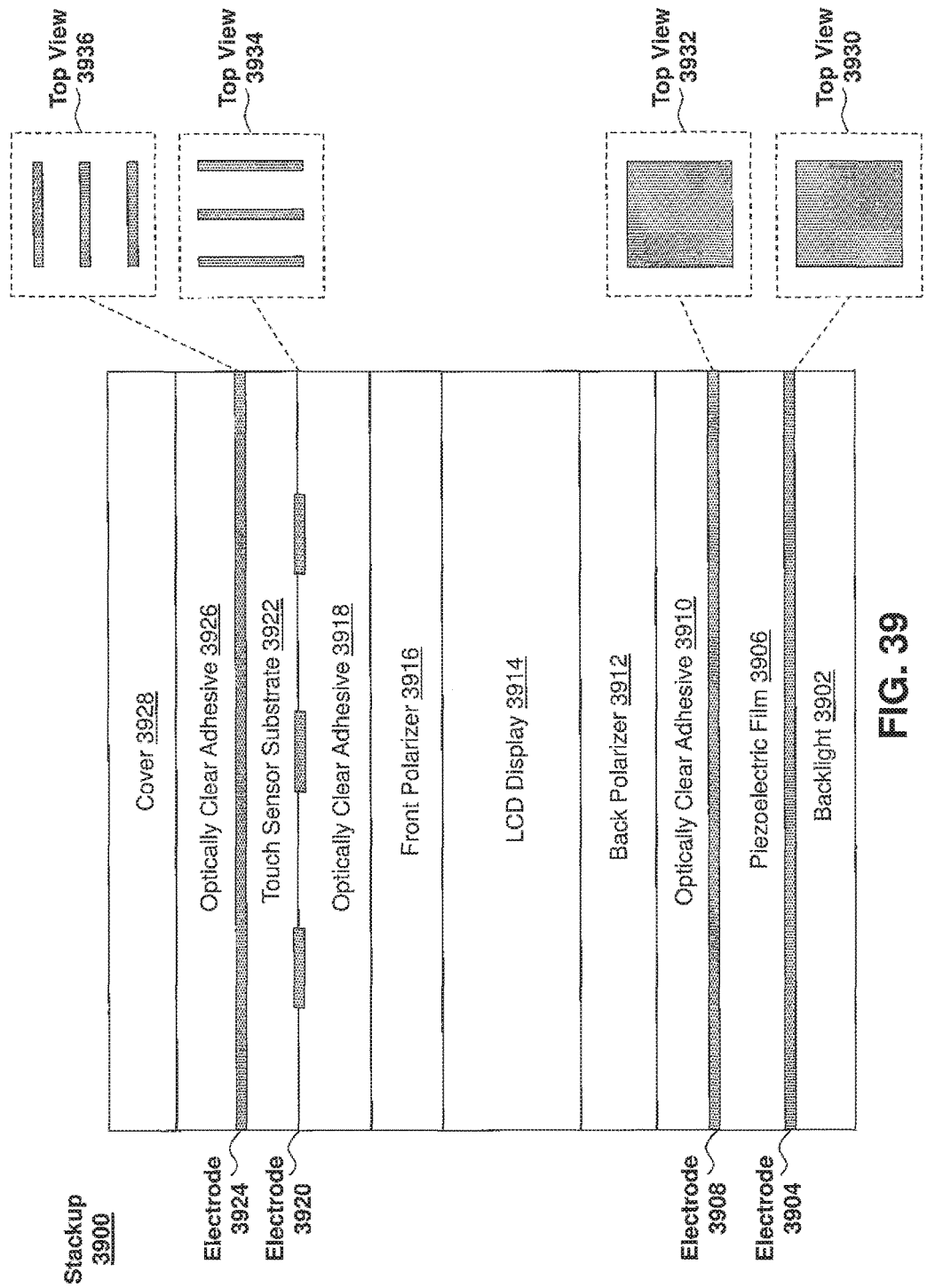

FIG. 39 illustrates a cross-sectional view of another exemplary stackup 3900 for a device containing an LCD display 3914. Stackup 3900 can include a backlight unit 3902 coupled to a piezoelectric film 3906 formed from a transparent film capable of generating a localized electric charge in response to a deformation of the film. Piezoelectric film 3906 can include a first electrode 3904 and a second electrode 3908 formed on opposite surfaces of the film. The electrodes can be formed from a transparent conductive material, such as ITO, PEDOT, or silver nanowire. Top views 3930 and 3932 show the shapes of electrodes 3904 and 3908, respectively, as viewed from above stackup 3900. In the illustrated example, electrodes 3904 and 3908 can both have a shape that substantially matches that of piezoelectric film 3906 and can extend along the surfaces of piezoelectric film 3906.

Stackup 3900 can further include LCD display 3914 coupled between a back polarizer 3912 and front polarizer 3916. The back polarizer can be coupled to piezoelectric film 3906 by optically clear adhesive 3910. Stackup 3900 can further include touch sensor substrate 3922 coupled to front polarizer 3916 by optically clear adhesive 3918. Touch sensor substrate 3922 can include electrodes 3920 and 3924 formed on opposite surfaces of the sensor. The electrodes can be formed from a transparent conductive material, such as ITO, PEDOT, or silver nanowire. Top views 3934 and 3936 show the shapes of electrodes 3920 and 3924, respectively, as viewed from above stackup 3900. In the illustrated example, electrodes 3920 can include columns of multiple discrete electrodes and electrode 3924 can include multiple rows of discrete electrodes. Stackup 3900 can further include cover material 3928 (e.g., glass, plastic, or other rigid and transparent material) coupled to touch sensor substrate 3922 by optically clear adhesive 3926. While FIG. 39 shows three columns of electrodes 3920 and three rows of electrodes 3924, it should be appreciated that any number of rows and columns of electrodes can be used. Moreover, in other examples, electrode 3920 can be formed on the top of touch sensor substrate 3922 and electrode 3924 can be formed on the bottom of touch sensor substrate 3922.

In some examples, electrode 3904 can be coupled to ground and electrode 3908 can be coupled to sense circuitry (not shown) similar or identical to sense circuitry 320 that is capable of detecting an amount of electric charge generated by piezoelectric film 3906. During operation, as a user applies a downward force on cover material 3928, cover material 3928 can deform by an amount corresponding to an amount of the applied force. The deformation of cover material 3928 can cause a corresponding deformation in optically clear adhesive 3926, touch sensor substrate 3922, optically clear adhesive 3918, polarizers 3916 and 3912, LCD display 3914, optically clear adhesive 3910, and piezoelectric film 3906. Piezoelectric film 3906 can then generate an amount of electric charge based on an amount of deformation of the film. The generated electric charge can be received by the sense circuitry via electrode 3908. Since the amount of electric charge generated by piezoelectric film 3906 can be representative of the amount of deformation of the film and because the amount of deformation of the film can be representative of the force applied to cover material 3928, the amount of electric charge detected by the sense circuitry can be representative of the force applied to cover material 3928. In this way, the sense circuitry can be used to detect an amount of force applied to cover material 3928. In other examples, the electrode 3908 can be coupled to ground and electrode 3904 can be coupled to the sense circuitry. In these examples, the sense circuitry can be used to determine the amount of force applied to cover material 3928 based on electric charge received from electrode 3904.

Additionally, during operation, touch sensor substrate 3922 and electrodes 3920 and 3924 can be used to determine a position of a touch event (e.g., a finger, stylus, or other object touching cover material 3928) on cover material 3928 using a mutual capacitance sensing technique. For example, electrodes 3924 can be driven with sinusoidal stimulation signals to capacitively couple with crossing columns of electrodes 3920, thereby forming a capacitive path for coupling charge from electrodes 3924 to the electrodes 3920. The crossing electrodes 3920 can output touch signals representing the coupled charge or current. When an object, such as a passive stylus, finger, etc., touches cover material 3928, the object can cause a capacitance between electrodes 3924 and 3920 at the touch location to decrease. This capacitance change can be caused by charge or current from the stimulated electrode 3924 being shunted through the touching object to ground rather than being coupled to the crossing electrode 3920 at the touch location. The touch signals representative of the capacitance change can be received by electrodes 3920 and transmitted to sense circuitry (e.g., similar or identical to sense circuitry 320) for processing. The touch signals can indicate the touch region where the touch occurred. When combined with the amount of force determined using piezoelectric film 3906 and electrodes 3904 and 3908, both the location of a touch event and amount of force applied to cover material 3928 can be determined. In other examples, electrode 3920 can be driven with stimulation signals while electrode 3924 can be coupled to sense circuitry for detecting a location of a touch event on cover material 3928.

Figure 40:
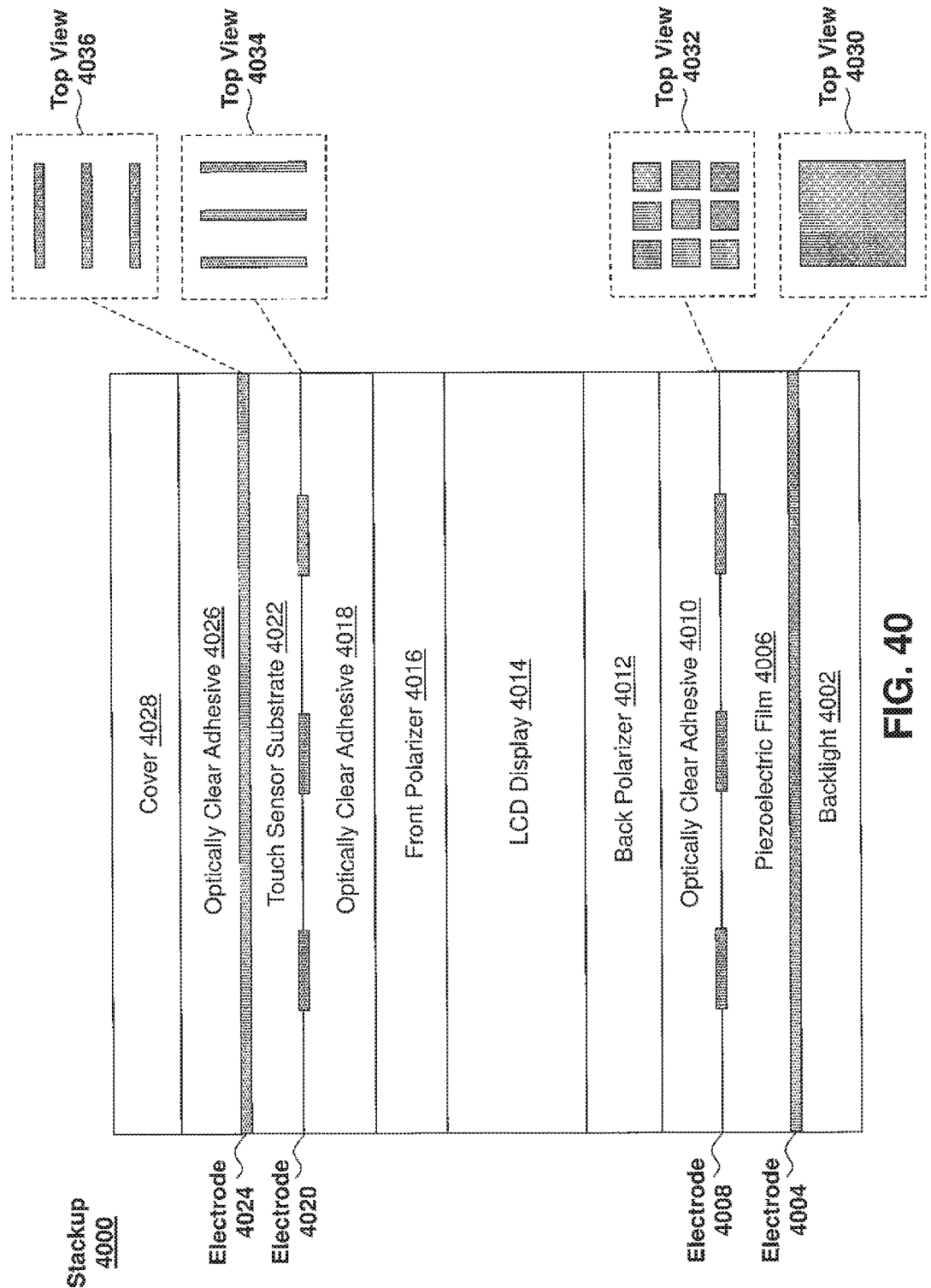

FIG. 40 illustrates a cross-sectional view of another exemplary stackup 4000 for a device containing an LCD display 4014. Stackup 4000 can include a backlight unit 4002 coupled to a piezoelectric film 4006 formed from a transparent film capable of generating a localized electric charge in response to a deformation of the film. Piezoelectric film 4006 can include a first electrode 4004 and a second electrode 4008 formed on opposite surfaces of the film. The electrodes can be formed from a transparent conductive material, such as ITO, PEDOT, or silver nanowire. Top views 4030 and 4032 show the shapes of electrodes 4004 and 4008, respectively, as viewed from above stackup 4000. In the illustrated example, electrode 4004 can extend along the bottom surface of piezoelectric film 4006 and electrode 4008 can include multiple discrete electrodes extending along the top surface of piezoelectric film 4006. While electrode 4008 is shown as having nine square electrodes arranged in rows and columns, it should be appreciated that electrode 4008 can each include any number of electrodes having any desired shaped and arranged in any desired pattern.

Stackup 4000 can further include LCD display 4014 coupled between a back polarizer 4012 and front polarizer 4016. The back polarizer can be coupled to piezoelectric film 4006 by optically clear adhesive 4010. Stackup 4000 can further include touch sensor substrate 4022 coupled to front polarizer 4016 by optically clear adhesive 4018. Touch sensor substrate 4022 can include electrodes 4020 and 4024 formed on opposite surfaces of the sensor. The electrodes can be formed from a transparent conductive material, such as ITO, PEDOT, or silver nanowire. Top views 4034 and 4036 show the shapes of electrodes 4020 and 4024, respectively, as viewed from above stackup 4000. In the illustrated example, electrodes 4020 can include columns of multiple discrete electrodes and electrode 4024 can include multiple rows of discrete electrodes. Stackup 4000 can further include cover material 4028 (e.g., glass, plastic, or other rigid and transparent material) coupled to touch sensor substrate 4022 by optically clear adhesive 4026. While FIG. 40 shows three columns of electrodes 4020 and three rows of electrodes 4024, it should be appreciated that any number of rows and columns of electrodes can be used. Moreover, in other examples, electrode 4020 can be formed on the top of touch sensor substrate 4022 and electrode 4024 can be formed on the bottom of touch sensor substrate 4022.

Electrode 4008 can be separated into discrete electrodes to allow the sense circuitry coupled to the electrodes of electrode 4008 to determine both the amount and location of force applied to cover material 4028. Additionally, multiple forces applied to different portions of cover material 4028 can be detected using the electrodes of electrode 4008. For example, electrode 4004 can be coupled to ground and each electrode of electrode 4008 can be coupled to separate sense circuitry (not shown) similar or identical to sense circuitry 320 that is capable of detecting an amount of electric charge generated by the portion of piezoelectric film 4006 coupled to the electrode. During operation, as a user applies a downward force on cover material 4028, cover material 4028 can deform by an amount corresponding to an amount of the applied force. The deformation of cover material 4028 can cause a corresponding deformation in optically clear adhesive 4026, touch sensor substrate 4022, optically clear adhesive 4018, polarizers 4016 and 4012, LCD display 4014, optically clear adhesive 4010, and piezoelectric film 4006. Piezoelectric film 4006 can then generate an amount of electric charge based on an amount of deformation of the film at a location of the deformation of the film. The electrode of electrode 4008 positioned at or near the location of the deformation and that is electrically coupled to receive the generated charge can transmit the generated charge to its associated sense circuitry. Since the amount of electric charge generated by piezoelectric film 4006 can be representative of the amount of deformation of the film and because the amount of deformation of the film can be representative of the force applied to cover material 4028, the amount of electric charge detected by the sense circuitry can be representative of the force applied to cover material 4028. Additionally, since the location of the electrode of electrode 4008 receiving the generated charge is known, the location of the applied force can also be determined. In this way, the sense circuitry can be used to detect an amount and location of a force applied to cover material 4028. Moreover, the multiple electrodes of electrode 4008 and the separate sense circuitry coupled to each electrode allows for detection of multiple forces applied to different portions of cover material 4028 at the same time. In other examples, electrode 4008 can be coupled to the bottom of piezoelectric film 4006 and electrode 4004 can be coupled to the top of piezoelectric film 4006. In these examples, the electrodes of electrode 4008 can each be coupled to separate sense circuitry and electrode 4004 can be coupled to ground. The sense circuitry can be used to detect an amount and location of force applied to cover material 4028 in a manner similar to that described above for the configuration shown in FIG. 40.

Additionally, during operation, touch sensor substrate 4022 and electrodes 4020 and 4024 can be used to determine a position of a touch event (e.g., a finger, stylus, or other object touching cover material 4028) on cover material 4028 using a mutual capacitance sensing technique. For example, electrodes 4024 can be driven with sinusoidal stimulation signals to capacitively couple with crossing columns of electrodes 4020, thereby forming a capacitive path for coupling charge from electrodes 4024 to the electrodes 4020. The crossing electrodes 4020 can output touch signals representing the coupled charge or current. When an object, such as a passive stylus, finger, etc., touches cover material 4028, the object can cause a capacitance between electrodes 4024 and 4020 at the touch location to decrease. This capacitance change can be caused by charge or current from the stimulated electrode 4024 being shunted through the touching object to ground rather than being coupled to the crossing electrode 4020 at the touch location. The touch signals representative of the capacitance change can be received by electrodes 4020 and transmitted to sense circuitry (e.g., similar or identical to sense circuitry 320) for processing. The touch signals can indicate the touch region where the touch occurred. When combined with the amount of force determined using piezoelectric film 4006 and electrodes 4004 and 4008, both the location of a touch event and amount of force applied to cover material 4028 can be determined. In other examples, electrode 4020 can be driven with stimulation signals while electrode 4024 can be coupled to sense circuitry for detecting a location of a touch event on cover material 4028.

Figure 41:
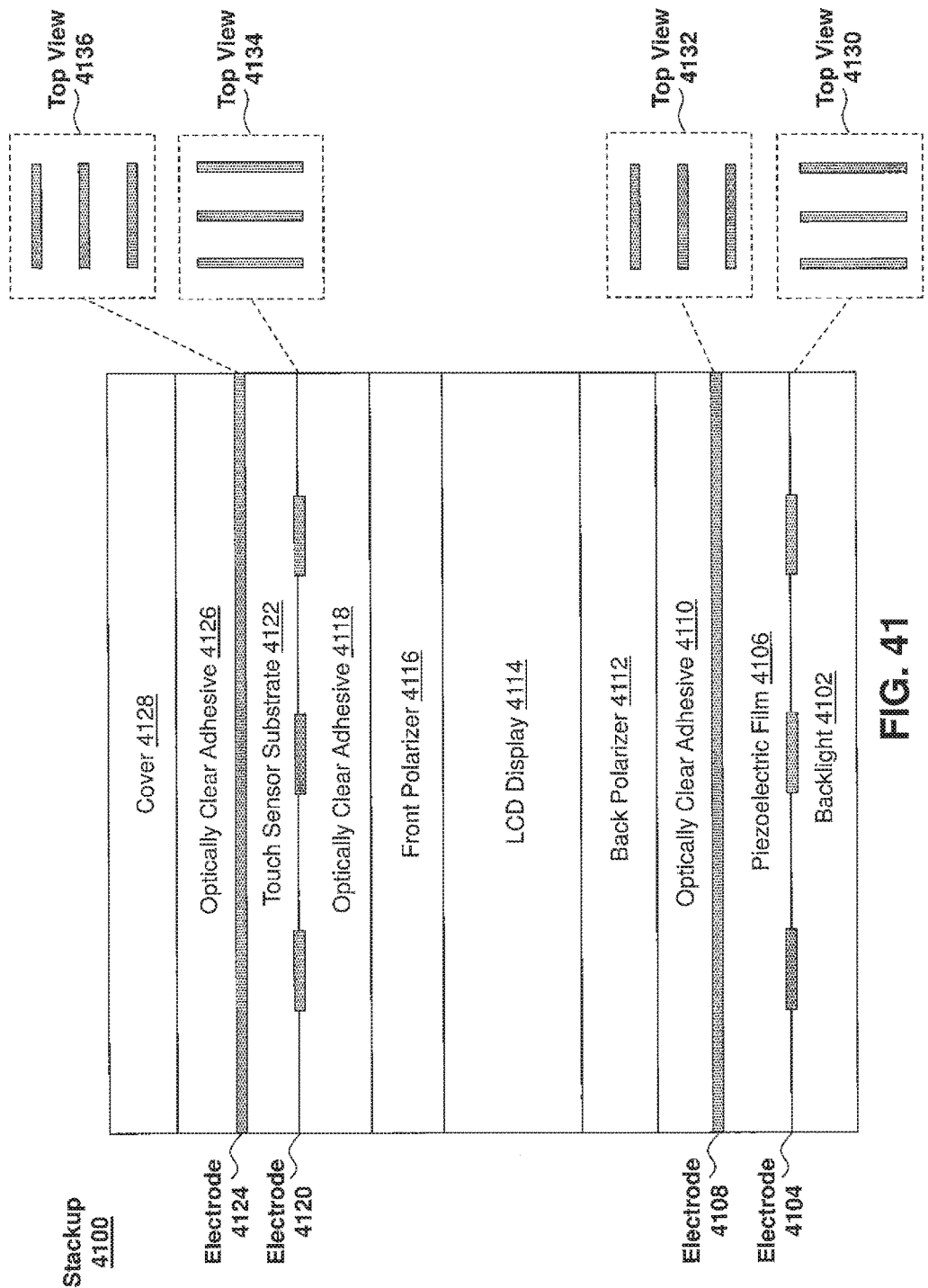

FIG. 41 illustrates a cross-sectional view of another exemplary stackup 4100 for a device containing an LCD display 4114. Stackup 4100 can include a backlight unit 4102 coupled to a piezoelectric film 4106 formed from a transparent film capable of generating a localized electric charge in response to a deformation of the film. Piezoelectric film 4106 can include a first electrode 4104 and a second electrode 4108 formed on opposite surfaces of the film. The electrodes can be formed from a transparent conductive material, such as ITO, PEDOT, or silver nanowire. Top views 4130 and 4132 show the shapes of electrodes 4104 and 4108, respectively, as viewed from above stackup 4100. In the illustrated example, electrode 4104 can include multiple columns of discrete electrodes and electrode 4108 can include multiple rows of discrete electrodes. While FIG. 41 shows three columns of electrodes 4104 and three rows of electrodes 4108, it should be appreciated that any number of rows and columns of electrodes can be used. Moreover, in other examples, electrode 4104 can be formed on the top of piezoelectric film 4106 and electrode 4108 can be formed on the bottom of piezoelectric film 4106.

Stackup 4100 can further include LCD display 4114 coupled between a back polarizer 4112 and front polarizer 4116. The back polarizer can be coupled to piezoelectric film 4106 by optically clear adhesive 4110. Stackup 4100 can further include touch sensor substrate 4122 coupled to front polarizer 4116 by optically clear adhesive 4118. Touch sensor substrate 4122 can include electrodes 4120 and 4124 formed on opposite surfaces of the sensor. The electrodes can be formed from a transparent conductive material, such as ITO, PEDOT, or silver nanowire. Top views 4134 and 4136 show the shapes of electrodes 4120 and 4124, respectively, as viewed from above stackup 4100. In the illustrated example, electrodes 4120 can include columns of multiple discrete electrodes and electrode 4124 can include multiple rows of discrete electrodes. Stackup 4100 can further include cover material 4128 (e.g., glass, plastic, or other rigid and transparent material) coupled to touch sensor substrate 4122 by optically clear adhesive 4126. While FIG. 41 shows three columns of electrodes 4120 and three rows of electrodes 4124, it should be appreciated that any number of rows and columns of electrodes can be used. Moreover, in other examples, electrode 4120 can be formed on the top of touch sensor substrate 4122 and electrode 4124 can be formed on the bottom of touch sensor substrate 4122.

In some examples, the electrodes of electrode 4104 can be coupled to ground and each electrode of electrode 4108 can be coupled to separate sense circuitry (not shown) similar or identical to sense circuitry 320 that is capable of detecting an amount of electric charge generated by the portion of piezoelectric film 4106 coupled to the electrode. During operation, as a user applies a downward force on cover material 4128, cover material 4128 can deform by an amount corresponding to an amount of the applied force. The deformation of cover material 4128 can cause a corresponding deformation in optically clear adhesive 4126, touch sensor substrate 4122, optically clear adhesive 4118, polarizers 4116, and 4112, LCD display 4114, optically clear adhesive 4110, and piezoelectric film 4106. Piezoelectric film 4106 can then generate an amount of electric charge based on an amount of deformation of the film. The location of the generated electric charge can correspond to the location of the deformation of the film. The electrode of electrode 4108 positioned at or near the location of the deformation and that is electrically coupled to receive the generated charge can transmit the generated charge to its associated sense circuitry. Since the amount of electric charge generated by piezoelectric film 4106 can be representative of the amount of deformation of the film and because the amount of deformation of the film can be representative of the force applied to cover material 4128, the amount of electric charge detected by the sense circuitry can be representative of the force applied to cover material 4128. Additionally, since the location of the electrode of electrode 4108 receiving the generated charge is known, the location of the applied force can also be determined. In this way, the sense circuitry can be used to detect an amount and location of a force applied to cover material 4128. Moreover, the multiple electrodes of electrode 4108 and the separate sense circuitry coupled to each electrode allows for detection of multiple forces applied to different portions of cover material 4128 at the same time. In other examples, the electrodes of electrode 4108 can be coupled to ground and the electrodes of electrode 4104 can each be coupled to separate sense circuitry. In these examples, the sense circuitry can be used to determine the amount and location of forces applied to cover material 4128 based on electric charges received from the electrodes of electrode 4104.

In yet other examples, electrode 4104 can be coupled to ground and electrode 4108 can be coupled to separate sense circuitry. The sense circuitry can be used to determine both an amount and location along one of the electrodes of electrode 4108 of an applied force. Using, for example, switching circuitry coupled to electrodes 4104 and 4108, electrode 4104 can then be coupled to separate sense circuitry and electrode 4108 can then be coupled to ground. The sense circuitry can be used to determine both an amount and location along one of the electrodes of electrode 4104 of an applied force. The intersection of the determined row and column can be interpreted as a location of the force on cover material 4128.

Additionally, during operation, touch sensor substrate 4122 and electrodes 4120 and 4124 can be used to determine a position of a touch event (e.g., a finger, stylus, or other object touching cover material 4128) on cover material 4128 using a mutual capacitance sensing technique. For example, electrodes 4124 can be driven with sinusoidal stimulation signals to capacitively couple with crossing columns of electrodes 4120, thereby forming a capacitive path for coupling charge from electrodes 4124 to the electrodes 4120. The crossing electrodes 4120 can output touch signals representing the coupled charge or current. When an object, such as a passive stylus, finger, etc., touches cover material 4128, the object can cause a capacitance between electrodes 4124 and 4120 at the touch location to decrease. This capacitance change can be caused by charge or current from the stimulated electrode 4124 being shunted through the touching object to ground rather than being coupled to the crossing electrode 4120 at the touch location. The touch signals representative of the capacitance change can be received by electrodes 4120 and transmitted to sense circuitry (e.g., similar or identical to sense circuitry 320) for processing. The touch signals can indicate the touch region where the touch occurred. When combined with the amount of force determined using piezoelectric film 4106 and electrodes 4104 and 4108, both the location of a touch event and amount of force applied to cover material 4128 can be determined. In other examples, electrode 4120 can be driven with stimulation signals while electrode 4124 can be coupled to sense circuitry for detecting a location of a touch event on cover material 4128.

Figure 42:
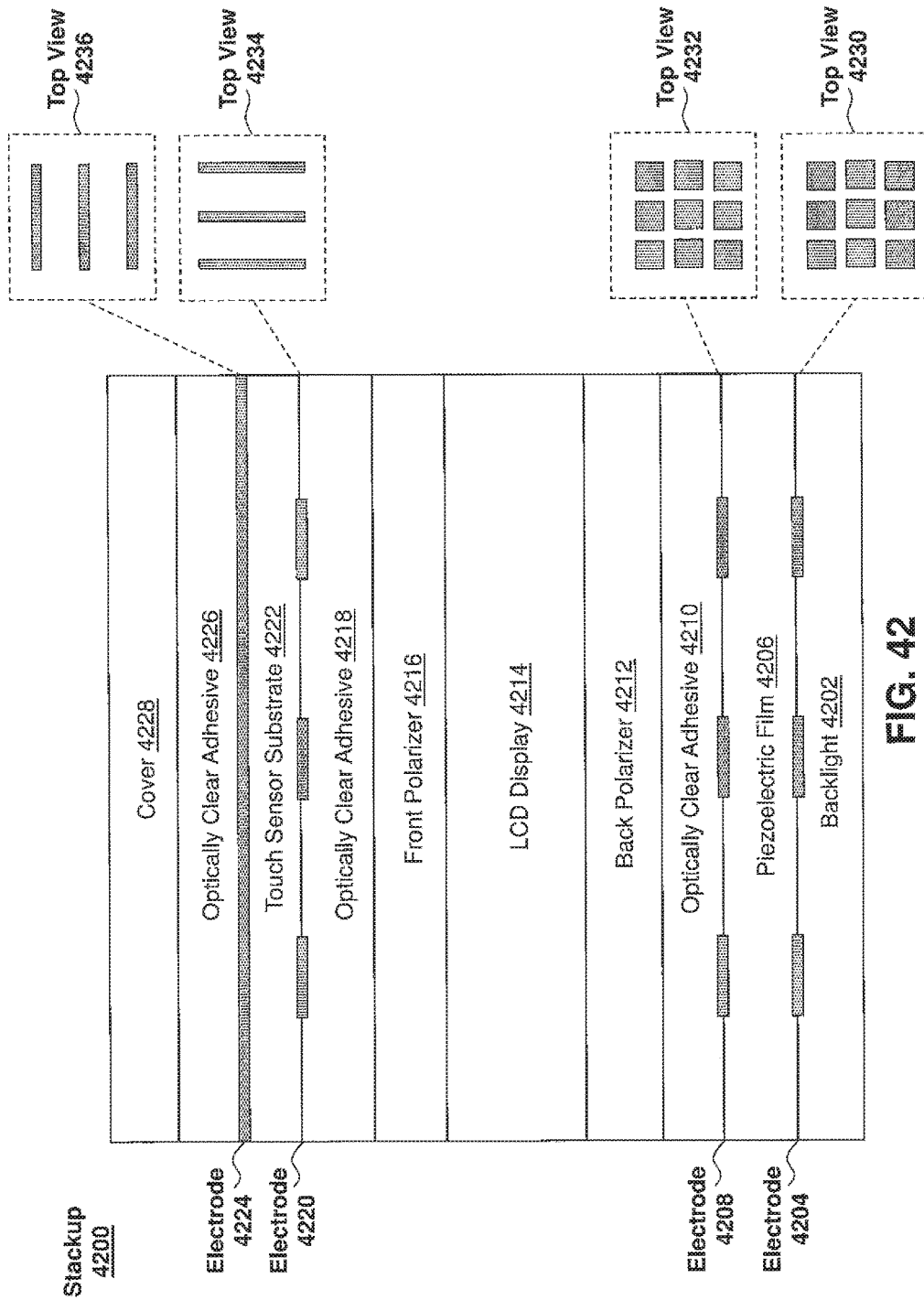

FIG. 42 illustrates a cross-sectional view of another exemplary stackup 4200 for a device containing an LCD display 4214. Stackup 4200 can include a backlight unit 4202 coupled to a piezoelectric film 4206 formed from a transparent film capable of generating a localized electric charge in response to a deformation of the film. Piezoelectric film 4206 can include a first electrode 4204 and a second electrode 4208 formed on opposite surfaces of the film. The electrodes can be formed from a transparent conductive material, such as ITO, PEDOT, or silver nanowire. Top views 4230 and 4232 show the shapes of electrodes 4204 and 4208, respectively, as viewed from above stackup 4200. In the illustrated example, electrodes 4204 and 4208 can both include multiple discrete electrodes extending along the top surface of piezoelectric film 4206. While FIG. 42 shows electrodes 4204 and 4208 each having nine square electrodes arranged in rows and columns, it should be appreciated that electrodes 4204 and 4208 can each include any number of electrodes having any desired shaped and arranged in any desired pattern such that the electrodes of electrode 4204 are positioned opposite the electrodes of electrode 4208 on piezoelectric film 4206.

Stackup 4200 can further include LCD display 4214 coupled between a back polarizer 4212 and front polarizer 4216. The back polarizer can be coupled to piezoelectric film 4206 by optically clear adhesive 4210. Stackup 4200 can further include touch sensor substrate 4222 coupled to front polarizer 4216 by optically clear adhesive 4218. Touch sensor substrate 4222 can include electrodes 4220 and 4224 formed on opposite surfaces of the sensor. The electrodes can be formed from a transparent conductive material, such as ITO, PEDOT, or silver nanowire. Top views 4234 and 4236 show the shapes of electrodes 4220 and 4224, respectively, as viewed from above stackup 4200. In the illustrated example, electrodes 4220 can include columns of multiple discrete electrodes and electrode 4224 can include multiple rows of discrete electrodes. Stackup 4200 can further include cover material 4228 (e.g., glass, plastic, or other rigid and transparent material) coupled to touch sensor substrate 4222 by optically clear adhesive 4226. While FIG. 42 shows three columns of electrodes 4220 and three rows of electrodes 4224, it should be appreciated that any number of rows and columns of electrodes can be used. Moreover, in other examples, electrode 4220 can be formed on the top of touch sensor substrate 4222 and electrode 4224 can be formed on the bottom of touch sensor substrate 4222.

Electrodes 4204 and 4208 can be separated into discrete electrodes positioned opposite each other on piezoelectric film 4206 to allow the sense circuitry coupled to the electrodes of electrode 4208 to determine both the amount and location of force applied to cover material 4228. Additionally, multiple forces applied to different portions of cover material 4228 can be detected using the electrodes of electrode 4208. For example, the electrodes of electrode 4204 can be coupled to ground and each electrode of electrode 4208 can be coupled to separate sense circuitry (not shown) similar or identical to sense circuitry 320 that is capable of detecting an amount of electric charge generated by the portion of piezoelectric film 4206 coupled to the electrode. During operation, as a user applies a downward force on cover material 4228, cover material 4228 can deform by an amount corresponding to an amount of the applied force. The deformation of cover material 4228 can cause a corresponding deformation in optically clear adhesive 4226, touch sensor substrate 4222, optically clear adhesive 4218, polarizers 4216 and 4212, LCD display 4214, optically clear adhesive 4210, and piezoelectric film 4206. Piezoelectric film 4206 can then generate an amount of electric charge based on an amount of deformation of the film and at a location of the deformation of the film. The electrode of electrode 4208 positioned at or near the location of the deformation and that is electrically coupled to receive the generated charge can transmit the generated charge to its associated sense circuitry. Since the amount of electric charge generated by piezoelectric film 4206 can be representative of the amount of deformation of the film and because the amount of deformation of the film can be representative of the force applied to cover material 4228, the amount of electric charge detected by the sense circuitry can be representative of the force applied to cover material 4228. Additionally, since the location of the electrode of electrode 4208 receiving the generated charge is known, the location of the applied force can also be determined. In this way, the sense circuitry can be used to detect an amount and location of a force applied to cover material 4228. Moreover, the multiple electrodes of electrode 4208 and the separate sense circuitry coupled to each electrode allows for detection of multiple forces applied to different portions of cover material 4228 at the same time. In other examples, the electrodes of electrode 4208 can be coupled to ground and the electrodes of electrode 4204 can each be coupled to separate sense circuitry. In these examples, the sense circuitry can be used to determine the amount and location of forces applied to cover material 4228 based on electric charges received from the electrodes of electrode 4204.

Additionally, during operation, touch sensor substrate 4222 and electrodes 4220 and 4224 can be used to determine a position of a touch event (e.g., a finger, stylus, or other object touching cover material 4228) on cover material 4228 using a mutual capacitance sensing technique. For example, electrodes 4224 can be driven with sinusoidal stimulation signals to capacitively couple with crossing columns of electrodes 4220, thereby forming a capacitive path for coupling charge from electrodes 4224 to the electrodes 4220. The crossing electrodes 4220 can output touch signals representing the coupled charge or current. When an object, such as a passive stylus, finger, etc., touches cover material 4228, the object can cause a capacitance between electrodes 4224 and 4220 at the touch location to decrease. This capacitance change can be caused by charge or current from the stimulated electrode 4224 being shunted through the touching object to ground rather than being coupled to the crossing electrode 4220 at the touch location. The touch signals representative of the capacitance change can be received by electrodes 4220 and transmitted to sense circuitry (e.g., similar or identical to sense circuitry 320) for processing. The touch signals can indicate the touch region where the touch occurred. When combined with the amount of force determined using piezoelectric film 4206 and electrodes 4204 and 4208, both the location of a touch event and amount of force applied to cover material 4228 can be determined. In other examples, electrode 4220 can be driven with stimulation signals while electrode 4224 can be coupled to sense circuitry for detecting a location of a touch event on cover material 4228.

Figure 43:
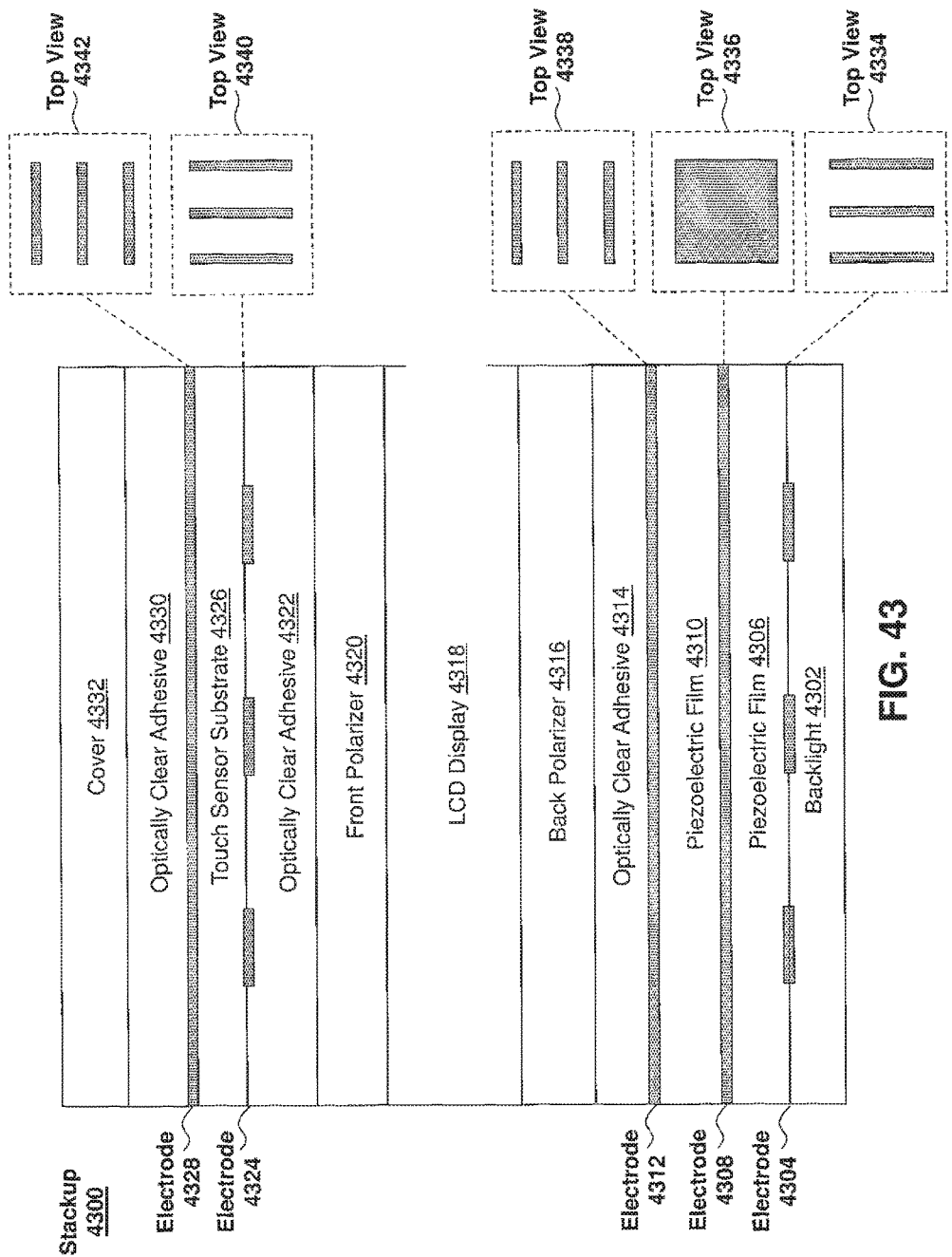

FIG. 43 illustrates a cross-sectional view of another exemplary stackup 4300 for a device containing an LCD display 4318. Stackup 4300 can include a backlight unit 4302 coupled to a first piezoelectric film 4306 and a second piezoelectric film 4310 coupled to first piezoelectric film 4306. The first and second piezoelectric films 4306 and 4310 can both include a transparent or non-transparent film capable of generating a localized electric charge in response to a deformation of the film. A first electrode 4304 can be formed on the bottom of the first piezoelectric film 4306, a second electrode 4308 can be formed between the first and second piezoelectric films 4306 and 4310, and a third electrode 4312 can be formed on the top of the second piezoelectric film 4310. The electrodes can be formed from a transparent or non-transparent conductive material, such as ITO, PEDOT, silver ink, silver nanowire, or copper. Top views 4334, 4336, and 4338 show the shapes of electrodes 4304, 4308, and 4312, respectively, as viewed from above stackup 4300. In the illustrated example, electrode 4304 can include multiple columns of discrete electrodes, electrode 4308 can include an electrode extending along the surfaces of piezoelectric films 4306 and 4310, and electrode 4312 can include rows of multiple discrete electrodes. While FIG. 43 shows electrodes 4304 and 4312 each having three rectangular electrodes arranged in columns and rows, respectively, it should be appreciated that electrodes 4304 and 4312 can each include any number of rectangular electrodes and can instead be arranged in rows and columns, respectively.

Stackup 4300 can further include LCD display 4318 coupled between a back polarizer 4316 and front polarizer 4320. The back polarizer can be coupled to second piezoelectric film 4310 by optically clear adhesive 4314. Stackup 4300 can further include touch sensor substrate 4326 coupled to front polarizer 4320 by optically clear adhesive 4322. Touch sensor substrate 4326 can include electrodes 4324 and 4328 formed on opposite surfaces of the sensor. The electrodes can be formed from a transparent conductive material, such as ITO, PEDOT, or silver nanowire. Top views 4340 and 4342 show the shapes of electrodes 4324 and 4328, respectively, as viewed from above stackup 4300. In the illustrated example, electrodes 4324 can include columns of multiple discrete electrodes and electrode 4328 can include multiple rows of discrete electrodes. Stackup 4300 can further include cover material 4332 (e.g., glass, plastic, or other rigid and transparent material) coupled to touch sensor substrate 4326 by optically clear adhesive 4330. While FIG. 43 shows three columns of electrodes 4324 and three rows of electrodes 4328, it should be appreciated that any number of rows and columns of electrodes can be used. Moreover, in other examples, electrode 4324 can be formed on the top of touch sensor substrate 4326 and electrode 4328 can be formed on the bottom of touch sensor substrate 4326.

Electrodes 4304 and 4312 can be separated into discrete columns and rows of electrodes to allow the sense circuitry coupled to the electrodes of electrodes 4304 and 4312 to determine both the amount and location of force applied to cover material 4332. Additionally, multiple forces applied to different portions of cover material 4332 can be detected at the same time using the electrodes of electrodes 4304 and 4312. For example, electrode 4308 can be coupled to ground while the electrodes of electrode 4304 can each be coupled to separate sense circuitry (not shown) similar or identical to sense circuitry 320 that is capable of detecting an amount of electric charge generated by the portion of piezoelectric film 4306 coupled to the electrode. The electrodes of electrode 4312 can also be coupled to separate sense circuitry (not shown) similar or identical to sense circuitry 320 that is capable of detecting an amount of electric charge generated by the portion of piezoelectric film 4310 coupled to the electrode. During operation, as a user applies a downward force on cover material 4332, cover material 4332 can deform by an amount corresponding to an amount of the applied force. The deformation of cover material 4332 can cause a corresponding deformation in optically clear adhesive 4330, touch sensor substrate 4326, optically clear adhesive 4322, polarizers 4320 and 4316, LCD display 4318, optically clear adhesive 4314, and piezoelectric films 4310 and 4306. Piezoelectric films 4310 and 4306 can then generate an amount of electric charge based on an amount of deformation of the film and at a location of the deformation of the film. The electrode of electrode 4312 positioned at or near the location of the deformation of piezoelectric film 4310 and that is electrically coupled to receive the generated charge can transmit the generated charge to its associated sense circuitry. Similarly the electrode of electrode 4304 positioned at or near the location of the deformation of piezoelectric film 4306 and that is electrically coupled to receive the generated charge can transmit the generated charge to its associated sense circuitry. Since the amount of electric charge generated by piezoelectric films 4306 and 4310 can be representative of the amount of deformation of the films and because the amount of deformation of the films can be representative of the force applied to cover material 4332, the amount of electric charge detected by the sense circuitry can be representative of the force applied to cover material 4332. Additionally, since the location of the electrodes of electrodes 4304 and 4312 receiving the generated charge is known, the location of the applied force can also be determined. For example, electrode 4312 can be used to determine the row at which the force was applied, while electrode 4304 can be used to determine the column at which the force was applied. The intersection of the determined row and column can be the location of the applied force. In this way, the sense circuitry can be used to detect an amount and location of a force applied to cover material 4332. Moreover, the multiple electrodes of electrodes 4304 and 4312 and the separate sense circuitry coupled to each electrode allows for detection of multiple forces applied to different portions of cover material 4332 at the same time. In other examples, electrode 4312 can be coupled to the bottom of piezoelectric film 4306 and electrode 4304 can be coupled to the top of piezoelectric film 4310. In these examples, the electrodes of electrodes 4304 and 4312 can each be coupled to separate sense circuitry. The sense circuitry can be used to detect an amount and location of force applied to cover material 4332 in a manner similar to that described above for the configuration shown in FIG. 43.

Additionally, during operation, touch sensor substrate 4326 and electrodes 4324 and 4328 can be used to determine a position of a touch event (e.g., a finger, stylus, or other object touching cover material 4332) on cover material 4332 using a mutual capacitance sensing technique. For example, electrodes 4328 can be driven with sinusoidal stimulation signals to capacitively couple with crossing columns of electrodes 4324, thereby forming a capacitive path for coupling charge from electrodes 4328 to the electrodes 4324. The crossing electrodes 4324 can output touch signals representing the coupled charge or current. When an object, such as a passive stylus, finger, etc., touches cover material 4332, the object can cause a capacitance between electrodes 4328 and 4324 at the touch location to decrease. This capacitance change can be caused by charge or current from the stimulated electrode 4328 being shunted through the touching object to ground rather than being coupled to the crossing electrode 4324 at the touch location. The touch signals representative of the capacitance change can be received by electrodes 4324 and transmitted to sense circuitry (e.g., similar or identical to sense circuitry 320) for processing. The touch signals can indicate the touch region where the touch occurred. When combined with the amount of force determined using piezoelectric films 4306 and 4310 and electrodes 4304, 4308, and 4312, both the location of a touch event and amount of force applied to cover material 4332 can be determined. In other examples, electrode 4324 can be driven with stimulation signals while electrode 4328 can be coupled to sense circuitry for detecting a location of a touch event on cover material 4332.

Figure 44:
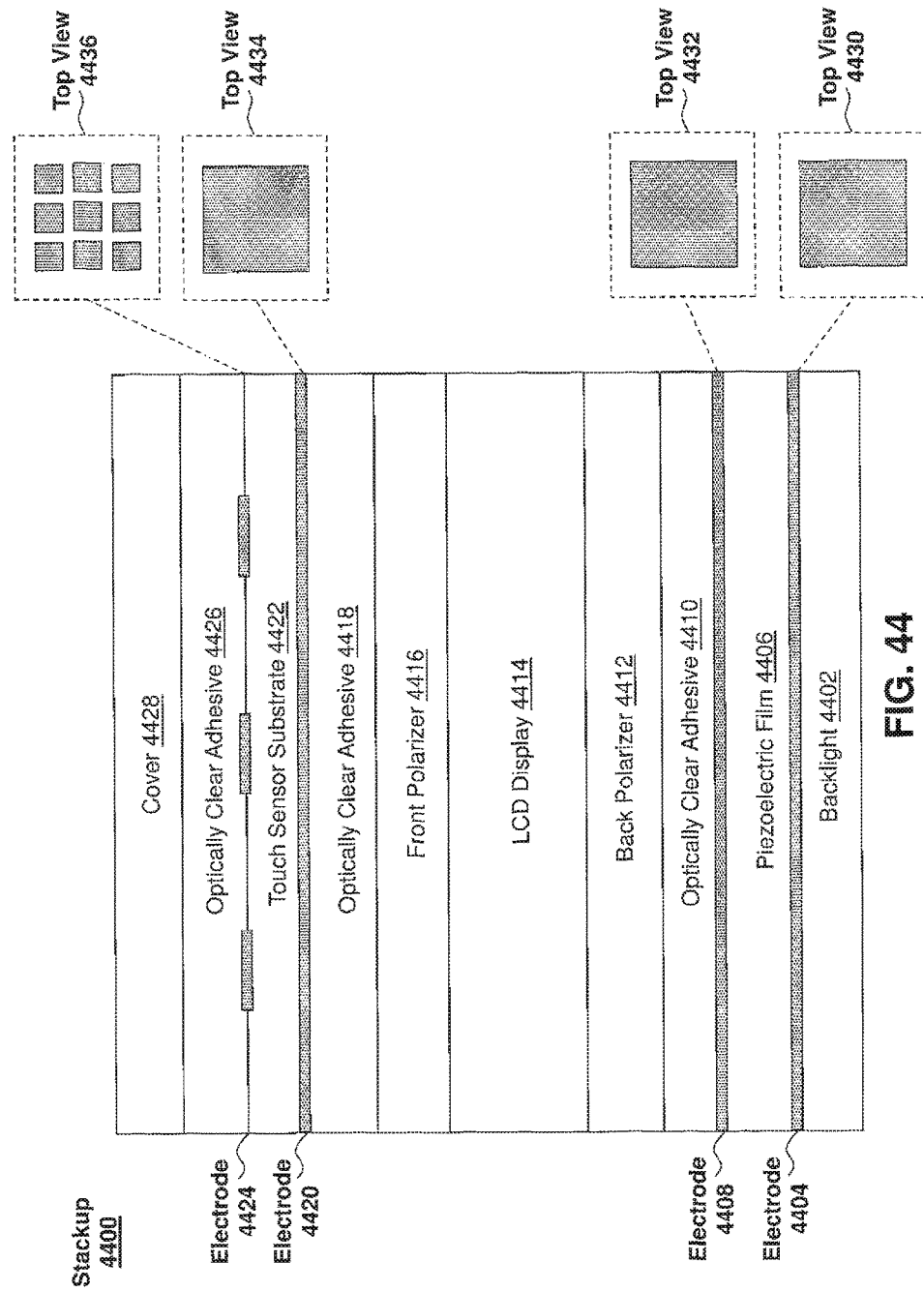

FIG. 44 illustrates a cross-sectional view of another exemplary stackup 4400 for a device containing an LCD display 4414. Stackup 4400 can include a backlight unit 4402 coupled to a piezoelectric film 4406 formed from a transparent film capable of generating a localized electric charge in response to a deformation of the film. Piezoelectric film 4406 can include a first electrode 4404 and a second electrode 4408 formed on opposite surfaces of the film. The electrodes can be formed from a transparent conductive material, such as ITO, PEDOT, or silver nanowire. Top views 4430 and 4432 show the shapes of electrodes 4404 and 4408, respectively, as viewed from above stackup 4400. In the illustrated example, electrodes 4404 and 4408 can both have a shape that substantially matches that of piezoelectric film 4406 and can extend along the surfaces of piezoelectric film 4406.

Stackup 4400 can further include LCD display 4414 coupled between a back polarizer 4412 and front polarizer 4416. The back polarizer 4412 can be coupled to piezoelectric film 4406 by optically clear adhesive 4410. Stackup 4400 can further include touch sensor substrate 4422 coupled to front polarizer 4416 by optically clear adhesive 4418. Touch sensor substrate 4422 can include electrodes 4420 and 4424 formed on opposite surfaces of the sensor. The electrodes can be formed from a transparent conductive material, such as ITO, PEDOT, or silver nanowire. Top views 4434 and 4436 show the shapes of electrodes 4420 and 4424, respectively, as viewed from above stackup 4400. In the illustrated example, electrode 4424 can include multiple discrete electrodes extending along the top surface of touch sensor substrate 4422 and electrode 4420 can extend along the bottom surface of touch sensor substrate 4420. Stackup 4400 can further include cover material 4428 (e.g., glass, plastic, or other rigid and transparent material) coupled to touch sensor substrate 4422 by optically clear adhesive 4426. While FIG. 44 shows electrode 4424 having nine square electrodes arranged in rows and columns, it should be appreciated that electrode 4424 can include any number of electrodes having any desired shaped and arranged in any desired pattern. Moreover, in other examples, electrode 4420 can be formed on the top of touch sensor substrate 4422 and electrode 4424 can be formed on the bottom of touch sensor substrate 4422.

In some examples, electrode 4404 can be coupled to ground and electrode 4408 can be coupled to sense circuitry (not shown) similar or identical to sense circuitry 320 that is capable of detecting an amount of electric charge generated by piezoelectric film 4406. During operation, as a user applies a downward force on cover material 4428, cover material 4428 can deform by an amount corresponding to an amount of the applied force. The deformation of cover material 4428 can cause a corresponding deformation in optically clear adhesive 4426, touch sensor substrate 4422, optically clear adhesive 4418, polarizers 4416 and 4412, LCD display 4414, optically clear adhesive 4410, and piezoelectric film 4406. Piezoelectric film 4406 can then generate an amount of electric charge based on an amount of deformation of the film. The generated electric charge can be received by the sense circuitry via electrode 4408. Since the amount of electric charge generated by piezoelectric film 4406 can be representative of the amount of deformation of the film and because the amount of deformation of the film can be representative of the force applied to cover material 4428, the amount of electric charge detected by the sense circuitry can be representative of the force applied to cover material 4428. In this way, the sense circuitry can be used to detect an amount of force applied to cover material 4428. In other examples, the electrode 4408 can be coupled to ground and electrode 4404 can be coupled to the sense circuitry. In these examples, the sense circuitry can be used to determine the amount of force applied to cover material 4428 based on electric charge received from electrode 4404.

Additionally, during operation, electrodes 4420 and 4424 can be used to determine a position of a touch event (e.g., a finger, stylus, or other object touching cover material 4428) on cover material 4428 using a self capacitance sensing technique. For example, each electrode of electrode 4424 can be coupled to a voltage source and sense circuitry. The sense circuitry can measure a change in capacitance at each electrode caused by an object, such as a passive stylus, finger, etc., touching cover material 4428. The capacitance change can be caused by charge or current from the electrode of electrode 4424 being shunted through the touching object to ground. The detected change in capacitance measured by the sense circuitry can be representative of a touch event occurring at a location corresponding to the associated electrode of electrode 4424. When combined with the amount of force determined using piezoelectric film 4406 and electrodes 4402 and 4408, both the location of the touch event and amount of force applied to cover material 4428 can be determined.

Figure 45:
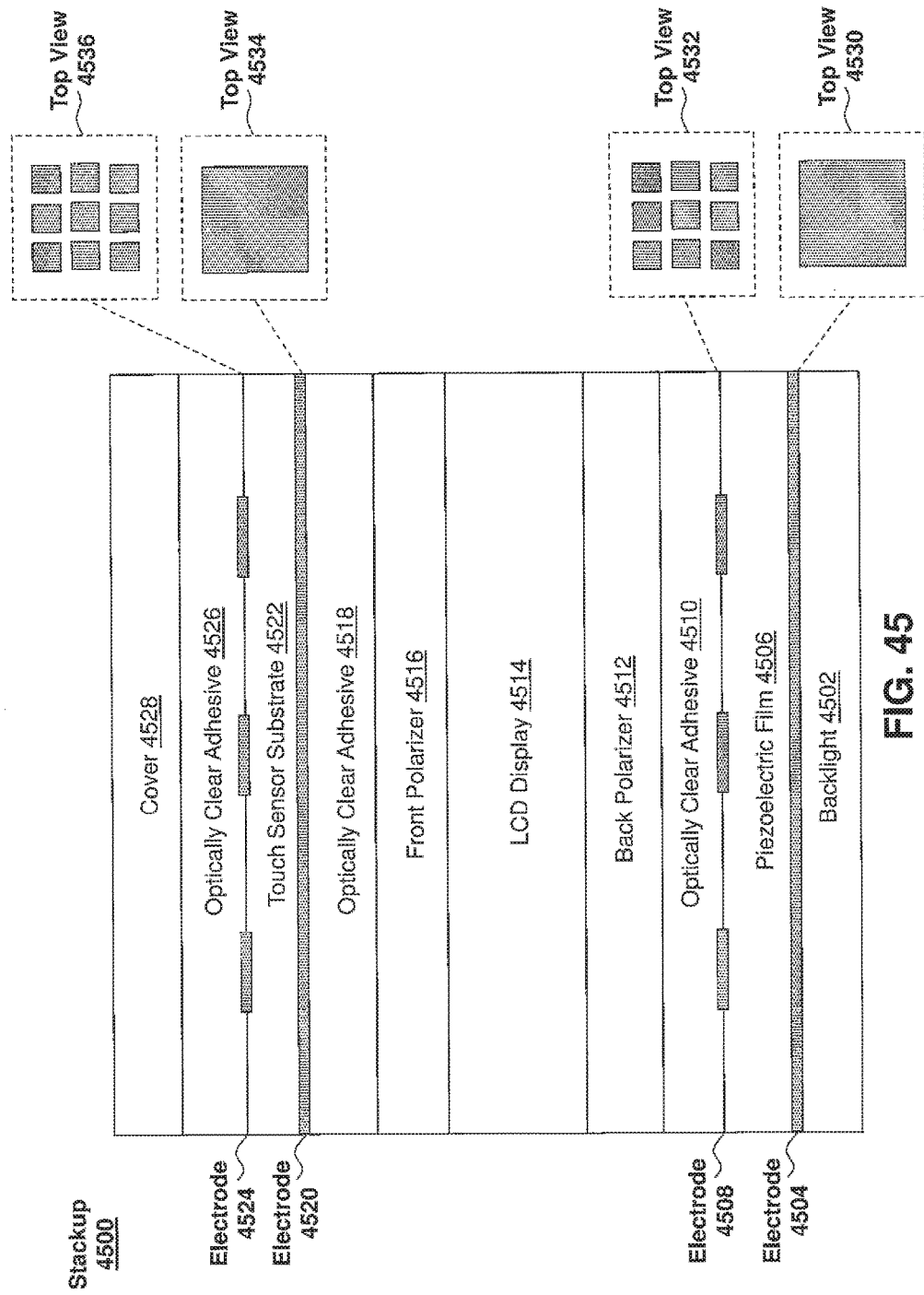

FIG. 45 illustrates a cross-sectional view of another exemplary stackup 4500 for a device containing an LCD display 4514. Stackup 4500 can include a backlight unit 4502 coupled to a piezoelectric film 4506 formed from a transparent film capable of generating a localized electric charge in response to a deformation of the film. Piezoelectric film 4506 can include a first electrode 4504 and a second electrode 4508 formed on opposite surfaces of the film. The electrodes can be formed from a transparent conductive material, such as ITO, PEDOT, or silver nanowire. Top views 4530 and 4532 show the shapes of electrodes 4504 and 4508, respectively, as viewed from above stackup 4500. In the illustrated example, electrode 4504 can extend along the bottom surface of piezoelectric film 4506 and electrode 4508 can include multiple discrete electrodes extending along the top surface of piezoelectric film 4506. While electrode 4508 is shown as having nine square electrodes arranged in rows and columns, it should be appreciated that electrode 4508 can each include any number of electrodes having any desired shaped and arranged in any desired pattern.

Stackup 4500 can further include LCD display 4514 coupled between a back polarizer 4512 and front polarizer 4516. The back polarizer can be coupled to piezoelectric film 4506 by optically clear adhesive 4510. Stackup 4500 can further include touch sensor substrate 4522 coupled to front polarizer 4516 by optically clear adhesive 4518. Touch sensor substrate 4522 can include electrodes 4520 and 4524 formed on opposite surfaces of the sensor. The electrodes can be formed from a transparent conductive material, such as ITO, PEDOT, or silver nanowire. Top views 4534 and 4536 show the shapes of electrodes 4520 and 4524, respectively, as viewed from above stackup 4500. In the illustrated example, electrode 4524 can include multiple discrete electrodes extending along the top surface of touch sensor substrate 4522 and electrode 4520 can extend along the bottom surface of touch sensor substrate 4422. Stackup 4500 can further include cover material 4528 (e.g., glass, plastic, or other rigid and transparent material) coupled to touch sensor substrate 4522 by optically clear adhesive 4526. While FIG. 45 shows electrode 4524 having nine square electrodes arranged in rows and columns, it should be appreciated that electrode 4524 can include any number of electrodes having any desired shaped and arranged in any desired pattern. Moreover, in other examples, electrode 4520 can be formed on the top of touch sensor substrate 4522 and electrode 4524 can be formed on the bottom of touch sensor substrate 4522.

Electrode 4508 can be separated into discrete electrodes to allow the sense circuitry coupled to the electrodes of electrode 4508 to determine both the amount and location of force applied to cover material 4528. Additionally, multiple forces applied to different portions of cover material 4528 can be detected using the electrodes of electrode 4508. For example, electrode 4504 can be coupled to ground and each electrode of electrode 4508 can be coupled to separate sense circuitry (not shown) similar or identical to sense circuitry 320 that is capable of detecting an amount of electric charge generated by the portion of piezoelectric film 4506 coupled to the electrode. During operation, as a user applies a downward force on cover material 4528, cover material 4528 can deform by an amount corresponding to an amount of the applied force. The deformation of cover material 4528 can cause a corresponding deformation in optically clear adhesive 4526, touch sensor substrate 4522, optically clear adhesive 4518, polarizers 4516 and 4512, LCD display 4514, optically clear adhesive 4510, and piezoelectric film 4506. Piezoelectric film 4506 can then generate an amount of electric charge based on an amount of deformation of the film at a location of the deformation of the film. The electrode of electrode 4508 positioned at or near the location of the deformation and that is electrically coupled to receive the generated charge can transmit the generated charge to its associated sense circuitry. Since the amount of electric charge generated by piezoelectric film 4506 can be representative of the amount of deformation of the film and because the amount of deformation of the film can be representative of the force applied to cover material 4528, the amount of electric charge detected by the sense circuitry can be representative of the force applied to cover material 4528. Additionally, since the location of the electrode of electrode 4508 receiving the generated charge is known, the location of the applied force can also be determined. In this way, the sense circuitry can be used to detect an amount and location of a force applied to cover material 4528. Moreover, the multiple electrodes of electrode 4508 and the separate sense circuitry coupled to each electrode allows for detection of multiple forces applied to different portions of cover material 4528 at the same time. In other examples, electrode 4508 can be coupled to the bottom of piezoelectric film 4506 and electrode 4504 can be coupled to the top of piezoelectric film 4506. In these examples, the electrodes of electrode 4508 can each be coupled to separate sense circuitry and electrode 4504 can be coupled to ground. The sense circuitry can be used to detect an amount and location of force applied to cover material 4528 in a manner similar to that described above for the configuration shown in FIG. 45.

Additionally, during operation, electrodes 4520 and 4524 can be used to determine a position of a touch event (e.g., a finger, stylus, or other object touching cover material 4528) on cover material 4528 using a self capacitance sensing technique. For example, each electrode of electrode 4524 can be coupled to a voltage source and sense circuitry. The sense circuitry can measure a change in capacitance at each electrode caused by an object, such as a passive stylus, finger, etc., touching cover material 4528. The capacitance change can be caused by charge or current from the electrode of electrode 4524 being shunted through the touching object to ground. The detected change in capacitance measured by the sense circuitry can be representative of a touch event occurring at a location corresponding to the associated electrode of electrode 4524. When combined with the amount of force determined using piezoelectric film 4506 and electrodes 4504 and 4508, both the location of the touch event and amount of force applied to cover material 4528 can be determined.

Figure 46:
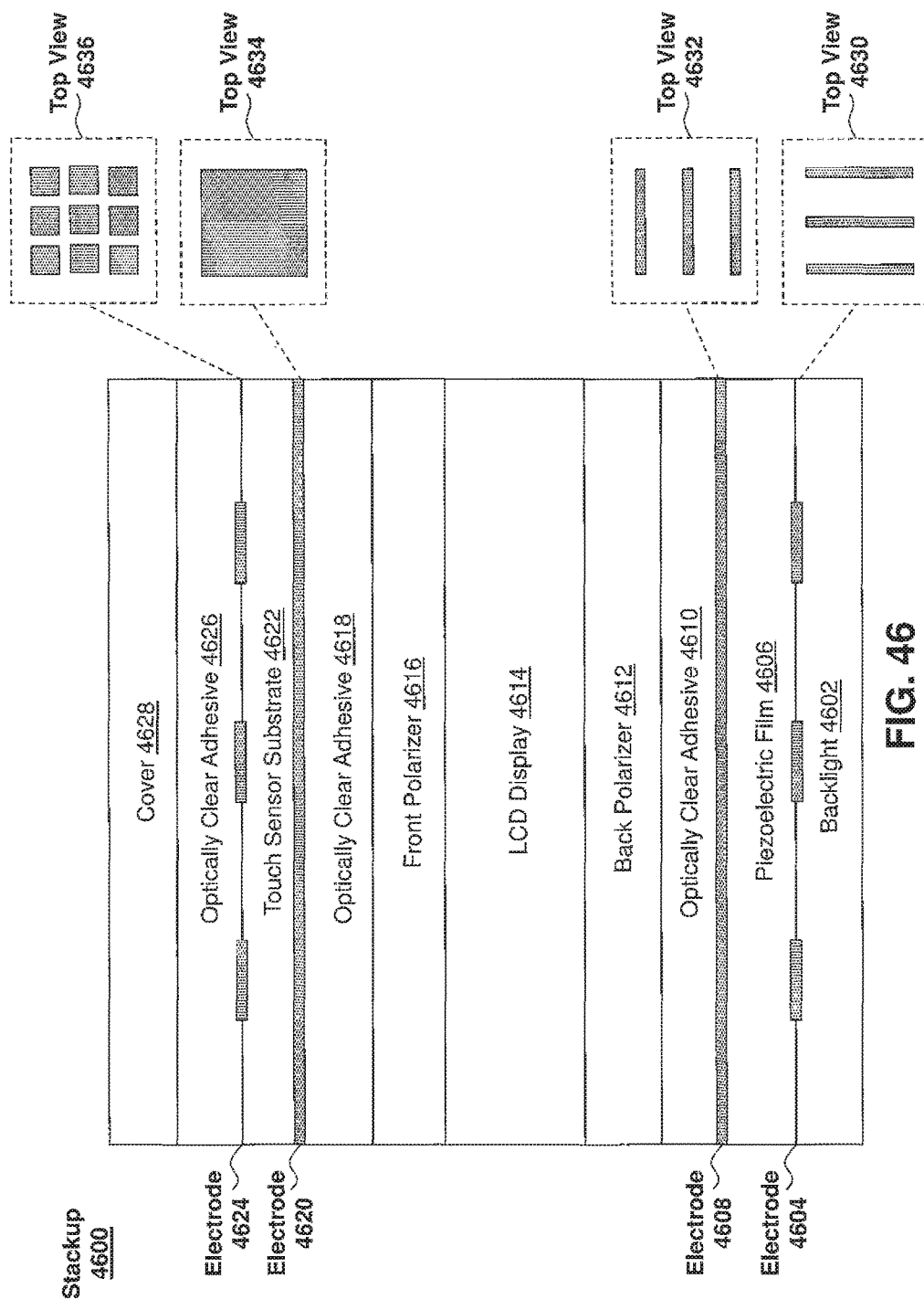

FIG. 46 illustrates a cross-sectional view of another exemplary stackup 4600 for a device containing an LCD display 4614. Stackup 4600 can include a backlight unit 4602 coupled to a piezoelectric film 4606 formed from a transparent film capable of generating a localized electric charge in response to a deformation of the film. Piezoelectric film 4606 can include a first electrode 4604 and a second electrode 4608 formed on opposite surfaces of the film. The electrodes can be formed from a transparent conductive material, such as ITO, PEDOT, or silver nanowire. Top views 4630 and 4632 show the shapes of electrodes 4604 and 4608, respectively, as viewed from above stackup 4600. In the illustrated example, electrode 4604 can include multiple columns of discrete electrodes and electrode 4608 can include multiple rows of discrete electrodes. While FIG. 46 shows three columns of electrodes 4604 and three rows of electrodes 4608, it should be appreciated that any number of rows and columns of electrodes can be used. Moreover, in other examples, electrode 4604 can be formed on the top of piezoelectric film 4606 and electrode 4608 can be formed on the bottom of piezoelectric film 4606. Stackup 4600 can further include LCD display 4614 coupled between a back polarizer 4612 and front polarizer 4616. The back polarizer can be coupled to piezoelectric film 4606 by optically clear adhesive 4610. Stackup 4600 can further include touch sensor substrate 4622 coupled to front polarizer 4616 by optically clear adhesive 4618. Touch sensor substrate 4622 can include electrodes 4620 and 4624 formed on opposite surfaces of the sensor. The electrodes can be formed from a transparent conductive material, such as ITO, PEDOT, or silver nanowire. Top views 4634 and 4636 show the shapes of electrodes 4620 and 4624, respectively, as viewed from above stackup 4600. In the illustrated example, electrode 4624 can include multiple discrete electrodes extending along the top surface of touch sensor substrate 4622 and electrode 4520 can extend along the bottom surface of touch sensor substrate 4622. Stackup 4600 can further include cover material 4628 (e.g., glass, plastic, or other rigid and transparent material) coupled to touch sensor substrate 4622 by optically clear adhesive 4626. While FIG. 46 shows electrode 4624 having nine square electrodes arranged in rows and columns, it should be appreciated that electrode 4624 can include any number of electrodes having any desired shaped and arranged in any desired pattern. Moreover, in other examples, electrode 4620 can be formed on the top of touch sensor substrate 4622 and electrode 4624 can be formed on the bottom of touch sensor substrate 4622.

In some examples, the electrodes of electrode 4604 can be coupled to ground and each electrode of electrode 4608 can be coupled to separate sense circuitry (not shown) similar or identical to sense circuitry 320 that is capable of detecting an amount of electric charge generated by the portion of piezoelectric film 4606 coupled to the electrode. During operation, as a user applies a downward force on cover material 4628, cover material 4628 can deform by an amount corresponding to an amount of the applied force.

The deformation of cover material 4628 can cause a corresponding deformation in optically clear adhesive 4626, touch sensor substrate 4622, optically clear adhesive 4618, polarizers 4616 and 4612, LCD display 4614, optically clear adhesive 4610, and piezoelectric film 4606. Piezoelectric film 4606 can then generate an amount of electric charge based on an amount of deformation of the film. The location of the generated electric charge can correspond to the location of the deformation of the film. The electrode of electrode 4608 positioned at or near the location of the deformation and that is electrically coupled to receive the generated charge can transmit the generated charge to its associated sense circuitry. Since the amount of electric charge generated by piezoelectric film 4606 can be representative of the amount of deformation of the film and because the amount of deformation of the film can be representative of the force applied to cover material 4628, the amount of electric charge detected by the sense circuitry can be representative of the force applied to cover material 4628. Additionally, since the location of the electrode of electrode 4608 receiving the generated charge is known, the location of the applied force can also be determined. In this way, the sense circuitry can be used to detect an amount and location of a force applied to cover material 4628. Moreover, the multiple electrodes of electrode 4608 and the separate sense circuitry coupled to each electrode allows for detection of multiple forces applied to different portions of cover material 4628 at the same time. In other examples, the electrodes of electrode 4608 can be coupled to ground and the electrodes of electrode 4604 can each be coupled to separate sense circuitry. In these examples, the sense circuitry can be used to determine the amount and location of forces applied to cover material 4628 based on electric charges received from the electrodes of electrode 4604.

In yet other examples, electrode 4604 can be coupled to ground and electrode 4608 can be coupled to separate sense circuitry. The sense circuitry can be used to determine both an amount and location along one of the electrodes of electrode 4608 of an applied force. Using, for example, switching circuitry coupled to electrodes 4604 and 4608, electrode 4604 can then be coupled to separate sense circuitry and electrode 4608 can then be coupled to ground. The sense circuitry can be used to determine both an amount and location along one of the electrodes of electrode 4604 of an applied force. The intersection of the determined row and column can be interpreted as a location of the force on cover material 4628.

Additionally, during operation, electrodes 4620 and 4624 can be used to determine a position of a touch event (e.g., a finger, stylus, or other object touching cover material 4628) on cover material 4628 using a self capacitance sensing technique. For example, each electrode of electrode 4624 can be coupled to a voltage source and sense circuitry. The sense circuitry can measure a change in capacitance at each electrode caused by an object, such as a passive stylus, finger, etc., touching cover material 4628. The capacitance change can be caused by charge or current from the electrode of electrode 4624 being shunted through the touching object to ground. The detected change in capacitance measured by the sense circuitry can be representative of a touch event occurring at a location corresponding to the associated electrode of electrode 4624. When combined with the amount of force determined using piezoelectric film 4606 and electrodes 4604 and 4608, both the location of the touch event and amount of force applied to cover material 4628 can be determined.

Figure 47:
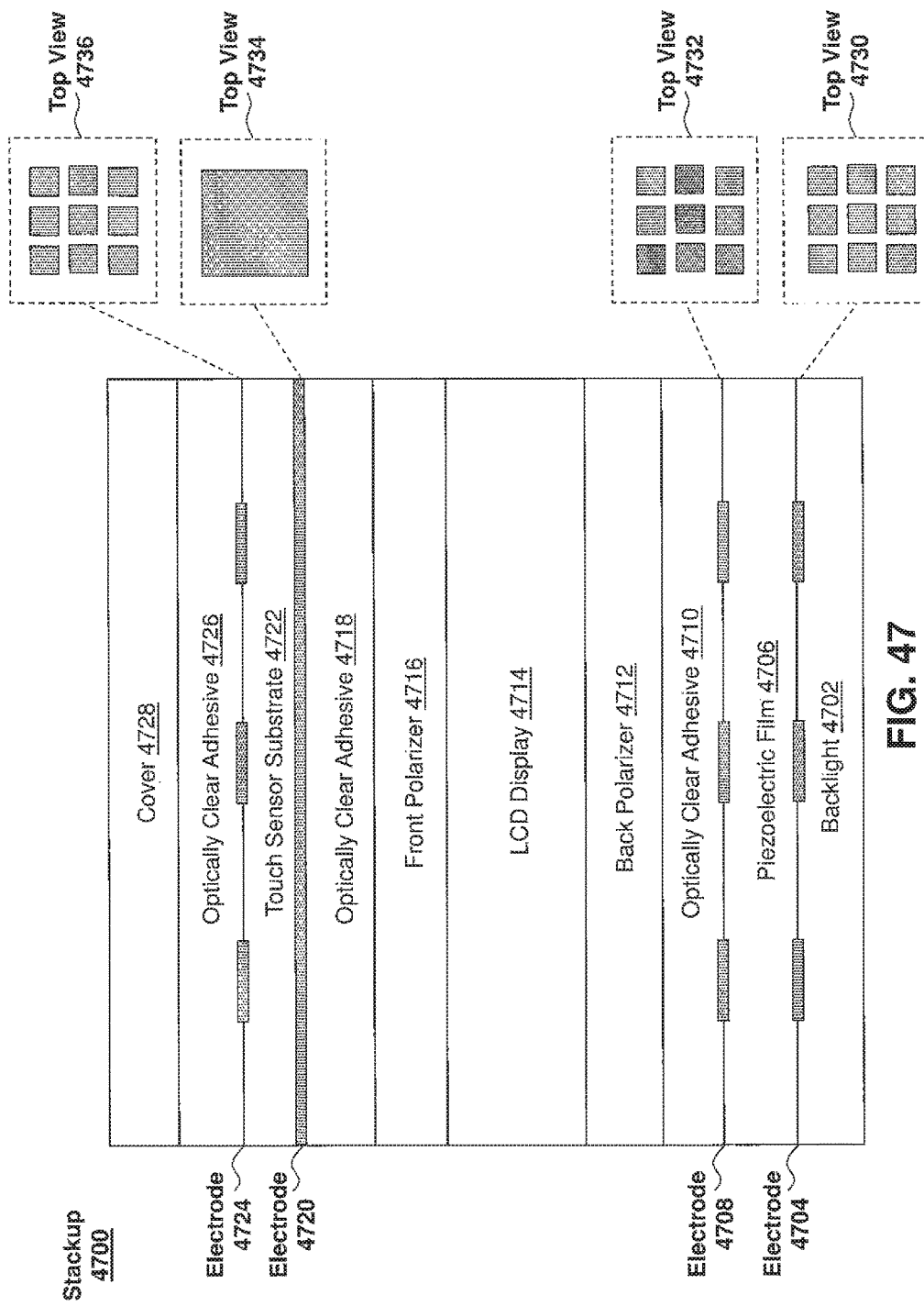

FIG. 47 illustrates a cross-sectional view of another exemplary stackup 4700 for a device containing an LCD display 4714. Stackup 4700 can include a backlight unit 4702 coupled to a piezoelectric film 4706 formed from a transparent film capable of generating a localized electric charge in response to a deformation of the film. Piezoelectric film 4706 can include a first electrode 4704 and a second electrode 4708 formed on opposite surfaces of the film. The electrodes can be formed from a transparent conductive material, such as ITO, PEDOT, or silver nanowire. Top views 4730 and 4732 show the shapes of electrodes 4704 and 4708, respectively, as viewed from above stackup 4700. In the illustrated example, electrodes 4704 and 4708 can both include multiple discrete electrodes extending along the surfaces of piezoelectric film 4706. While FIG. 47 shows electrodes 4704 and 4708 each having nine square electrodes arranged in rows and columns, it should be appreciated that electrodes 4704 and 4708 can each include any number of electrodes having any desired shaped and arranged in any desired pattern such that the electrodes of electrode 4704 are positioned opposite the electrodes of electrode 4708 on piezoelectric film 4706.

Stackup 4700 can further include LCD display 4714 coupled between a back polarizer 4712 and front polarizer 4716. The back polarizer can be coupled to piezoelectric film 4706 by optically clear adhesive 4710. Stackup 4700 can further include touch sensor substrate 4722 coupled to front polarizer 4716 by optically clear adhesive 4718. Touch sensor substrate 4722 can include electrodes 4720 and 4724 formed on opposite surfaces of the sensor. The electrodes can be formed from a transparent conductive material, such as ITO, PEDOT, or silver nanowire. Top views 4734 and 4736 show the shapes of electrodes 4720 and 4724, respectively, as viewed from above stackup 4700. In the illustrated example, electrode 4724 can include multiple discrete electrodes extending along the top surface of touch sensor substrate 4722 and electrode 4720 can extend along the bottom surface of touch sensor substrate 4722. Stackup 4700 can further include cover material 4728 (e.g., glass, plastic, or other rigid and transparent material) coupled to touch sensor substrate 4722 by optically clear adhesive 4726. While FIG. 47 shows electrode 4724 having nine square electrodes arranged in rows and columns, it should be appreciated that electrode 4724 can include any number of electrodes having any desired shaped and arranged in any desired pattern. Moreover, in other examples, electrode 4720 can be formed on the top of touch sensor substrate 4722 and electrode 4724 can be formed on the bottom of touch sensor substrate 4722.

Electrodes 4704 and 4708 can be separated into discrete electrodes positioned opposite each other on piezoelectric film 4706 to allow the sense circuitry coupled to the electrodes of electrode 4708 to determine both the amount and location of force applied to cover material 4728. Additionally, multiple forces applied to different portions of cover material 4728 can be detected using the electrodes of electrode 4708. For example, the electrodes of electrode 4704 can be coupled to ground and each electrode of electrode 4708 can be coupled to separate sense circuitry (not shown) similar or identical to sense circuitry 320 that is capable of detecting an amount of electric charge generated by the portion of piezoelectric film 4706 coupled to the electrode. During operation, as a user applies a downward force on cover material 4728, cover material 4728 can deform by an amount corresponding to an amount of the applied force. The deformation of cover material 4728 can cause a corresponding deformation in optically clear adhesive 4726, touch sensor substrate 4722, optically clear adhesive 4718, polarizers 4716 and 4712, LCD display 4714, optically clear adhesive 4710, and piezoelectric film 4706. Piezoelectric film 4706 can then generate an amount of electric charge based on an amount of deformation of the film and at a location of the deformation of the film. The electrode of electrode 4708 positioned at or near the location of the deformation and that is electrically coupled to receive the generated charge can transmit the generated charge to its associated sense circuitry. Since the amount of electric charge generated by piezoelectric film 4706 can be representative of the amount of deformation of the film and because the amount of deformation of the film can be representative of the force applied to cover material 4728, the amount of electric charge detected by the sense circuitry can be representative of the force applied to cover material 4728. Additionally, since the location of the electrode of electrode 4708 receiving the generated charge is known, the location of the applied force can also be determined. In this way, the sense circuitry can be used to detect an amount and location of a force applied to cover material 4728. Moreover, the multiple electrodes of electrode 4708 and the separate sense circuitry coupled to each electrode allows for detection of multiple forces applied to different portions of cover material 4728 at the same time. In other examples, the electrodes of electrode 4708 can be coupled to ground and the electrodes of electrode 4704 can each be coupled to separate sense circuitry. In these examples, the sense circuitry can be used to determine the amount and location of forces applied to cover material 4728 based on electric charges received from the electrodes of electrode 4704.

Additionally, during operation, electrodes 4720 and 4724 can be used to determine a position of a touch event (e.g., a finger, stylus, or other object touching cover material 4728) on cover material 4728 using a self capacitance sensing technique. For example, each electrode of electrode 4724 can be coupled to a voltage source and sense circuitry. The sense circuitry can measure a change in capacitance at each electrode caused by an object, such as a passive stylus, finger, etc., touching cover material 4728. The capacitance change can be caused by charge or current from the electrode of electrode 4724 being shunted through the touching object to ground. The detected change in capacitance measured by the sense circuitry can be representative of a touch event occurring at a location corresponding to the associated electrode of electrode 4724. When combined with the amount of force determined using piezoelectric film 4706 and electrodes 4704 and 4708, both the location of the touch event and amount of force applied to cover material 4728 can be determined.

Figure 48:
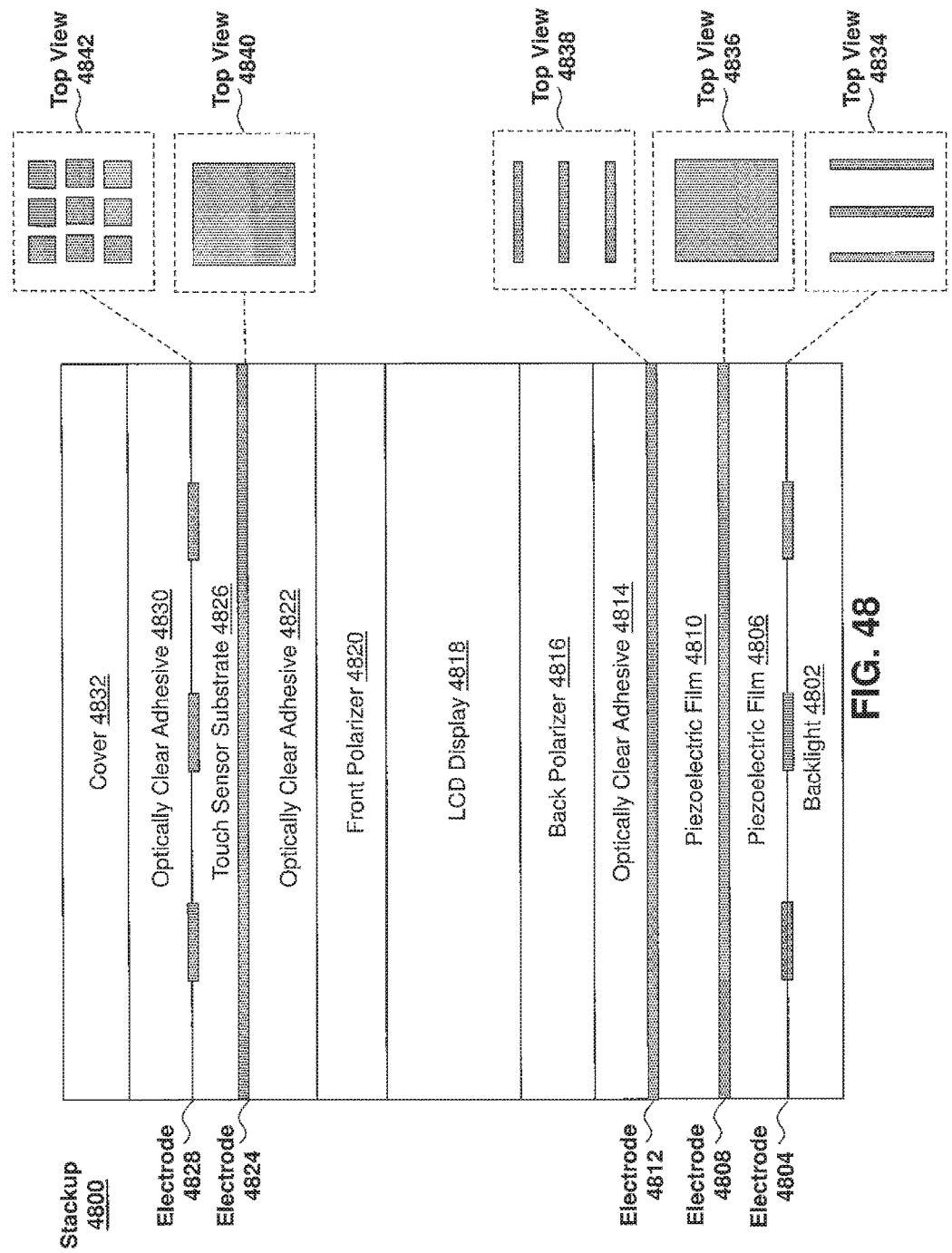

FIG. 48 illustrates a cross-sectional view of another exemplary stackup 4800 for a device containing an LCD display 4818. Stackup 4800 can include a backlight unit 4802 coupled to a first piezoelectric film 4806 and a second piezoelectric film 4810 coupled to first piezoelectric film 4806. The first and second piezoelectric films 4806 and 4810 can both include a transparent or non-transparent film capable of generating a localized electric charge in response to a deformation of the film. A first electrode 4804 can be formed on the bottom of the first piezoelectric film 4806, a second electrode 4808 can be formed between the first and second piezoelectric films 4806 and 4810, and a third electrode 4812 can be formed on the top of the second piezoelectric film 4810. The electrodes can be formed from a transparent or non-transparent conductive material, such as ITO, PEDOT, silver ink, silver nanowire, or copper. Top views 4834, 4836, and 4838 show the shapes of electrodes 4803, 4808, and 4812, respectively, as viewed from above stackup 4800. In the illustrated example, electrode 4804 can include multiple columns of discrete electrodes, electrode 4808 can include an electrode extending along the surfaces of piezoelectric films 4806 and 4810, and electrode 4812 can include rows of multiple discrete electrodes. While FIG. 48 shows electrodes 4804 and 4812 each having three rectangular electrodes arranged in columns and rows, respectively, it should be appreciated that electrodes 4804 and 4812 can each include any number of rectangular electrodes and can instead be arranged in rows and columns, respectively.

Stackup 4800 can further include LCD display 4818 coupled between a back polarizer 4816 and front polarizer 4820. The back polarizer can be coupled to second piezoelectric film 4810 by optically clear adhesive 4814. Stackup 4800 can further include touch sensor substrate 4826 coupled to front polarizer 4820 by optically clear adhesive 4822. Touch sensor substrate 4826 can include electrodes 4824 and 4828 formed on opposite surfaces of the sensor. The electrodes can be formed from a transparent conductive material, such as ITO, PEDOT, or silver nanowire. Top views 4840 and 4842 show the shapes of electrodes 4824 and 4828, respectively, as viewed from above stackup 4800. In the illustrated example, electrode 4828 can include multiple discrete electrodes extending along the top surface of touch sensor substrate 4826 and electrode 4824 can extend along the bottom surface of touch sensor substrate 4826. Stackup 4800 can further include cover material 4832 (e.g., glass, plastic, or other rigid and transparent material) coupled to touch sensor substrate 4826 by optically clear adhesive 4830. While FIG. 4800 shows electrode 4828 having nine square electrodes arranged in rows and columns, it should be appreciated that electrode 4828 can include any number of electrodes having any desired shaped and arranged in any desired pattern. Moreover, in other examples, electrode 4824 can be formed on the top of touch sensor substrate 4826 and electrode 4828 can be formed on the bottom of touch sensor substrate 4826.

Electrodes 4804 and 4812 can be separated into discrete columns and rows of electrodes to allow the sense circuitry coupled to the electrodes of electrodes 4804 and 4812 to determine both the amount and location of force applied to cover material 4832. Additionally, multiple forces applied to different portions of cover material 4832 can be detected at the same time using the electrodes of electrodes 4804 and 4812. For example, electrode 4808 can be coupled to ground while the electrodes of electrode 4804 can each be coupled to separate sense circuitry (not shown) similar or identical to sense circuitry 320 that is capable of detecting an amount of electric charge generated by the portion of piezoelectric film 4806 coupled to the electrode. The electrodes of electrode 4812 can also be coupled to separate sense circuitry (not shown) similar or identical to sense circuitry 320 that is capable of detecting an amount of electric charge generated by the portion of piezoelectric film 4810 coupled to the electrode. During operation, as a user applies a downward force on cover material 4832, cover material 4832 can deform by an amount corresponding to an amount of the applied force. The deformation of cover material 4832 can cause a corresponding deformation in optically clear adhesive 4830, touch sensor substrate 4826, optically clear adhesive 4822, polarizers 4820 and 4816, LCD display 4818, optically clear adhesive 4814, and piezoelectric films 4810 and 4806. Piezoelectric films 4810 and 4806 can then generate an amount of electric charge based on an amount of deformation of the film and at a location of the deformation of the film. The electrode of electrode 4812 positioned at or near the location of the deformation of piezoelectric film 4810 and that is electrically coupled to receive the generated charge can transmit the generated charge to its associated sense circuitry. Similarly the electrode of electrode 4804 positioned at or near the location of the deformation of piezoelectric film 4806 and that is electrically coupled to receive the generated charge can transmit the generated charge to its associated sense circuitry. Since the amount of electric charge generated by piezoelectric films 4806 and 4810 can be representative of the amount of deformation of the films and because the amount of deformation of the films can be representative of the force applied to cover material 4832, the amount of electric charge detected by the sense circuitry can be representative of the force applied to cover material 4832. Additionally, since the location of the electrodes of electrodes 4804 and 4812 receiving the generated charge is known, the location of the applied force can also be determined. For example, electrode 4812 can be used to determine the row at which the force was applied, while electrode 4804 can be used to determine the column at which the force was applied. The intersection of the determined row and column can be the location of the applied force. In this way, the sense circuitry can be used to detect an amount and location of a force applied to cover material 4832. Moreover, the multiple electrodes of electrodes 4804 and 4812 and the separate sense circuitry coupled to each electrode allows for detection of multiple forces applied to different portions of cover material 4832 at the same time. In other examples, electrode 4812 can be coupled to the bottom of piezoelectric film 4806 and electrode 4804 can be coupled to the top of piezoelectric film 4810. In these examples, the electrodes of electrodes 4804 and 4812 can each be coupled to separate sense circuitry. The sense circuitry can be used to detect an amount and location of force applied to cover material 4832 in a manner similar to that described above for the configuration shown in FIG. 48.

Additionally, during operation, electrodes 4824 and 4828 can be used to determine a position of a touch event (e.g., a finger, stylus, or other object touching cover material 4822) on cover material 4832 using a self capacitance sensing technique. For example, each electrode of electrode 4828 can be coupled to a voltage source and sense circuitry. The sense circuitry can measure a change in capacitance at each electrode caused by an object, such as a passive stylus, finger, etc., touching cover material 4832. The capacitance change can be caused by charge or current from the electrode of electrode 4828 being shunted through the touching object to ground. The detected change in capacitance measured by the sense circuitry can be representative of a touch event occurring at a location corresponding to the associated electrode of electrode 4828. When combined with the amount of force determined using piezoelectric films 4806 and 4810 and electrodes 4804, 4808, and 4812, both the location of the touch event and amount of force applied to cover material 4832 can be determined.

Figure 49:
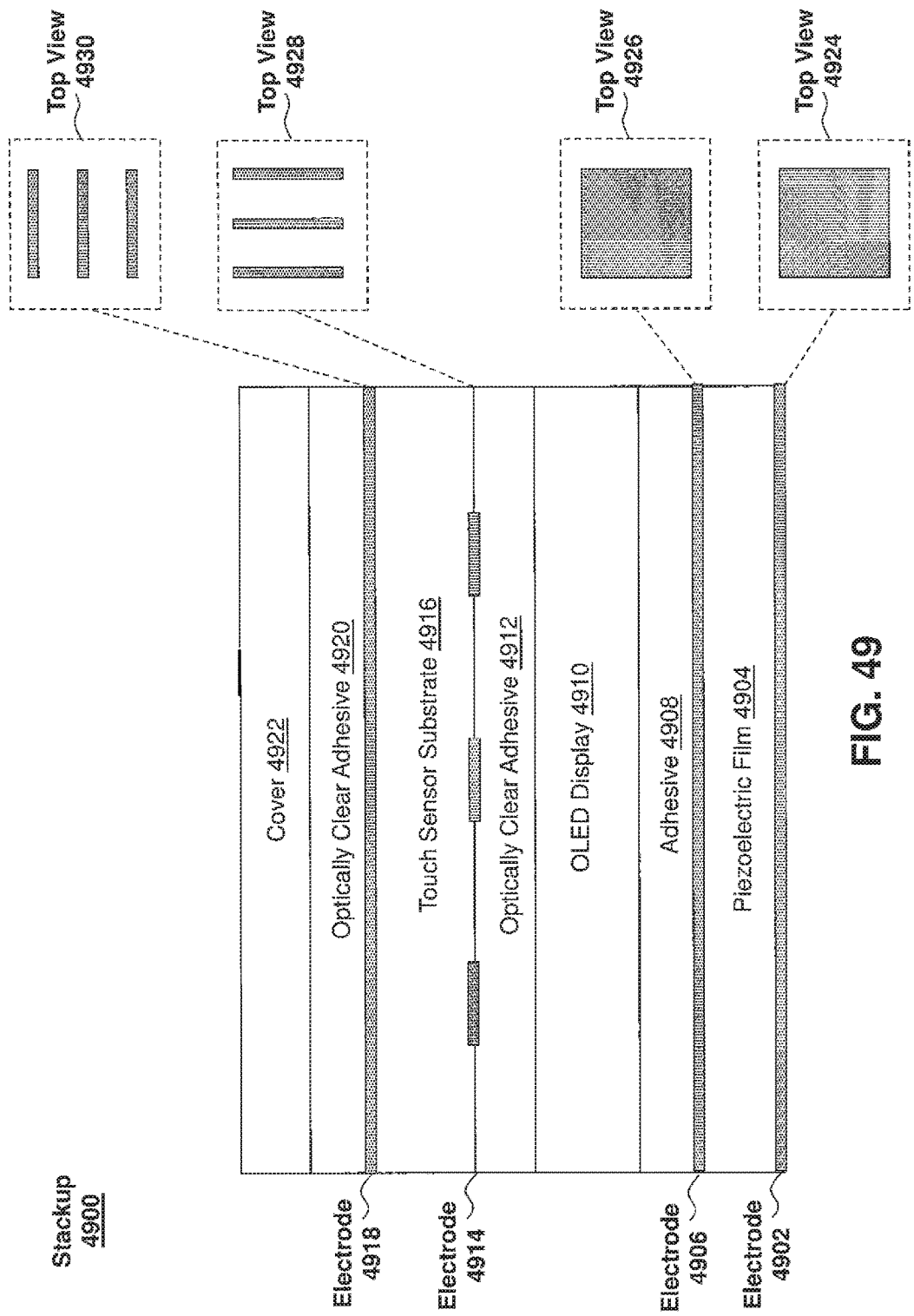

FIG. 49 illustrates a cross-sectional view of another exemplary stackup 4900 for a device containing an OLED display 4910. Stackup 4900 can include piezoelectric film 4904 formed from a transparent or non-transparent film capable of generating a localized electric charge in response to a deformation of the film. Piezoelectric film 4904 can include a first electrode 4902 and a second electrode 4906 formed on opposite surfaces of the film. The electrodes can be formed from a transparent or non-transparent conductive material, such as ITO, PEDOT, silver ink, silver nanowire, or copper. Top views 4924 and 4926 show the shapes of electrodes 4902 and 4906, respectively, as viewed from above stackup 4900. In the illustrated example, electrodes 4902 and 4906 can both have a shape that substantially matches that of piezoelectric film 4904 and can extend along the surfaces of piezoelectric film 4904.

Stackup 4900 can further include integrated OLED display 4910 coupled to piezoelectric film 4904 by adhesive 4908. Unlike the LCD examples described herein, piezoelectric film 4904, adhesive 4908, and electrodes 4902 and 4906 need not be transparent or optically clear since they are located behind OLED display 4910 and thus, would not block a user's view of the display. Stackup 4900 can further include touch sensor substrate 4916 coupled to OLED display 4910 by optically clear adhesive 4912. Touch sensor substrate 4916 can include electrodes 4914 and 4918 formed on opposite surfaces of the sensor. The electrodes can be formed from a transparent conductive material, such as ITO, PEDOT, or silver nanowire. Top views 4928 and 4930 show the shapes of electrodes 4914 and 4918, respectively, as viewed from above stackup 4900. In the illustrated example, electrodes 4914 can include columns of multiple discrete electrodes and electrode 4918 can include multiple rows of discrete electrodes. Stackup 4900 can further include cover material 4922 (e.g., glass, plastic, or other rigid and transparent material) coupled to touch sensor substrate 4916 by optically clear adhesive 4920. While FIG. 49 shows three columns of electrodes 4914 and three rows of electrodes 4918, it should be appreciated that any number of rows and columns of electrodes can be used. Moreover, in other examples, electrode 4914 can be formed on the top of touch sensor substrate 4916 and electrode 4918 can be formed on the bottom of touch sensor substrate 4914.

In some examples, electrode 4902 can be coupled to ground and electrode 4906 can be coupled to sense circuitry (not shown) similar or identical to sense circuitry 320 that is capable of detecting an amount of electric charge generated by piezoelectric film 4904. During operation, as a user applies a downward force on cover material 4922, cover material 4922 can deform by an amount corresponding to an amount of the applied force. The deformation of cover material 4922 can cause a corresponding deformation in optically clear adhesive 4920, touch sensor substrate 4916, optically clear adhesive 4912, OLED display 4910, adhesive 4908, and piezoelectric film 4904. Piezoelectric film 4904 can then generate an amount of electric charge based on an amount of deformation of the film. The generated electric charge can be received by the sense circuitry via electrode 4906. Since the amount of electric charge generated by piezoelectric film 4904 can be representative of the amount of deformation of the film and because the amount of deformation of the film can be representative of the force applied to cover material 4922, the amount of electric charge detected by the sense circuitry can be representative of the force applied to cover material 4922. In this way, the sense circuitry can be used to detect an amount of force applied to cover material 4922. In other examples, the electrode 4906 can be coupled to ground and electrode 4902 can be coupled to the sense circuitry. In these examples, the sense circuitry can be used to determine the amount of force applied to cover material 4922 based on electric charge received from electrode 4902.

Additionally, during operation, touch sensor substrate 4916 and electrodes 4914 and 4918 can be used to determine a position of a touch event (e.g., a finger, stylus, or other object touching cover material 4922) on cover material 4922 using a mutual capacitance sensing technique. For example, electrodes 4918 can be driven with sinusoidal stimulation signals to capacitively couple with crossing columns of electrodes 4914, thereby forming a capacitive path for coupling charge from electrodes 4918 to the electrodes 4914. The crossing electrodes 4914 can output touch signals representing the coupled charge or current. When an object, such as a passive stylus, finger, etc., touches cover material 4922, the object can cause a capacitance between electrodes 4918 and 4914 at the touch location to decrease. This capacitance change can be caused by charge or current from the stimulated electrode 4918 being shunted through the touching object to ground rather than being coupled to the crossing electrode 4914 at the touch location. The touch signals representative of the capacitance change can be received by electrodes 4914 and transmitted to sense circuitry (e.g., similar or identical to sense circuitry 320) for processing. The touch signals can indicate the touch region where the touch occurred. When combined with the amount of force determined using piezoelectric film 4904 and electrodes 4902 and 4906, both the location of a touch event and amount of force applied to cover material 4922 can be determined. In other examples, electrode 4914 can be driven with stimulation signals while electrode 4918 can be coupled to sense circuitry for detecting a location of a touch event on cover material 4922.

Figure 50:
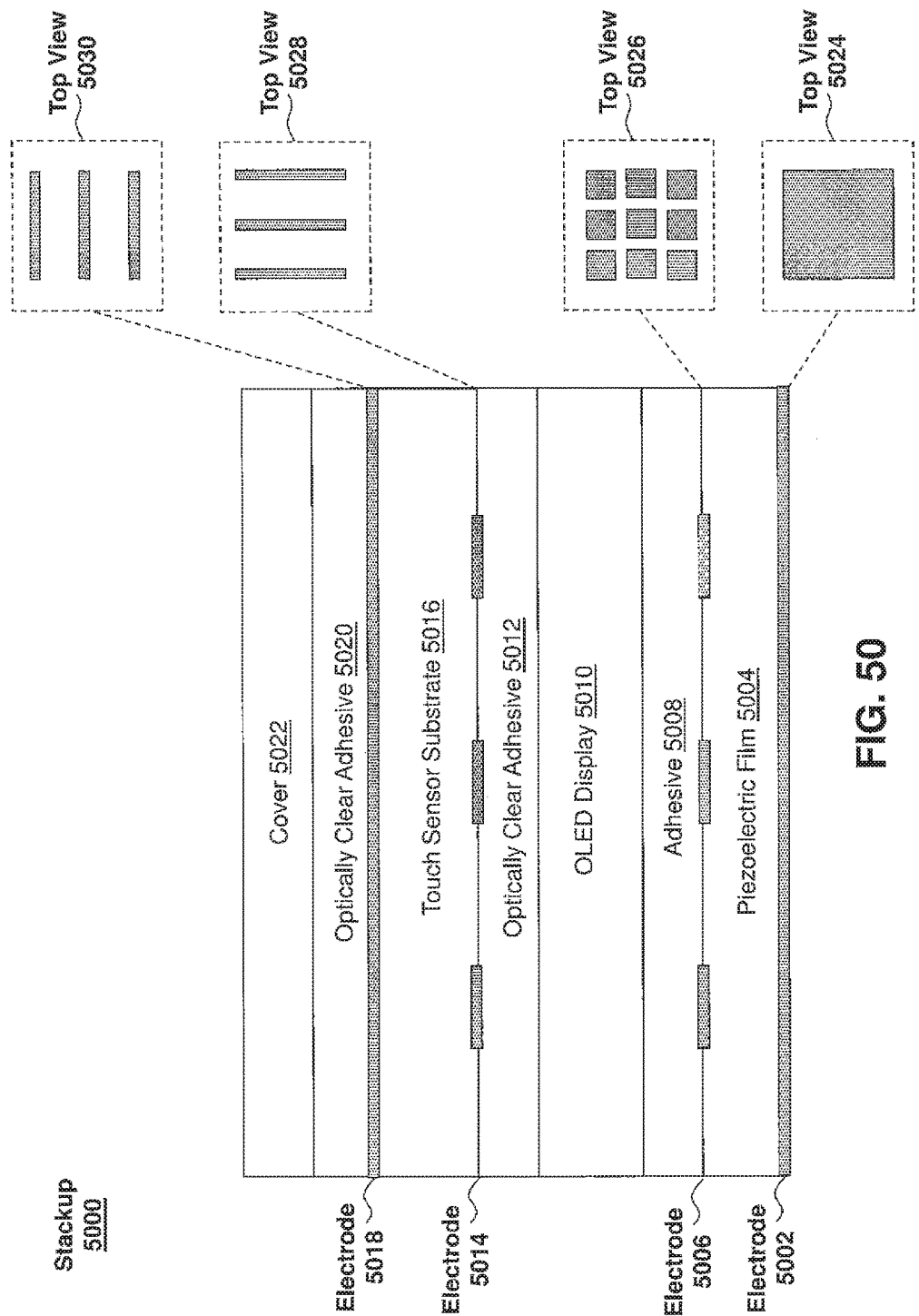

FIG. 50 illustrates a cross-sectional view of another exemplary stackup 5000 for a device containing an OLED display 5010. Stackup 5000 can include piezoelectric film 5004 formed from a transparent or non-transparent film capable of generating a localized electric charge in response to a deformation of the film. Piezoelectric film 5004 can include a first electrode 5002 and a second electrode 5006 formed on opposite surfaces of the film 5004. The electrodes can be formed from a transparent or non-transparent conductive material, such as ITO, PEDOT, silver ink, silver nanowire, or copper. Top views 5024 and 5026 show the shapes of electrodes 5002 and 5006, respectively, as viewed from above stackup 5000. In the illustrated example, electrode 5002 can extend along the bottom surface of piezoelectric film 5004 and electrode 5006 can include multiple discrete electrodes extending along the top surface of piezoelectric film 5004. While electrode 5006 is shown as having nine square electrodes arranged in rows and columns, it should be appreciated that electrode 5006 can each include any number of electrodes having any desired shaped and arranged in any desired pattern.

Stackup 5000 can further include integrated OLED display 5010 coupled to piezoelectric film 5004 by adhesive 5008. Unlike the LCD examples described herein, piezoelectric film 5004, adhesive 5008, and electrodes 5002 and 5006 need not be transparent or optically clear since they are located behind OLED display 5010 and thus, would not block a user's view of the display. Stackup 5000 can further include touch sensor substrate 5016 coupled to OLED display 5012 by optically clear adhesive 5012. Touch sensor substrate 5016 can include electrodes 5014 and 5018 formed on opposite surfaces of the sensor. The electrodes can be formed from a transparent conductive material, such as ITO, PEDOT, or silver nanowire. Top views 5028 and 5030 show the shapes of electrodes 5014 and 5018, respectively, as viewed from above stackup 5000. In the illustrated example, electrodes 5014 can include columns of multiple discrete electrodes and electrode 5018 can include multiple rows of discrete electrodes. Stackup 5000 can further include cover material 5022 (e.g., glass, plastic, or other rigid and transparent material) coupled to touch sensor substrate 5016 by optically clear adhesive 5020. While FIG. 50 shows three columns of electrodes 5014 and three rows of electrodes 5018, it should be appreciated that any number of rows and columns of electrodes can be used. Moreover, in other examples, electrode 5014 can be formed on the top of touch sensor substrate 5016 and electrode 5018 can be formed on the bottom of touch sensor substrate 5014.

Electrode 5006 can be separated into discrete electrodes to allow the sense circuitry coupled to the electrodes of electrode 5006 to determine both the amount and location of force applied to cover material 5022. Additionally, multiple forces applied to different portions of cover material 5022 can be detected using the electrodes of electrode 5006. For example, electrode 5002 can be coupled to ground and each electrode of electrode 5006 can be coupled to separate sense circuitry (not shown) similar or identical to sense circuitry 320 that is capable of detecting an amount of electric charge generated by the portion of piezoelectric film 5004 coupled to the electrode. During operation, as a user applies a downward force on cover material 5022, cover material 5022 can deform by an amount corresponding to an amount of the applied force. The deformation of cover material 5022 can cause a corresponding deformation in optically clear adhesive 5020, touch sensor substrate 5016, optically clear adhesive 5012, OLED display 5010, adhesive 5008, and piezoelectric film 5004. Piezoelectric film 5004 can then generate an amount of electric charge based on an amount of deformation of the film at a location of the deformation of the film. The electrode of electrode 5006 positioned at or near the location of the deformation and that is electrically coupled to receive the generated charge can transmit the generated charge to its associated sense circuitry. Since the amount of electric charge generated by piezoelectric film 5004 can be representative of the amount of deformation of the film and because the amount of deformation of the film can be representative of the force applied to cover material 5022, the amount of electric charge detected by the sense circuitry can be representative of the force applied to cover material 5022. Additionally, since the location of the electrode of electrode 5006 receiving the generated charge is known, the location of the applied force can also be determined. In this way, the sense circuitry can be used to detect an amount and location of a force applied to cover material 5022. Moreover, the multiple electrodes of electrode 5006 and the separate sense circuitry coupled to each electrode allows for detection of multiple forces applied to different portions of cover material 5022 at the same time. In other examples, electrode 5006 can be coupled to the bottom of piezoelectric film 5004 and electrode 5002 can be coupled to the top of piezoelectric film 5004. In these examples, the electrodes of electrode 5006 can each be coupled to separate sense circuitry and electrode 5002 can be coupled to ground. The sense circuitry can be used to detect an amount and location of force applied to cover material 5022 in a manner similar to that described above for the configuration shown in FIG. 50.

Additionally, during operation, touch sensor substrate 5016 and electrodes 5014 and 5018 can be used to determine a position of a touch event (e.g., a finger, stylus, or other object touching cover material 5022) on cover material 5022 using a mutual capacitance sensing technique. For example, electrodes 5018 can be driven with sinusoidal stimulation signals to capacitively couple with crossing columns of electrodes 5014, thereby forming a capacitive path for coupling charge from electrodes 5018 to the electrodes 5014. The crossing electrodes 5014 can output touch signals representing the coupled charge or current. When an object, such as a passive stylus, finger, etc., touches cover material 5022, the object can cause a capacitance between electrodes 5018 and 5014 at the touch location to decrease. This capacitance change can be caused by charge or current from the stimulated electrode 5018 being shunted through the touching object to ground rather than being coupled to the crossing electrode 5014 at the touch location. The touch signals representative of the capacitance change can be received by electrodes 5014 and transmitted to sense circuitry (e.g., similar or identical to sense circuitry 320) for processing. The touch signals can indicate the touch region where the touch occurred. When combined with the amount of force determined using piezoelectric film 5004 and electrodes 5002 and 5006, both the location of a touch event and amount of force applied to cover material 5022 can be determined. In other examples, electrode 5014 can be driven with stimulation signals while electrode 5018 can be coupled to sense circuitry for detecting a location of a touch event on cover material 5022.

Figure 51:
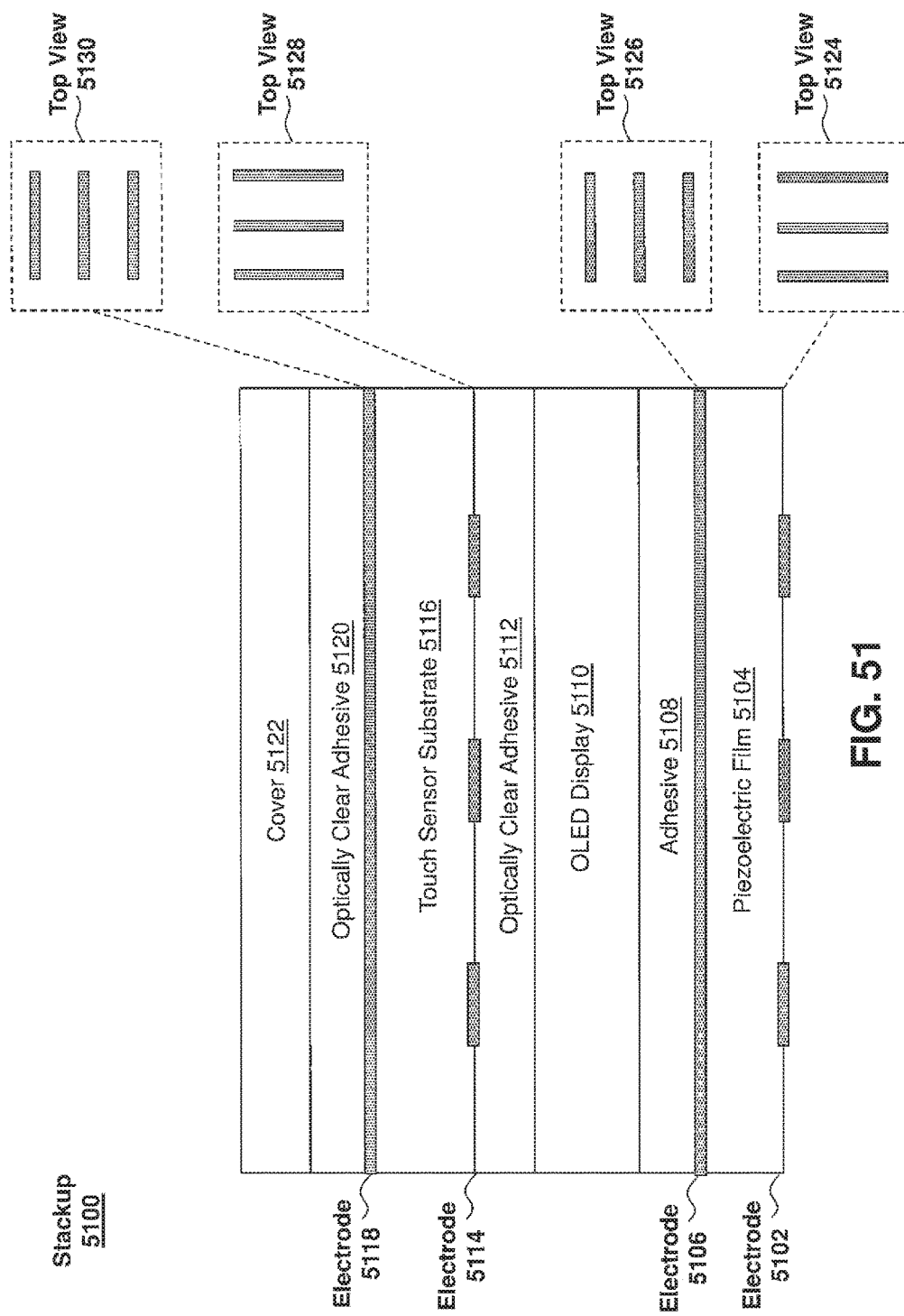

FIG. 51 illustrates a cross-sectional view of another exemplary stackup 5100 for a device containing an OLED display 5110. Stackup 5100 can include piezoelectric film 5104 formed from a transparent or non-transparent film capable of generating a localized electric charge in response to a deformation of the film. Piezoelectric film 5104 can include a first electrode 5102 and a second electrode 5106 formed on opposite surfaces of the film. The electrodes can be formed from a transparent or non-transparent conductive material, such as ITO, PEDOT, silver ink, silver nanowire, or copper. Top views 5124 and 5126 show the shapes of electrodes 5102 and 5106, respectively, as viewed from above stackup 5100. In the illustrated example, electrode 5102 can include multiple columns of discrete electrodes and electrode 5106 can include multiple rows of discrete electrodes. While FIG. 51 shows three columns of electrodes 5102 and three rows of electrodes 5106, it should be appreciated that any number of rows and columns of electrodes can be used. Moreover, in other examples, electrode 5102 can be formed on the top of piezoelectric film 5104 and electrode 5106 can be formed on the bottom of piezoelectric film 5104.

Stackup 5100 can further include integrated OLED display 5110 coupled to piezoelectric film 5104 by adhesive 5108. Unlike the LCD examples described herein, piezoelectric film 5104, adhesive 5108, and electrodes 5102 and 5106 need not be transparent or optically clear since they are located behind OLED display 5110 and thus, would not block a user's view of the display. Stackup 5100 can further include touch sensor substrate 5116 coupled to OLED display 5112 by optically clear adhesive 5112. Touch sensor substrate 5116 can include electrodes 5114 and 5118 formed on opposite surfaces of the sensor. The electrodes can be formed from a transparent conductive material, such as ITO, PEDOT, or silver nanowire. Top views 5128 and 5130 show the shapes of electrodes 5114 and 5118, respectively, as viewed from above stackup 5100. In the illustrated example, electrodes 5114 can include columns of multiple discrete electrodes and electrode 5118 can include multiple rows of discrete electrodes. Stackup 5100 can further include cover material 5122 (e.g., glass, plastic, or other rigid and transparent material) coupled to touch sensor substrate 5116 by optically clear adhesive 5120. While FIG. 51 shows three columns of electrodes 5114 and three rows of electrodes 5118, it should be appreciated that any number of rows and columns of electrodes can be used. Moreover, in other examples, electrode 5114 can be formed on the top of touch sensor substrate 5116 and electrode 5118 can be formed on the bottom of touch sensor substrate 5114.

In some examples, the electrodes of electrode 5102 can be coupled to ground and each electrode of electrode 5106 can be coupled to separate sense circuitry (not shown) similar or identical to sense circuitry 320 that is capable of detecting an amount of electric charge generated by the portion of piezoelectric film 5104 coupled to the electrode. During operation, as a user applies a downward force on cover material 5122, cover material 5122 can deform by an amount corresponding to an amount of the applied force. The deformation of cover material 5122 can cause a corresponding deformation in optically clear adhesive 5120, touch sensor substrate 5116, optically clear adhesive 5112, OLED display 5110, adhesive 5108, and piezoelectric film 5104. Piezoelectric film 5104 can then generate an amount of electric charge based on an amount of deformation of the film. The location of the generated electric charge can correspond to the location of the deformation of the film. The electrode of electrode 5106 positioned at or near the location of the deformation and that is electrically coupled to receive the generated charge can transmit the generated charge to its associated sense circuitry. Since the amount of electric charge generated by piezoelectric film 5104 can be representative of the amount of deformation of the film and because the amount of deformation of the film can be representative of the force applied to cover material 5122, the amount of electric charge detected by the sense circuitry can be representative of the force applied to cover material 5122. Additionally, since the location of the electrode of electrode 5106 receiving the generated charge is known, the location of the applied force can also be determined. In this way, the sense circuitry can be used to detect an amount and location of a force applied to cover material 5122. Moreover, the multiple electrodes of electrode 5106 and the separate sense circuitry coupled to each electrode allows for detection of multiple forces applied to different portions of cover material 5122 at the same time. In other examples, the electrodes of electrode 5106 can be coupled to ground and the electrodes of electrode 5104 can each be coupled to separate sense circuitry. In these examples, the sense circuitry can be used to determine the amount and location of forces applied to cover material 5122 based on electric charges received from the electrodes of electrode 5102.

In yet other examples, electrode 5102 can be coupled to ground and electrode 5106 can be coupled to separate sense circuitry. The sense circuitry can be used to determine both an amount and location along one of the electrodes of electrode 5106 of an applied force. Using, for example, switching circuitry coupled to electrodes 5102 and 5106, electrode 5102 can then be coupled to separate sense circuitry and electrode 5106 can then be coupled to ground. The sense circuitry can be used to determine both an amount and location along one of the electrodes of electrode 5102 of an applied force. The intersection of the determined row and column can be interpreted as a location of the force on cover material 5122.

Additionally, during operation, touch sensor substrate 5116 and electrodes 5114 and 5118 can be used to determine a position of a touch event (e.g., a finger, stylus, or other object touching cover material 5122) on cover material 5122 using a mutual capacitance sensing technique. For example, electrodes 5118 can be driven with sinusoidal stimulation signals to capacitively couple with crossing columns of electrodes 5114, thereby forming a capacitive path for coupling charge from electrodes 5118 to the electrodes 5114. The crossing electrodes 5114 can output touch signals representing the coupled charge or current. When an object, such as a passive stylus, finger, etc., touches cover material 5122, the object can cause a capacitance between electrodes 5118 and 5114 at the touch location to decrease. This capacitance change can be caused by charge or current from the stimulated electrode 5118 being shunted through the touching object to ground rather than being coupled to the crossing electrode 5114 at the touch location. The touch signals representative of the capacitance change can be received by electrodes 5114 and transmitted to sense circuitry (e.g., similar or identical to sense circuitry 320) for processing. The touch signals can indicate the touch region where the touch occurred. When combined with the amount of force determined using piezoelectric film 5104 and electrodes 5102 and 5106, both the location of a touch event and amount of force applied to cover material 5122 can be determined. In other examples, electrode 5114 can be driven with stimulation signals while electrode 5118 can be coupled to sense circuitry for detecting a location of a touch event on cover material 5122.

Figure 52:
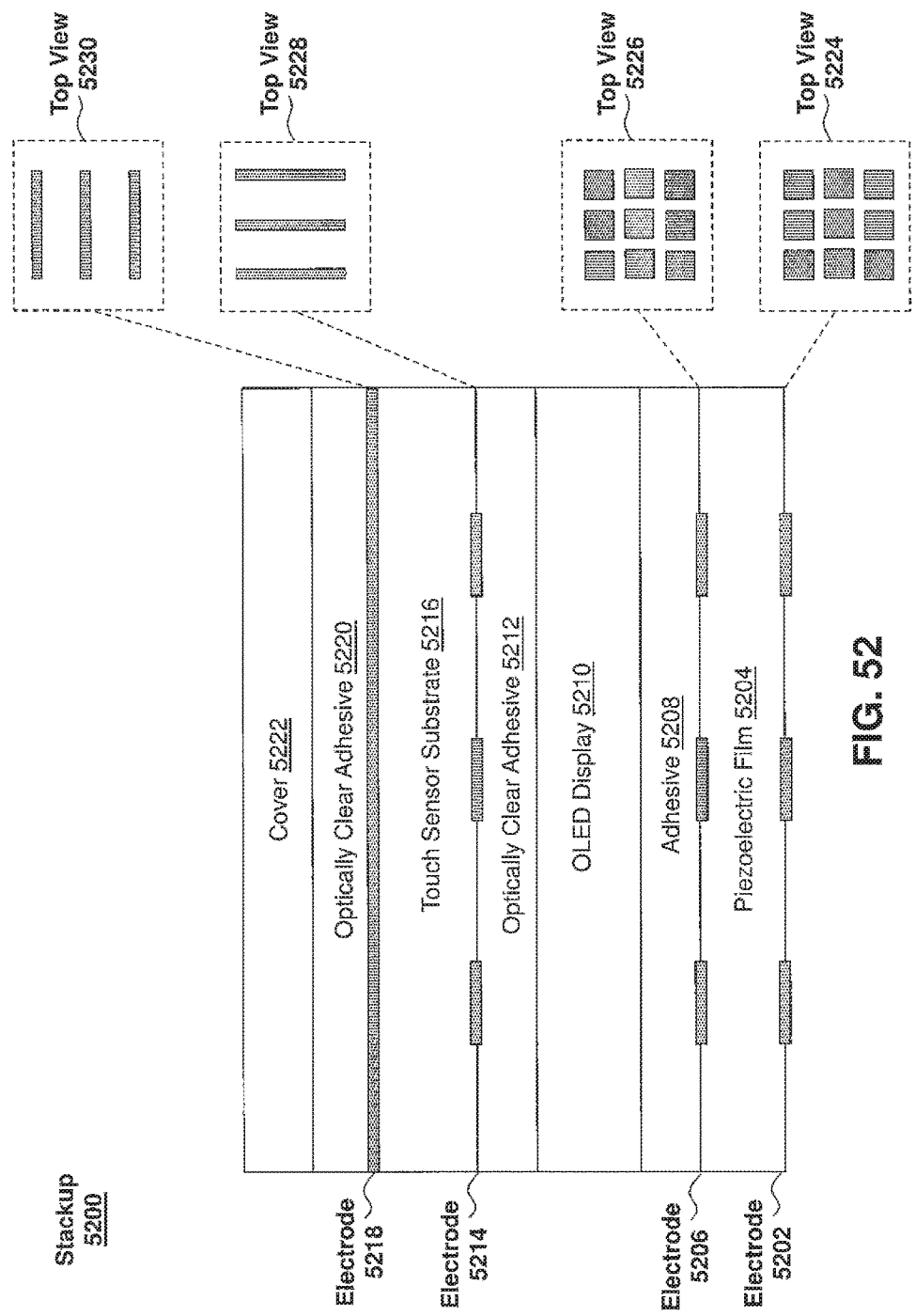

FIG. 52 illustrates a cross-sectional view of another exemplary stackup 5200 for a device containing an OLED display 5210. Stackup 5200 can include piezoelectric film 5204 formed from a transparent or non-transparent film capable of generating a localized electric charge in response to a deformation of the film. Piezoelectric film 5204 can include a first electrode 5202 and a second electrode 5206 formed on opposite surfaces of the film. The electrodes can be formed from a transparent or non-transparent conductive material, such as ITO, PEDOT, silver ink, silver nanowire, or copper. Top views 5224 and 5226 show the shapes of electrodes 5202 and 5206, respectively, as viewed from above stackup 5200. In the illustrated example, electrodes 5202 and 5206 can both include multiple discrete electrodes extending along the top surface of piezoelectric film 5204. While FIG. 52 shows electrodes 5202 and 5206 each having nine square electrodes arranged in rows and columns, it should be appreciated that electrodes 5202 and 5206 can each include any number of electrodes having any desired shaped and arranged in any desired pattern such that the electrodes of electrode 5202 are positioned opposite the electrodes of electrode 5206 on piezoelectric film 5204.

Stackup 5200 can further include OLED display 5210 coupled to piezoelectric film 5204 by adhesive 5208. Unlike the LCD examples described herein, piezoelectric film 5204, adhesive 5208, and electrodes 5202 and 5206 need not be transparent or optically clear since they are located behind OLED display 5210 and thus, would not block a user's view of the display. Stackup 5200 can further include touch sensor substrate 5216 coupled to OLED display 5212 by optically clear adhesive 5212. Touch sensor substrate 5216 can include electrodes 5214 and 5218 formed on opposite surfaces of the sensor. The electrodes can be formed from a transparent conductive material, such as ITO, PEDOT, or silver nanowire. Top views 5228 and 5230 show the shapes of electrodes 5214 and 5218, respectively, as viewed from above stackup 5200. In the illustrated example, electrodes 5214 can include columns of multiple discrete electrodes and electrode 5218 can include multiple rows of discrete electrodes. Stackup 5200 can further include cover material 5222 (e.g., glass, plastic, or other rigid and transparent material) coupled to touch sensor substrate 5216 by optically clear adhesive 5220. While FIG. 52 shows three columns of electrodes 5214 and three rows of electrodes 5218, it should be appreciated that any number of rows and columns of electrodes can be used. Moreover, in other examples, electrode 5214 can be formed on the top of touch sensor substrate 5216 and electrode 5218 can be formed on the bottom of touch sensor substrate 5216.

Electrodes 5202 and 5206 can be separated into discrete electrodes positioned opposite each other on piezoelectric film 5204 to allow the sense circuitry coupled to the electrodes of electrode 5206 to determine both the amount and location of force applied to cover material 5222. Additionally, multiple forces applied to different portions of cover material 5222 can be detected using the electrodes of electrode 5206. For example, the electrodes of electrode 5202 can be coupled to ground and each electrode of electrode 5206 can be coupled to separate sense circuitry (not shown) similar or identical to sense circuitry 320 that is capable of detecting an amount of electric charge generated by the portion of piezoelectric film 5404 coupled to the electrode. During operation, as a user applies a downward force on cover material 5222, cover material 5222 can deform by an amount corresponding to an amount of the applied force. The deformation of cover material 5222 can cause a corresponding deformation in optically clear adhesive 5220, touch sensor substrate 5216, optically clear adhesive 5212, OLED display 5210, adhesive 5208, and piezoelectric film 5204. Piezoelectric film 5204 can then generate an amount of electric charge based on an amount of deformation of the film and at a location of the deformation of the film. The electrode of electrode 5206 positioned at or near the location of the deformation and that is electrically coupled to receive the generated charge can transmit the generated charge to its associated sense circuitry. Since the amount of electric charge generated by piezoelectric film 5204 can be representative of the amount of deformation of the film and because the amount of deformation of the film can be representative of the force applied to cover material 5222, the amount of electric charge detected by the sense circuitry can be representative of the force applied to cover material 5222. Additionally, since the location of the electrode of electrode 5206 receiving the generated charge is known, the location of the applied force can also be determined. In this way, the sense circuitry can be used to detect an amount and location of a force applied to cover material 5222. Moreover, the multiple electrodes of electrode 5206 and the separate sense circuitry coupled to each electrode allows for detection of multiple forces applied to different portions of cover material 5222 at the same time. In other examples, the electrodes of electrode 5206 can be coupled to ground and the electrodes of electrode 5202 can each be coupled to separate sense circuitry. In these examples, the sense circuitry can be used to determine the amount and location of forces applied to cover material 5222 based on electric charges received from the electrodes of electrode 5202.

Additionally, during operation, touch sensor substrate 5216 and electrodes 5214 and 5218 can be used to determine a position of a touch event (e.g., a finger, stylus, or other object touching cover material 5222) on cover material 5222 using a mutual capacitance sensing technique. For example, electrodes 5218 can be driven with sinusoidal stimulation signals to capacitively couple with crossing columns of electrodes 5214, thereby forming a capacitive path for coupling charge from electrodes 5218 to the electrodes 5214. The crossing electrodes 5214 can output touch signals representing the coupled charge or current. When an object, such as a passive stylus, finger, etc., touches cover material 5222, the object can cause a capacitance between electrodes 5218 and 5214 at the touch location to decrease. This capacitance change can be caused by charge or current from the stimulated electrode 5218 being shunted through the touching object to ground rather than being coupled to the crossing electrode 5214 at the touch location. The touch signals representative of the capacitance change can be received by electrodes 5214 and transmitted to sense circuitry (e.g., similar or identical to sense circuitry 320) for processing. The touch signals can indicate the touch region where the touch occurred. When combined with the amount of force determined using piezoelectric film 5204 and electrodes 5202 and 5206, both the location of a touch event and amount of force applied to cover material 5222 can be determined. In other examples, electrode 5214 can be driven with stimulation signals while electrode 5218 can be coupled to sense circuitry for detecting a location of a touch event on cover material 5222.

Figure 53:
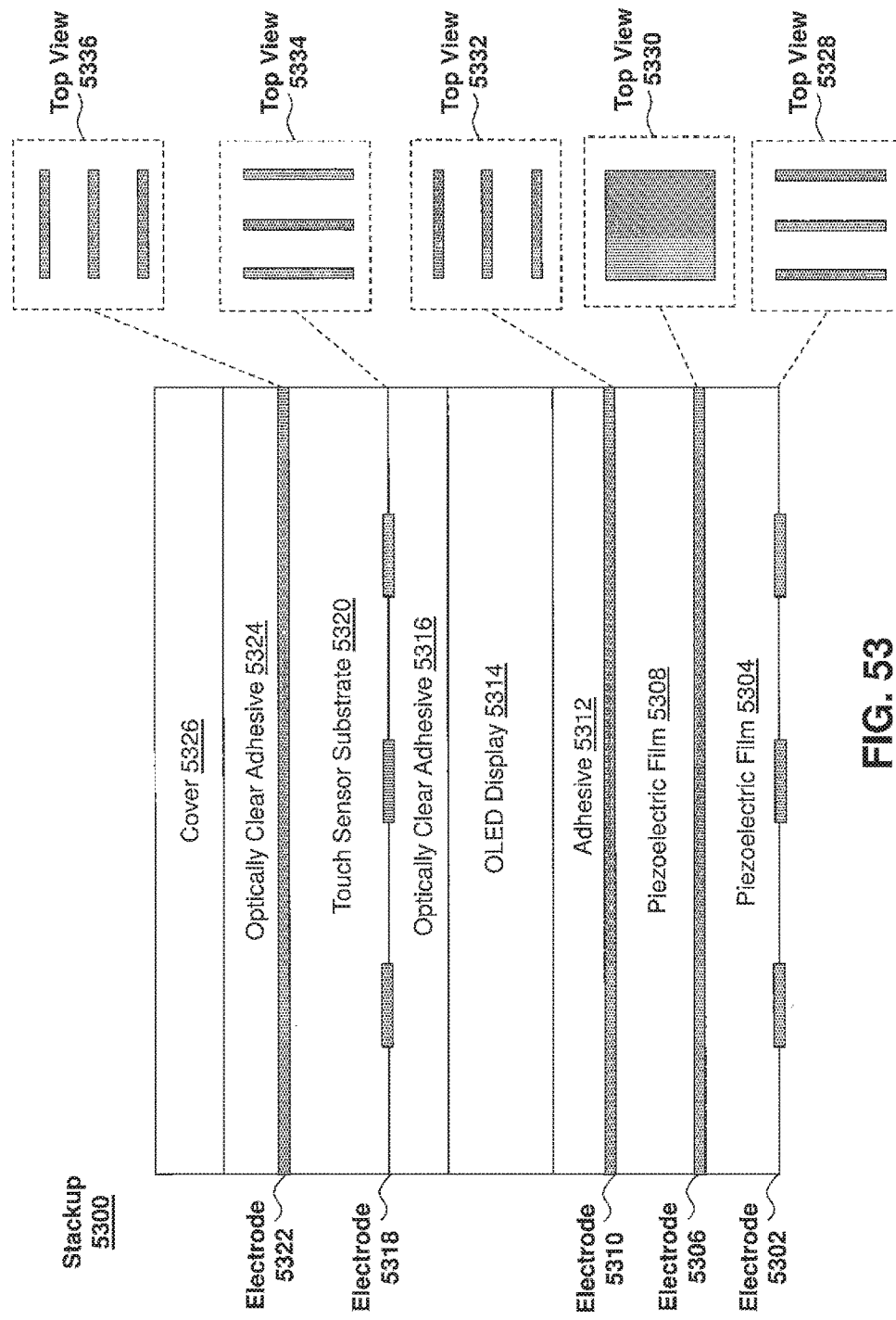

FIG. 53 illustrates a cross-sectional view of another exemplary stackup 5300 for a device containing an OLED display 5314. Stackup 5300 can include a first piezoelectric film 5304. Stackup 5300 can further include a second piezoelectric film 5308 coupled to first piezoelectric film 5304. The first and second piezoelectric films 5308 and 5304 can both include a transparent or non-transparent film capable of generating a localized electric charge in response to a deformation of the film. A first electrode 5302 can be formed on the bottom of the first piezoelectric film 5304, a second electrode 5306 can be formed between the first and second piezoelectric films 5304 and 5308, and a third electrode 5310 can be formed on the top of the second piezoelectric film 5308. The electrodes can be formed from a transparent or non-transparent conductive material, such as ITO, PEDOT, silver ink, silver nanowire, or copper. Top views 5328, 5330, and 5332 show the shapes of electrodes 5302, 5304, and 5310, respectively, as viewed from above stackup 5300. In the illustrated example, electrode 5302 can include multiple columns of discrete electrodes, electrode 5306 can include an electrode extending along the surfaces of piezoelectric films 5304 and 5308, and electrode 5310 can include rows of multiple discrete electrodes. While FIG. 53 shows electrodes 5302 and 5310 each having three rectangular electrodes arranged in columns and rows, respectively, it should be appreciated that electrodes 5302 and 5310 can each include any number of rectangular electrodes and can instead be arranged in rows and columns, respectively.

Stackup 5300 can further include OLED display 5314 coupled to second piezoelectric film 5308 by adhesive 5312. Unlike the LCD examples described herein, piezoelectric films 5304 and 5308, adhesive 5312, and electrodes 5302, 5306, and 5310 need not be transparent or optically clear since they are located behind OLED display 5314 and thus, would not block a user's view of the display. Stackup 5300 can further include touch sensor substrate 5320 coupled to OLED display 5314 by optically clear adhesive 5316. Touch sensor substrate 5320 can include electrodes 5318 and 5322 formed on opposite surfaces of the sensor. The electrodes can be formed from a transparent conductive material, such as ITO, PEDOT, or silver nanowire. Top views 5334 and 5336 show the shapes of electrodes 5318 and 5322, respectively, as viewed from above stackup 5300. In the illustrated example, electrodes 5318 can include columns of multiple discrete electrodes and electrode 5322 can include multiple rows of discrete electrodes. Stackup 5300 can further include cover material 5326 (e.g., glass, plastic, or other rigid and transparent material) coupled to touch sensor substrate 5320 by optically clear adhesive 5324. While FIG. 53 shows three columns of electrodes 5318 and three rows of electrodes 5322, it should be appreciated that any number of rows and columns of electrodes can be used. Moreover, in other examples, electrode 5318 can be formed on the top of touch sensor substrate 5320 and electrode 5322 can be formed on the bottom of touch sensor substrate 5318.

Electrodes 5302 and 5310 can be separated into discrete columns and rows of electrodes to allow the sense circuitry coupled to the electrodes of electrodes 5302 and 5310 to determine both the amount and location of force applied to cover material 5326. Additionally, multiple forces applied to different portions of cover material 5326 can be detected at the same time using the electrodes of electrodes 5302 and 5310. For example, electrode 5306 can be coupled to ground while the electrodes of electrode 5302 can each be coupled to separate sense circuitry (not shown) similar or identical to sense circuitry 320 that is capable of detecting an amount of electric charge generated by the portion of piezoelectric film 5304 coupled to the electrode. The electrodes of electrode 5310 can also be coupled to separate sense circuitry (not shown) similar or identical to sense circuitry 320 that is capable of detecting an amount of electric charge generated by the portion of piezoelectric film 5308 coupled to the electrode. During operation, as a user applies a downward force on cover material 5326, cover material 5326 can deform by an amount corresponding to an amount of the applied force. The deformation of cover material 5326 can cause a corresponding deformation in optically clear adhesive 5324, touch sensor substrate 5320, optically clear adhesive 5316, OLED display 5314, adhesive 5312, and piezoelectric films 5308 and 5304. Piezoelectric films 5308 and 5304 can then generate an amount of electric charge based on an amount of deformation of the film and at a location of the deformation of the film. The electrode of electrode 5310 positioned at or near the location of the deformation of piezoelectric film 5308 and that is electrically coupled to receive the generated charge can transmit the generated charge to its associated sense circuitry. Similarly the electrode of electrode 5302 positioned at or near the location of the deformation of piezoelectric film 5304 and that is electrically coupled to receive the generated charge can transmit the generated charge to its associated sense circuitry. Since the amount of electric charge generated by piezoelectric films 5304 and 5308 can be representative of the amount of deformation of the films and because the amount of deformation of the films can be representative of the force applied to cover material 5326, the amount of electric charge detected by the sense circuitry can be representative of the force applied to cover material 5326. Additionally, since the location of the electrodes of electrodes 5302 and 5310 receiving the generated charge is known, the location of the applied force can also be determined. For example, electrode 5310 can be used to determine the row at which the force was applied, while electrode 5302 can be used to determine the column at which the force was applied. The intersection of the determined row and column can be the location of the applied force. In this way, the sense circuitry can be used to detect an amount and location of a force applied to cover material 5326. Moreover, the multiple electrodes of electrodes 5302 and 5310 and the separate sense circuitry coupled to each electrode allows for detection of multiple forces applied to different portions of cover material 5326 at the same time. In other examples, electrode 5310 can be coupled to the bottom of piezoelectric film 5304 and electrode 5302 can be coupled to the top of piezoelectric film 5308. In these examples, the electrodes of electrodes 5302 and 5310 can each be coupled to separate sense circuitry. The sense circuitry can be used to detect an amount and location of force applied to cover material 5326 in a manner similar to that described above for the configuration shown in FIG. 53.

Additionally, during operation, touch sensor substrate 5320 and electrodes 5318 and 5322 can be used to determine a position of a touch event (e.g., a finger, stylus, or other object touching cover material 5326) on cover material 5326 using a mutual capacitance sensing technique. For example, electrodes 5322 can be driven with sinusoidal stimulation signals to capacitively couple with crossing columns of electrodes 5318, thereby forming a capacitive path for coupling charge from electrodes 5322 to the electrodes 5318. The crossing electrodes 5318 can output touch signals representing the coupled charge or current. When an object, such as a passive stylus, finger, etc., touches cover material 5328, the object can cause a capacitance between electrodes 5322 and 5318 at the touch location to decrease. This capacitance change can be caused by charge or current from the stimulated electrode 5322 being shunted through the touching object to ground rather than being coupled to the crossing electrode 5318 at the touch location. The touch signals representative of the capacitance change can be received by electrodes 5318 and transmitted to sense circuitry (e.g., similar or identical to sense circuitry 320) for processing. The touch signals can indicate the touch region where the touch occurred. When combined with the amount of force determined using piezoelectric film 5304 and electrodes 5302 and 5306, both the location of a touch event and amount of force applied to cover material 5326 can be determined. In other examples, electrode 5318 can be driven with stimulation signals while electrode 5322 can be coupled to sense circuitry for detecting a location of a touch event on cover material 5326.

Figure 54:
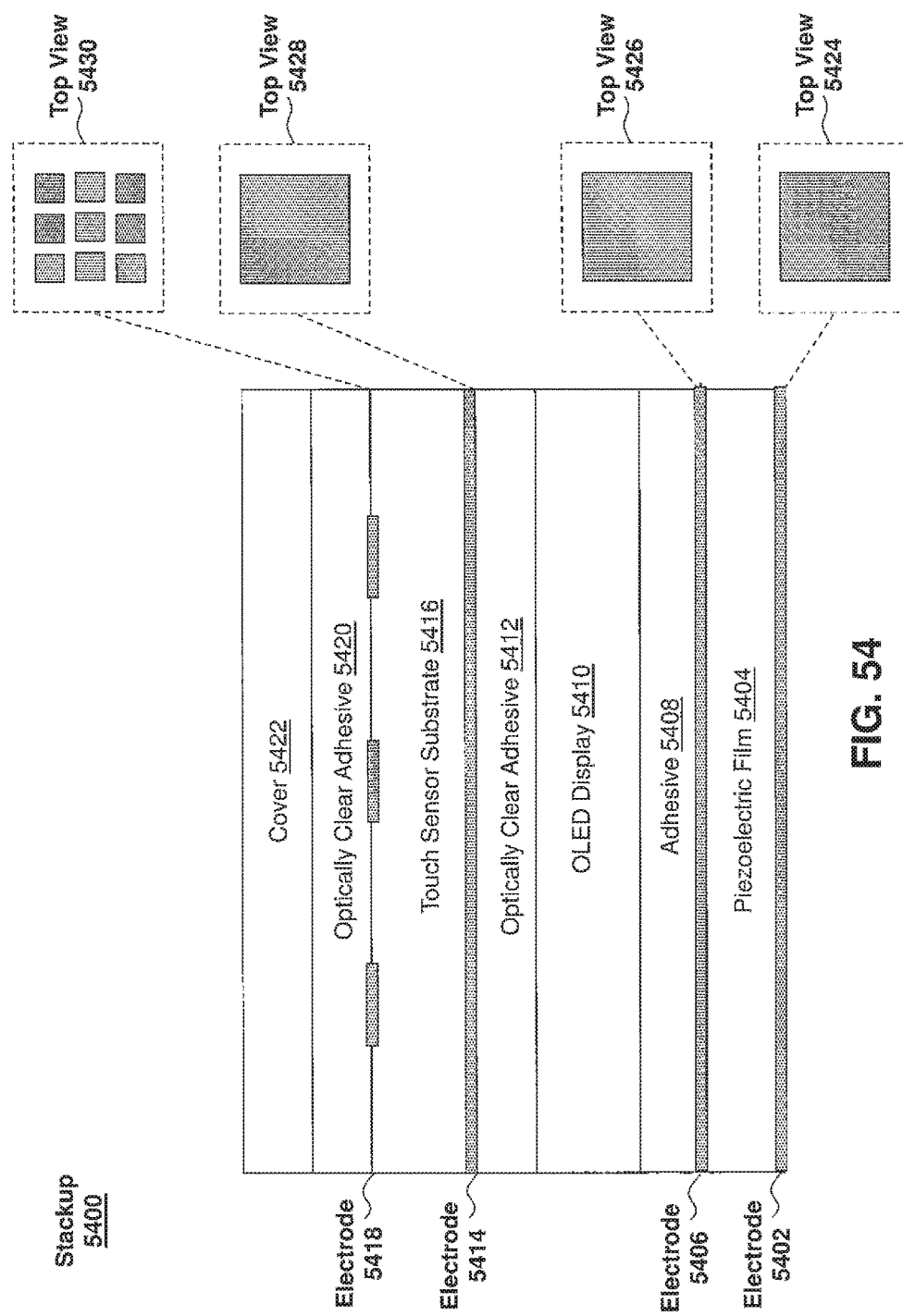

FIG. 54 illustrates a cross-sectional view of another exemplary stackup 5400 for a device containing an OLED display 5410. Stackup 5400 can include piezoelectric film 5404 formed from a transparent or non-transparent film capable of generating a localized electric charge in response to a deformation of the film. Piezoelectric film 5404 can include a first electrode 5402 and a second electrode 5406 formed on opposite surfaces of the film. The electrodes can be formed from a transparent or non-transparent conductive material, such as ITO, PEDOT, silver ink, silver nanowire, or copper. Top views 5424 and 5426 show the shapes of electrodes 5402 and 5406, respectively, as viewed from above stackup 5400. In the illustrated example, electrodes 5402 and 5406 can both have a shape that substantially matches that of piezoelectric film 5404 and can extend along the surfaces of piezoelectric film 5404.

Stackup 5400 can further include integrated OLED display 5410 coupled to piezoelectric film 5404 by adhesive 5408. Unlike the LCD examples described herein, piezoelectric film 5404, adhesive 5408, and electrodes 5402 and 5406 need not be transparent or optically clear since they are located behind OLED display 5410 and thus, would not block a user's view of the display. Stackup 5400 can further include touch sensor substrate 5416 coupled to OLED display 5410 by optically clear adhesive 5412. Touch sensor substrate 5416 can include electrodes 5414 and 5418 formed on opposite surfaces of the sensor. The electrodes can be formed from a transparent conductive material, such as ITO, PEDOT, or silver nanowire. Top views 5428 and 5430 show the shapes of electrodes 5414 and 5418, respectively, as viewed from above stackup 5400. In the illustrated example, electrode 5418 can include multiple discrete electrodes extending along the top surface of touch sensor substrate 5416 and electrode 5414 can extend along the bottom surface of touch sensor substrate 5416. Stackup 5400 can further include cover material 5422 (e.g., glass, plastic, or other rigid and transparent material) coupled to touch sensor substrate 5416 by optically clear adhesive 5420. While FIG. 54 shows electrode 5418 having nine square electrodes arranged in rows and columns, it should be appreciated that electrode 5418 can include any number of electrodes having any desired shaped and arranged in any desired pattern. Moreover, in other examples, electrode 5414 can be formed on the top of touch sensor substrate 5416 and electrode 5418 can be formed on the bottom of touch sensor substrate 5416.

In some examples, electrode 5402 can be coupled to ground and electrode 5406 can be coupled to sense circuitry (not shown) similar or identical to sense circuitry 320 that is capable of detecting an amount of electric charge generated by piezoelectric film 5404. During operation, as a user applies a downward force on cover material 5422, cover material 5422 can deform by an amount corresponding to an amount of the applied force. The deformation of cover material 5422 can cause a corresponding deformation in optically clear adhesive 5420, touch sensor substrate 5416, optically clear adhesive 5412, OLED display 5410, adhesive 5408, and piezoelectric film 5404. Piezoelectric film 5404 can then generate an amount of electric charge based on an amount of deformation of the film. The generated electric charge can be received by the sense circuitry via electrode 5406. Since the amount of electric charge generated by piezoelectric film 5404 can be representative of the amount of deformation of the film and because the amount of deformation of the film can be representative of the force applied to cover material 5422, the amount of electric charge detected by the sense circuitry can be representative of the force applied to cover material 5422. In this way, the sense circuitry can be used to detect an amount of force applied to cover material 5422. In other examples, the electrode 5406 can be coupled to ground and electrode 5402 can be coupled to the sense circuitry. In these examples, the sense circuitry can be used to determine the amount of force applied to cover material 5422 based on electric charge received from electrode 5402.

Additionally, during operation, electrodes 5414 and 5418 can be used to determine a position of a touch event (e.g., a finger, stylus, or other object touching cover material 5422) on cover material 5422 using a self capacitance sensing technique. For example, each electrode of electrode 5418 can be coupled to a voltage source and sense circuitry. The sense circuitry can measure a change in capacitance at each electrode caused by an object, such as a passive stylus, finger, etc., touching cover material 5422. The capacitance change can be caused by charge or current from the electrode of electrode 5418 being shunted through the touching object to ground. The detected change in capacitance measured by the sense circuitry can be representative of a touch event occurring at a location corresponding to the associated electrode of electrode 5418. When combined with the amount of force determined using piezoelectric film 5404 and electrodes 5402 and 5406, both the location of the touch event and amount of force applied to cover material 5422 can be determined.

Figure 55:
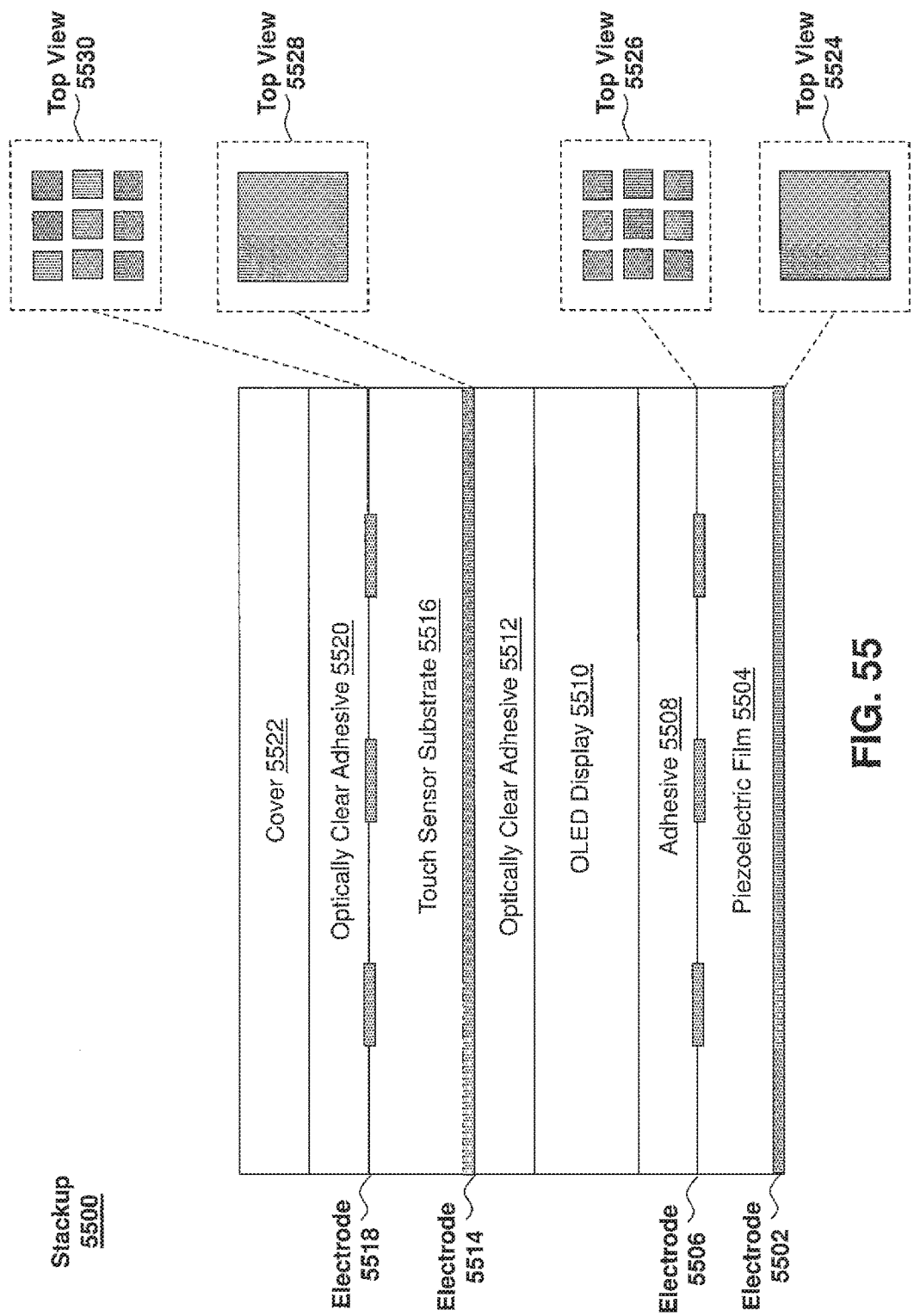

FIG. 55 illustrates a cross-sectional view of another exemplary stackup 5500 for a device containing an OLED display 5510. Stackup 5500 can include piezoelectric film 5504 formed from a transparent or non-transparent film capable of generating a localized electric charge in response to a deformation of the film. Piezoelectric film 5504 can include a first electrode 5502 and a second electrode 5506 formed on opposite surfaces of the film. The electrodes can be formed from a transparent or non-transparent conductive material, such as ITO, PEDOT, silver ink, silver nanowire, or copper. Top views 5524 and 5526 show the shapes of electrodes 5502 and 5506, respectively, as viewed from above stackup 5500. In the illustrated example, electrode 5502 can extend along the bottom surface of piezoelectric film 5504 and electrode 5506 can include multiple discrete electrodes extending along the top surface of piezoelectric film 5504. While electrode 5506 is shown as having nine square electrodes arranged in rows and columns, it should be appreciated that electrode 5506 can each include any number of electrodes having any desired shaped and arranged in any desired pattern.

Stackup 5500 can further include integrated OLED display 5510 coupled to piezoelectric film 5504 by adhesive 5508. Unlike the LCD examples described herein, piezoelectric film 5504, adhesive 5508, and electrodes 5502 and 5506 need not be transparent or optically clear since they are located behind OLED display 5510 and thus, would not block a user's view of the display. Stackup 5500 can further include touch sensor substrate 5516 coupled to OLED display 5510 by optically clear adhesive 5512. Touch sensor substrate 5516 can include electrodes 5514 and 5518 formed on opposite surfaces of the sensor. The electrodes can be formed from a transparent conductive material, such as ITO, PEDOT, or silver nanowire. Top views 5528 and 5530 show the shapes of electrodes 5514 and 5518, respectively, as viewed from above stackup 5500. In the illustrated example, electrode 5518 can include multiple discrete electrodes extending along the top surface of touch sensor substrate 5516 and electrode 5514 can extend along the bottom surface of touch sensor substrate 5516. Stackup 5500 can further include cover material 5522 (e.g., glass, plastic, or other rigid and transparent material) coupled to touch sensor substrate 5516 by optically clear adhesive 5520. While FIG. 55 shows electrode 5518 having nine square electrodes arranged in rows and columns, it should be appreciated that electrode 5518 can include any number of electrodes having any desired shaped and arranged in any desired pattern. Moreover, in other examples, electrode 5514 can be formed on the top of touch sensor substrate 5516 and electrode 5518 can be formed on the bottom of touch sensor substrate 5516.

Electrode 5506 can be separated into discrete electrodes to allow the sense circuitry coupled to the electrodes of electrode 5506 to determine both the amount and location of force applied to cover material 5522. Additionally, multiple forces applied to different portions of cover material 5522 can be detected using the electrodes of electrode 5506. For example, electrode 5502 can be coupled to ground and each electrode of electrode 5506 can be coupled to separate sense circuitry (not shown) similar or identical to sense circuitry 320 that is capable of detecting an amount of electric charge generated by the portion of piezoelectric film 5504 coupled to the electrode. During operation, as a user applies a downward force on cover material 5522, cover material 5522 can deform by an amount corresponding to an amount of the applied force. The deformation of cover material 5522 can cause a corresponding deformation in optically clear adhesive 5520, touch sensor substrate 5516, optically clear adhesive 5512, OLED display 5510, adhesive 5508, and piezoelectric film 5504. Piezoelectric film 5504 can then generate an amount of electric charge based on an amount of deformation of the film at a location of the deformation of the film. The electrode of electrode 5506 positioned at or near the location of the deformation and that is electrically coupled to receive the generated charge can transmit the generated charge to its associated sense circuitry. Since the amount of electric charge generated by piezoelectric film 5504 can be representative of the amount of deformation of the film and because the amount of deformation of the film can be representative of the force applied to cover material 5522, the amount of electric charge detected by the sense circuitry can be representative of the force applied to cover material 5522. Additionally, since the location of the electrode of electrode 5506 receiving the generated charge is known, the location of the applied force can also be determined. In this way, the sense circuitry can be used to detect an amount and location of a force applied to cover material 5522. Moreover, the multiple electrodes of electrode 5506 and the separate sense circuitry coupled to each electrode allows for detection of multiple forces applied to different portions of cover material 5522 at the same time. In other examples, electrode 5506 can be coupled to the bottom of piezoelectric film 5504 and electrode 5502 can be coupled to the top of piezoelectric film 5504. In these examples, the electrodes of electrode 5506 can each be coupled to separate sense circuitry and electrode 5502 can be coupled to ground. The sense circuitry can be used to detect an amount and location of force applied to cover material 5522 in a manner similar to that described above for the configuration shown in FIG. 55.

Additionally, during operation, electrodes 5514 and 5518 can be used to determine a position of a touch event (e.g., a finger, stylus, or other object touching cover material 5522) on cover material 5522 using a self capacitance sensing technique. For example, each electrode of electrode 5518 can be coupled to a voltage source and sense circuitry. The sense circuitry can measure a change in capacitance at each electrode caused by an object, such as a passive stylus, finger, etc., touching cover material 5522. The capacitance change can be caused by charge or current from the electrode of electrode 5518 being shunted through the touching object to ground. The detected change in capacitance measured by the sense circuitry can be representative of a touch event occurring at a location corresponding to the associated electrode of electrode 5518. When combined with the amount of force determined using piezoelectric film 5504 and electrodes 5502 and 5506, both the location of the touch event and amount of force applied to cover material 5522 can be determined.

Figure 56:
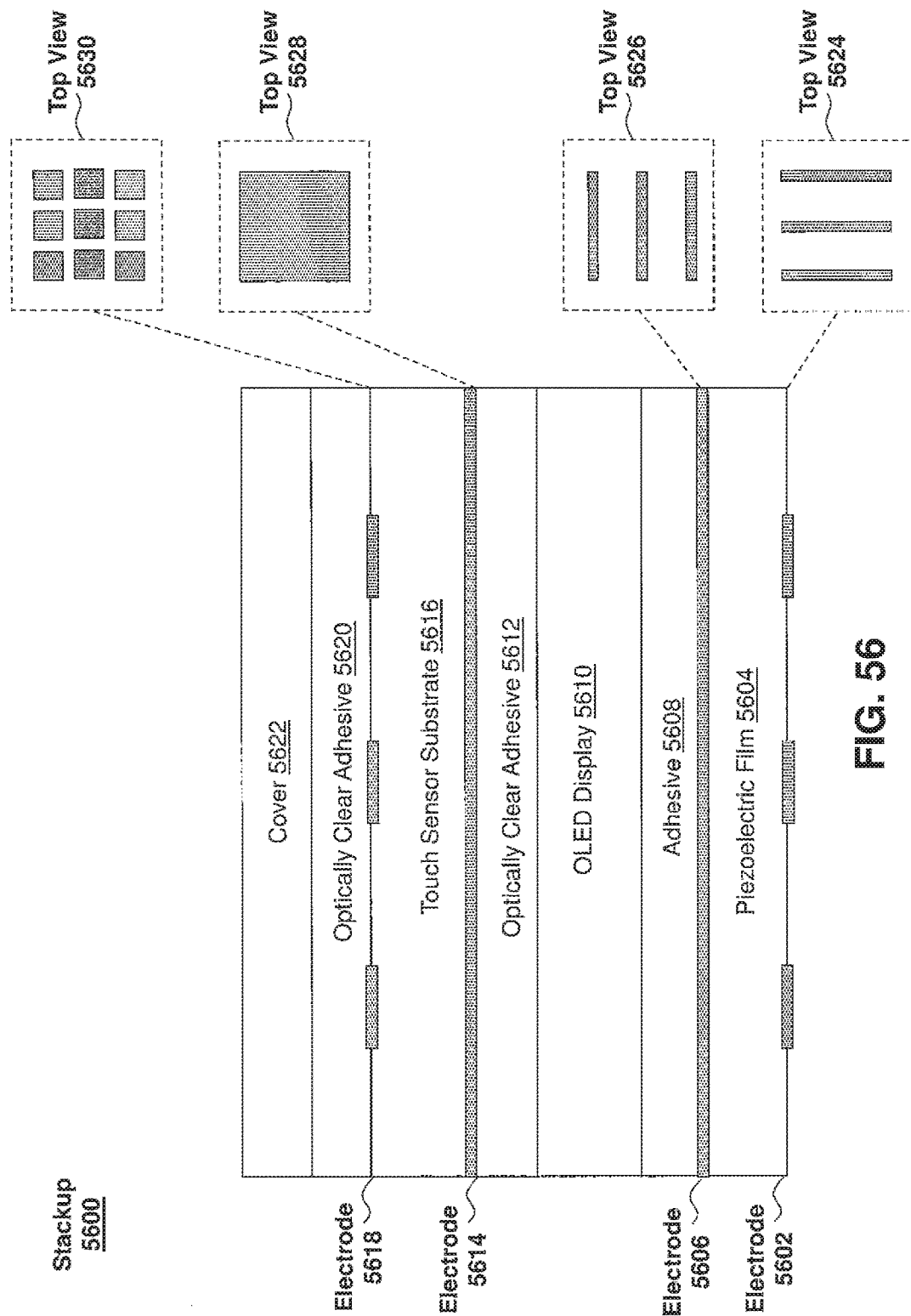

FIG. 56 illustrates a cross-sectional view of another exemplary stackup 5600 for a device containing an OLED display 5610. Stackup 5600 can include piezoelectric film 5604 formed from a transparent or non-transparent film capable of generating a localized electric charge in response to a deformation of the film. Piezoelectric film 5604 can include a first electrode 5602 and a second electrode 5606 formed on opposite surfaces of the film. The electrodes can be formed from a transparent or non-transparent conductive material, such as ITO, PEDOT, silver ink, silver nanowire, or copper. Top views 5624 and 5626 show the shapes of electrodes 5602 and 5606, respectively, as viewed from above stackup 5600. In the illustrated example, electrode 5602 can include multiple columns of discrete electrodes and electrode 5606 can include multiple rows of discrete electrodes. While FIG. 56 shows three columns of electrodes 5602 and three rows of electrodes 5606, it should be appreciated that any number of rows and columns of electrodes can be used. Moreover, in other examples, electrode 5602 can be formed on the top of piezoelectric film 5604 and electrode 5606 can be formed on the bottom of piezoelectric film 5604.

Stackup 5600 can further include integrated OLED display 5610 coupled to piezoelectric film 5604 by adhesive 5608. Unlike the LCD examples described herein, piezoelectric film 5604, adhesive 5608, and electrodes 5602 and 5606 need not be transparent or optically clear since they are located behind OLED display 5610 and thus, would not block a user's view of the display. Stackup 5600 can further include touch sensor substrate 5616 coupled to OLED display 5610 by optically clear adhesive 5612. Touch sensor substrate 5616 can include electrodes 5614 and 5618 formed on opposite surfaces of the sensor. The electrodes can be formed from a transparent conductive material, such as ITO, PEDOT, or silver nanowire. Top views 5628 and 5630 show the shapes of electrodes 5614 and 5618, respectively, as viewed from above stackup 5600. In the illustrated example, electrode 5618 can include multiple discrete electrodes extending along the top surface of touch sensor substrate 5616 and electrode 5614 can extend along the bottom surface of touch sensor substrate 5616. Stackup 5600 can further include cover material 5622 (e.g., glass, plastic, or other rigid and transparent material) coupled to touch sensor substrate 5616 by optically clear adhesive 5620. While FIG. 56 shows electrode 5618 having nine square electrodes arranged in rows and columns, it should be appreciated that electrode 5618 can include any number of electrodes having any desired shaped and arranged in any desired pattern. Moreover, in other examples, electrode 5614 can be formed on the top of touch sensor substrate 5616 and electrode 5618 can be formed on the bottom of touch sensor substrate 5616.

In some examples, the electrodes of electrode 5602 can be coupled to ground and each electrode of electrode 5606 can be coupled to separate sense circuitry (not shown) similar or identical to sense circuitry 320 that is capable of detecting an amount of electric charge generated by the portion of piezoelectric film 5604 coupled to the electrode. During operation, as a user applies a downward force on cover material 5622, cover material 5622 can deform by an amount corresponding to an amount of the applied force. The deformation of cover material 5622 can cause a corresponding deformation in optically clear adhesive 5620, touch sensor substrate 5616, optically clear adhesive 5612, OLED display 5610, adhesive 5608, and piezoelectric film 5604. Piezoelectric film 5604 can then generate an amount of electric charge based on an amount of deformation of the film. The location of the generated electric charge can correspond to the location of the deformation of the film. The electrode of electrode 5606 positioned at or near the location of the deformation and that is electrically coupled to receive the generated charge can transmit the generated charge to its associated sense circuitry. Since the amount of electric charge generated by piezoelectric film 5604 can be representative of the amount of deformation of the film and because the amount of deformation of the film can be representative of the force applied to cover material 5622, the amount of electric charge detected by the sense circuitry can be representative of the force applied to cover material 5622. Additionally, since the location of the electrode of electrode 5606 receiving the generated charge is known, the location of the applied force can also be determined. In this way, the sense circuitry can be used to detect an amount and location of a force applied to cover material 5622. Moreover, the multiple electrodes of electrode 5606 and the separate sense circuitry coupled to each electrode allows for detection of multiple forces applied to different portions of cover material 5622 at the same time. In other examples, the electrodes of electrode 5606 can be coupled to ground and the electrodes of electrode 5604 can each be coupled to separate sense circuitry. In these examples, the sense circuitry can be used to determine the amount and location of forces applied to cover material 5622 based on electric charges received from the electrodes of electrode 5602.

In yet other examples, electrode 5102 can be coupled to ground and electrode 5606 can be coupled to separate sense circuitry. The sense circuitry can be used to determine both an amount and location along one of the electrodes of electrode 5606 of an applied force. Using, for example, switching circuitry coupled to electrodes 5602 and 5606, electrode 5602 can then be coupled to separate sense circuitry and electrode 5606 can then be coupled to ground. The sense circuitry can be used to determine both an amount and location along one of the electrodes of electrode 5602 of an applied force. The intersection of the determined row and column can be interpreted as a location of the force on cover material 5622.

Additionally, during operation, electrodes 5614 and 5618 can be used to determine a position of a touch event (e.g., a finger, stylus, or other object touching cover material 5622) on cover material 5622 using a self capacitance sensing technique. For example, each electrode of electrode 5618 can be coupled to a voltage source and sense circuitry. The sense circuitry can measure a change in capacitance at each electrode caused by an object, such as a passive stylus, finger, etc., touching cover material 5622. The capacitance change can be caused by charge or current from the electrode of electrode 5618 being shunted through the touching object to ground. The detected change in capacitance measured by the sense circuitry can be representative of a touch event occurring at a location corresponding to the associated electrode of electrode 5618. When combined with the amount of force determined using piezoelectric film 5604 and electrodes 5602 and 5606, both the location of the touch event and amount of force applied to cover material 5622 can be determined.

Figure 57:
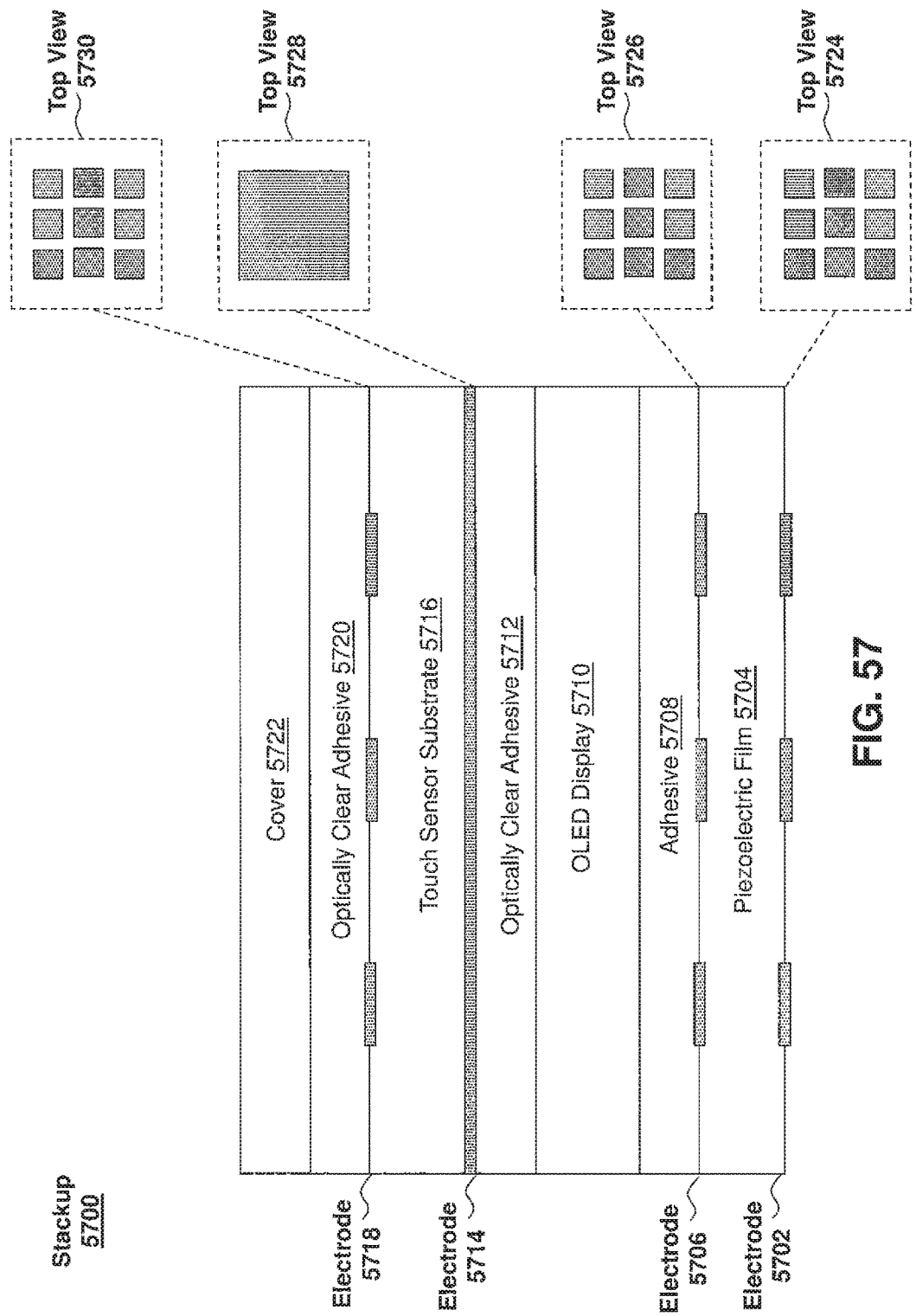

FIG. 57 illustrates a cross-sectional view of another exemplary stackup 5700 for a device containing an OLED display 5710. Stackup 5700 can include piezoelectric film 5704 formed from a transparent or non-transparent film capable of generating a localized electric charge in response to a deformation of the film. Piezoelectric film 5704 can include a first electrode 5702 and a second electrode 5706 formed on opposite surfaces of the film. The electrodes can be formed from a transparent or non-transparent conductive material, such as ITO, PEDOT, silver ink, silver nanowire, or copper. Top views 5724 and 5726 show the shapes of electrodes 5702 and 5706, respectively, as viewed from above stackup 5700. In the illustrated example, electrodes 5702 and 5706 can both include multiple discrete electrodes extending along the top surface of piezoelectric film 5704. While FIG. 57 shows electrodes 5702 and 5706 each having nine square electrodes arranged in rows and columns, it should be appreciated that electrodes 5702 and 5706 can each include any number of electrodes having any desired shaped and arranged in any desired pattern such that the electrodes of electrode 5702 are positioned opposite the electrodes of electrode 5706 on piezoelectric film 5704.

Stackup 5700 can further include integrated OLED display 5710 coupled to piezoelectric film 5704 by adhesive 5708. Unlike the LCD examples described herein, piezoelectric film 5704, adhesive 5708, and electrodes 5702 and 5706 need not be transparent or optically clear since they are located behind OLED display 5710 and thus, would not block a user's view of the display. Stackup 5700 can further include touch sensor substrate 5716 coupled to OLED display 5712 by optically clear adhesive 5712. Touch sensor substrate 5716 can include electrodes 5714 and 5718 formed on opposite surfaces of the sensor. The electrodes can be formed from a transparent conductive material, such as ITO, PEDOT, or silver nanowire. Top views 5728 and 5730 show the shapes of electrodes 5714 and 5718, respectively, as viewed from above stackup 5700. In the illustrated example, electrode 5718 can include multiple discrete electrodes extending along the top surface of touch sensor substrate 5716 and electrode 5714 can extend along the bottom surface of touch sensor substrate 5716. Stackup 5700 can further include cover material 5722 (e.g., glass, plastic, or other rigid and transparent material) coupled to touch sensor substrate 5716 by optically clear adhesive 5720. While FIG. 57 shows electrode 5718 having nine square electrodes arranged in rows and columns, it should be appreciated that electrode 5718 can include any number of electrodes having any desired shaped and arranged in any desired pattern. Moreover, in other examples, electrode 5714 can be formed on the top of touch sensor substrate 5716 and electrode 5718 can be formed on the bottom of touch sensor substrate 5716.

Electrodes 5702 and 5706 can be separated into discrete electrodes positioned opposite each other on piezoelectric film 5704 to allow the sense circuitry coupled to the electrodes of electrode 5706 to determine both the amount and location of force applied to cover material 5722. Additionally, multiple forces applied to different portions of cover material 5722 can be detected using the electrodes of electrode 5706. For example, the electrodes of electrode 5702 can be coupled to ground and each electrode of electrode 5706 can be coupled to separate sense circuitry (not shown) similar or identical to sense circuitry 320 that is capable of detecting an amount of electric charge generated by the portion of piezoelectric film 5704 coupled to the electrode. During operation, as a user applies a downward force on cover material 5722, cover material 5722 can deform by an amount corresponding to an amount of the applied force. The deformation of cover material 5722 can cause a corresponding deformation in optically clear adhesive 5720, touch sensor substrate 5716, optically clear adhesive 5712, OLED display 5710, adhesive 5708, and piezoelectric film 5704. Piezoelectric film 5704 can then generate an amount of electric charge based on an amount of deformation of the film and at a location of the deformation of the film. The electrode of electrode 5706 positioned at or near the location of the deformation and that is electrically coupled to receive the generated charge can transmit the generated charge to its associated sense circuitry. Since the amount of electric charge generated by piezoelectric film 5704 can be representative of the amount of deformation of the film and because the amount of deformation of the film can be representative of the force applied to cover material 5722, the amount of electric charge detected by the sense circuitry can be representative of the force applied to cover material 5722. Additionally, since the location of the electrode of electrode 5706 receiving the generated charge is known, the location of the applied force can also be determined. In this way, the sense circuitry can be used to detect an amount and location of a force applied to cover material 5722. Moreover, the multiple electrodes of electrode 5706 and the separate sense circuitry coupled to each electrode allows for detection of multiple forces applied to different portions of cover material 5722 at the same time. In other examples, the electrodes of electrode 5706 can be coupled to ground and the electrodes of electrode 5702 can each be coupled to separate sense circuitry. In these examples, the sense circuitry can be used to determine the amount and location of forces applied to cover material 5722 based on electric charges received from the electrodes of electrode 5702.

Additionally, during operation, electrodes 5714 and 5718 can be used to determine a position of a touch event (e.g., a finger, stylus, or other object touching cover material 5722) on cover material 5722 using a self capacitance sensing technique. For example, each electrode of electrode 5718 can be coupled to a voltage source and sense circuitry. The sense circuitry can measure a change in capacitance at each electrode caused by an object, such as a passive stylus, finger, etc., touching cover material 5722. The capacitance change can be caused by charge or current from the electrode of electrode 5718 being shunted through the touching object to ground. The detected change in capacitance measured by the sense circuitry can be representative of a touch event occurring at a location corresponding to the associated electrode of electrode 5718. When combined with the amount of force determined using piezoelectric film 5704 and electrodes 5702 and 5706, both the location of the touch event and amount of force applied to cover material 5722 can be determined.

Figure 58:
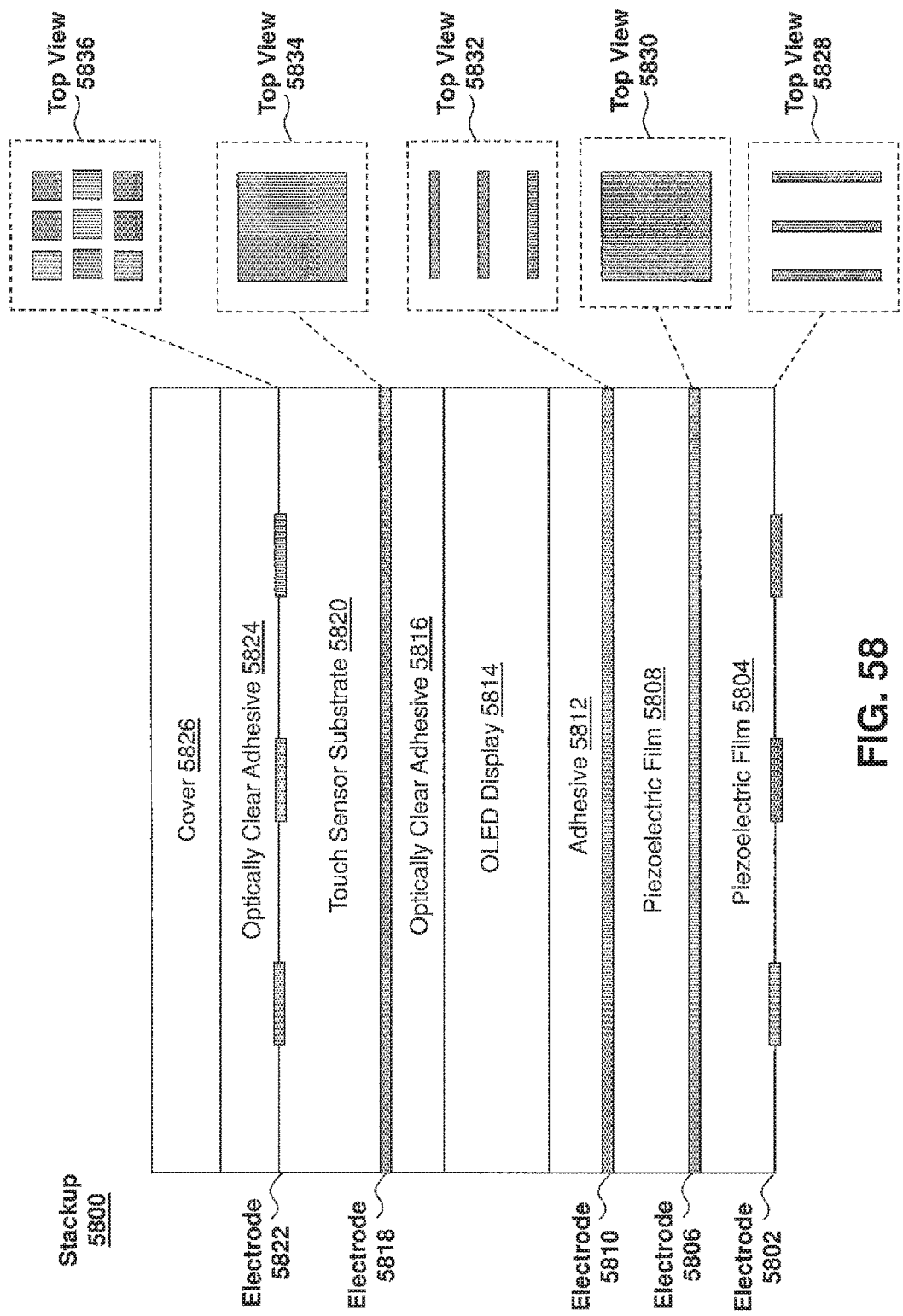

FIG. 58 illustrates a cross-sectional view of another exemplary stackup 5800 for a device containing an OLED display 5814. Stackup 5800 can include a first piezoelectric film 5804. Stackup 5800 can further include a second piezoelectric film 5808 coupled to first piezoelectric film 5804. The first and second piezoelectric films 5808 and 5804 can both include a transparent or non-transparent film capable of generating a localized electric charge in response to a deformation of the film. A first electrode 5802 can be formed on the bottom of the first piezoelectric film 5804, a second electrode 5806 can be formed between the first and second piezoelectric films 5804 and 5808, and a third electrode 5810 can be formed on the top of the second piezoelectric film 5808. The electrodes can be formed from a transparent or non-transparent conductive material, such as ITO, PEDOT, silver ink, silver nanowire, or copper. Top views 5828, 5830, and 5832 show the shapes of electrodes 5802, 5806, and 5810, respectively, as viewed from above stackup 5800. In the illustrated example, electrode 5802 can include multiple columns of discrete electrodes, electrode 5806 can include an electrode extending along the surfaces of piezoelectric films 5804 and 5808, and electrode 5810 can include rows of multiple discrete electrodes. While FIG. 58 shows electrodes 5802 and 5810 each having three rectangular electrodes arranged in columns and rows, respectively, it should be appreciated that electrodes 5802 and 5810 can each include any number of rectangular electrodes and can instead be arranged in rows and columns, respectively.

Stackup 5800 can further include integrated OLED display 5814 coupled to second piezoelectric film 5808 by adhesive 5812. Unlike the LCD examples described herein, piezoelectric films 5804 and 5808, adhesive 5812, and electrodes 5802, 5806, and 5810 need not be transparent or optically clear since they are located behind OLED display 5814 and thus, would not block a user's view of the display. Stackup 5800 can further include touch sensor substrate 5820 coupled to OLED display 5814 by optically clear adhesive 5816. Touch sensor substrate 5820 can include electrodes 5818 and 5822 formed on opposite surfaces of the sensor. The electrodes can be formed from a transparent conductive material, such as ITO, PEDOT, or silver nanowire. Top views 5834 and 5836 show the shapes of electrodes 5818 and 5822, respectively, as viewed from above stackup 5800. In the illustrated example, electrode 5822 can include multiple discrete electrodes extending along the top surface of touch sensor substrate 5820 and electrode 5818 can extend along the bottom surface of touch sensor substrate 5820. Stackup 5800 can further include cover material 5826 (e.g., glass, plastic, or other rigid and transparent material) coupled to touch sensor substrate 5820 by optically clear adhesive 5824. While FIG. 58 shows electrode 5822 having nine square electrodes arranged in rows and columns, it should be appreciated that electrode 5822 can include any number of electrodes having any desired shaped and arranged in any desired pattern. Moreover, in other examples, electrode 5818 can be formed on the top of touch sensor substrate 5820 and electrode 5822 can be formed on the bottom of touch sensor substrate 5820.

Electrodes 5802 and 5810 can be separated into discrete columns and rows of electrodes to allow the sense circuitry coupled to the electrodes of electrodes 5802 and 5810 to determine both the amount and location of force applied to cover material 5826. Additionally, multiple forces applied to different portions of cover material 5826 can be detected at the same time using the electrodes of electrodes 5802 and 5810. For example, electrode 5806 can be coupled to ground while the electrodes of electrode 5802 can each be coupled to separate sense circuitry (not shown) similar or identical to sense circuitry 320 that is capable of detecting an amount of electric charge generated by the portion of piezoelectric film 5804 coupled to the electrode. The electrodes of electrode 5810 can also be coupled to separate sense circuitry (not shown) similar or identical to sense circuitry 320 that is capable of detecting an amount of electric charge generated by the portion of piezoelectric film 5808 coupled to the electrode. During operation, as a user applies a downward force on cover material 5826, cover material 5826 can deform by an amount corresponding to an amount of the applied force. The deformation of cover material 5826 can cause a corresponding deformation in optically clear adhesive 5824, touch sensor substrate 5820, optically clear adhesive 5816, polarizers 5816 and 5812, OLED display 5814, adhesive 5812, and piezoelectric films 5808 and 5804. Piezoelectric films 5808 and 5804 can then generate an amount of electric charge based on an amount of deformation of the film and at a location of the deformation of the film. The electrode of electrode 5810 positioned at or near the location of the deformation of piezoelectric film 5808 and that is electrically coupled to receive the generated charge can transmit the generated charge to its associated sense circuitry. Similarly the electrode of electrode 5802 positioned at or near the location of the deformation of piezoelectric film 5804 and that is electrically coupled to receive the generated charge can transmit the generated charge to its associated sense circuitry. Since the amount of electric charge generated by piezoelectric films 5804 and 5808 can be representative of the amount of deformation of the films and because the amount of deformation of the films can be representative of the force applied to cover material 5826, the amount of electric charge detected by the sense circuitry can be representative of the force applied to cover material 5826. Additionally, since the location of the electrodes of electrodes 5802 and 5810 receiving the generated charge is known, the location of the applied force can also be determined. For example, electrode 5810 can be used to determine the row at which the force was applied, while electrode 5802 can be used to determine the column at which the force was applied. The intersection of the determined row and column can be the location of the applied force. In this way, the sense circuitry can be used to detect an amount and location of a force applied to cover material 5826. Moreover, the multiple electrodes of electrodes 5802 and 5810 and the separate sense circuitry coupled to each electrode allows for detection of multiple forces applied to different portions of cover material 5826 at the same time. In other examples, electrode 5810 can be coupled to the bottom of piezoelectric film 5804 and electrode 5802 can be coupled to the top of piezoelectric film 5808. In these examples, the electrodes of electrodes 5802 and 5810 can each be coupled to separate sense circuitry. The sense circuitry can be used to detect an amount and location of force applied to cover material 5826 in a manner similar to that described above for the configuration shown in FIG. 58.

Additionally, during operation, electrodes 5814 and 5818 can be used to determine a position of a touch event (e.g., a finger, stylus, or other object touching cover material 5822) on cover material 5822 using a self capacitance sensing technique. For example, each electrode of electrode 5818 can be coupled to a voltage source and sense circuitry. The sense circuitry can measure a change in capacitance at each electrode caused by an object, such as a passive stylus, finger, etc., touching cover material 5822. The capacitance change can be caused by charge or current from the electrode of electrode 5818 being shunted through the touching object to ground. The detected change in capacitance measured by the sense circuitry can be representative of a touch event occurring at a location corresponding to the associated electrode of electrode 5818. When combined with the amount of force determined using piezoelectric films 5802 and 5806 and electrodes 5802, 5806, and 5810, both the location of the touch event and amount of force applied to cover material 5826 can be determined.

While the examples described above include displays and transparent piezoelectric films, it should be appreciated that the described stackups can similarly be applied to devices that do not include displays. In these examples, the displays can be omitted from the stackups or replaced with a substrate and the various layers (e.g., cover material, electrodes, piezoelectric film, and adhesive layers) of the stackups need not be transparent. For example, a trackpad can be formed using a similar stackup as described above, but without the use of a display. Additionally, the piezoelectric film, cover material, electrodes, and adhesive layers need not be transparent.

Figure 59:
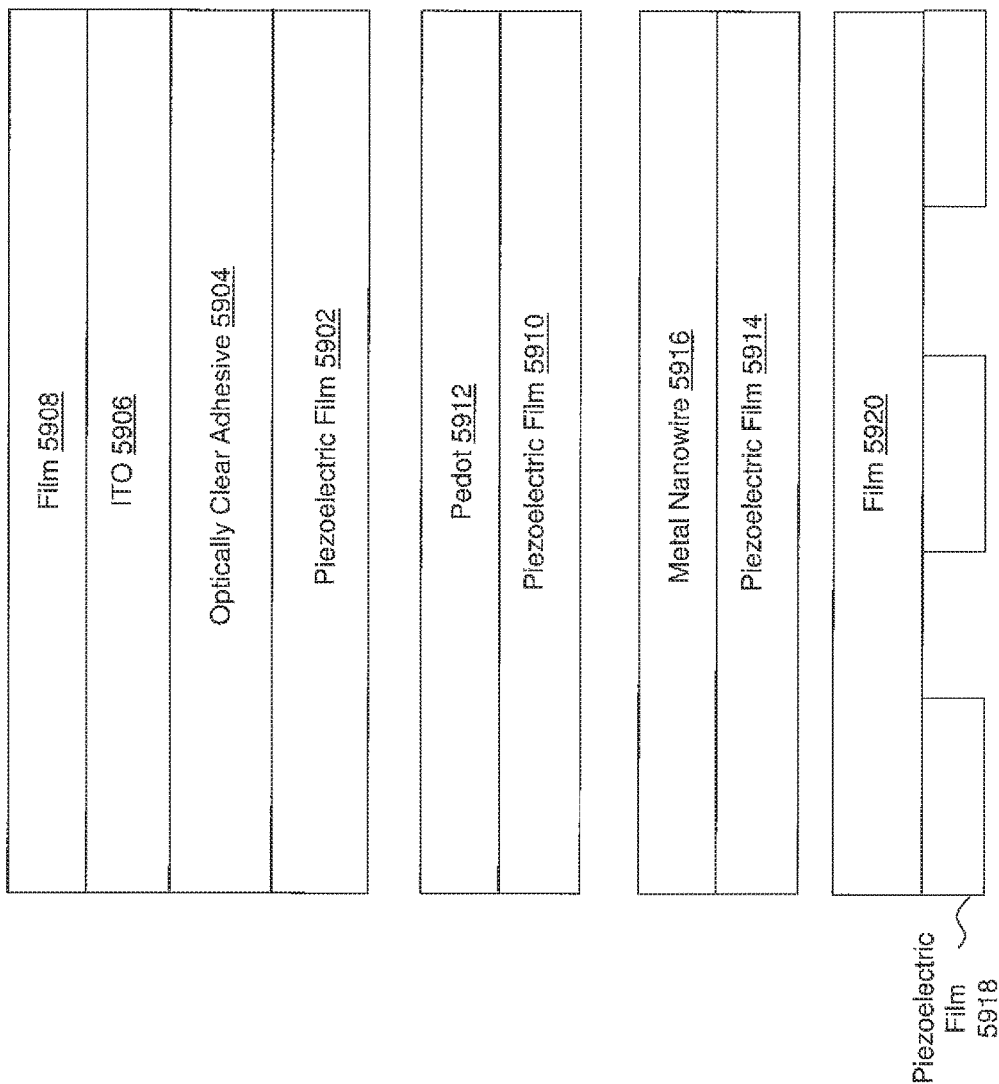
FIG. 59 illustrates exemplary patterned electrodes according to various examples.

In some examples, the piezoelectric films and electrodes described above can be patterned. FIG. 59 illustrates example patterning that can be performed. In one example, ITO 5906 can be deposited onto a film 5908 and laminated to piezoelectric film 5902 using adhesive 5904. In another example, PEDOT 5912 can be deposited onto piezoelectric film 5910. In yet another example, a metal nanowire 5916 (e.g., silver nanowire) can be patterned onto piezoelectric film 5914. In yet another example, piezoelectric film 5918 can be patterned on to a film 5920. In some examples, the piezoelectric film can be manufactured such that it includes sections of active material and sections of inactive material. The active material can generate electric charge when deformed, while the inactive sections of material may not generate electric charge when deformed. For example, the piezoelectric film can be stretched in a desired direction, causing strain in the film in that direction. The film can be stretched in other desired directions to similarly create directed strain at desired locations. As a result, the piezoelectric film can include regions of x-y strain. In yet other examples, discrete stacks of piezoelectric film disposed between layers of electrodes can be deposited on a substrate. These stacks can be arranged in any desired pattern to create localized regions for force sensing.

Figure 60:
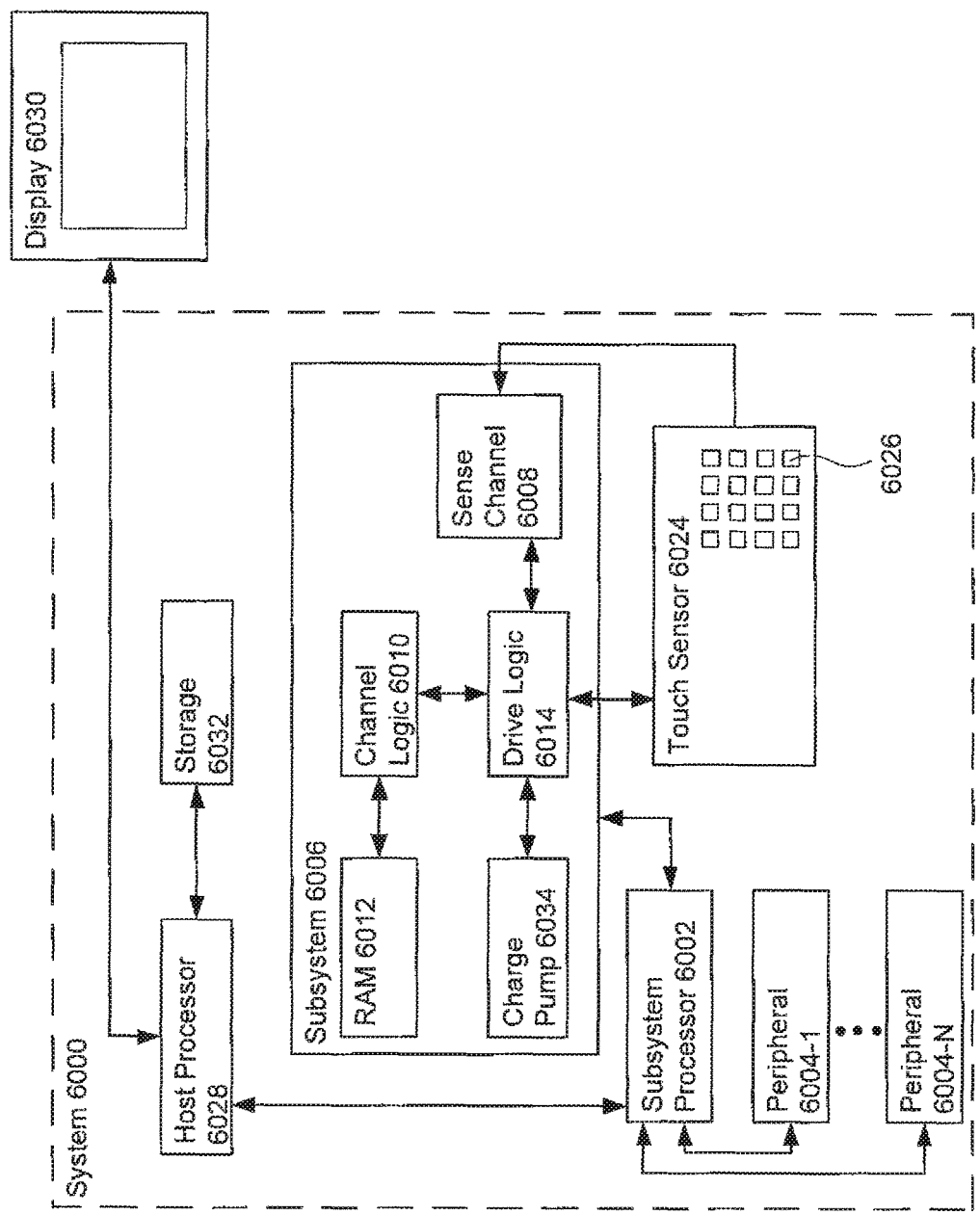
FIG. 60 illustrates an exemplary computing system that can include a stackup for a device according to various examples.

FIG. 60 illustrates exemplary computing system 6000 that can include a touch sensor panel 6024 stackup as in one or more of the examples described above. Computing system 6000 can include one or more panel processors 6002 and peripherals 6004-1 through 6004-N, and panel subsystem 6006. Peripherals 6004 can include, but are not limited to, random access memory (RAM) or other types of memory or storage, watchdog timers and the like. Panel subsystem 6006 can include, but is not limited to, one or more sense channels 6008, channel scan logic 6010, charge pump 6034 and driver logic 6014. Channel scan logic 6010 can access RAM 6012, autonomously read data from the sense channels and provide control for the sense channels. In addition, channel scan logic 6010 can control driver logic 6014 to generate stimulation signals at various frequencies and phases that can be selectively applied to drive lines of touch sensor panel 6024. Charge pump 6034 may, for example, supply charge for such stimulation signals. In some embodiments, panel subsystem 6006, panel processor 6002 and peripherals 6004-1 . . . 6004-N can be integrated into a single application specific integrated circuit (ASIC).

Touch sensor panel 6024 can include a capacitive sensing medium having a plurality of drive lines and a plurality of sense lines, although other sensing media can also be used. Each intersection of drive and sense lines can represent a capacitive sensing node and can be viewed as picture element (pixel) 6026, which can be particularly useful when touch sensor panel 6024 is viewed as capturing an "image" of touch. (In other words, after panel subsystem 6006 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) The capacitive sensing nodes can also be referred to as touch sensors or touch nodes. Each sense line of touch sensor panel 6024 can drive sense channel 6008 (also referred to herein as an event detection and demodulation circuit) in panel subsystem 6006.

Computing system 6000 can also include host processor 6028 for receiving outputs from panel processor 6002 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 6028 can also perform additional functions that may not be related to panel processing, and can be coupled to program storage 6032 and display device 6030 such as an LCD display for providing a UI to a user of the device. Display device 6030 together with touch sensor panel 6024, when located partially or entirely above or under the touch sensor panel, can form touch screen 6018. In some embodiments, the display device 6030 may be separate from the rest of the system 6000 while in others it may be integrated. Here, the touch sensor 6024 is shown as a separate element for clarity although it may be co-located and/or integrated with the display 6030 in practical application.

A force sensor may operate in a similar fashion as the touch sensor 6024 and/or in accordance with embodiments described herein. Further, the force sensor and touch sensor may be coplanar, integrated with one another, or otherwise associated.

Note that one or more of the functions described above, can be performed, for example, by firmware stored in memory (e.g., one of the peripherals) and executed by the panel processor 6002, or stored in the program storage 6032 and executed by the host processor 6028. The firmware can also be stored and/or transported within any computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer readable storage medium" can be any medium that can contain or store the program for use by or in connection with the instruction execution system, apparatus, or device. The non-transitory computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Figure 61:
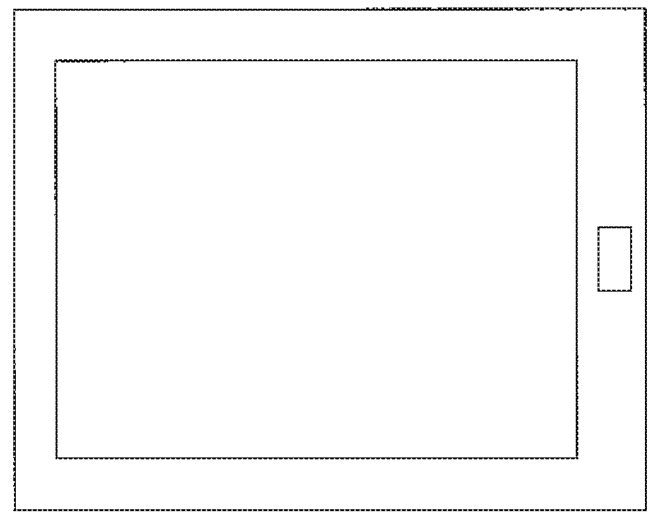
FIGS. 61-64 illustrate exemplary personal devices that can include stackup for a device having a piezoelectric film for detecting force according to various examples.
Figure 62:
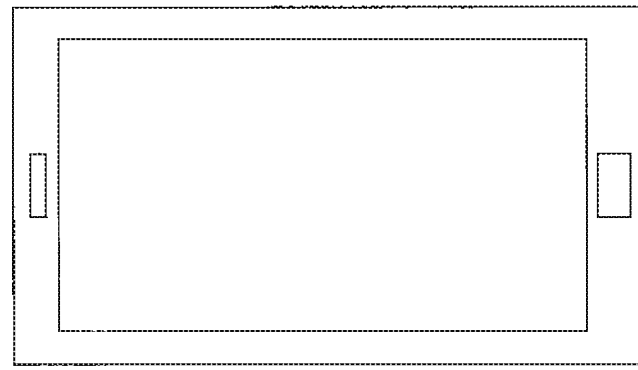
Figure 64:
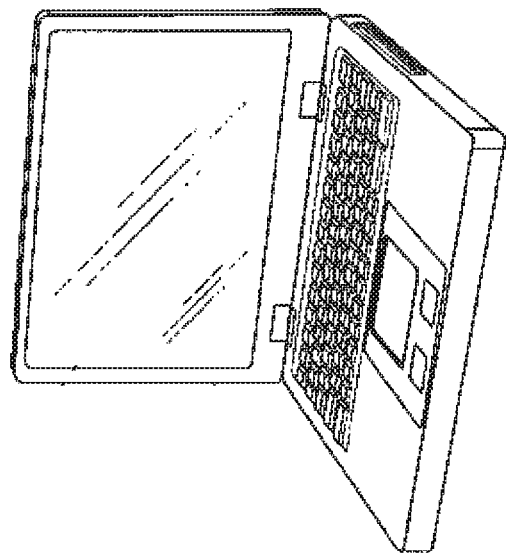
Figure 63:
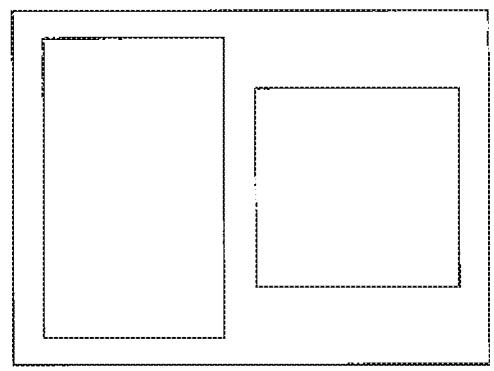

FIGS. 61-64 show example personal devices that can include a stackup for a device having a piezoelectric film for detecting force according to various examples. FIG. 61 illustrates an exemplary personal device 6100, such as a tablet, that can be used with a stackup for a device having a piezoelectric film for detecting force according to various examples. FIG. 62 illustrates another exemplary personal device 6200, such as a mobile phone, that can be used with a stackup for a device having a piezoelectric film for detecting force according to various examples. FIG. 63 illustrates yet another exemplary personal device 6300, such as a portable media player, that can be used with a stackup for a device having a piezoelectric film for detecting force according to various examples. FIG. 64 illustrates another exemplary personal device 6400, such as a laptop computer, that can be used with a stackup for a device having a piezoelectric film for detecting force according to various examples.

Although examples have been fully described with reference to the accompanying drawings, it is to be noted that various changes and modifications will become apparent to those skilled in the art. Such changes and modifications are to be understood as being included within the scope of the various examples as defined by the appended claims.

What is claimed is:

1. A system comprising:
   a cover;
   a piezoelectric layer disposed below the cover;
   a first electrode layer disposed in a grid and coupled to a lower surface of the piezoelectric layer;

a second electrode layer disposed in a first pattern coupled to an upper surface of the piezoelectric layer;

a third electrode layer disposed in a second pattern oriented perpendicular to the first pattern and positioned between the cover and the piezoelectric layer;

a touch sensor coupled to the third electrode layer and the second electrode layer, the touch sensor operable to detect a change in capacitance between the third electrode layer and the second electrode layer corresponding to a touch or proximity input event provided to the cover; and a sense circuitry coupled to the first electrode layer and the second electrode layer, the sense circuitry operable to:

detect an electric charge generated by the piezoelectric layer between the first electrode layer and the second electrode layer; and estimate a magnitude of force exerted on the cover based on the electric charge.

2. The system of claim 1, wherein the piezoelectric layer comprises a transparent film.

3. The system of claim 1, further comprising a display disposed above or below the piezoelectric layer.

4. The system of claim 3, wherein:
the display is coupled to the piezoelectric layer by a first layer of optically clear adhesive; and
the piezoelectric layer is coupled to the cover by a second layer of optically clear adhesive.

5. The system of claim 1, wherein:
the first electrode layer is disposed to define a first pattern;
the second electrode layer is disposed to define a second pattern; and
the first and second patterns are different.

6. The system of claim 1, wherein:
the first electrode layer comprises a first sheet of conductive material coupled to ground; and
the second electrode layer comprises a second sheet of conductive material coupled to the sense circuitry.

7. The system of claim 1, wherein:
the sense circuitry comprises a plurality of sense circuits;
the first electrode layer comprises a sheet of conductive material coupled to ground; and
the second electrode layer comprises a plurality of discrete electrodes, each discrete electrode coupled to a different sense circuit of the plurality of sense circuits.

8. The system of claim 1, wherein:
the sense circuitry comprises a plurality of sense circuits;
the first electrode layer comprises a first plurality of discrete electrodes, each discrete electrode of the first plurality of discrete electrodes coupled to ground; and
the second electrode layer comprises a second plurality of discrete electrodes, each discrete electrode of the second plurality of discrete electrodes coupled to a different sense circuit of the plurality of sense circuits.

9. The system of claim 1, wherein:
the first electrode layer comprises a plurality of rows of conductive material; and
the second electrode layer comprises a plurality of columns of conductive material.

10. The system of claim 9, wherein the plurality of rows of conductive material is coupled to ground, and wherein the plurality of columns of conductive material is coupled to the sense circuitry.

11. The system of claim 1, wherein:
the piezoelectric layer is located on a first side of a display;
the third electrode layer is located on a second side of a display;
a fourth electrode layer is separated from the third electrode layer and positioned further from the display than the third electrode layer; wherein
the third and fourth electrode layers are operably coupled to the cover and closer to the cover than the first and second sets of electrode layer.

12. A system comprising:
a first piezoelectric layer;
a second piezoelectric layer coupled to the first piezoelectric layer;
a cover coupled to the second piezoelectric layer by a first layer of adhesive;
a first electrode layer coupled to the first piezoelectric layer and disposed in a first linear pattern;
a second electrode layer coupled between the first and second piezoelectric layers disposed in a grid pattern;
a third electrode layer coupled between the second piezoelectric layer and the cover, and disposed in a second linear pattern oriented perpendicular to the first linear pattern; and
a sense circuitry operable to detect an electric charge generated by the first and second piezoelectric layers in response to a deformation of the first and second piezoelectric layers and determine a magnitude and a location of an exerted force based on the electric charge.

13. The system of claim 12, further comprising a display coupled to the first piezoelectric layer by a second layer of adhesive.

14. A system comprising:
a piezoelectric layer;
a touch sensor coupled to the piezoelectric layer by a first layer of adhesive;
a cover coupled to the piezoelectric layer by a second layer of adhesive;
a first electrode layer coupled to the piezoelectric layer and disposed in a first linear pattern;
a second electrode layer coupled between the piezoelectric layer and the touch sensor and disposed in a second linear pattern perpendicular to the first linear pattern; and
sense circuitry operable to detect an electric charge generated by the piezoelectric layer in response to a deformation of the piezoelectric layer and output an estimated magnitude of force exerted on the cover based on the electric charge.

15. The system of claim 14, further comprising a display coupled to the piezoelectric layer by a second layer of adhesive.

16. The system of claim 14, wherein the touch sensor comprises a plurality of drive electrode layer and a plurality of sense electrode layer.

17. The system of claim 14, wherein the first electrode layer comprises a first sheet of conductive material, and wherein the second electrode layer comprises a second sheet of conductive material.

18. The system of claim 17, wherein the first sheet of conductive material is coupled to ground, and wherein the second sheet of conductive material is coupled to the sense circuitry.

19. The system of claim 17, wherein the first sheet of conductive material is coupled to the sense circuitry, and wherein the second sheet of conductive material is coupled to ground.

* * * * *